US012707892B2

(12) United States Patent
Kim et al.

(10) Patent No.: US 12,707,892 B2
(45) Date of Patent: Aug. 11, 2026

(54) ORGANIC LIGHT EMITTING DIODE WITH AT LEAST TWO ANTHRACENE HOSTS HAVING DIFFERENT DEUTERATION RATIO AND ORGANIC LIGHT EMITTING DEVICE INCLUDING THE SAME

(71) Applicant: LG DISPLAY CO., LTD., Seoul (KR)

(72) Inventors: Sang-Beom Kim, Paju-si (KR); Young-Jun Yu, Paju-si (KR); Seon-Keun Yoo, Paju-si (KR); Dae-Wi Yoon, Paju-si (KR); Su-Na Choi, Paju-si (KR); Seong-Su Jeon, Paju-si (KR); Ji-Yun Kim, Paju-si (KR); Yong-Hwan Kim, Paju-si (KR); Jin-Hwan Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 360 days.

(21) Appl. No.: 18/369,546

(22) Filed: Sep. 18, 2023

(65) Prior Publication Data

US 2024/0244970 A1 Jul. 18, 2024

(30) Foreign Application Priority Data

Dec. 26, 2022 (KR) ........................ 10-2022-0184115

(51) Int. Cl.
*H10K 85/60* (2023.01)
*C09K 11/02* (2006.01)
(Continued)

(52) U.S. Cl.
CPC ............ *H10K 85/658* (2023.02); *C09K 11/02* (2013.01); *C09K 11/06* (2013.01); *H10K 85/615* (2023.02);
(Continued)

(58) Field of Classification Search
CPC .. H10K 85/658; H10K 85/615; H10K 85/626; H10K 85/633; H10K 85/636;
(Continued)

(56) References Cited

U.S. PATENT DOCUMENTS

2014/0209884 A1* 7/2014 Park .................... H10K 85/615 546/18
2022/0173324 A1 6/2022 Yu et al.
(Continued)

FOREIGN PATENT DOCUMENTS

KR 10-2022-0076781 A 6/2022
WO WO2021010656 A1 * 1/2021 ........... H10K 85/658

OTHER PUBLICATIONS

Extended European Search Report dated Mar. 5, 2024, issued in corresponding European Patent Application No. 23197946.9.

*Primary Examiner* — Duy T Nguyen
(74) *Attorney, Agent, or Firm* — Morgan, Lewis & Bockius LLP

(57) ABSTRACT

The present invention relates to an organic light emitting diode including first and second electrodes facing each other; and a first emitting part including a first blue emitting layer, a second blue emitting layer, an electron transporting layer and positioned between the first and second electrode, wherein the first blue emitting layer includes a first host and a first dopant, and the second blue emitting layer includes a second host and a second dopant, wherein the first host is an anthracene derivative having a first deuteration ratio, and the second host is an anthracene derivative having a second deuteration ratio smaller than the first deuteration ratio, wherein the first dopant is a first compound represented by Formula 3, and wherein the first electron transporting layer includes at least one of a first electron transporting material
(Continued)

represented by Formula 9 and a second electron transporting material represented by Formula 10.

16 Claims, 5 Drawing Sheets

(51) Int. Cl.

| | |
|---|---|
| ***C09K 11/06*** | (2006.01) |
| ***H10K 50/12*** | (2023.01) |
| ***H10K 50/16*** | (2023.01) |
| ***H10K 50/19*** | (2023.01) |
| ***H10K 101/00*** | (2023.01) |

(52) U.S. Cl.
CPC ......... *H10K 85/626* (2023.02); *H10K 85/633* (2023.02); *H10K 85/636* (2023.02); *H10K 85/654* (2023.02); *H10K 85/6572* (2023.02); *H10K 85/6574* (2023.02); *C09K 2211/1011* (2013.01); *C09K 2211/1018* (2013.01); *H10K 50/12* (2023.02); *H10K 50/16* (2023.02); *H10K 50/19* (2023.02); *H10K 2101/90* (2023.02)

(58) Field of Classification Search
CPC ............ H10K 85/654; H10K 85/6572; H10K 85/6574; H10K 50/12; H10K 50/16; H10K 50/19; H10K 2101/90; H10K 85/322; H10K 50/11; H10K 85/657; H10K 59/12; H10K 85/649; H10K 85/6576; H10K 50/13; H10K 50/81; H10K 50/82; C09K 11/02; C09K 11/06; C09K 2211/1011; C09K 2211/1018
USPC ............................................................ 257/40
See application file for complete search history.

(56) References Cited

U.S. PATENT DOCUMENTS

| | | | | |
|---|---|---|---|---|
| 2022/0209119 | A1* | 6/2022 | Choi | H10K 85/615 |
| 2022/0285625 | A1* | 9/2022 | Tasaki | H10K 85/636 |

* cited by examiner

ORGANIC LIGHT EMITTING DIODE WITH AT LEAST TWO ANTHRACENE HOSTS HAVING DIFFERENT DEUTERATION RATIO AND ORGANIC LIGHT EMITTING DEVICE INCLUDING THE SAME

CROSS-REFERENCE TO RELATED APPLICATION

The present application claims the benefit of Korean Patent Application No. 10-2022-0184115 filed in the Republic of Korea on Dec. 26, 2022, which is hereby incorporated by reference in its entirety.

BACKGROUND

Technical Field

The present invention relates to an organic light emitting device, and more specifically, to an organic light emitting diode (OLED) having an advantage in at least one a driving voltage, an emitting efficiency and a lifespan.

Description of the Related Art

As requests for a flat panel display device having a small occupied area have been increased, an organic light emitting display device including an OLED has been the subject of recent research and development.

The OLED emits light by injecting electrons from a cathode as an electron injection electrode and holes from an anode as a hole injection electrode into an emitting material layer (EML), combining the electrons with the holes, generating an exciton, and transforming the exciton from an excited state to a ground state. A flexible substrate, for example, a plastic substrate, can be used as a base substrate where elements are formed. In addition, the organic light emitting display device can be operated at a voltage (e.g., 10V or below) lower than a voltage required to operate other display devices. Moreover, the organic light emitting display device has advantages in the power consumption and the color sense.

The OLED includes a first electrode as an anode over a substrate, a second electrode, which is spaced apart from and faces the first electrode, and an organic emitting layer therebetween.

For example, the organic light emitting display device may include a red pixel region, a green pixel region and a blue pixel region, and the OLED may be formed in each of the red, green and blue pixel regions.

However, the OLED in the blue pixel does not provide sufficient emitting efficiency and lifespan such that the organic light emitting display device has a limitation in the emitting efficiency and the lifespan.

SUMMARY

The present invention is directed to an OLED and an organic light emitting device including the OLED that substantially obviate one or more of the problems associated with the limitations and disadvantages of the related conventional art.

Additional features and advantages of the present invention are set forth in the description which follows, and will be apparent from the description, or evident by practice of the present invention. The objectives and other advantages of the present invention are realized and attained by the features described herein as well as in the appended drawings.

To achieve these and other advantages in accordance with the objects of the present invention, as embodied and broadly described herein, an organic light emitting diode comprises a first electrode; a second electrode facing the first electrode; and a first emitting part including a first blue emitting layer, a second blue emitting layer and an electron transporting layer and positioned between the first and second electrode, the second blue emitting layer positioned between the first blue emitting layer and the second electrode and contacting the first blue emitting layer, and the electron transporting layer positioned between the second blue emitting layer and the second electrode, wherein the first blue emitting layer includes a first host and a first dopant, and the second blue emitting layer includes a second host and a second dopant, wherein the first host is an anthracene derivative having a first deuteration ratio, and the second host is an anthracene derivative having a second deuteration ratio smaller than the first deuteration ratio, wherein the first dopant is a first compound represented by Formula 3:

[Formula 3],

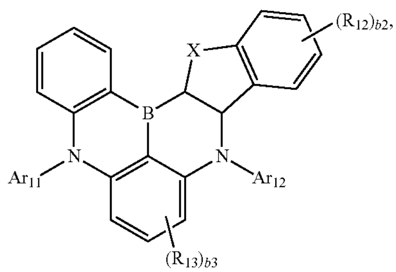

wherein in the Formula 3, each of b1 and b2 is independently an integer of 0 to 4, and b3 is an integer of 0 to 3, X is O or S, each of $Ar_{11}$ and $Ar_{12}$ is independently selected from the group consisting of a substituted or unsubstituted C6 to C30 aryl group, a substituted or unsubstituted C3 to C30 heteroaryl group and a substituted or unsubstituted C6 to C30 alicyclic group, and $R_{11}$, $R_{12}$ and $R_{13}$ is independently selected from the group consisting of a substituted or unsubstituted C1 to C30 alkyl group, a substituted or unsubstituted C3 to C30 cycloalkyl group, a substituted or unsubstituted C6 to C30 arylamino group, a substituted or unsubstituted C6 to C30 aryl group and a substituted or unsubstituted C3 to C30 heteroaryl group, or at least one pair of adjacent two or more $R_{11}$, adjacent two or more Ru and adjacent two or more $R_{13}$ are connected to each other to form a substitute or unsubstituted ring, wherein the first electron transporting layer includes at least one of a first electron transporting material represented by Formula 9 and a second electron transporting material represented by Formula 9;

[Formula 9]

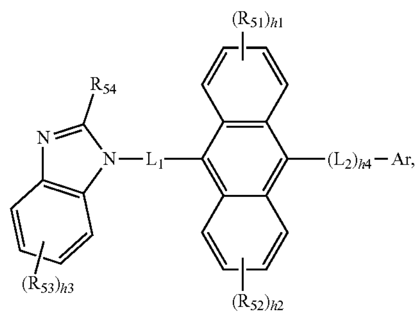

wherein in the Formula 9, each of h1, h2 and h3 is independently an integer of 0 to 4, and h4 is 0 or 1, each of $R_{51}$, $R_{52}$ and $R_{53}$ is independently selected from the group consisting of deuterium, a substituted or unsubstituted C1 to C10 alkyl group, a substituted or unsubstituted C3 to C10 cycloalkyl group, a substituted or unsubstituted C6 to C30 aryl group and a substituted or unsubstituted C3 to C30 heteroaryl group, $R_{54}$ is selected from the group consisting of hydrogen, deuterium, a substituted or unsubstituted C1 to C10 alkyl group, a substituted or unsubstituted C3 to C10 cycloalkyl group, a substituted or unsubstituted C6 to C30 aryl group and a substituted or unsubstituted C3 to C30 heteroaryl group, each of $L_1$ and $L_2$ is independently a substituted or unsubstituted C6 to C30 arylene group, and Ar is selected from the group consisting of a substituted or unsubstituted C6 to C30 aryl group and a substituted or unsubstituted C3 to C30 heteroaryl group,

[Formula 10]

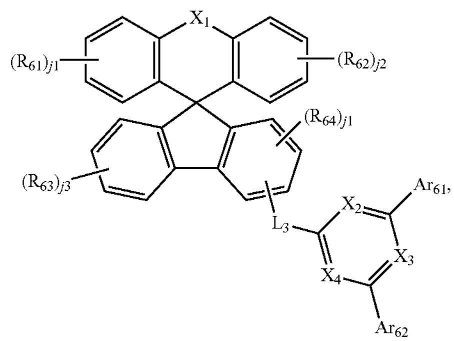

wherein in the Formula 10, each of j1, j2 and j3 is independently an integer of 0 to 4, and j4 is an integer of 0 to 3, each of $R_{61}$, $R_{62}$, $R_{63}$ and $R_{64}$ is independently selected from the group consisting of a substituted or unsubstituted C1 to C10 alkyl group, a substituted or unsubstituted C3 to C10 cycloalkyl group, a substituted or unsubstituted C6 to C30 aryl group and a substituted or unsubstituted C3 to C30 heteroaryl group, $X_1$ is O, S or $NR_{65}$, and $R_{65}$ is a substituted or unsubstituted C6 to C30 aryl group and connected to adjacent benzene ring to form a ring, each of $X_2$, $X_3$ and $X_4$ is independently N or $CR_{66}$, and at least two of $X_2$, $X_3$ and $X_4$ are N, each of $Ar_{61}$, $Ar_{62}$ and $R_{66}$ is independently selected from the group consisting of hydrogen, a substituted or unsubstituted C6 to C30 aryl group and a substituted or unsubstituted C3 to C30 heteroaryl group, and $L_3$ is selected from the group consisting of a substituted or unsubstituted C6 to C30 arylene group and a substituted or unsubstituted C3 to C30 heteroarylene group. In an embodiment, the first dopant is represented by Formula 3a:

[Formula 3a]

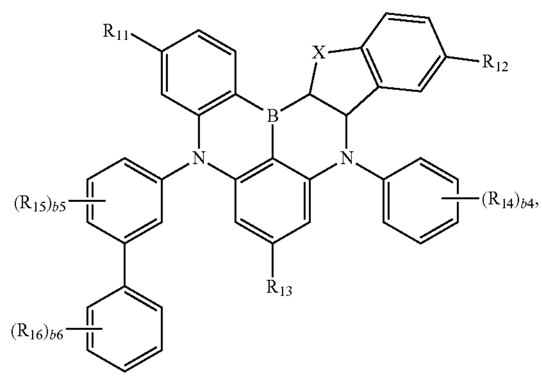

wherein in the Formula 3a, the definitions of X, $R_{11}$, $R_{12}$ and $R_{13}$ is same as those in Formula 3, each of b4 and b6 is independently an integer of 0 to 5, and b5 is an integer of 0 to 4, each of $R_{14}$, $R_{15}$ and $R_{16}$ is selected from the group consisting of a substituted or unsubstituted C1 to C30 alkyl group and a substituted or unsubstituted C3 to C30 cycloalkyl group, or at least one pair of adjacent two $R_{14}$ and adjacent $R_{15}$ and $R_{16}$ are connected to each other to form a substituted or unsubstituted ring.

In an embodiment, the first dopant is one of compounds in Formula 4:

[Formula 4]

BD2_B1

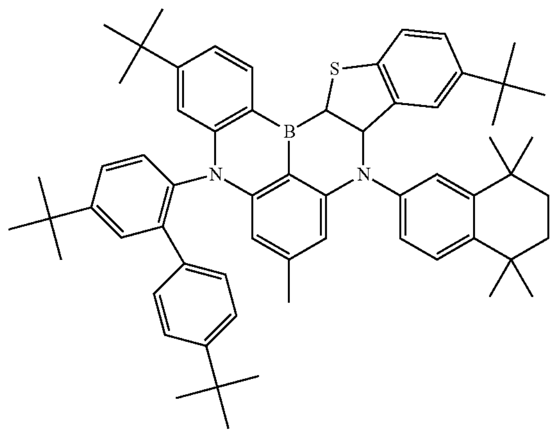

-continued
BD2_B2
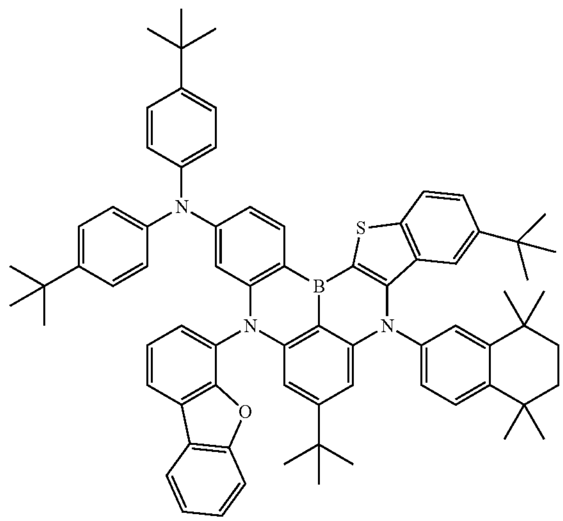
BD2_B3
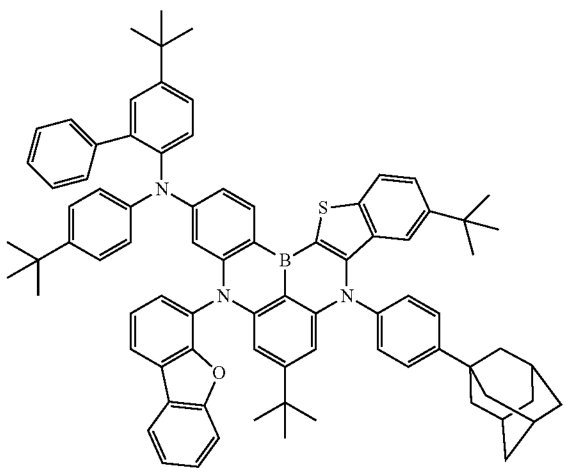
BD2_B4
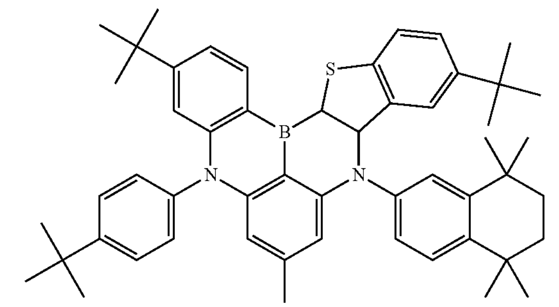
-continued
BD2_B5
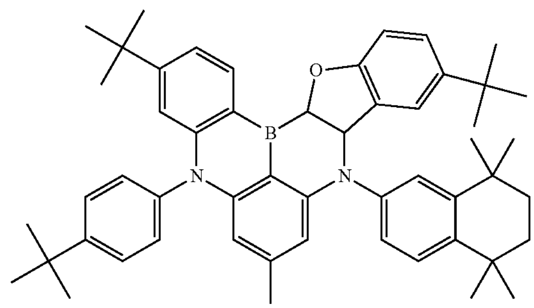
BD2_B6
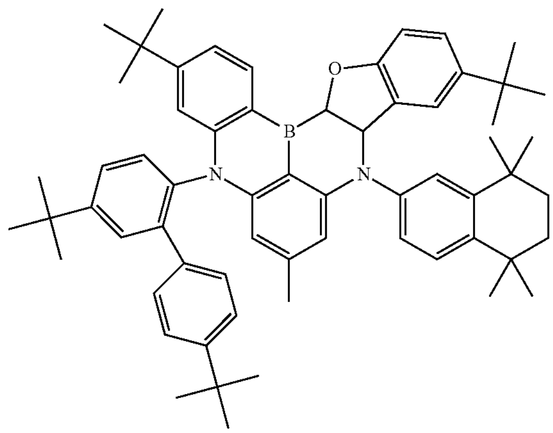
BD2_B7
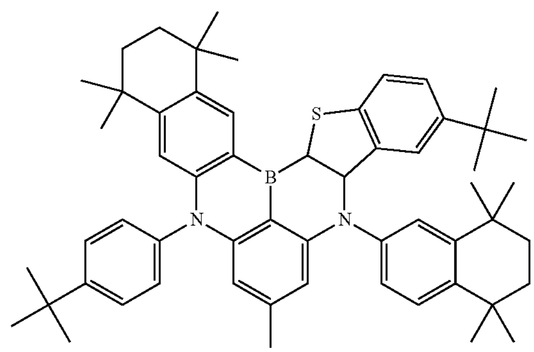
BD2_B8
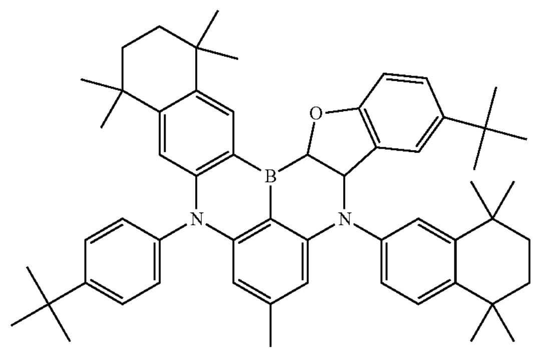

-continued
BD2_B9
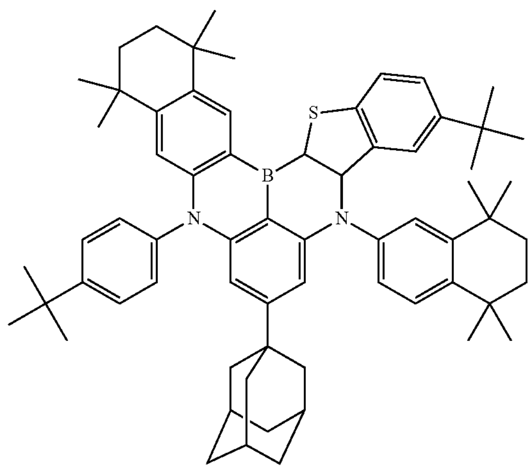
BD2_B10
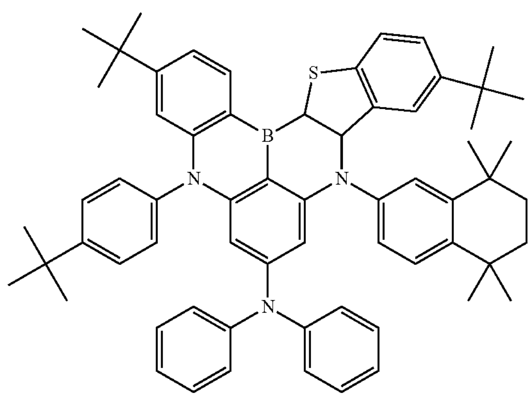
BD2_B11
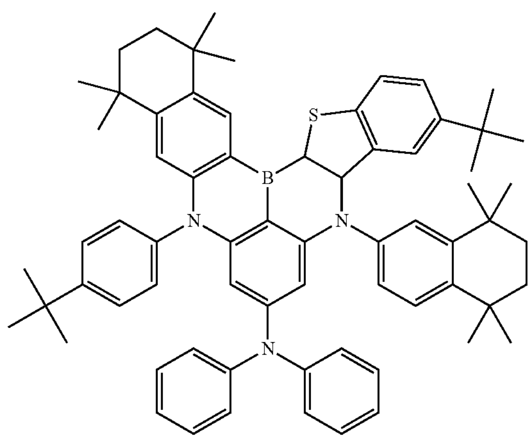
-continued
BD2_B12
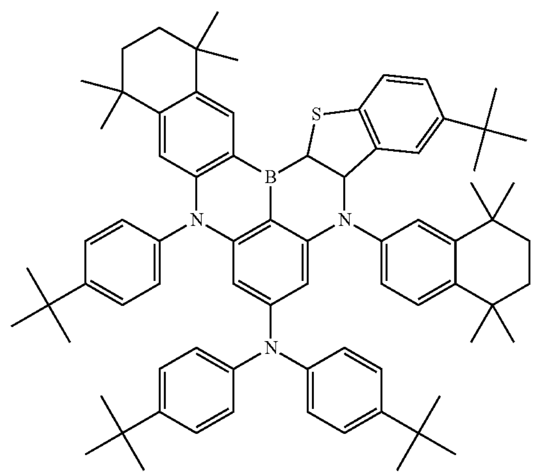
BD2_B13
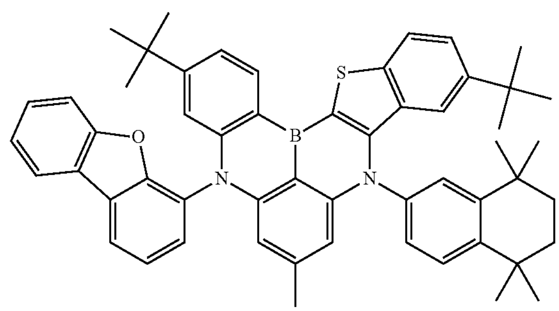
BD2_B14
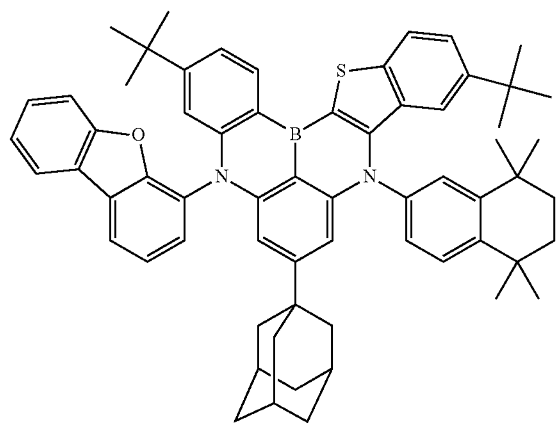

-continued
BD2_B15
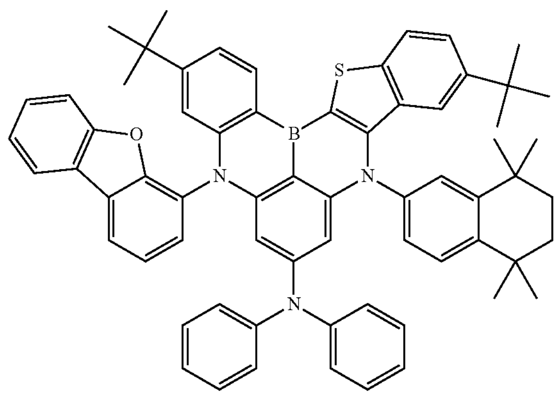
BD2_B16
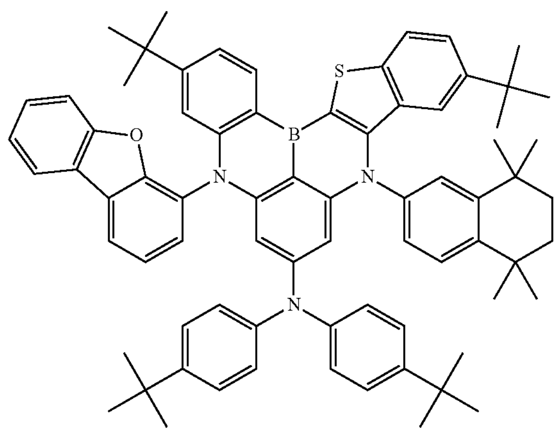
BD2_B17
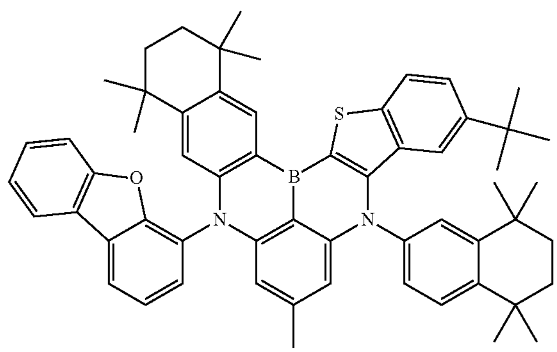
-continued
BD2_B18
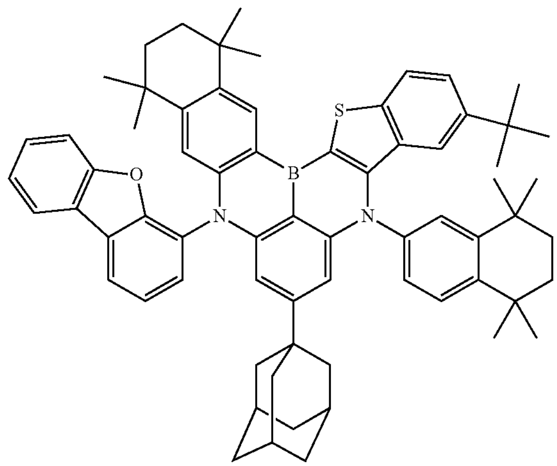
BD2_B19
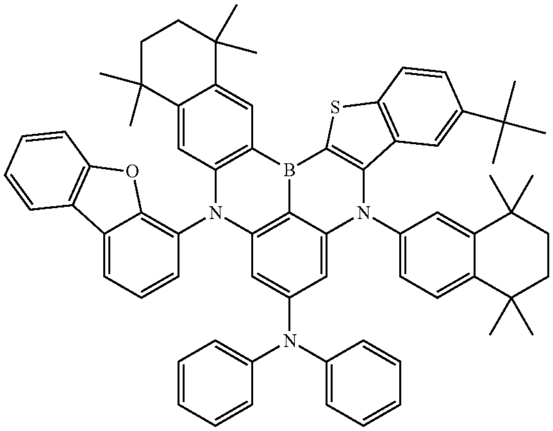
BD2_B20
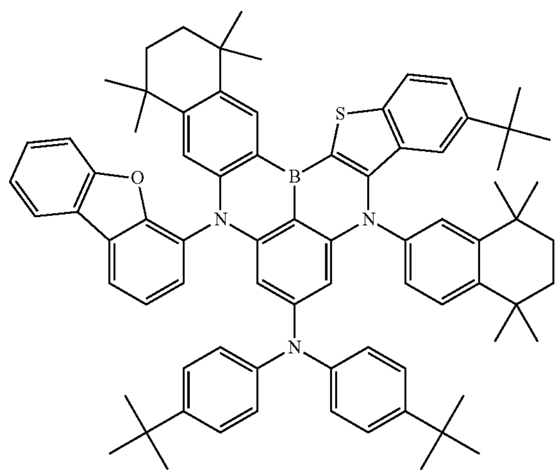
In an embodiment, the second dopant is a second compound represented by Formula 7:

[Formula 7]

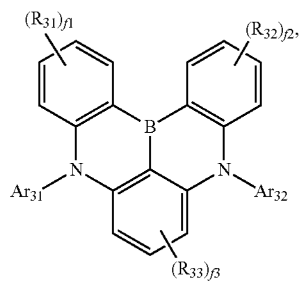

wherein in the Formula 7, each of f1 and f2 is independently an integer of 0 to 4, and f3 is an integer of 0 to 3, each of $Ar_{31}$ and $Ar_{32}$ is independently selected from the group consisting of a substituted or unsubstituted C6 to C30 aryl group, a substituted or unsubstituted C3 to C30 heteroaryl group and a substituted or unsubstituted C6 to C30 alicyclic group, and $R_{31}$, $R_{32}$ and $R_{33}$ is independently selected from the group consisting of a substituted or unsubstituted C1 to C30 alkyl group, a substituted or unsubstituted C3 to C30 cycloalkyl group, a substituted or unsubstituted C6 to C30 arylamino group, a substituted or unsubstituted C6 to C30 aryl group and a substituted or unsubstituted C3 to C30 heteroaryl group. In an embodiment, the second dopant is represented by Formula 7a:

[Formula 7a]

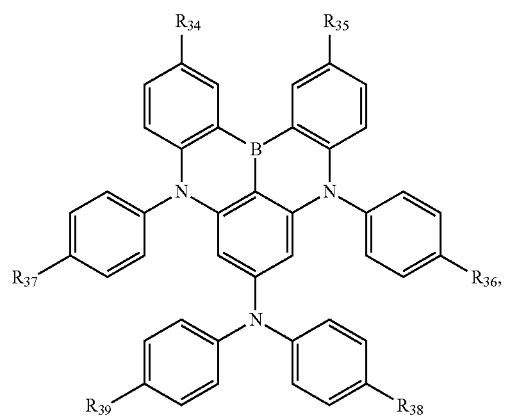

wherein in the Formula 7a, each of $R_{34}$ to $R_{39}$ is independently selected from the group consisting of hydrogen, a substituted or unsubstituted C1 to C30 alkyl group, a substituted or unsubstituted C3 to C30 cycloalkyl group, a substituted or unsubstituted C6 to C30 aryl group and a substituted or unsubstituted C3 to C30 heteroaryl group.

In an embodiment, the second dopant is one of compounds in Formula 8:

[Formula 8]

BD1_A1

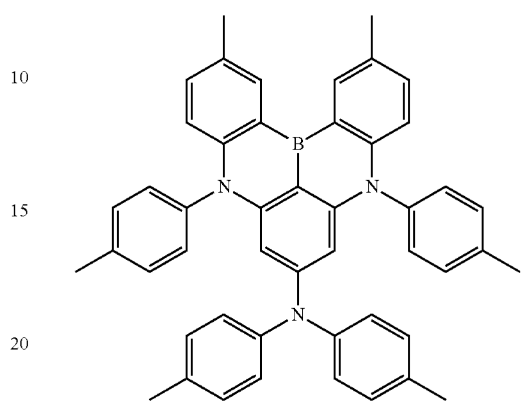

BD1_A2

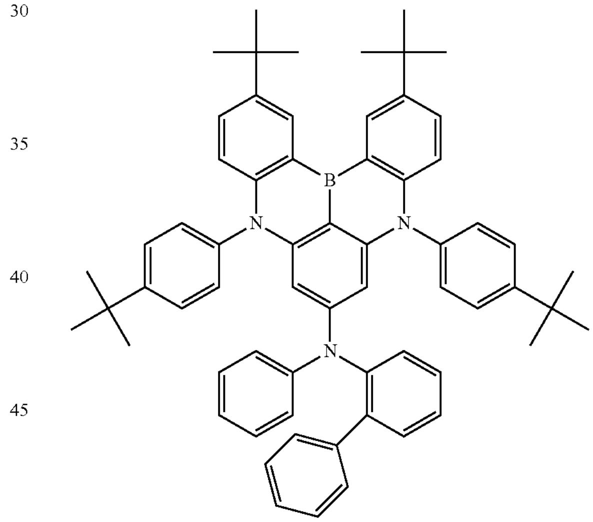

BD1_A3

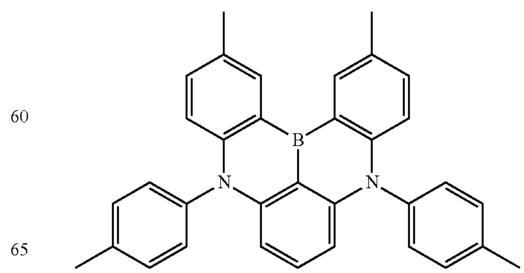

-continued
BD1_A4
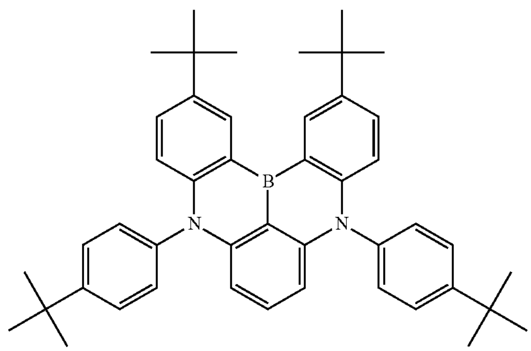
BD1_A5
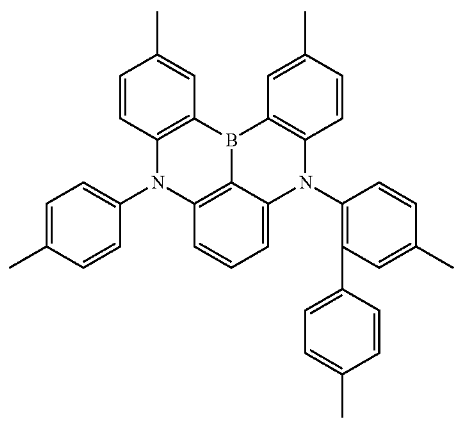
BD1_A6
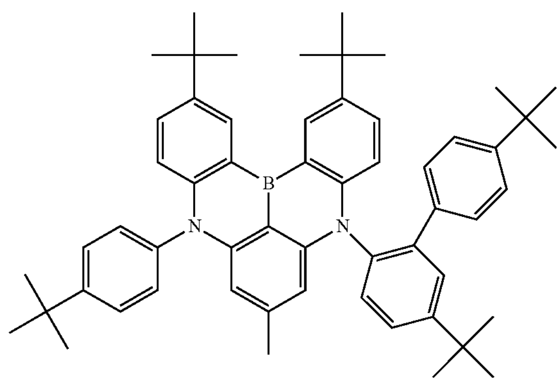
BD1_A7
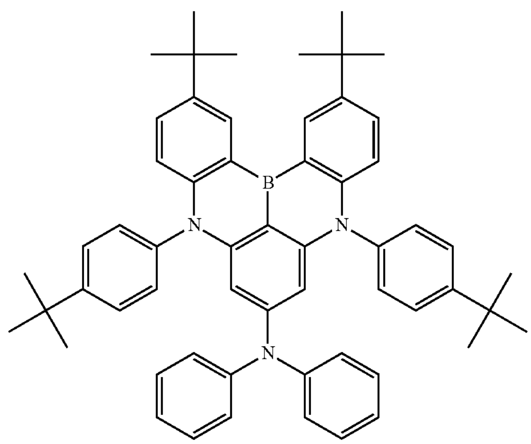
-continued
BD1_A8
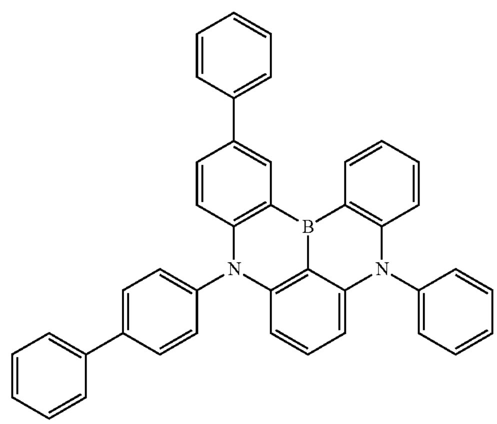
BD1_A9
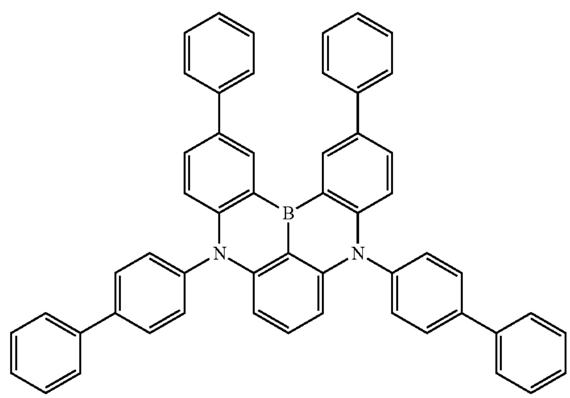
BD1_A10
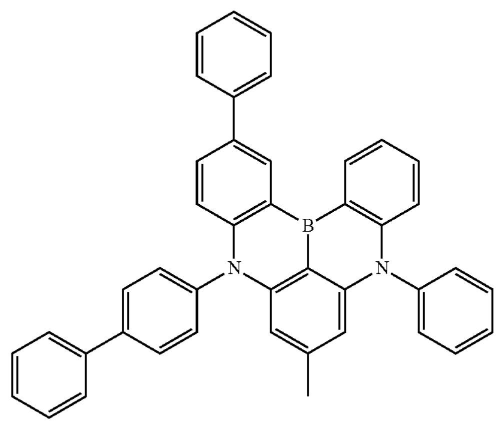

-continued
BD1_A11
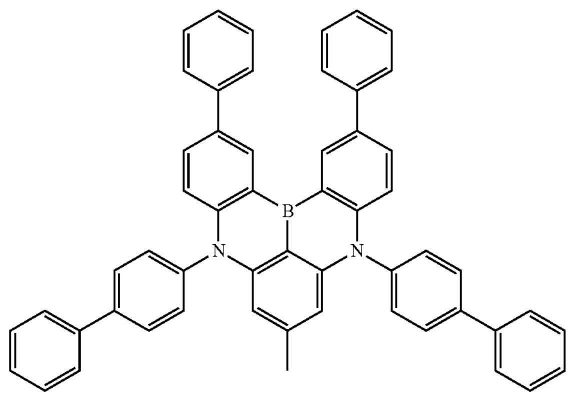
BD1_A12
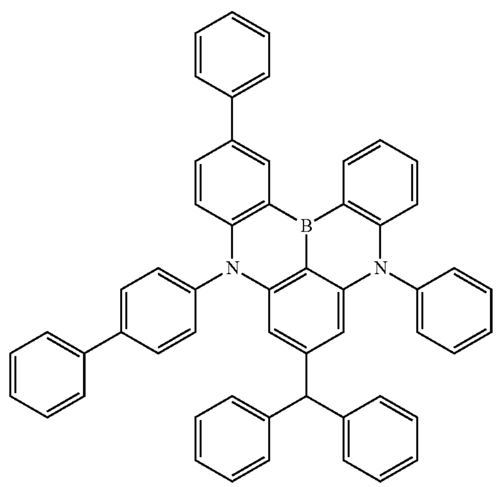
BD1_A13
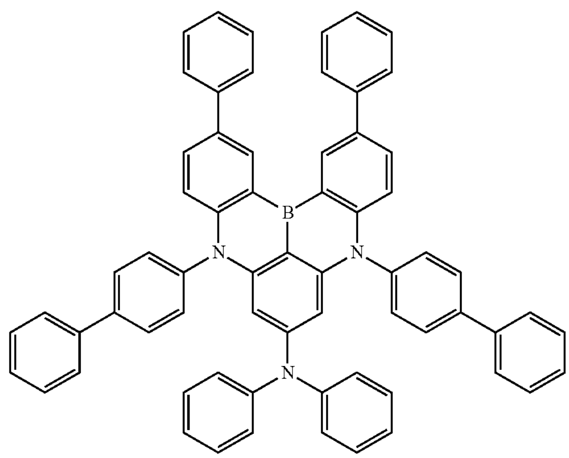
-continued
BD1_A14
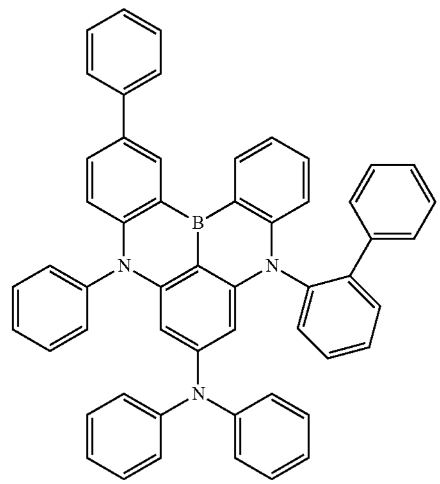
BD1_A15
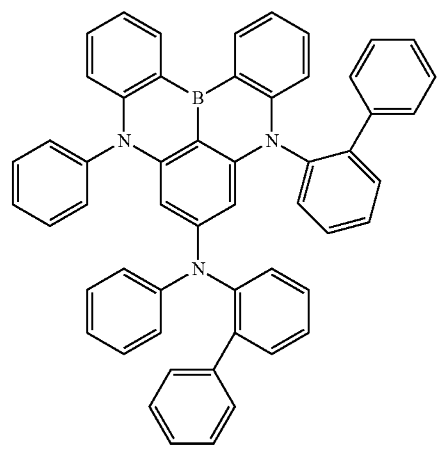
BD1_A16
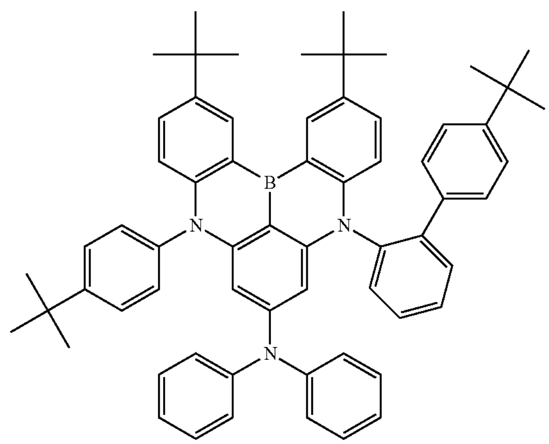

-continued

BD1_A17

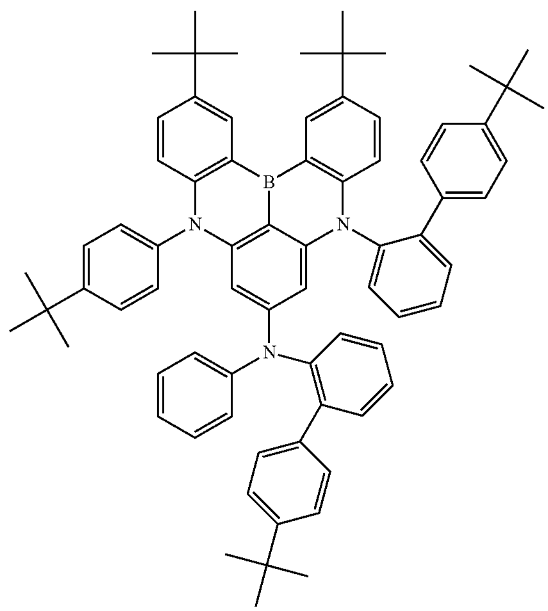

BD1_A18

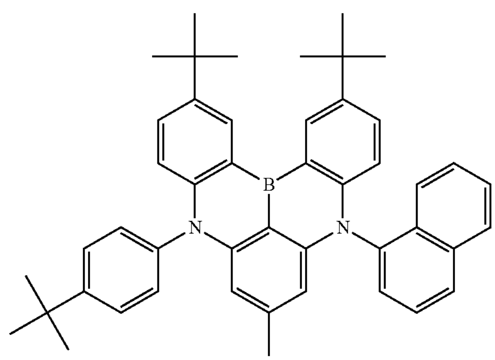

BD1_A19

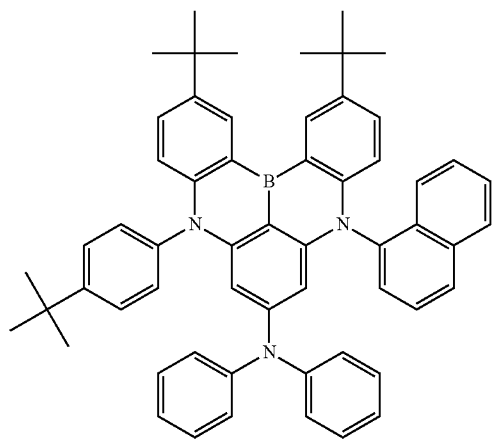

-continued

BD1_A20

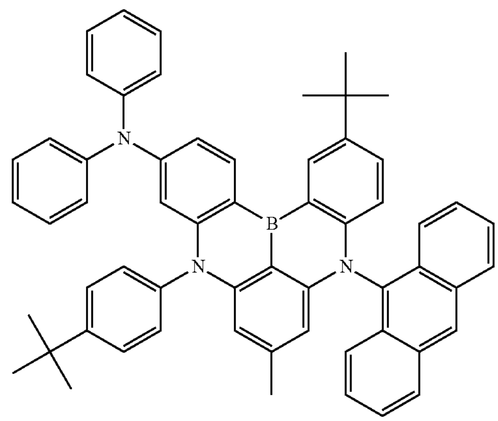

In an embodiment, the first host is represented by Formula 1.

[Formula 1]

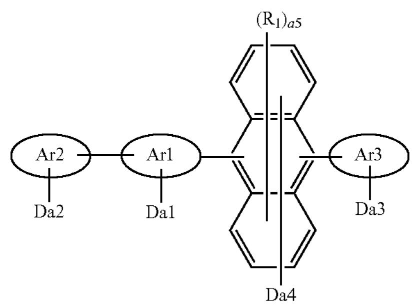

wherein in the Formula 1, each of a1, a2 and a3 is independently an integer of 0 or 30, each of a4 and a5 is independently an integer of 0 to 8, and at least one of a1 to a4 is a positive integer, Ar1 is selected from the group consisting of a single bond (a direct bond), a substituted or unsubstituted C6 to C30 arylene group and a substituted or unsubstituted C3 to C30 heteroarylene group, each of Ar2 and Ar3 is selected from the group consisting of a substituted or unsubstituted C6 to C30 aryl group and a substituted or unsubstituted C3 to C30 heteroaryl group, and $R_1$ is selected from the group consisting of a C1 to C30 alkyl group unsubstituted or substituted with deuterium and a C3 to C30 cycloalkyl group unsubstituted or substituted with deuterium, wherein the second host is represented by Formula 5:

[Formula 5]

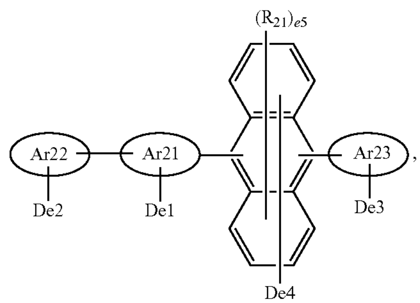

wherein in the Formula 5, each of e1, e2 and e3 is independently an integer of 0 or 30, each of e4 and e5 is independently an integer of 0 to 8, and a summation of e1 to e4 is smaller than a summation of a1 to a4 in Formula 1, Ar21 is selected from the group consisting of a single bond (a direct bond), a substituted or unsubstituted C6 to C30 arylene group and a substituted or unsubstituted C3 to C30 heteroarylene group, each of Ar22 and Ar23 is selected from the group consisting of a substituted or unsubstituted C6 to C30 aryl group and a substituted or unsubstituted C3 to C30 heteroaryl group, and $R_{21}$ is selected from the group consisting of a C1 to C30 alkyl group unsubstituted or substituted with deuterium and a C3 to C30 cycloalkyl group unsubstituted or substituted with deuterium. In an embodiment, the first host is represented by Formula 1a:

[Formula 1a]

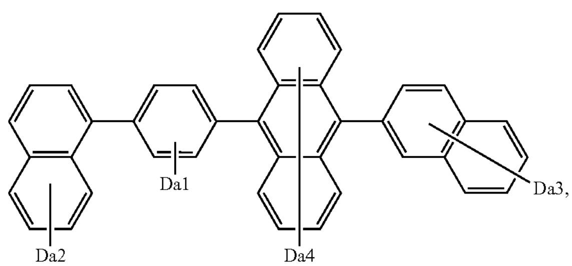

wherein in the Formula 1a, a1 is an integer of 0 to 4, each of a2 and a3 is independently an integer of 0 to 7, a4 is an integer of 0 to 8, and at least one of a1 to a4 is a positive integer, wherein the second host is represented by Formula 5a:

[Formula 5a]

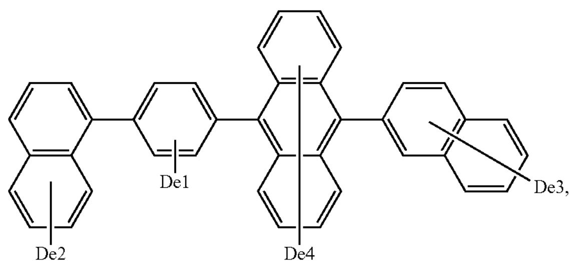

wherein in the Formula 5a, e1 is an integer of 0 to 4, each of e2 and e3 is independently an integer of 0 to 7, e4 is an integer of 0 to 8, and a summation of e1 to e4 is smaller than a summation of a1 to a4 in Formula 1a. In an embodiment, the first host includes at least one of first host compounds in Formula 2:

[Formula 2]

BH1_D1

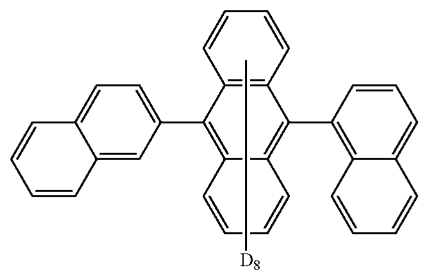

BH1_D2

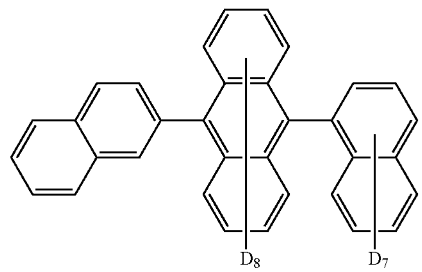

BH1_D3

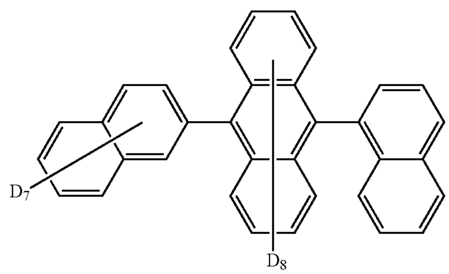

BH1_D4

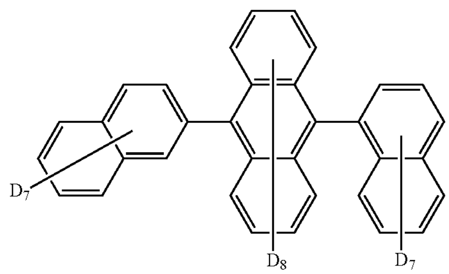

BH2_D1

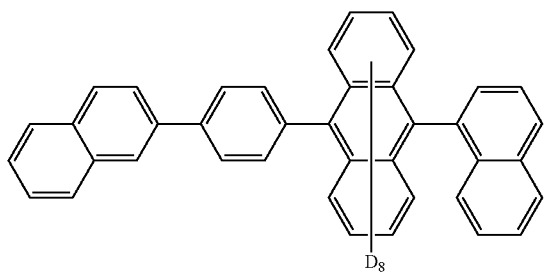

-continued
BH2_D2
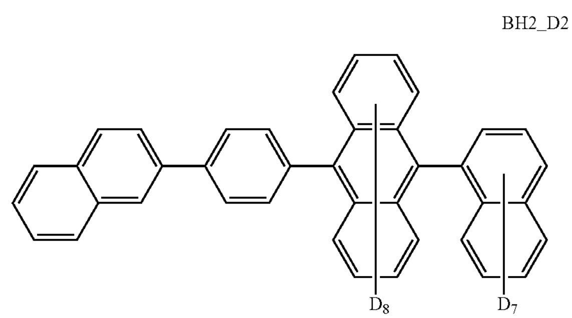
BH2_D3
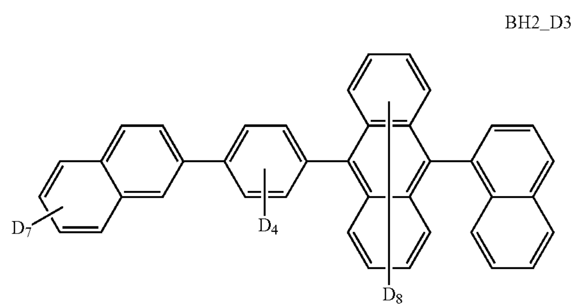
BH2_D4
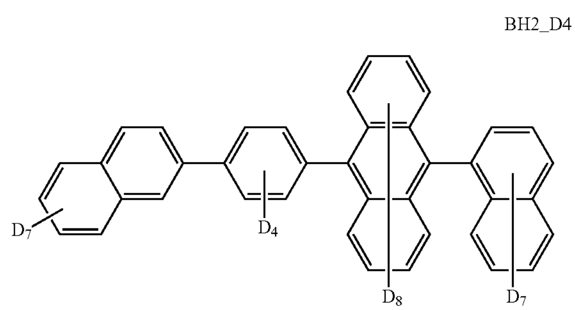
BH3_D1
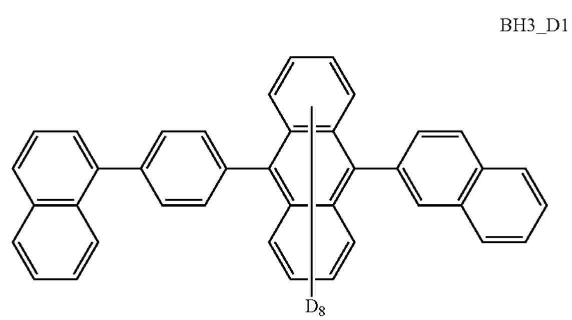
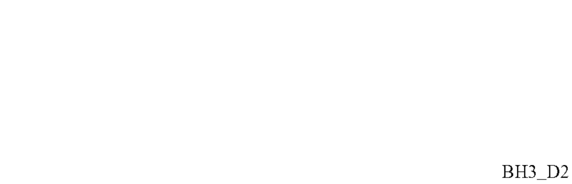
BH3_D2
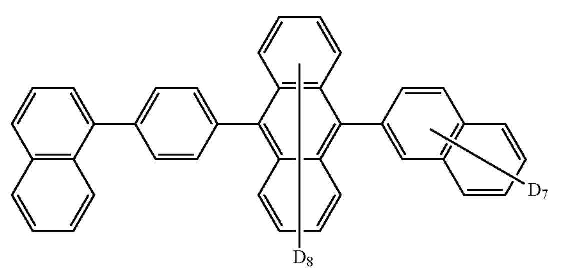
-continued
BH3_D3
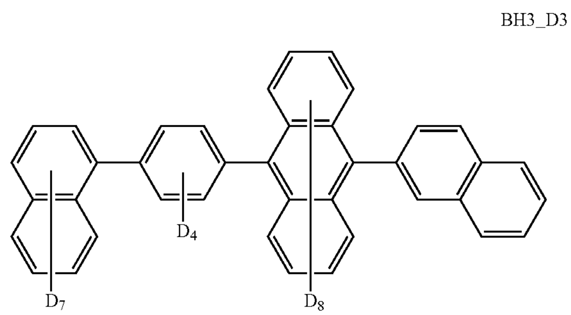
BH3_D4
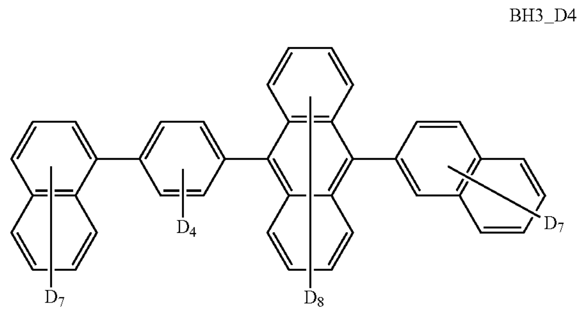
BH4_D1
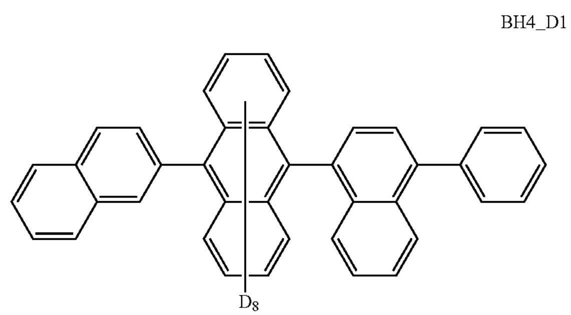
BH4_D2
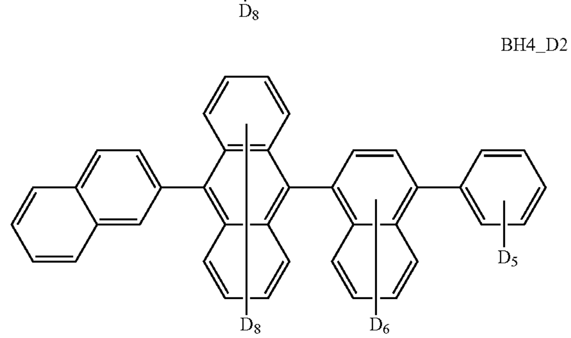
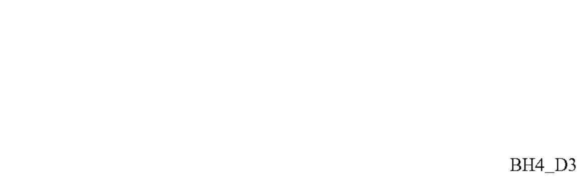
BH4_D3
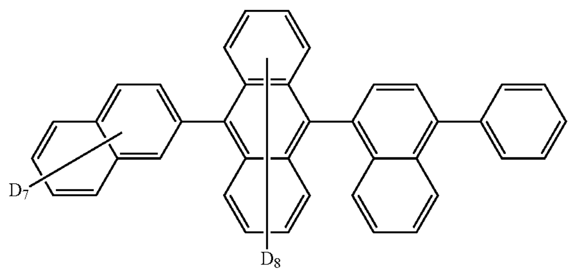

-continued
BH4_D4
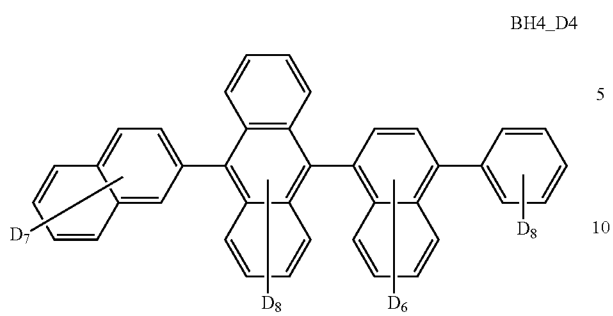
BH5_D1
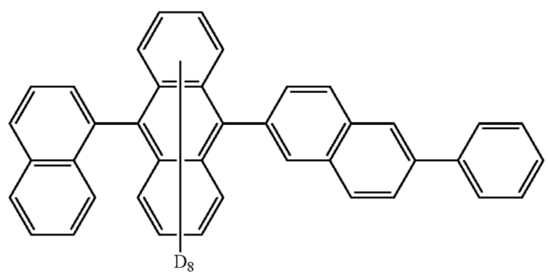
BH5_D2
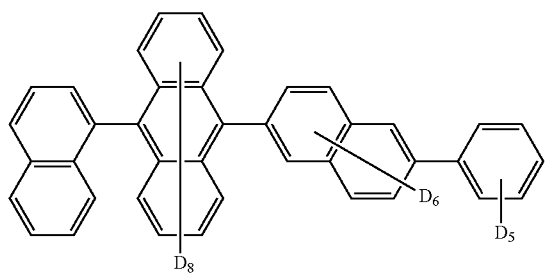
BH5_D3
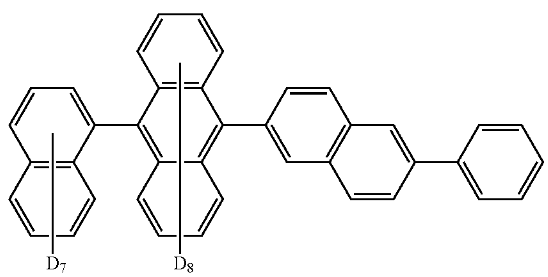
BH5_D4
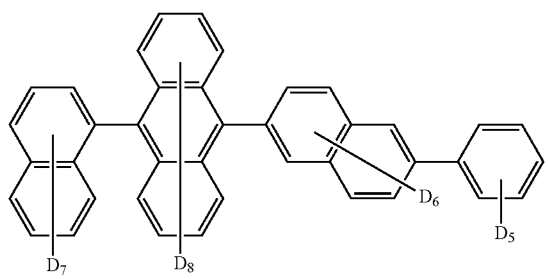
-continued
BH6_D1
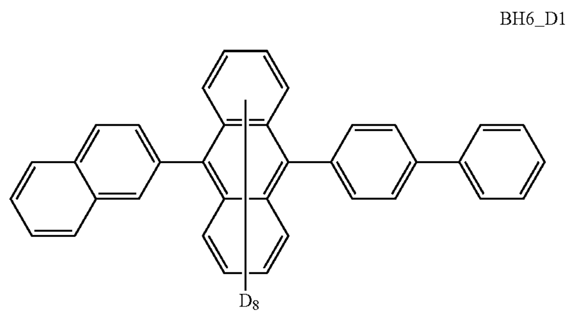
BH6_D2
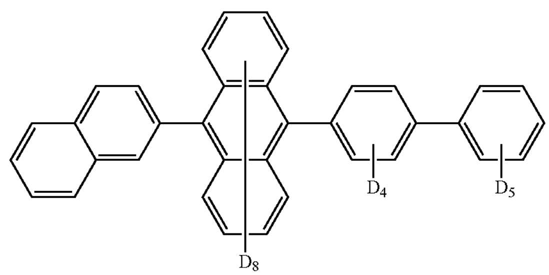
BH6_D3
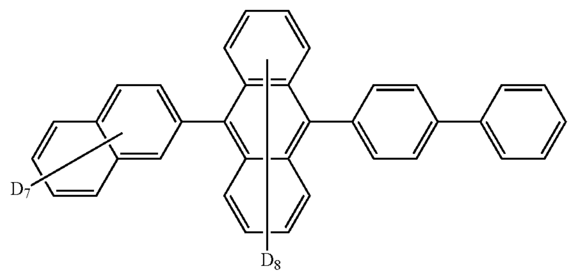
BH6_D4
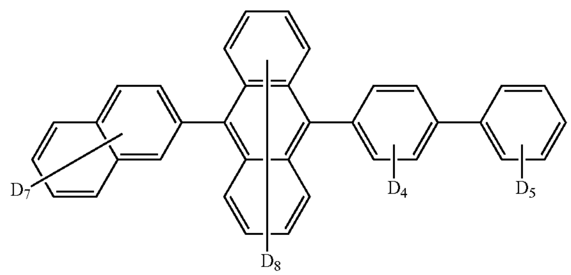
BH7_D1
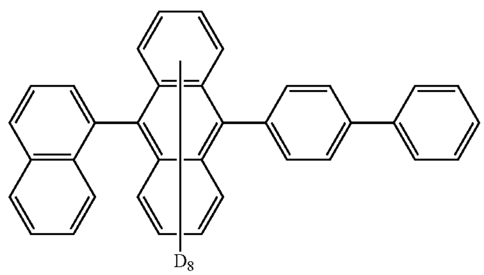

-continued
BH7_D2
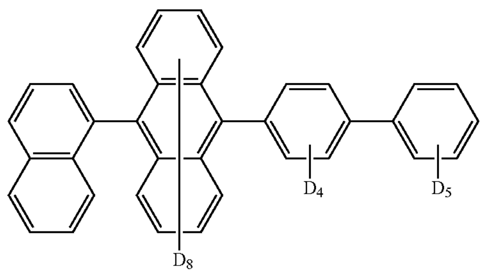
BH7_D3
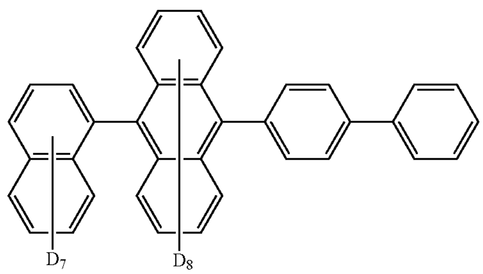
BH7_D4
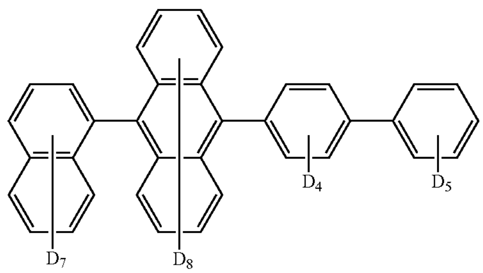
BH8_D1
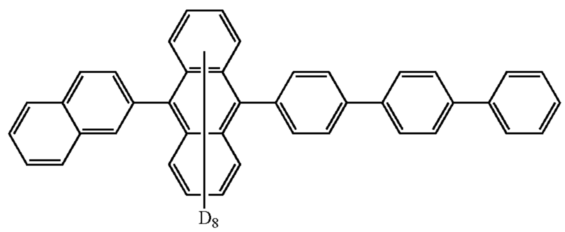
BH8_D2
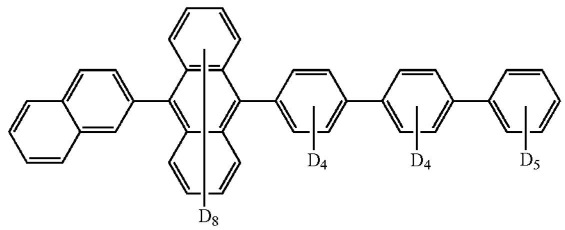
BH8_D3
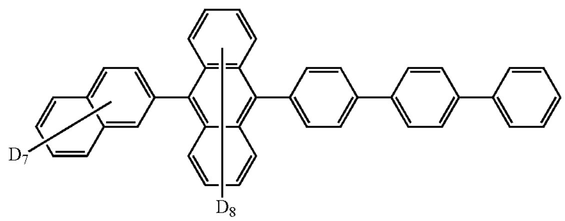
-continued
BH8_D4
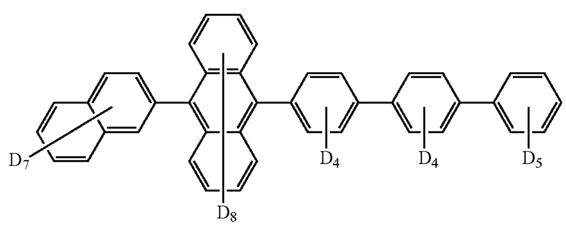
BH9_D1
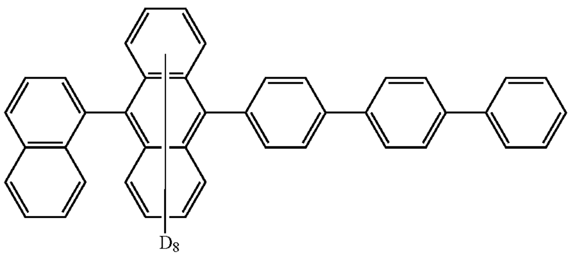
BH9_D2
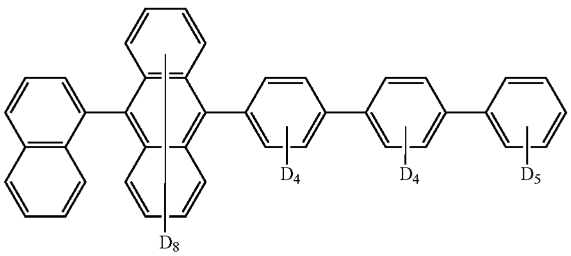
BH9_D3
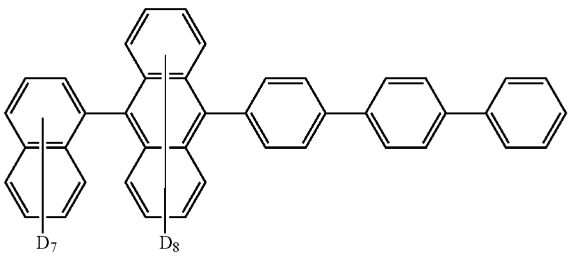
BH9_D4
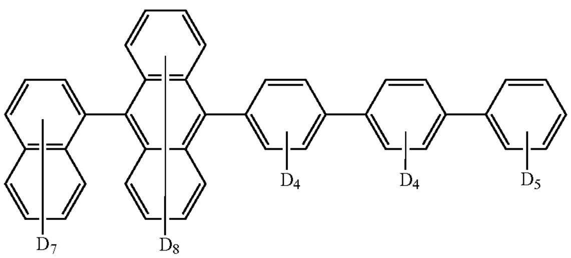
BH10_D1
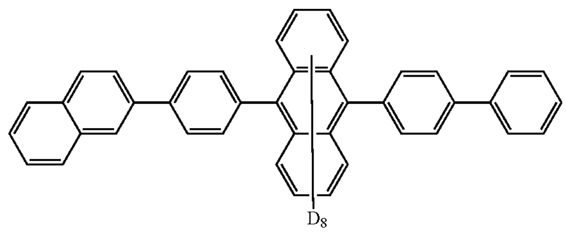

-continued
BH10_D2
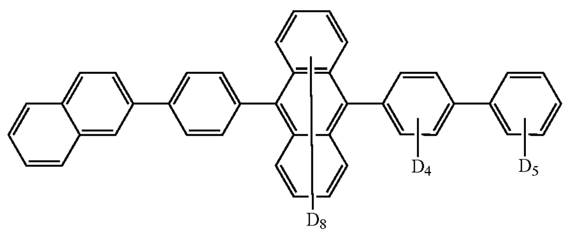
BH10_D3
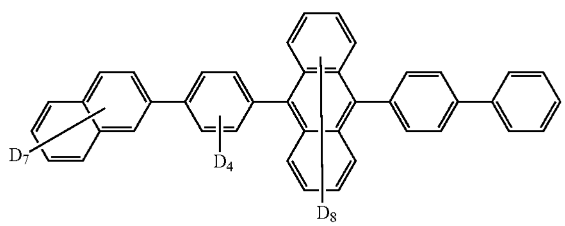
BH10_D4
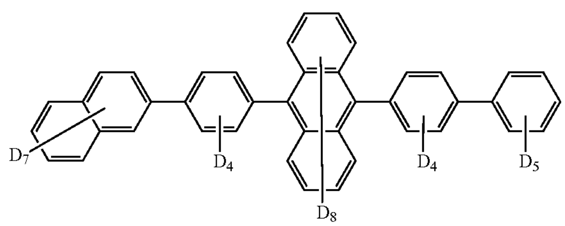
BH11_D1
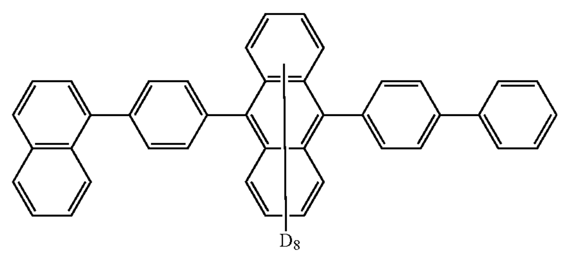
BH11_D2
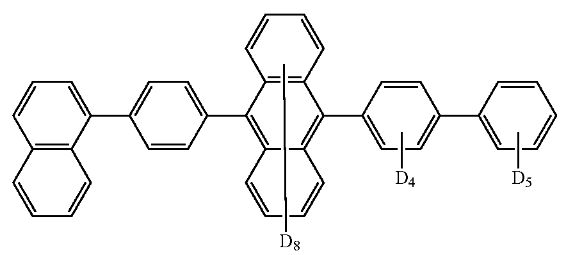
BH11_D3
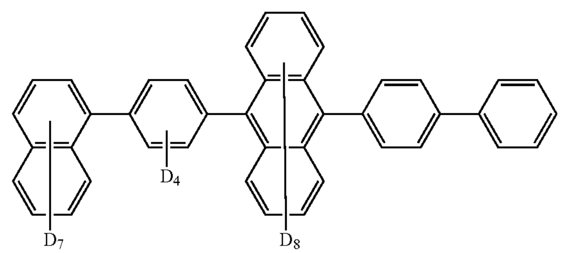
-continued
BH11_D4
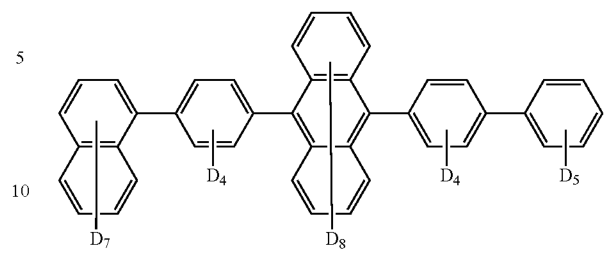
BH12_D1
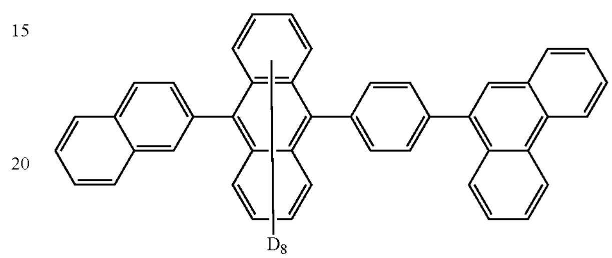
BH12_D2
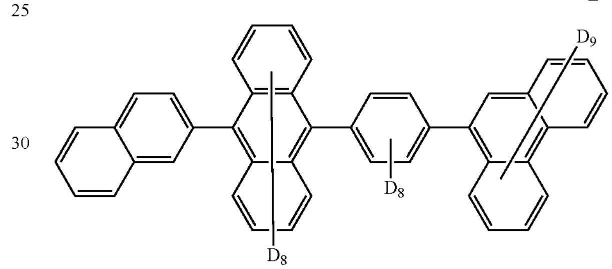
BH12_D3
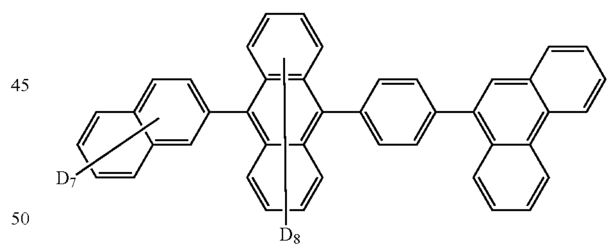
BH12_D4
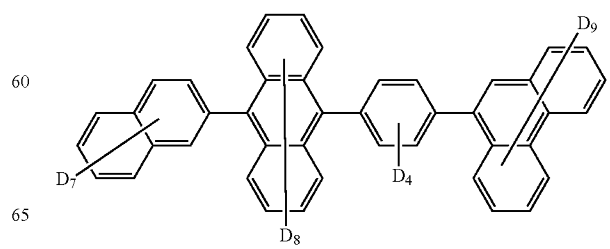

-continued
BH13_D1
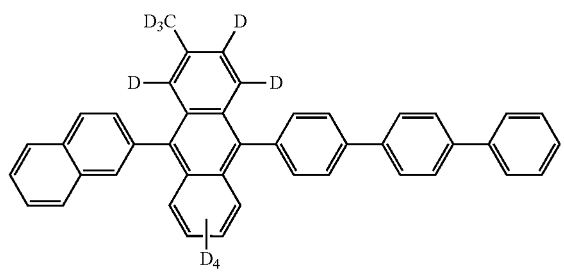
BH13_D2
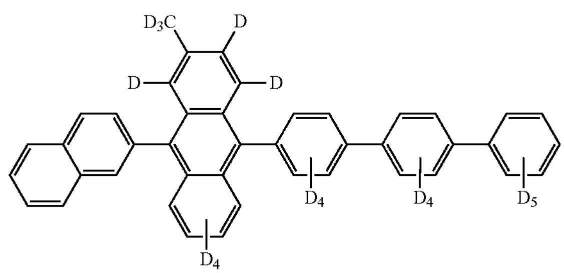
BH13_D3
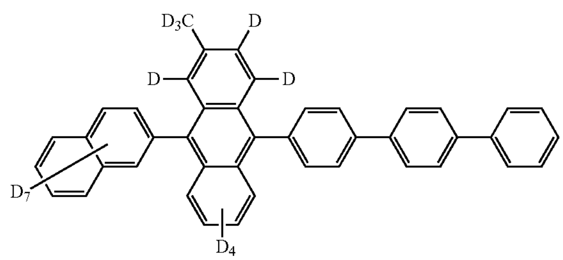
BH13_D4
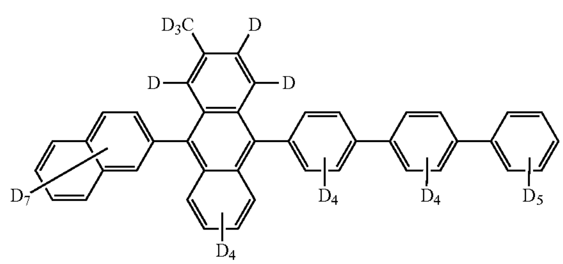
BH14_D1
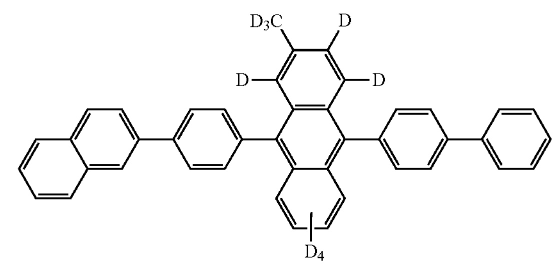
-continued
BH14_D2
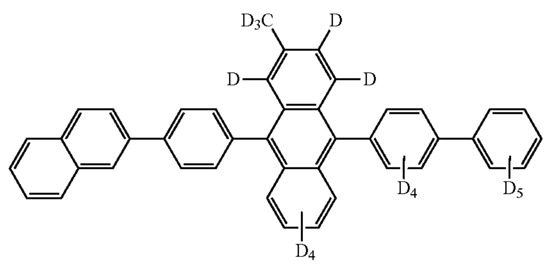
BH14_D3
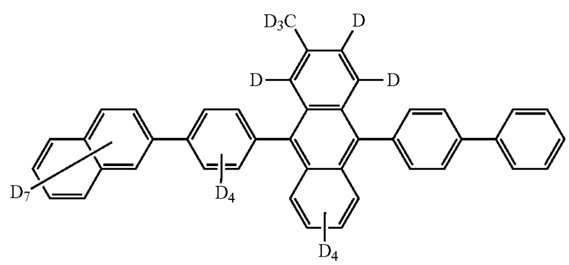
BH14_D4
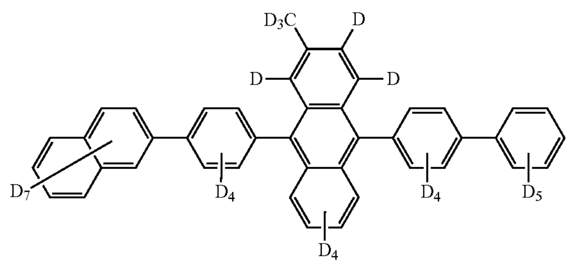
BH15_D1
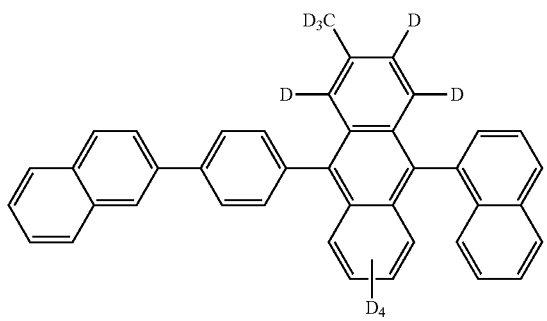
BH15_D2
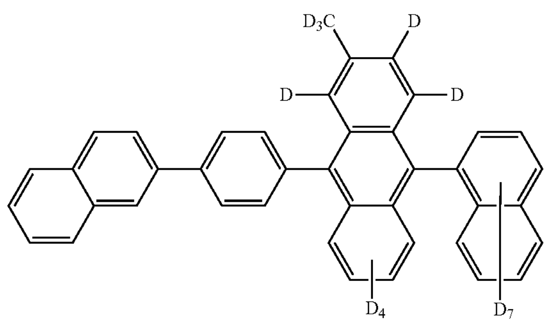

-continued
BH15_D3
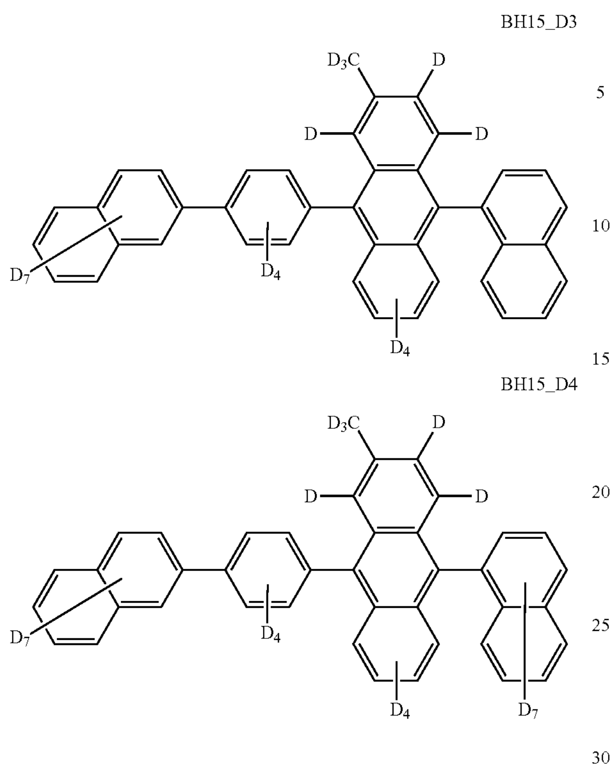
BH15_D4
BH16_D1
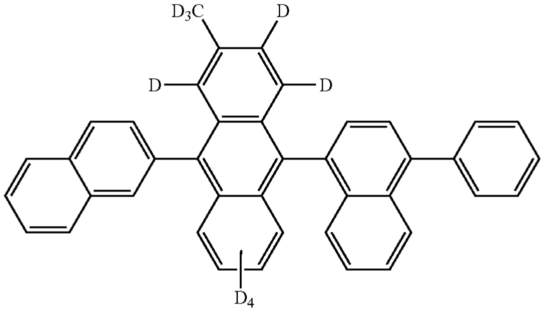
BH16_D2
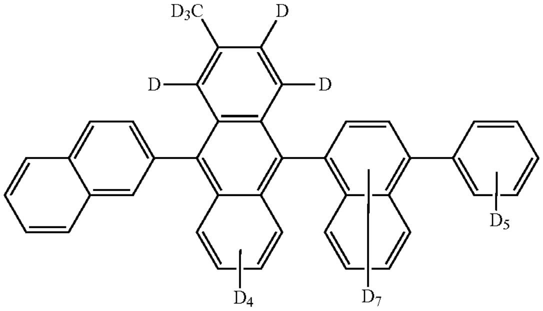
-continued
BH16_D3
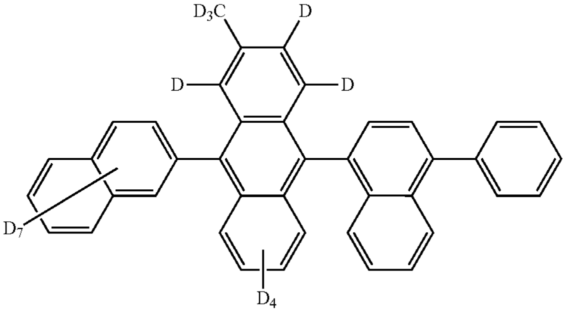
BH16_D4
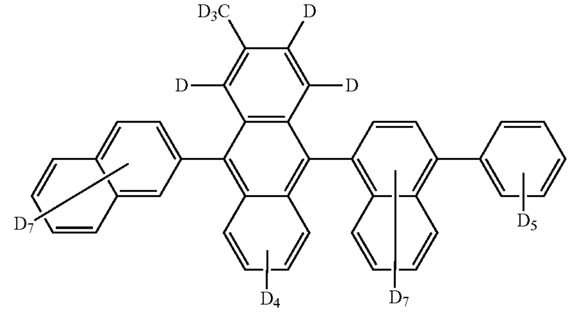
BH17_D1
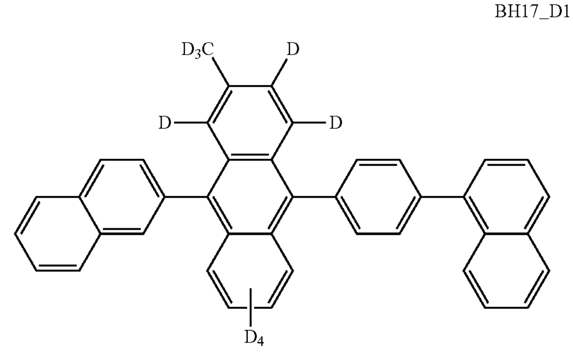
BH17_D2
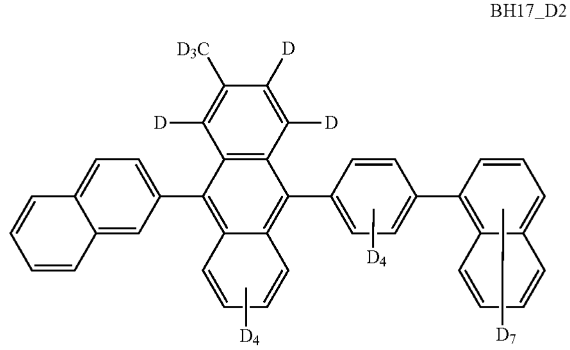

-continued
BH17_D3
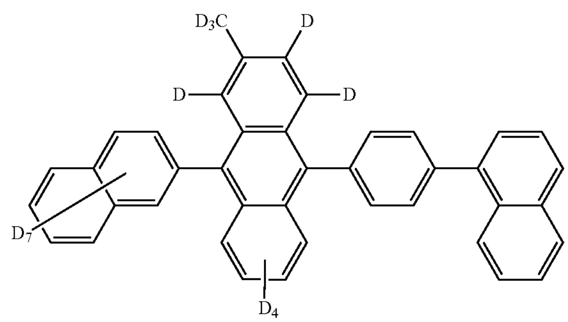
BH17_D4
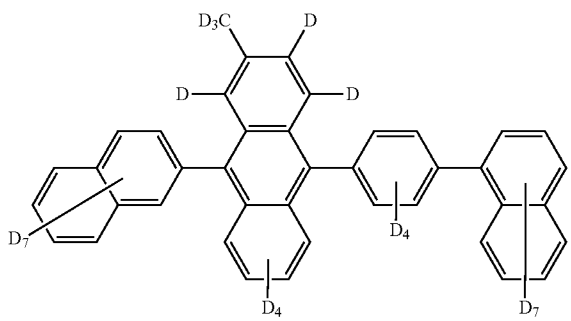
BH18_D1
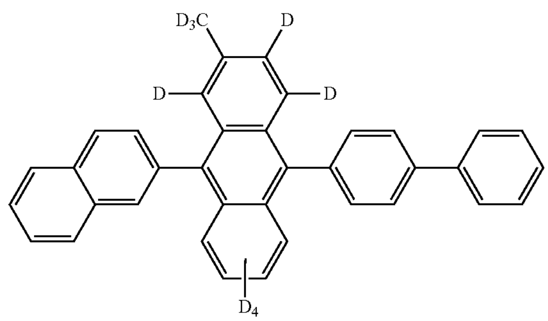
BH18_D2
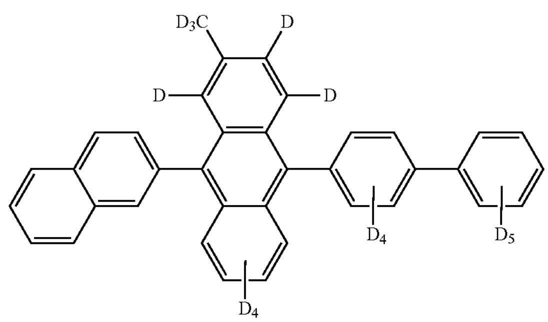
-continued
BH18_D3
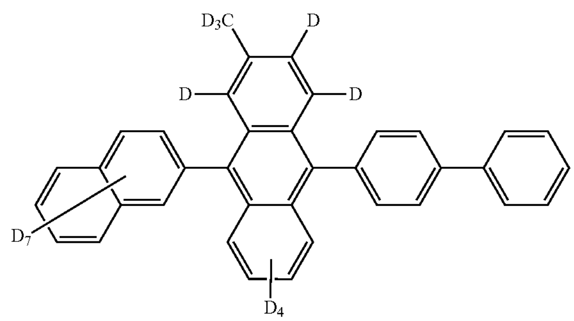
BH18_D4
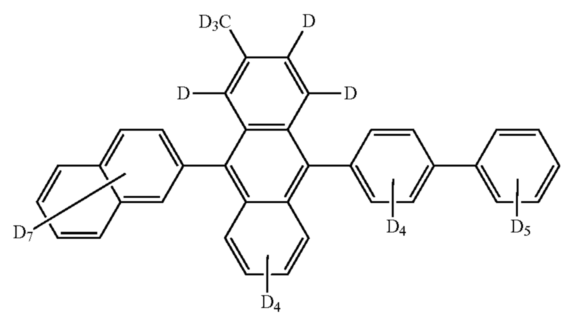
In an embodiment, the second host includes at least one of second host compounds in Formula 6:
[Formula 6]
BH1
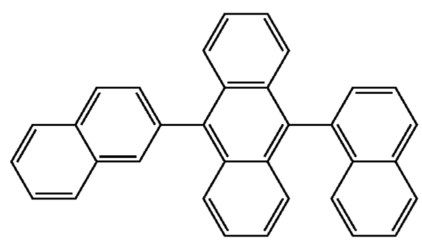
BH1_D1
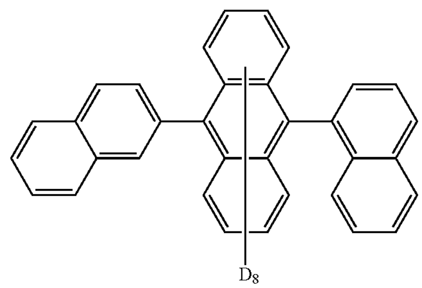

-continued
BH1_D2
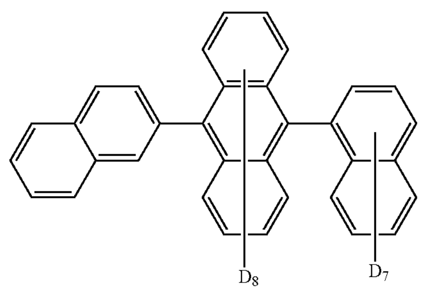
BH1_D3
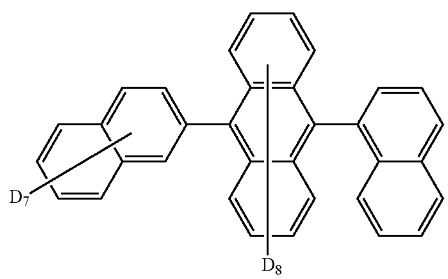
BH1_D4
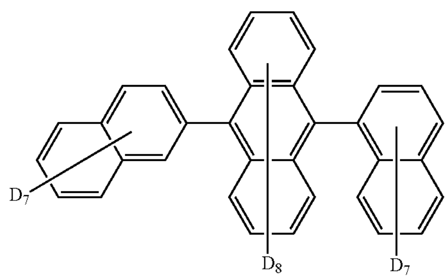
BH2
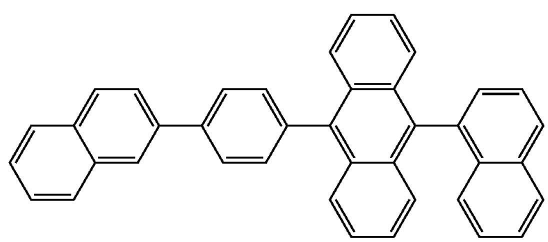
BH2_D1
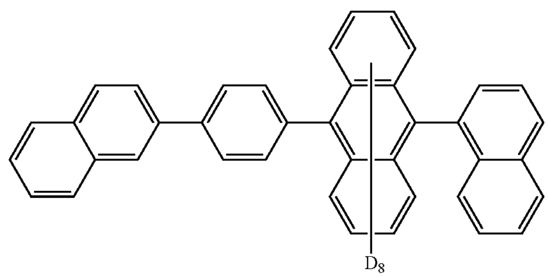
-continued
BH2_D2
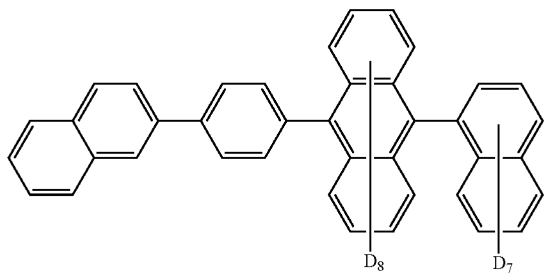
BH2_D3
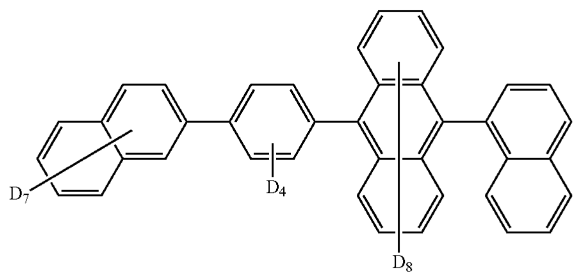
BH2_D4
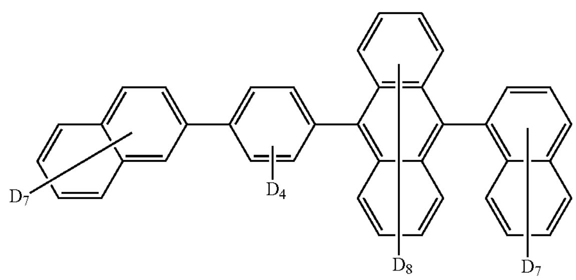
BH3
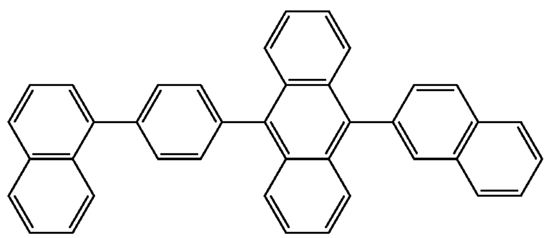
BH3_D1
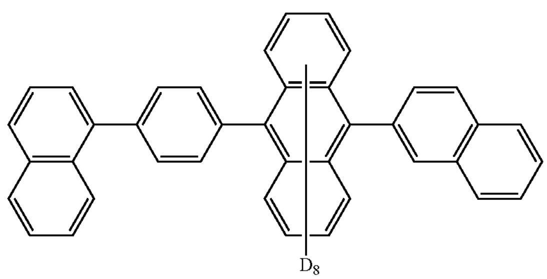

-continued
BH3_D2
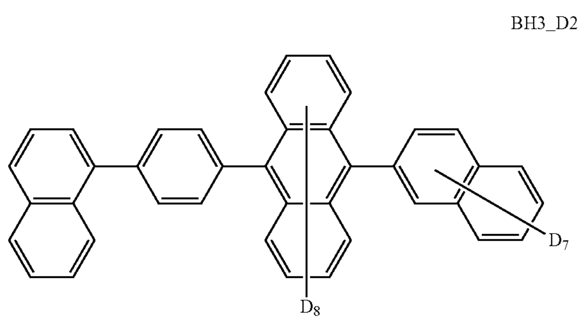
BH3_D3
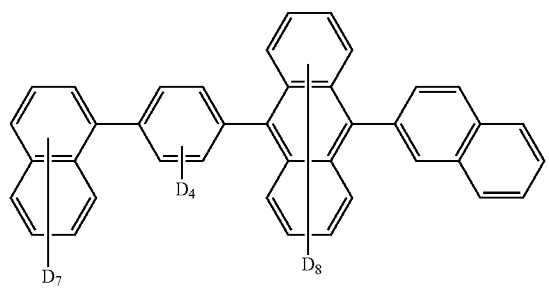
BH3_D4
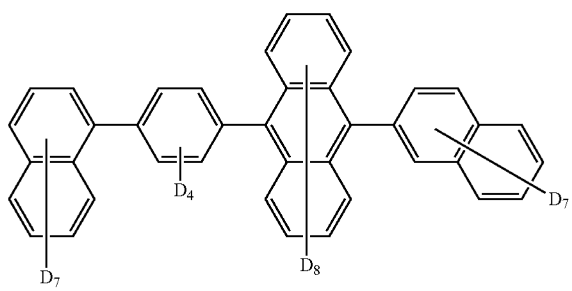
BH4
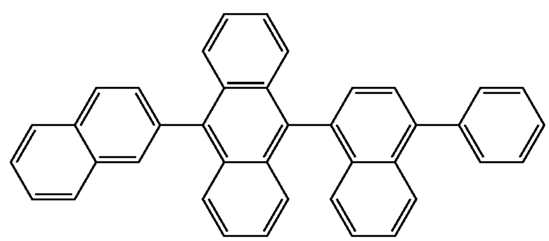
BH4_D1
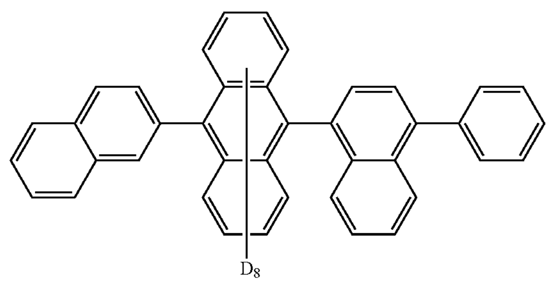
-continued
BH4_D2
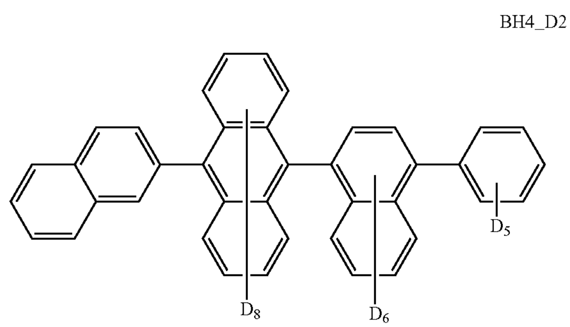
BH4_D3
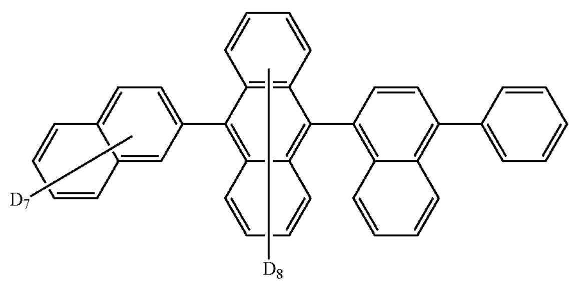
BH4_D4
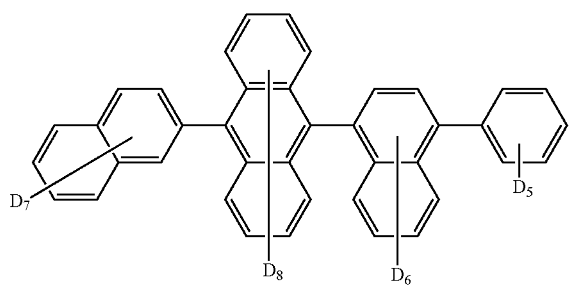
BH5
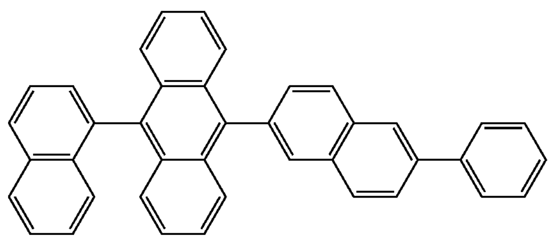
BH5_D1
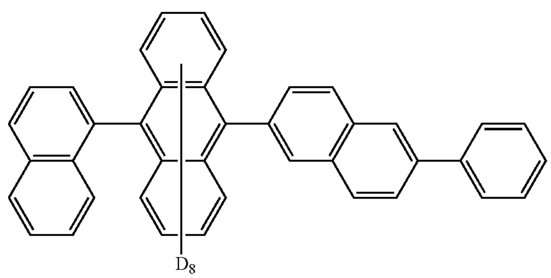

-continued
BH5_D2
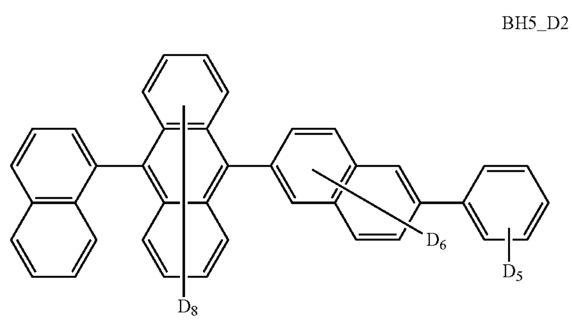
BH5_D3
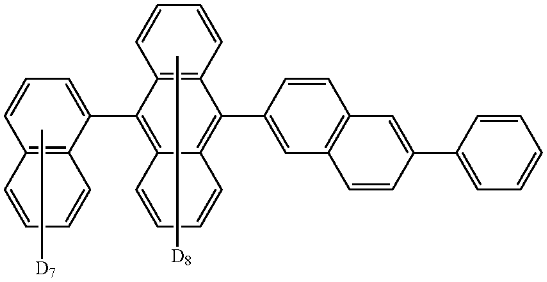
BH5_D4
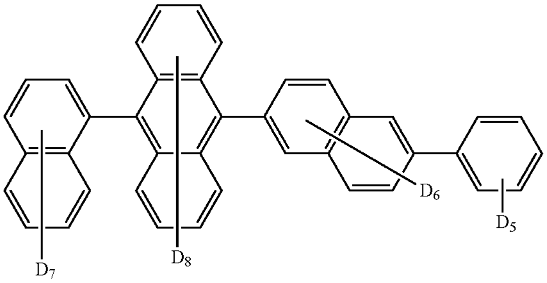
BH6
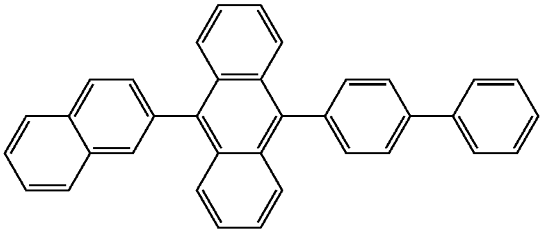
BH6_D1
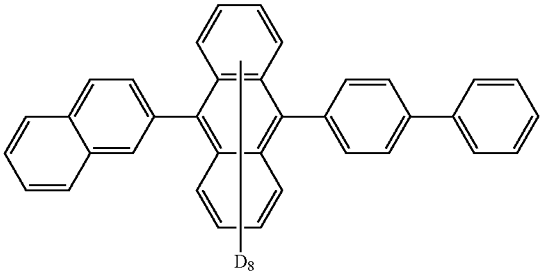
-continued
BH6_D2
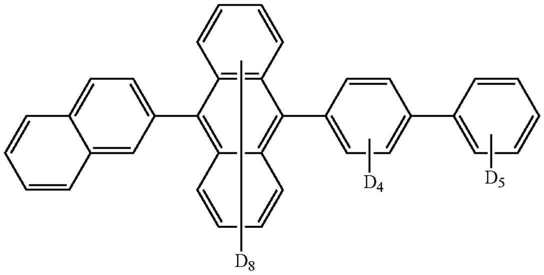
BH6_D3
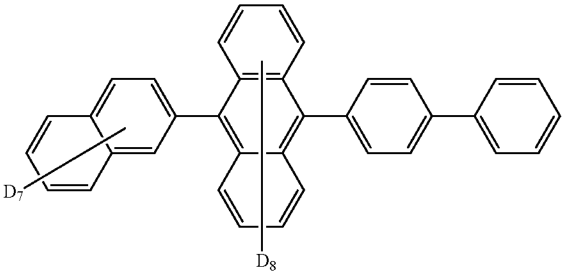
BH6_D4
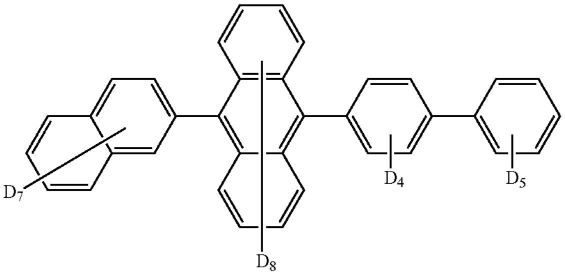
BH7
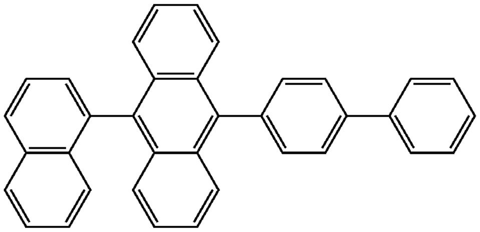
BH7_D1
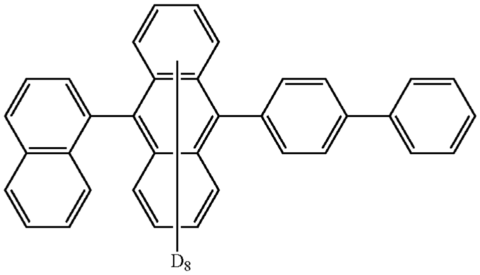

-continued
BH7_D2
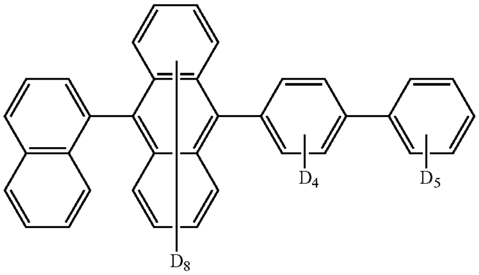
BH7_D3
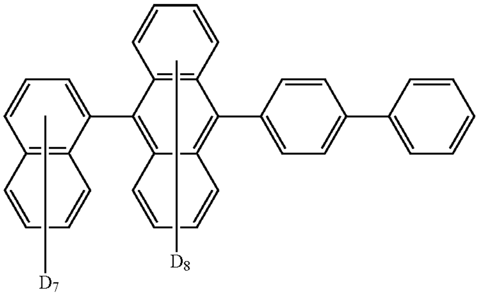
BH7_D4
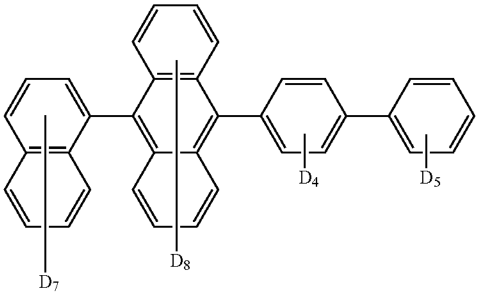
BH8
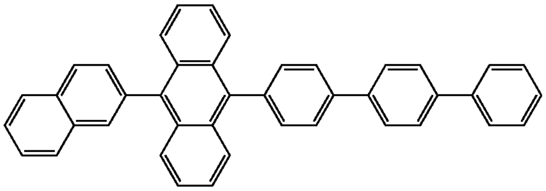
BH8_D1
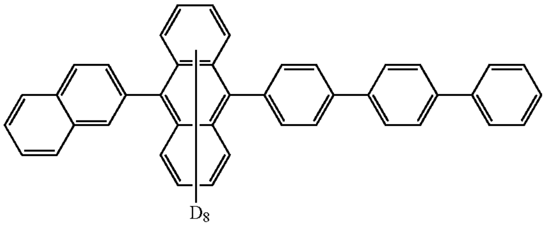
-continued
BH8_D2
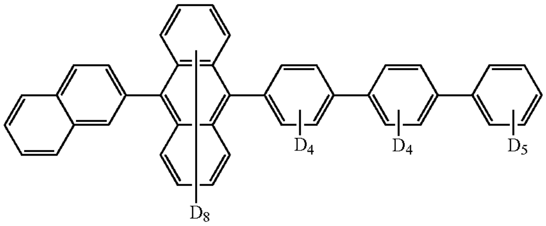
BH8_D3
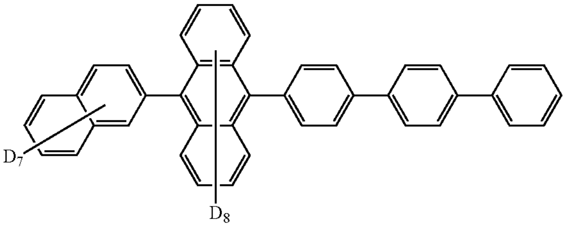
BH8_D4
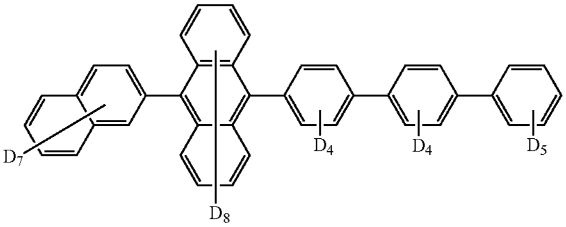
BH9
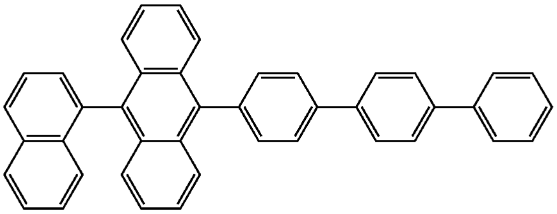
BH9_D1
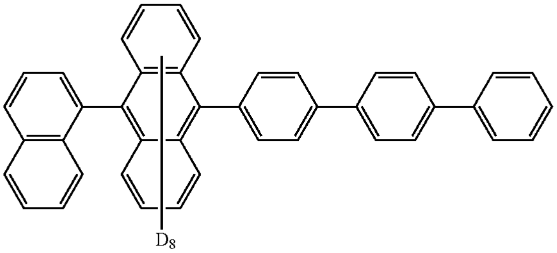
BH9_D2
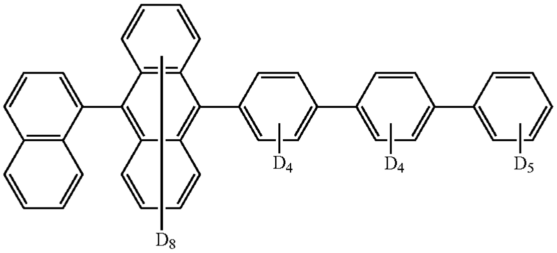

-continued
BH9_D3
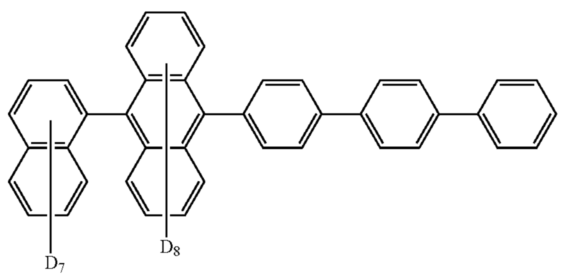
BH9_D4
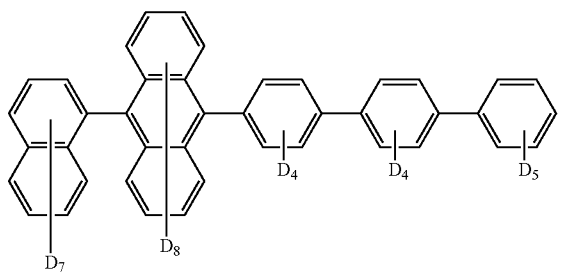
BH10
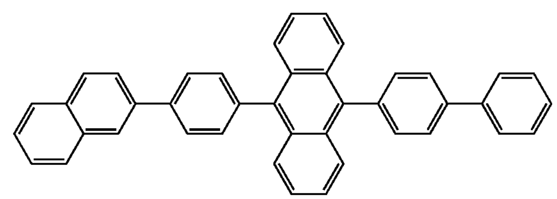
BH10_D1
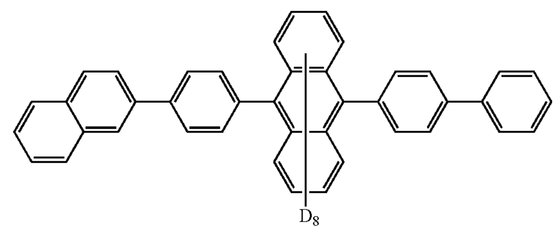
BH10_D42
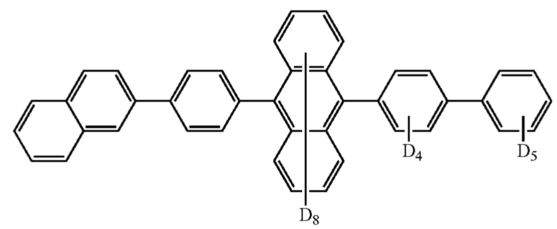
BH10_D3
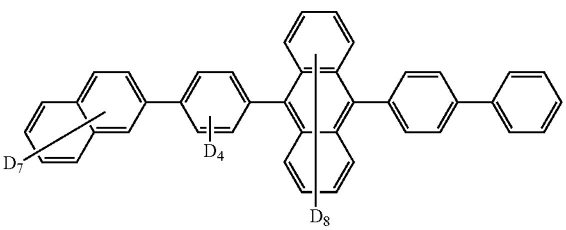
-continued
BH10_D4
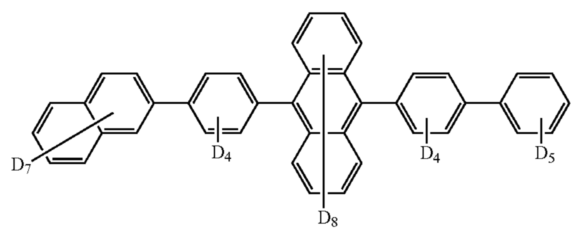
BH11
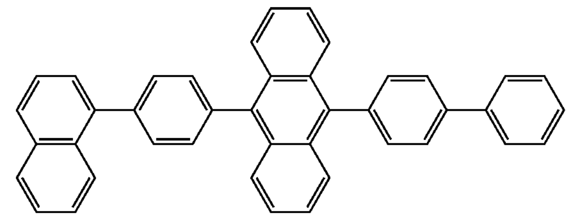
BH11_D1
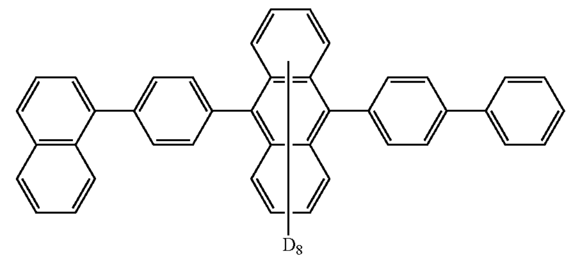
BH11_D2
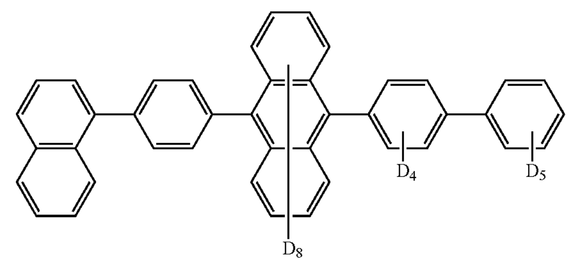
BH11_D3
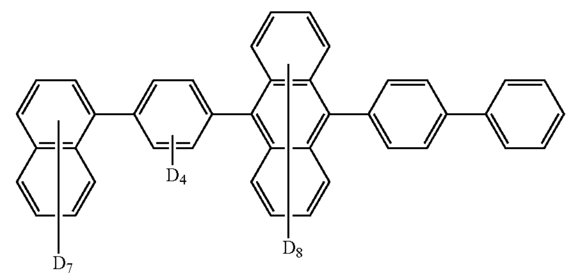

-continued
BH11_D4
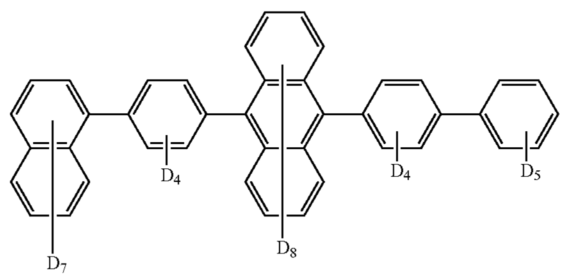
BH12
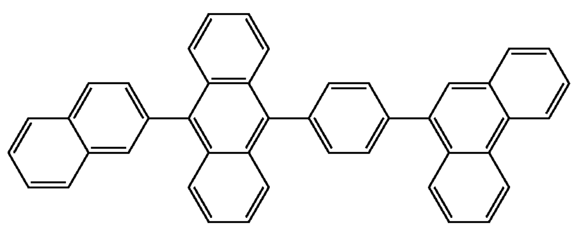
BH12_D1
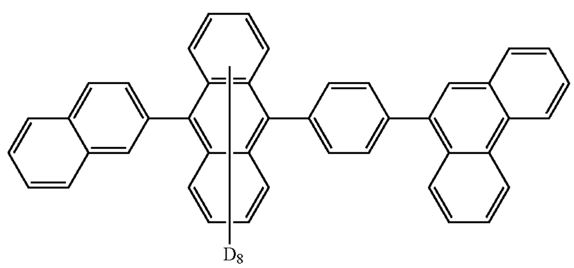
BH12_D2
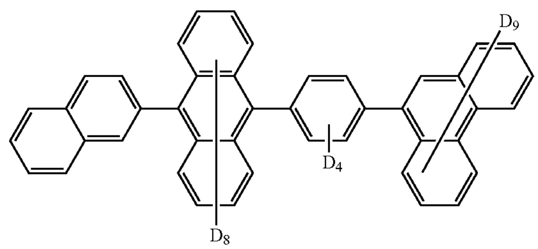
BH12_D3
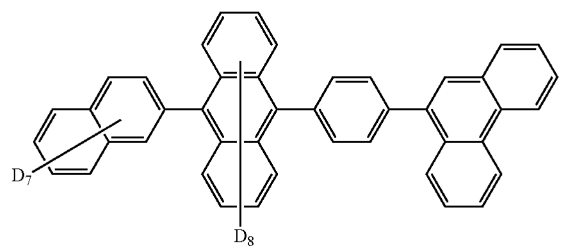
BH12_D4
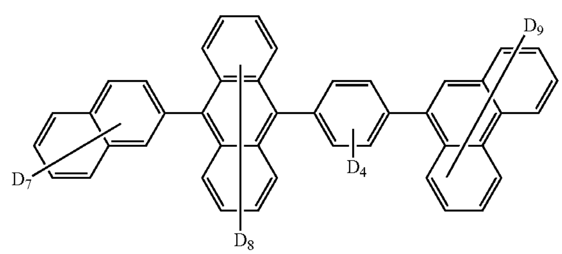
-continued
BH13
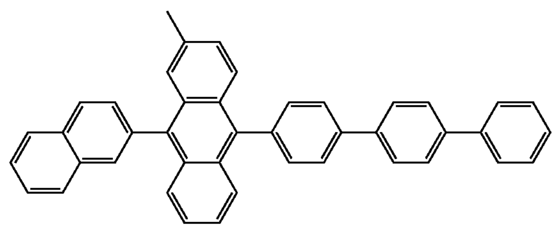
BH13_D1
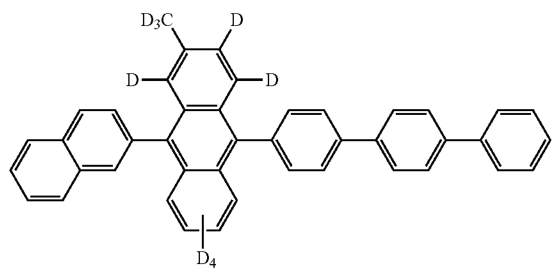
BH13_D2
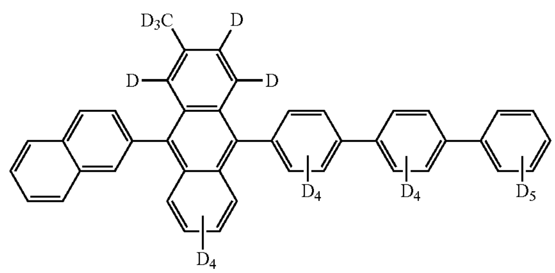
BH13_D3
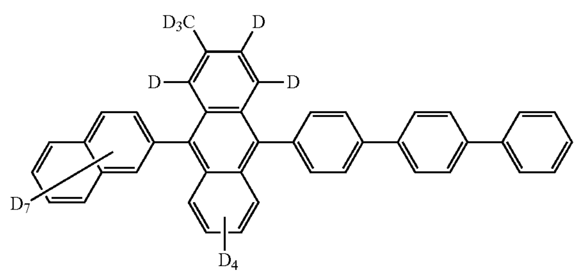
BH13_D4
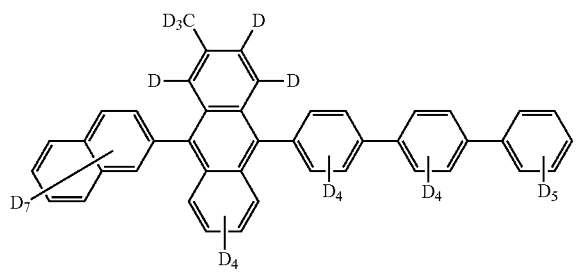

BH14
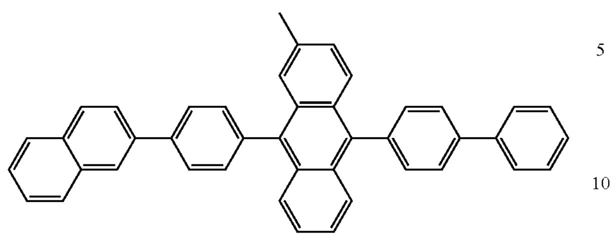
BH14_D1
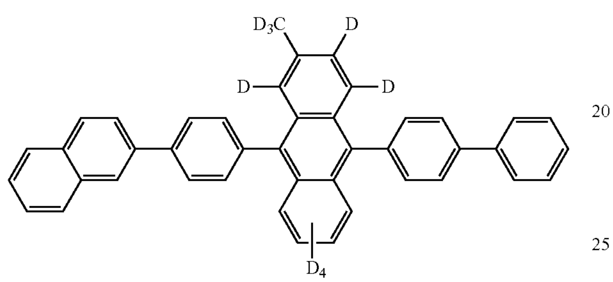
BH14_D2
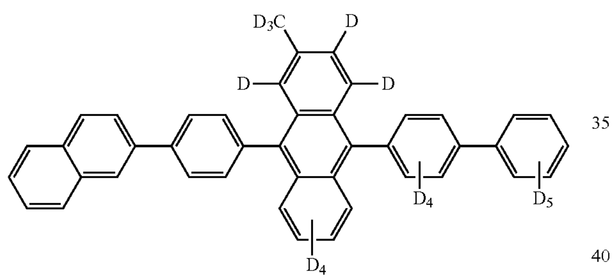
BH14_D3
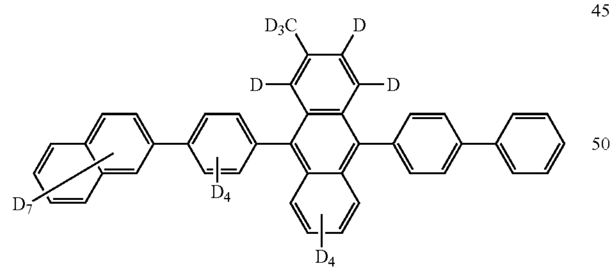
BH14_D4
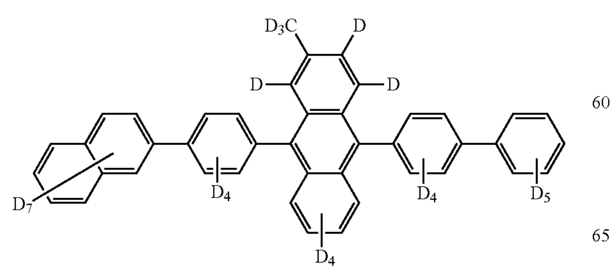
BH15
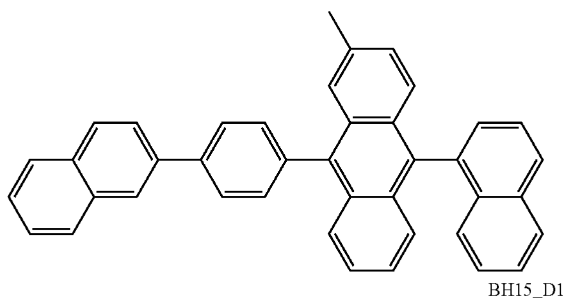
BH15_D1
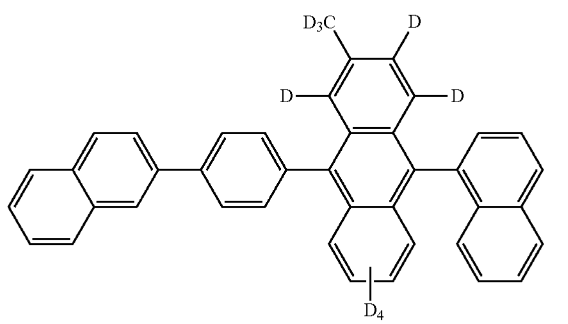
BH15_D2
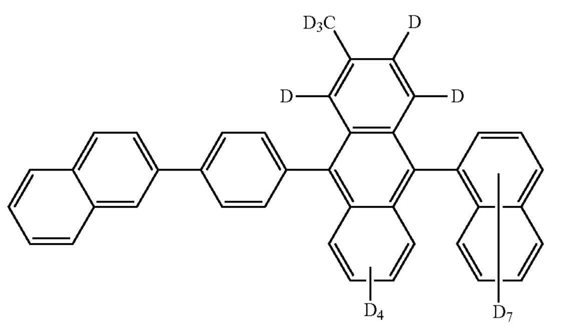
BH15_D3
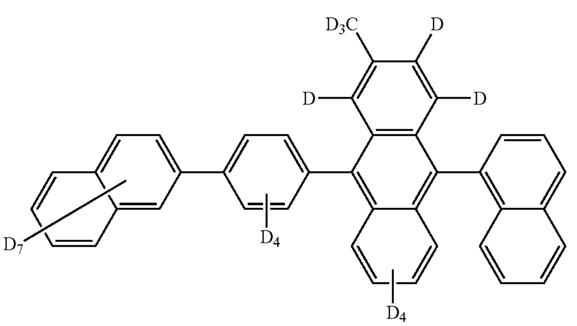
BH15_D4
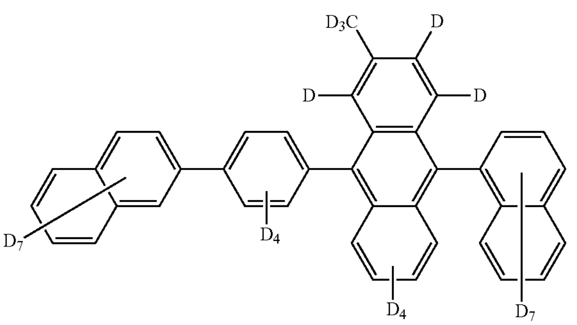

-continued
BH16
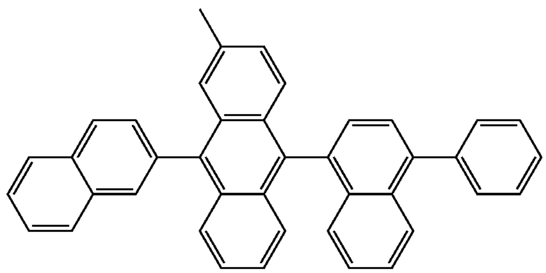
BH16_D1
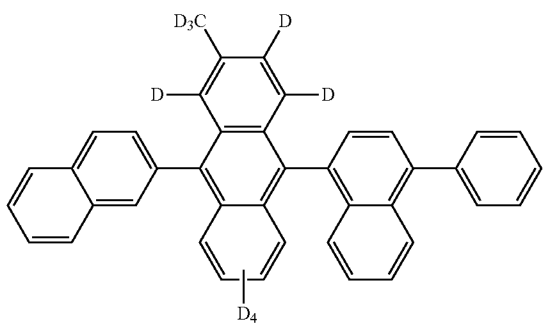
BH16_D2
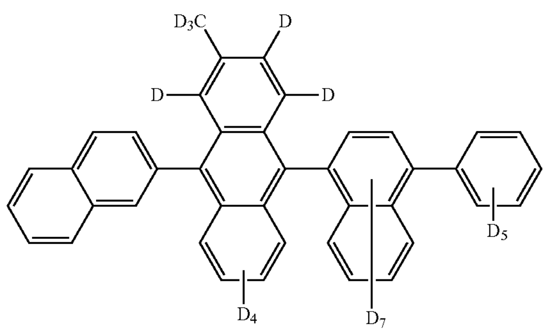
BH16_D3
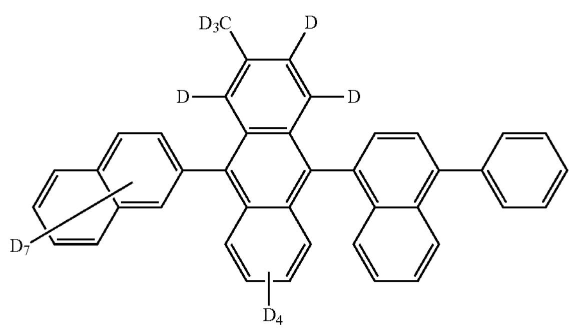
-continued
BH16_D4
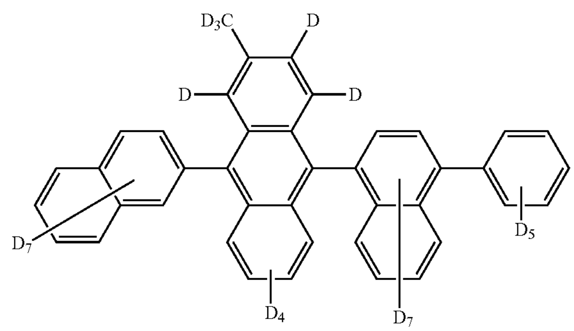
BH17
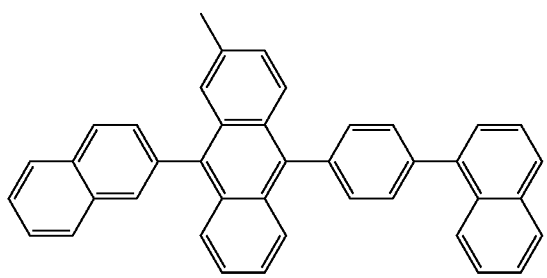
BH17_D1
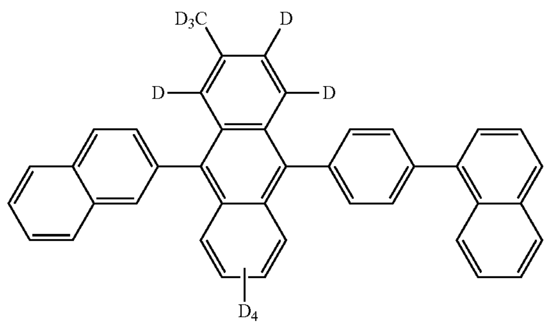
BH17_D2
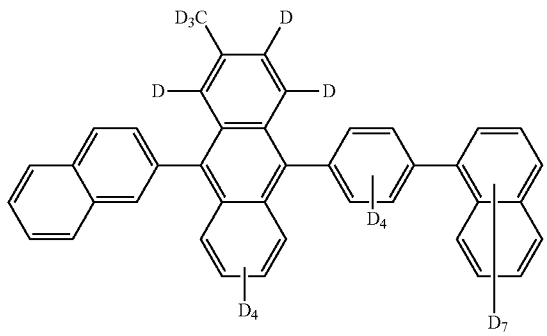

-continued
BH17_D3
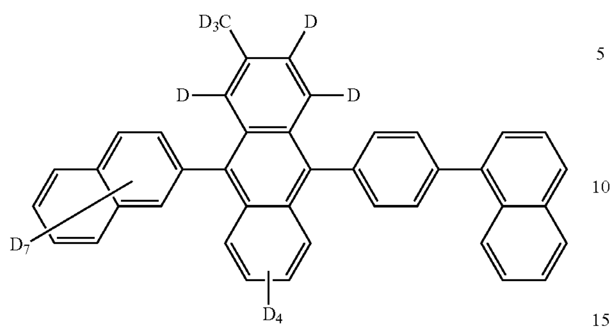
BH17_D4
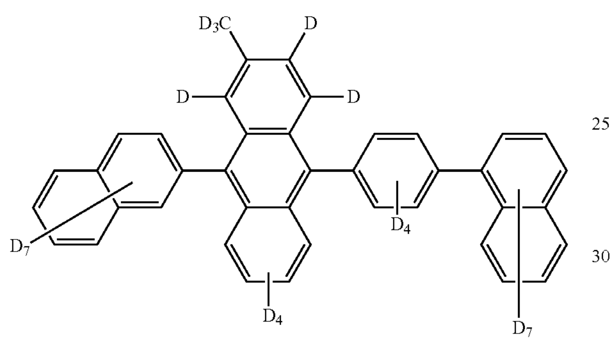
BH18
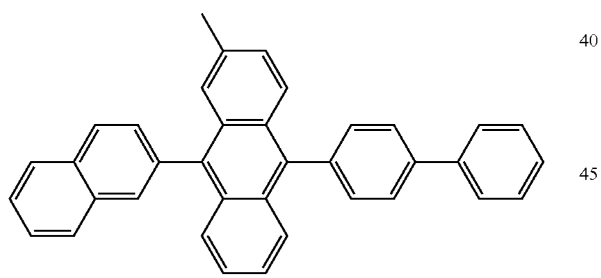
BH18_D1
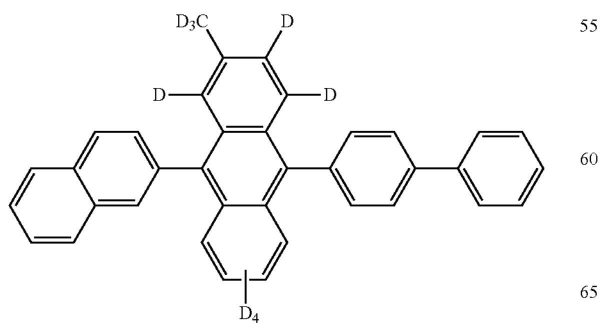
-continued
BH18_D2
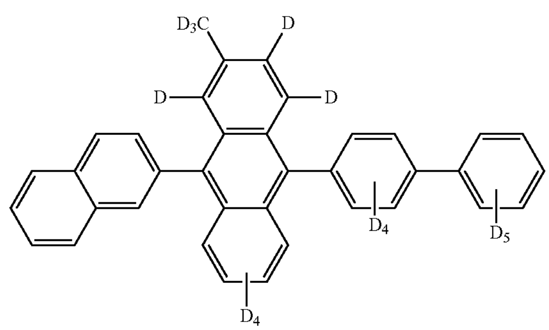
BH18_D3
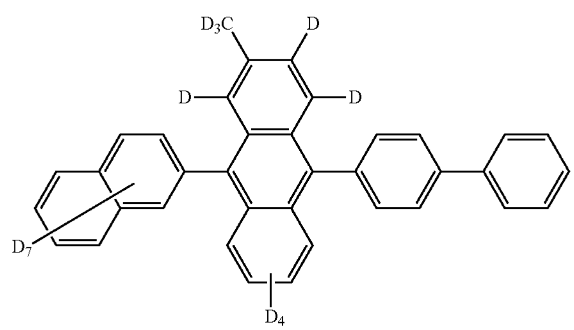
BH18_D4
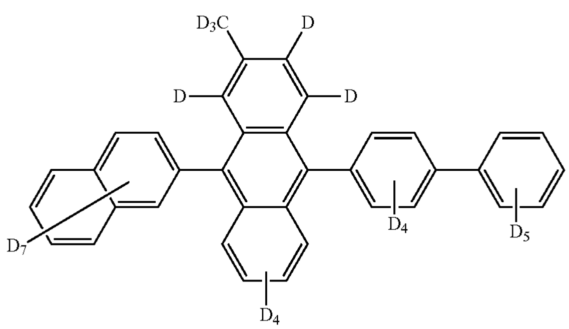
In an embodiment, a weight % ratio of the first electron transporting material to the second electron transporting material is in a range of 3:7 to 7:3.
In an embodiment, the first electron transporting material is one of compounds in Formula 11:
[Formula 11]
ETL1-1
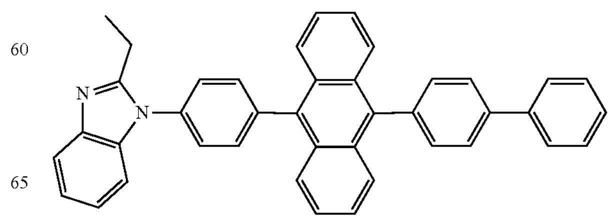

-continued
ETL1-2
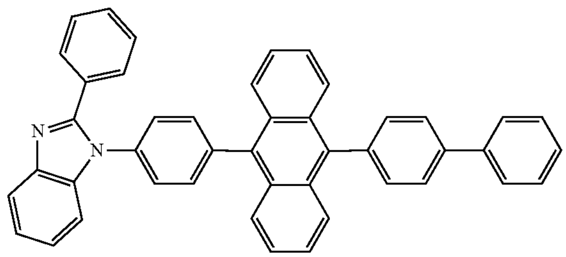
ETL1-3
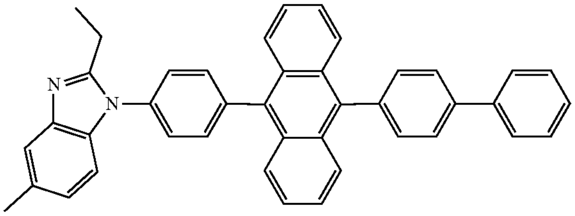
ETL1-4
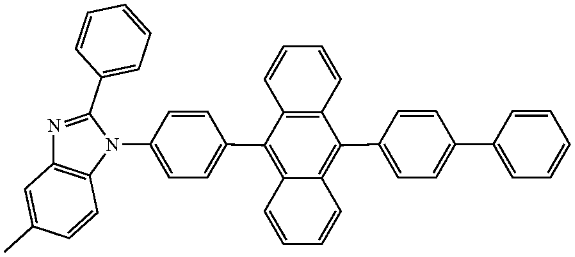
ETL1-5
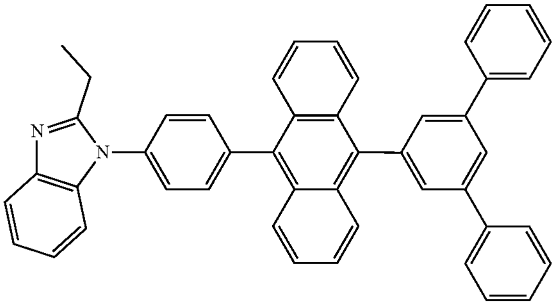
ETL1-6
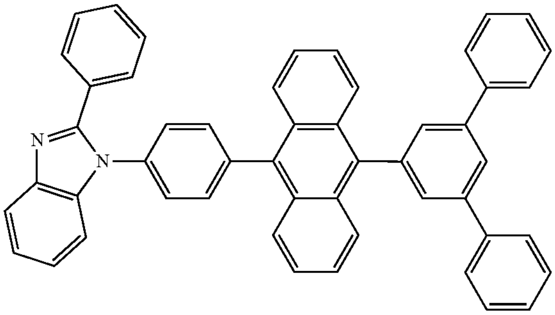
-continued
ETL1-7
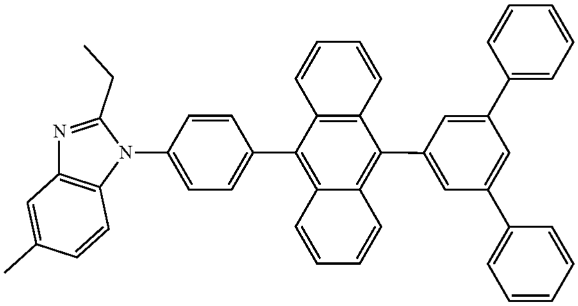
ETL1-8
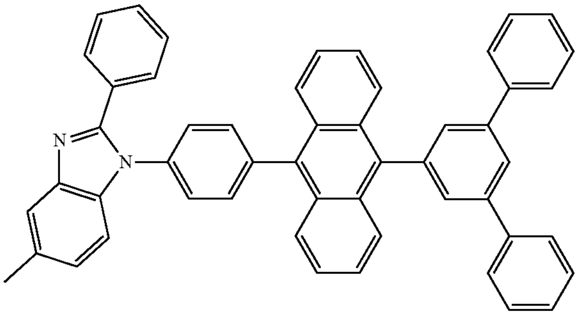
ETL1-9
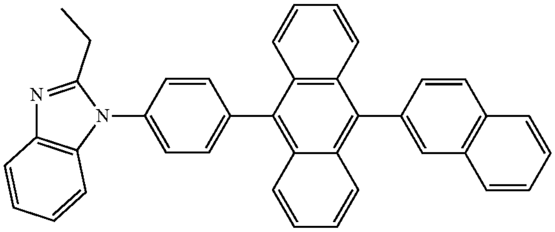
ETL1-10
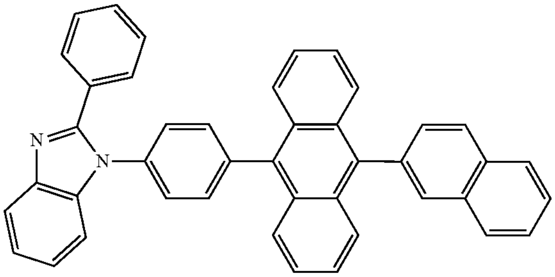
ETL1-11
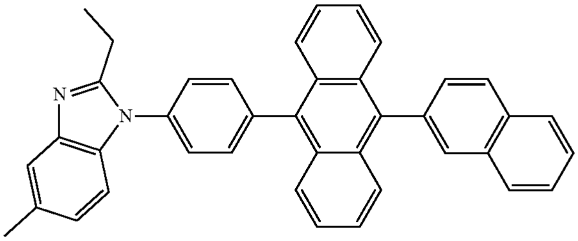

-continued
ETL1-12
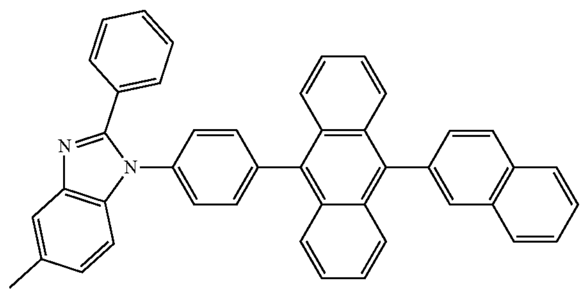
ETL1-13
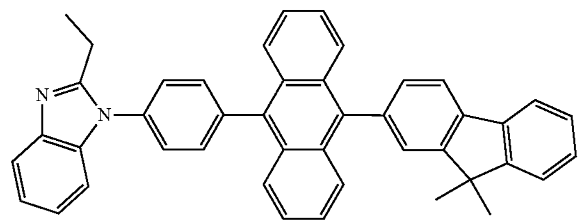
ETL1-14
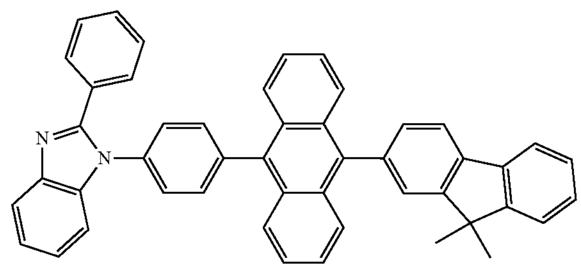
ETL1-15
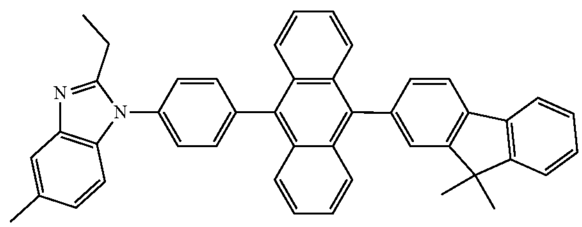
ETL1-16
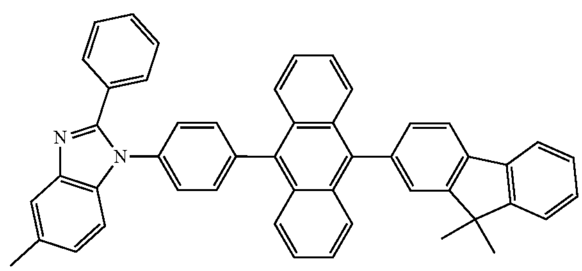
ETL1-17
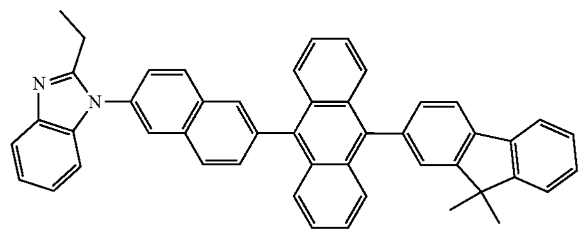
-continued
ETL1-18
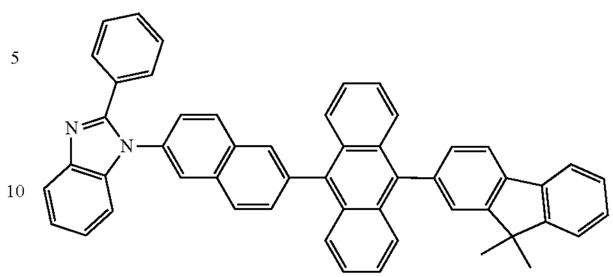
ETL1-19
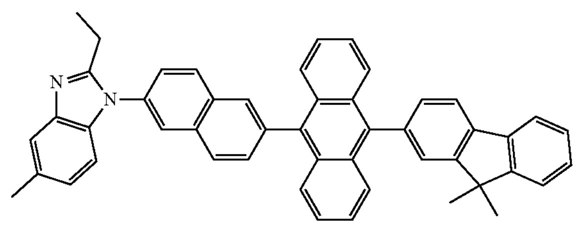
ETL1-20
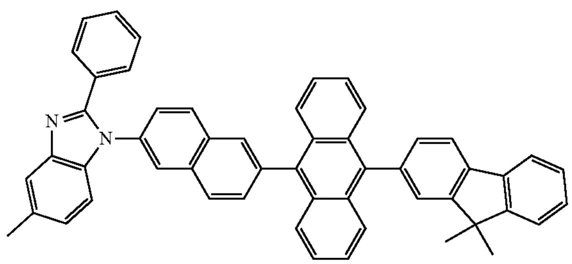
In an embodiment, the second electron transporting material is one of compounds in Formula 12:
[Formula 12]
ETL2-1
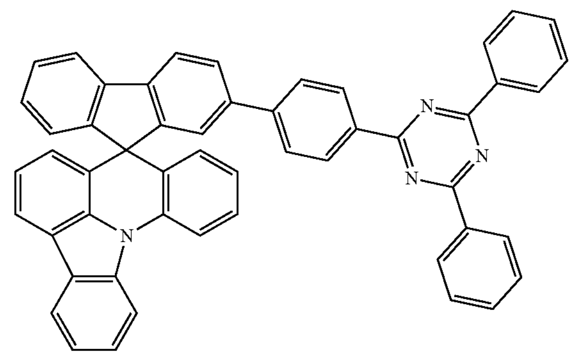

-continued
ETL2-2
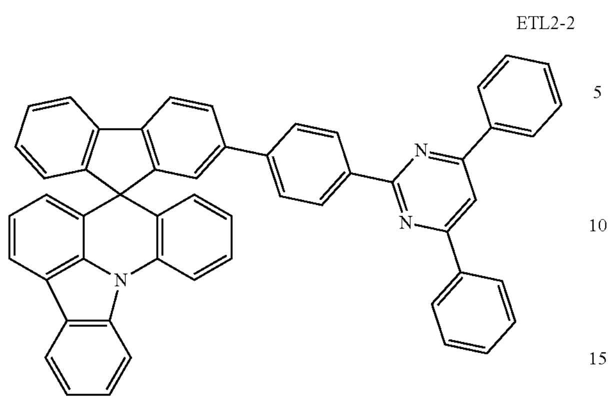
ETL2-3
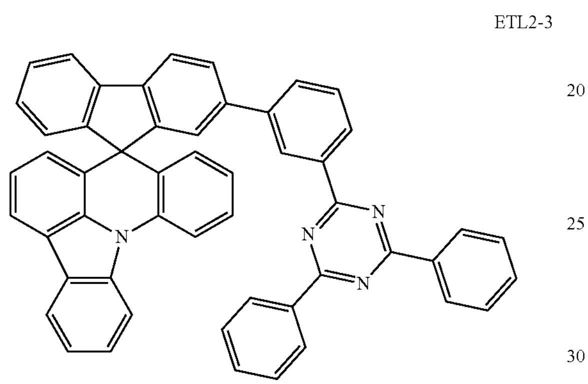
ETL2-4
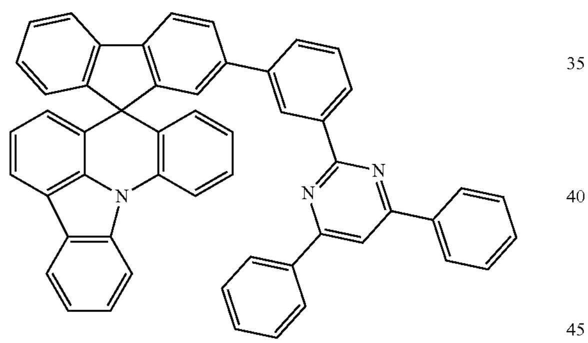
ETL2-5
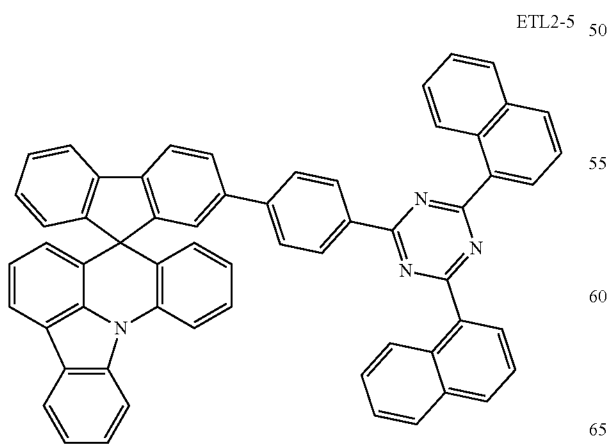
-continued
ETL2-6
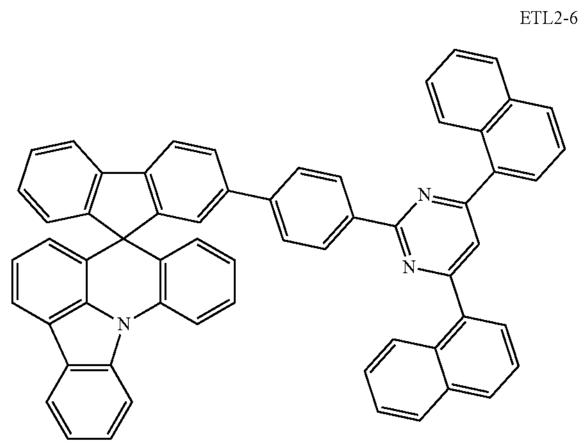
ETL2-7
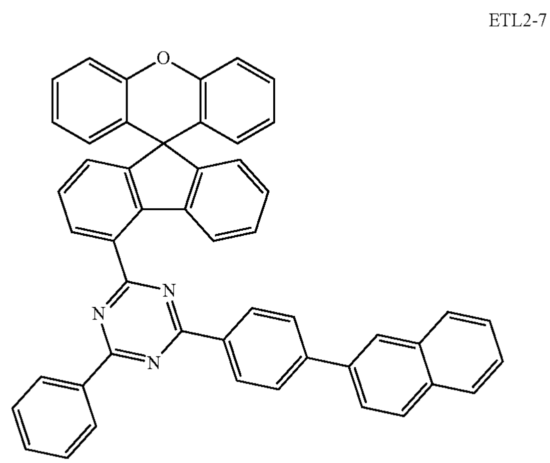
ETL2-8
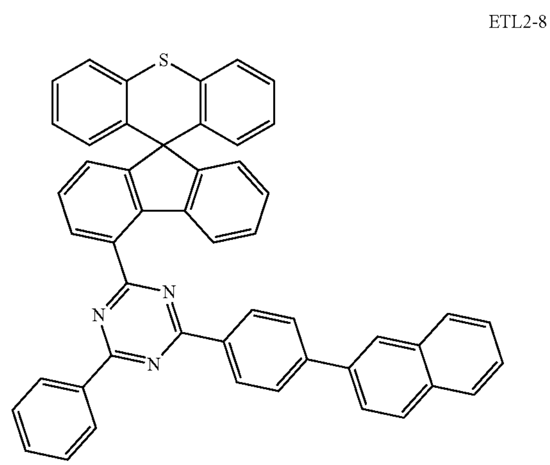

-continued
ETL2-9
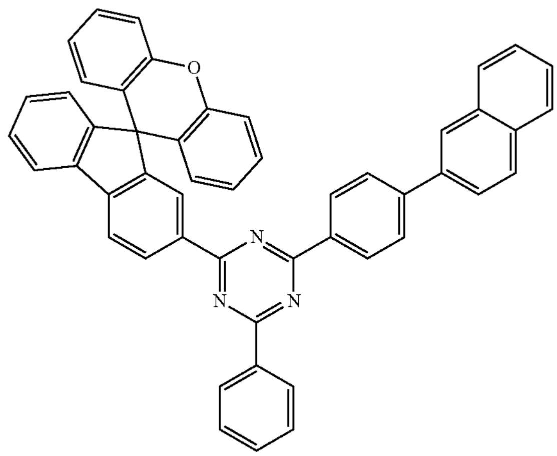
ETL2-10
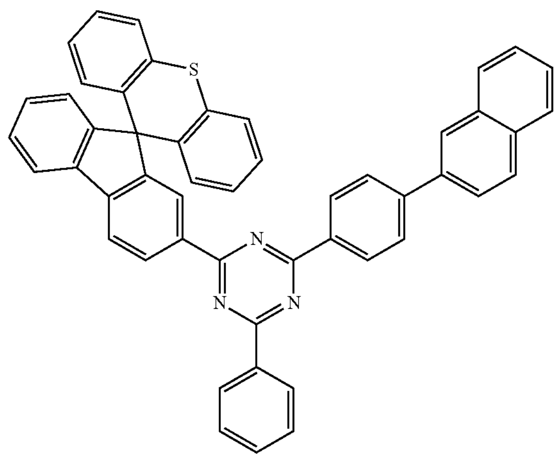
ETL2-11
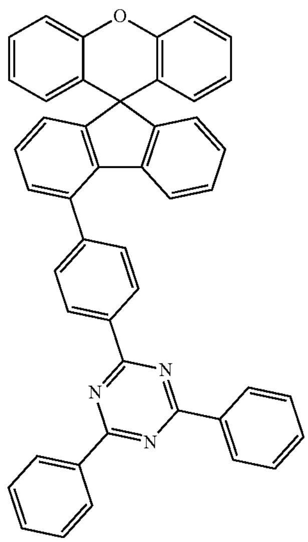
-continued
ETL2-12
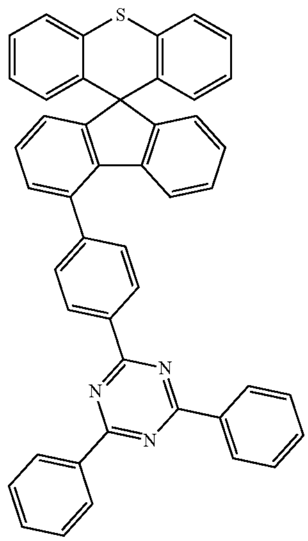
ETL2-13
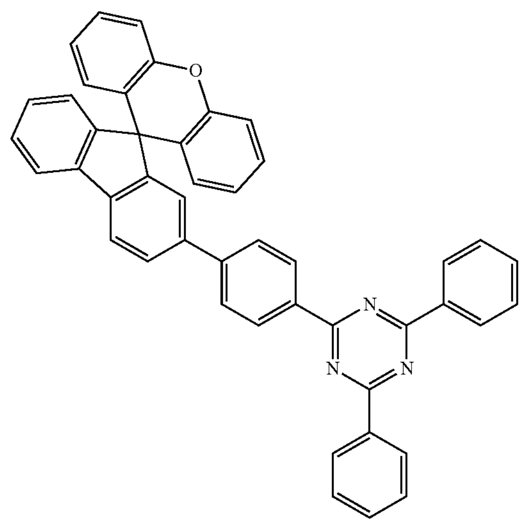
ETL2-14
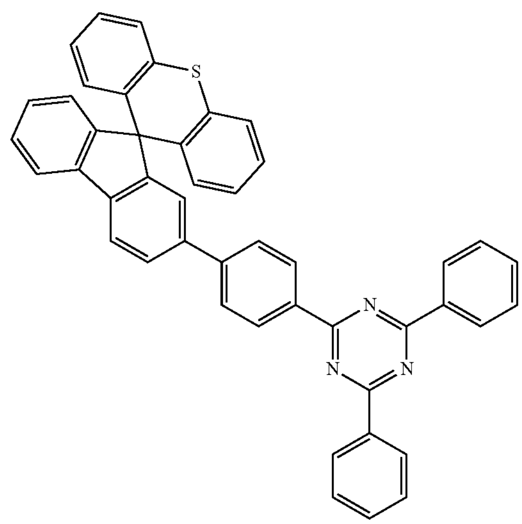

-continued

ETL2-15

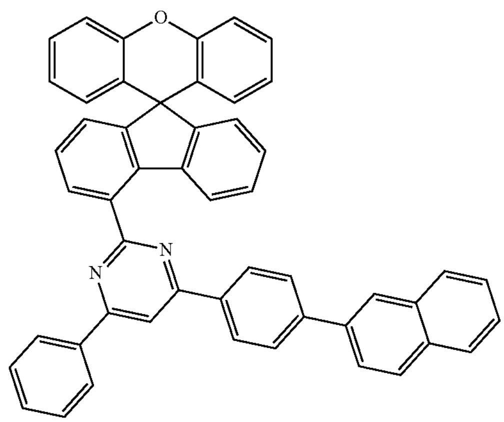

ETL2-16

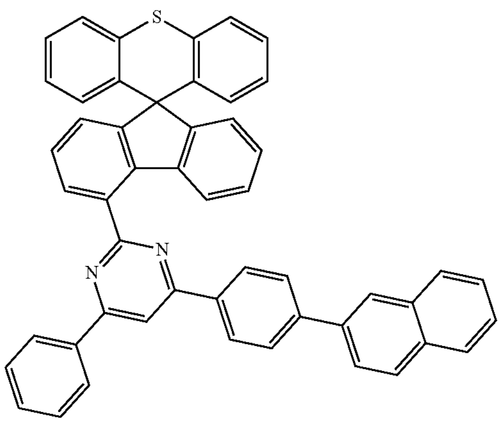

In an embodiment, the organic light emitting diode further comprises.

a second emitting part including a third blue emitting layer, a fourth blue emitting layer and a second electron transporting layer and positioned between the first emitting part and the second electrode, the fourth blue emitting layer positioned between the third blue emitting layer and the second electrode and contacting the third blue emitting layer, and the second electron transporting layer positioned between the fourth blue emitting layer and the second electrode, wherein the third blue emitting layer includes a third host and a third dopant, and the fourth blue emitting layer includes a fourth host and a fourth dopant, wherein the third host is an anthracene derivative having a third deuteration ratio, and the fourth host is an anthracene derivative having a fourth deuteration ratio smaller than the third deuteration ratio, wherein the third dopant is a third compound represented by the Formula 3, and the fourth dopant is a fourth compound represented by the Formula 7, and wherein the first electron transporting layer includes at least one of the first electron transporting material and the second electron transporting material. In an embodiment, the third host is represented by Formula 1:

[Formula 1]

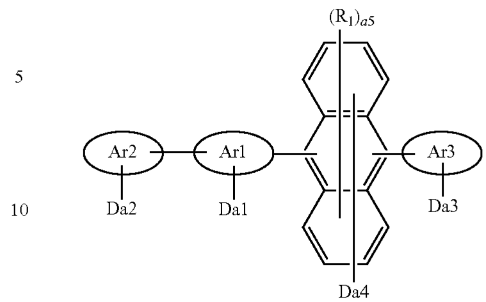

wherein in the Formula 1, each of a1, a2 and a3 is independently an integer of 0 or 30, each of a4 and a5 is independently an integer of 0 to 8, and at least one of a1 to a4 is a positive integer, Ar1 is selected from the group consisting of a single bond (a direct bond), a substituted or unsubstituted C6 to C30 arylene group and a substituted or unsubstituted C3 to C30 heteroarylene group, each of Ar2 and Ar3 is selected from the group consisting of a substituted or unsubstituted C6 to C30 aryl group and a substituted or unsubstituted C3 to C30 heteroaryl group, and $R_1$ is selected from the group consisting of a C1 to C30 alkyl group unsubstituted or substituted with deuterium and a C3 to C30 cycloalkyl group unsubstituted or substituted with deuterium, wherein the fourth host is represented by Formula 5:

[Formula 5]

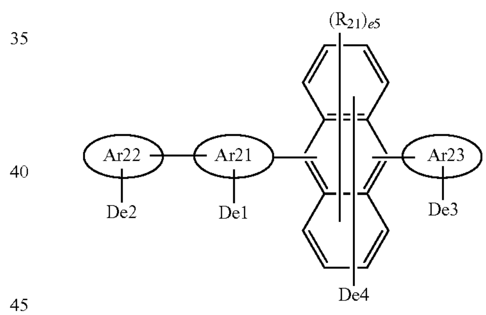

wherein in the Formula 5, each of e1, e2 and e3 is independently an integer of 0 or 30, each of e4 and e5 is independently an integer of 0 to 8, and a summation of e1 to e4 is smaller than a summation of a1 to a4 in Formula 1, Ar21 is selected from the group consisting of a single bond (a direct bond), a substituted or unsubstituted C6 to C30 arylene group and a substituted or unsubstituted C3 to C30 heteroarylene group, each of Ar22 and Ar23 is selected from the group consisting of a substituted or unsubstituted C6 to C30 aryl group and a substituted or unsubstituted C3 to C30 heteroaryl group, and $R_{21}$ is selected from the group consisting of a C1 to C30 alkyl group unsubstituted or substituted with deuterium and a C3 to C30 cycloalkyl group unsubstituted or substituted with deuterium.

In an embodiment, the organic light emitting diode further comprises:

a third emitting part including a red emitting layer and a green emitting layer and positioned between the first and second emitting parts.

In an embodiment, the organic light emitting diode further comprises a second emitting part including a yellow-green emitting layer and positioned between the first emitting part and the second electrode.

In an embodiment, the first dopant is a boron derivative having a first HOMO energy level and a first triplet energy, and the second dopant is a boron derivative having a second HOMO energy level lower than the first HOMO energy level and a second triplet energy greater than the first triplet energy, and wherein the first electron transporting material has a third HOMO energy level lower than the second HOMO energy level and a third triplet energy greater than the first triplet energy. In an embodiment, the second electron transporting material has a fourth HOMO energy level lower than the second HOMO energy level and a fourth triplet energy smaller than the second triplet energy.

In an embodiment of the organic light emitting diode, the first electron transporting material has a third HOMO energy level lower than the second HOMO energy level and a third triplet energy greater than the first triplet energy, and the second electron transporting material has a fourth HOMO energy level lower than the second HOMO energy level and a fourth triplet energy smaller than the second triplet energy.

In another aspect of the present invention, an organic light emitting device comprises a substrate; the organic light emitting diode of the invention over the substrate; and an encapsulation layer covering the organic light emitting diode.

It is to be understood that both the foregoing general description and the following detailed description are merely by way of example and are intended to further explain the present invention as claimed.

BRIEF DESCRIPTION OF THE DRAWINGS

The accompanying drawings, which are included to provide a further understanding of the present invention and are incorporated in and constitute a part of this specification, illustrate embodiments of the present invention and together with the description serve to explain the principles of the present invention.

DETAILED DESCRIPTION

Figure 1:
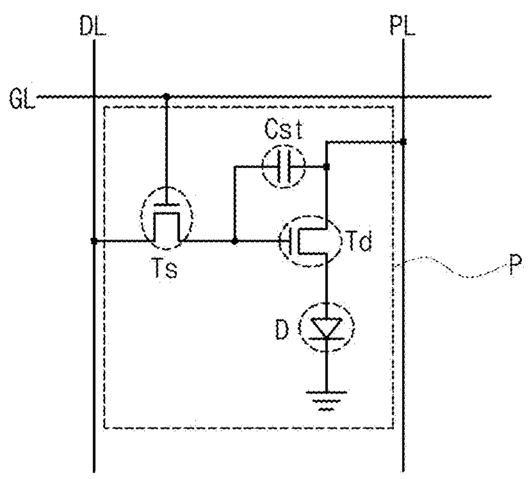
FIG. 1 is a schematic circuit diagram illustrating an organic light emitting display device of the present invention.

Reference will now be made in detail to aspects of the present invention, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present invention and methods of achieving them will be apparent with reference to the aspects described below in detail with the accompanying drawings. However, the present invention is not limited to the aspects disclosed below, but can be realized in a variety of different forms, and only these aspects allow the disclosure of the present invention to be complete. The present disclosure is provided to fully inform the scope of the invention to the skilled in the art.

The shapes, sizes, proportions, angles, numbers, and the like disclosed in the drawings for explaining the aspects of the present invention are illustrative, and the present invention is not limited to the illustrated matters. The same reference numerals refer to the same elements throughout the specification. In addition, in describing the present invention, if it is determined that a detailed description of the related known technology unnecessarily obscure the subject matter of the present invention, the detailed description thereof can be omitted. When 'including', 'having', 'consisting', and the like are used in this specification, other parts may be added unless 'only' is used. When a component is expressed in the singular, cases including the plural are included unless specific statement is described.

In construing an element, the element is construed as including an error or tolerance range although there is no explicit description of such an error or tolerance range.

In describing a position relationship, for example, when a position relation between two parts is described as, for example, "on," "over," "under," and "next," one or more other parts may be disposed between the two parts unless a more limiting term, such as "just" or "direct(ly)" is used.

In describing a time relationship, for example, when the temporal order is described as, for example, "after," "subsequent," "next," and "before," a case that is not continuous may be included unless a more limiting term, such as "just," "immediate(ly)," or "direct(ly)" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various aspects of the present invention may be partially or overall coupled to or combined with each other, and may be variously inter-operated with each other and driven technically as those skilled in the art can sufficiently understand. The aspects of the present invention may be carried out independently from each other, or may be carried out together in co-dependent relationship.

Reference will now be made in detail to some of the examples and preferred embodiments, which are illustrated in the accompanying drawings.

In the present invention, an organic light emitting device including the OLED may be an organic light emitting display device or an organic lightening device. As an example, an organic light emitting display device, which is a display device including the OLED of the present invention, will be mainly described.

FIG. 1 is a schematic circuit diagram illustrating an organic light emitting display device of the present invention.

As illustrated in FIG. 1, a gate line GL and a data line DL, which cross each other to define a pixel region P, and a power line PL are formed in an organic light display device. A switching thin film transistor (TFT) Ts, a driving thin film transistor (TFT) Td, a storage capacitor Cst and an OLED D are formed in the pixel region P. The pixel region P may include a red pixel region, a green pixel region and a blue pixel region.

The switching thin film transistor Ts is connected to the gate line GL and the data line DL, and the driving thin film transistor Td and the storage capacitor Cst are connected between the switching thin film transistor Ts and the power line PL. The OLED D is connected to the driving thin film transistor Td.

When the switching thin film transistor Ts is turned on by the gate signal applied through the gate line GL, the data signal applied through the data line DL is applied to a gate electrode of the driving thin film transistor Td and one electrode of the storage capacitor Cst through the switching thin film transistor Ts.

The driving thin film transistor Td is turned on by the data signal applied into the gate electrode so that a current proportional to the data signal is supplied from the power line PL to the OLED D through the driving thin film transistor Td. The OLED D emits light having a luminance proportional to the current flowing through the driving thin film transistor Td.

In this case, the storage capacitor Cst is charged with a voltage proportional to the data signal so that the voltage of the gate electrode in the driving thin film transistor Td is kept constant during one frame.

Therefore, the organic light emitting display device can display a desired image.

Figure 2:
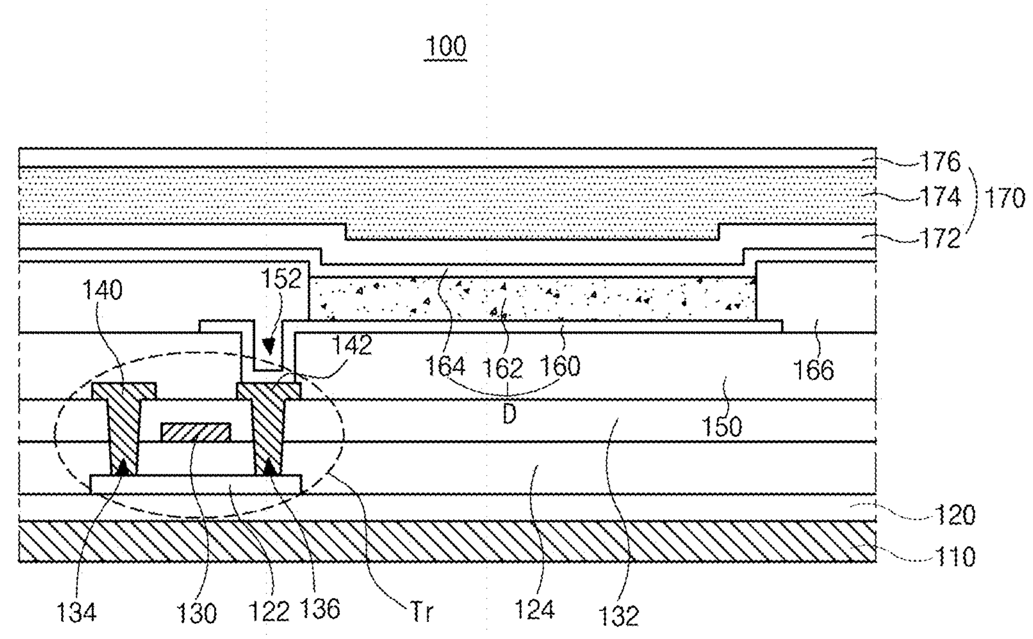
FIG. 2 is a schematic cross-sectional view illustrating an organic light emitting display device according to a first embodiment of the present invention.

FIG. 2 is a schematic cross-sectional view illustrating an organic light emitting display device according to a first embodiment of the present invention.

As illustrated in FIG. 2, the organic light emitting display device 100 includes a substrate 110, a TFT Tr and an OLED D disposed on a planarization layer and connected to the TFT Tr.

The substrate 110 may be a glass substrate or a flexible substrate. For example, the flexible substrate may be a polyimide (PI) substrate, a polyethersulfone (PES) substrate, a polyethylenenaphthalate (PEN) substrate, a polyethylene terephthalate (PET) substrate or a polycarbonate (PC) substrate.

A buffer layer 120 is formed on the substrate, and the TFT Tr is formed on the buffer layer 120. The buffer layer 120 may be omitted.

A semiconductor layer 122 is formed on the buffer layer 120. The semiconductor layer 122 may include an oxide semiconductor material or polycrystalline silicon. When the semiconductor layer 122 includes the oxide semiconductor material, a light-shielding pattern (not shown) may be formed under the semiconductor layer 122. The light to the semiconductor layer 122 is shielded or blocked by the light-shielding pattern such that thermal degradation of the semiconductor layer 122 can be prevented. On the other hand, when the semiconductor layer 122 includes polycrystalline silicon, impurities may be doped into both sides of the semiconductor layer 122.

A gate insulating layer 124 is formed on the semiconductor layer 122. The gate insulating layer 124 may be formed of an inorganic insulating material such as silicon oxide (SiOx) or silicon nitride (SiNx).

A gate electrode 130, which is formed of a conductive material, e.g., metal, is formed on the gate insulating layer 124 to correspond to a center of the semiconductor layer 122. In FIG. 2, the gate insulating layer 124 is formed on an entire surface of the substrate 110. Alternatively, the gate insulating layer 124 may be patterned to have the same shape as the gate electrode 130.

An interlayer insulating layer 132, which is formed of an insulating material, is formed on the gate electrode 130. The interlayer insulating layer 132 may be formed of an inorganic insulating material, e.g., silicon oxide or silicon nitride, or an organic insulating material, e.g., benzocyclobutene or photo-acryl.

The interlayer insulating layer 132 includes first and second contact holes 134 and 136 exposing both sides of the semiconductor layer 122. The first and second contact holes 134 and 136 are positioned at both sides of the gate electrode 130 to be spaced apart from the gate electrode 130. The first and second contact holes 134 and 136 are formed through the gate insulating layer 124. Alternatively, when the gate insulating layer 124 is patterned to have the same shape as the gate electrode 130, the first and second contact holes 134 and 136 is formed only through the interlayer insulating layer 132.

A source electrode 140 and a drain electrode 142, which are formed of a conductive material, e.g., metal, are formed on the interlayer insulating layer 132. The source electrode 140 and the drain electrode 142 are spaced apart from each other with respect to the gate electrode 130 and respectively contact both sides of the semiconductor layer 122 through the first and second contact holes 134 and 136.

The semiconductor layer 122, the gate electrode 130, the source electrode 140 and the drain electrode 142 constitute the TFT Tr. The TFT Tr serves as a driving element. Namely, the TFT Tr may correspond to the driving TFT Td (of FIG. 1).

In the TFT Tr, the gate electrode 130, the source electrode 140, and the drain electrode 142 are positioned over the semiconductor layer 122. Namely, the TFT Tr has a coplanar structure. Alternatively, in the TFT Tr, the gate electrode may be positioned under the semiconductor layer, and the source and drain electrodes may be positioned over the semiconductor layer such that the TFT Tr may have an inverted staggered structure. In this instance, the semiconductor layer may include amorphous silicon.

Although not shown, the gate line and the data line cross each other to define the pixel region, and the switching TFT is formed to be connected to the gate and data lines. The switching TFT is connected to the TFT Tr as the driving element. In addition, the power line, which may be formed to be parallel to and spaced apart from one of the gate and data lines, and the storage capacitor for maintaining the voltage of the gate electrode of the TFT Tr in one frame may be further formed.

A planarization layer 150 is formed on the source and drain electrodes 140 and 142 and over an entire surface of the substrate 110. The planarization layer 150 has a flat top surface and includes a drain contact hole 152 exposing the drain electrode 142 of the TFT Tr.

The OLED D is disposed on the planarization layer 150 and includes a first electrode 160, which is connected to the drain electrode 142 of the TFT Tr, an organic emitting layer 162 on the first electrode 160 and a second electrode 164 on the organic emitting layer 162. The OLED D is disposed at each of the red, green and blue pixel regions and emits red light, green light and blue light in the red, green and blue pixel regions, respectively.

The first electrode 160 is separately formed in each pixel region. The first electrode 160 may be an anode and may be formed of a conductive material having a relatively high work function. For example, the first electrode 160 may be formed of a conductive material having a relatively high work function, e.g., a transparent conductive oxide (TCO). for example, the first electrode 160 may include at least one of indium-tin-oxide (ITO), indium-zinc-oxide (IZO), indium-tin-zinc oxide (ITZO), tin oxide (SnO), zinc oxide (ZnO), indium-copper-oxide (ICO) and aluminum-zinc-oxide (Al:ZnO, AZO).

When the organic light emitting display device 100 is operated in a bottom-emission type, the first electrode 160 may have a single-layered structure formed of the transparent conductive oxide. Alternatively, when the organic light emitting display device 100 is operated in a top-emission type, the first electrode 160 may further include a reflective layer to have a double-layered structure or a triple-layered structure. For example, the reflective layer may include silver (Ag) or aluminum-palladium-copper alloy (APC). In the top-emission type OLED D, the first electrode 160 may have a double-layered structure of Ag/ITO or APC/ITO or a triple-layered structure of ITO/Ag/ITO or ITO/APC/ITO.

A bank layer 166 is formed on the planarization layer 150 to cover an edge of the first electrode 160. Namely, the bank layer 166 is positioned at a boundary of the pixel region and exposes a center of the first electrode 160 in the pixel region.

An organic emitting layer 162 is formed on the first electrode 160. The organic emitting layer 162 includes an emitting material layer (EML) and an electron transport layer (ETL). The organic emitting layer 162 may further include at least one of a hole injection layer (HIL), a hole transport layer (HTL), an electron blocking layer (EBL), a hole blocking layer (HBL), and an electron injection layer (EIL).

In the blue pixel region, the organic emitting layer 162 of the OLED D includes a blue EML, and the blue EML includes a first blue emitting layer and a second blue emitting layer.

The first blue emitting layer includes a first host having a first deuteration ratio and a first dopant represented by Formula 3, and the second blue emitting layer includes a second host having a second deuteration ratio, which is smaller than the first deuteration ratio, and a second dopant represented by Formula 7. In addition, the ETL contacts the second blue emitting layer and includes an electron transporting material including at least one of a compound represented by Formula 9 and a compound represented by Formula 10. As a result, each of the OLED D and the organic light emitting display device 100 has an advantage in at least one a driving voltage, an emitting efficiency and a lifespan.

The organic emitting layer 162 may include two or more blue EMLs, which are disposed to be spaced apart from each other, so that the OLED D may have a tandem structure.

The second electrode 164 is formed over the substrate 110 where the organic emitting layer 162 is formed. The second electrode 164 covers an entire surface of the display area and may be formed of a conductive material having a relatively low work function to serve as a cathode. For example, the second electrode 164 may be formed of a material having high reflectance, such as aluminum (Al), magnesium (Mg), calcium (Ca), silver (Ag), their alloys or their combinations. In the top-emission type organic light emitting display device 100, the second electrode 164 may have a thin profile (small thickness) to provide a light transmittance property (or a semi-transmittance property).

An encapsulation layer (or encapsulation film) 170 is formed on the second electrode 164 to prevent penetration of moisture into the OLED D. The encapsulation film 170 includes a first inorganic insulating layer 172, an organic insulating layer 174 and a second inorganic insulating layer 176 sequentially stacked, but it is not limited thereto. The encapsulation film 170 may be omitted.

In the bottom-emission type organic light emitting display device 100, a metal plate may be disposed on the encapsulation layer 170.

The organic light emitting display device 100 may include a color filter layer corresponding to the red, green and blue pixel regions. The color filter layer may include red, green and blue color filters respectively corresponding to the red, green and blue pixel regions. The organic light emitting display device 100 with the color filter layer may have improved color purity.

In the bottom-emission type organic light emitting display device 100, the color filter layer may be disposed between the OLED D and the substrate 110, e.g., between the interlayer insulating layer 132 and the planarization layer 150. In the top-emission type organic light emitting display device 100, the color filter layer may be disposed over the OLED D, e.g., on or over the second electrode 164 or the encapsulation layer 170.

The organic light emitting display device 100 may further include a polarization plate for reducing an ambient light reflection. For example, the polarization plate may be a circular polarization plate. In the bottom-emission type organic light emitting display device 100, the polarization plate may be disposed under the substrate 110. In the top-emission type organic light emitting display device 100, the polarization plate may be disposed on or over the encapsulation film 170.

In addition, in the top-emission type organic light emitting display device 100, a cover window may be attached to the encapsulation film 170 or the polarization plate. In this instance, the substrate 110 and the cover window have a flexible property such that a flexible organic light emitting display device may be provided.

Figure 3:
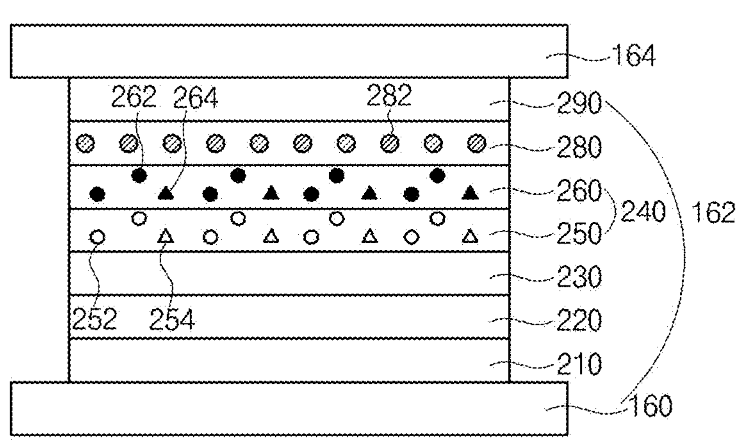
FIG. 3 is a schematic cross-sectional view illustrating an OLED according to a second embodiment of the present invention.

FIG. 3 is a schematic cross-sectional view illustrating an OLED according to a second embodiment of the present invention.

As illustrated in FIG. 3, the OLED D1 includes the first and second electrodes 160 and 164, which face each other, and the organic emitting layer 162 therebetween, and the organic emitting layer 162 includes a blue EML 240 and an ETL 280.

The organic light emitting display device 100 (of FIG. 2) includes red, green and blue pixels. In addition, the organic light emitting display device 100 may further include a white pixel region. The OLED D1 may be positioned in the blue pixel.

The organic emitting layer 162 in the red pixel region includes a red EML, and the organic emitting layer 162 in the green pixel region includes a green EML.

One of the first and second electrodes 160 and 164 is an anode, and the other one of the first and second electrodes 160 and 164 is a cathode. One of the first and second electrodes 160 and 164 is a reflection electrode, and the other one of the first and second electrodes 160 and 164 is a transparent electrode (or a semi-transparent electrode).

For example, the first electrode 160 may include a transparent conductive material layer of ITO or IZO, and the second electrode 164 may be formed of one of Al, Mg, Ag, AlMg and MgAg.

The blue EML 240 includes a first blue emitting layer 250 being closer to the first electrode 160 and a second blue emitting layer 260 being closer to the second electrode 164 and adjacent to the first blue emitting layer 250. Namely, the second blue emitting layer 260 is disposed between the first blue emitting layer 250 and the second electrode 164 and contacts the first blue emitting layer 250.

The blue EML 240 may have a thickness of 100 to 500 Å. A summation of a thickness of the first blue emitting layer 250 and a thickness of the second blue emitting layer 260 is equal to a thickness of the blue EML 240, and the thickness of the first blue emitting layer 250 and the thickness of the second blue emitting layer 260 may be same or different. Each of the thickness of the first blue emitting layer 250 and the thickness of the second blue emitting layer 260 may be 50 to 250 Å, e.g., 70 to 150 Å.

The first blue emitting layer 250 includes a first host 252 and a first dopant (e.g., a first emitter) 254. In the first blue emitting layer 250, the first host 252 may have a weight % (wt %) of 80 to 99, preferably 95 to 99, and the first dopant 254 may have a wt % of 1 to 20, preferably 1 to 5.

In an embodiment, the first host 252 includes at least one of a first host compound represented by Formula 1.

[Formula 1]

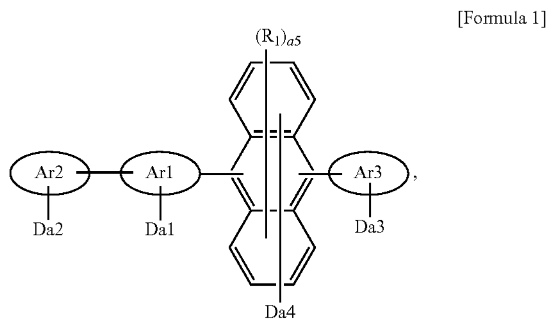

In Formula 1, each of a1, a2 and a3 is independently an integer of 0 or 30, each of a4 and a5 is independently an integer of 0 to 8, and at least one of a1 to a4 is a positive integer, Ar1 is selected from the group consisting of a single bond (a direct bond), a substituted or unsubstituted C6 to C30 arylene group and a substituted or unsubstituted C3 to C30 heteroarylene group, each of Ar2 and Ar3 is selected from the group consisting of a substituted or unsubstituted C6 to C30 aryl group and a substituted or unsubstituted C3 to C30 heteroaryl group, and $R_1$ is selected from the group consisting of a C1 to C30 alkyl group unsubstituted or substituted with deuterium and a C3 to C30 cycloalkyl group unsubstituted or substituted with deuterium.

In Formula 1, D denotes a deuterium atom, each of a1, a2, a3 and a4 is a number of deuterium atoms, and a5 is a number of $R_1$ as a substituent.

In the present invention, without specific definition, a substituent of an alkyl group, a cycloalkyl group, an alicylic group, an aryl group, a heteroaryl group and an arylamino group may be at least one of a substituted or unsubstituted C1 to C10 alkyl group, a substituted or unsubstituted C3 to C30 cycloalkyl group, a substituted or unsubstituted C6 to C30 aryl group and a substituted or unsubstituted C3 to C30 heteroaryl group.

In the present invention, without specific definition, a C1 to C30 alkyl group may be selected from the group consisting of methyl, ethyl, propyl and butyl, e.g., tert-butyl or isobutyl).

In the present invention, without specific definition, a C3 to C30 cycloalkyl group may be selected from the group consisting of cyclopropyl, cyclobutyl, cyclopentyl, cyclohexyl, and adamantanyl.

In the present invention, without specific definition, a C6 to C30 alicyclic group may be selected from the group consisting of tetralinyl, methyltetralinyl, ethyltetralinyl, tetramethyltetralinyl and pentamethylindanyl.

In the present invention, without specific definition, a C6 to C30 aryl group may be selected from the group consisting of phenyl, biphenyl, terphenyl, naphthyl, anthracenyl, pentanenyl, indenyl, indenoindenyl, heptalenyl, biphenylenyl, indacenyl, phenanthrenyl, benzophenanthrenyl, dibenzophenanthrenyl, azulenyl, pyrenyl, fluoranthenyl, triphenylenyl, chrysenyl, tetraphenyl, tetrasenyl, picenyl, pentaphenyl, pentacenyl, fluorenyl, indenofluorenyl and spiro-fluorenyl.

In the present invention, without specific definition, a C6 to C30 arylene group may be selected from the group consisting of phenylene, biphenylene, terphenylene, naphthylene, anthracenylene, pentanenylene, indenylene, indenoindenylene, heptalenylene, biphenylenylene, indacenylene, phenanthrenylene, benzophenanthrenylene, dibenzophenanthrenylene, azulenylene, pyrenylene, fluoranthenylene, triphenylenylene, chrysenylene, tetraphenylene, tetrasenylene, picenylene, pentaphenylene, pentacenylene, fluorenylene, indenofluorenylene and spiro-fluorenylene.

In the present invention, without specific definition, a C3 to C30 heteroaryl group may be selected from the group consisting of pyrrolyl, pyridinyl, pyrimidinyl, pyrazinyl, pyridazinyl, triazinyl, tetrazinyl, imidazolyl, pyrazolyl, indolyl, isoindolyl, indazolyl, indolizinyl, pyrrolizinyl, carbazolyl, benzocarbazolyl, dibenzocarbazolyl, indolocarbazolyl, indenocarbazolyl, benzofurocarbazolyl, benzothienocarbazolyl, quinolinyl, isoquinolinyl, phthalazinyl, quinoxalinyl, cinnolinyl, quinazolinyl, quinazolinyl, quinolinyl, purinyl, phthalazinyl, quinoxalinyl, benzoquinolinyl, benzoisoquinolinyl, benzoquinazolinyl, benzoquinoxalinyl, acridinyl, phenanthrolinyl, perimidinyl, phenanthridinyl, pteridinyl, cinnolinyl, naphthridinyl, furanyl, oxazinyl, oxazolyl, oxadiazolyl, triazolyl, dioxinyl, benzofuranyl, dibenzofuranyl, thiopyranyl, xanthenyl, chromanyl, isochromanyl, thiazinyl, thiophenyl, benzothiophenyl, dibenzothiophenyl, difuropyrazinyl, benzofurodibenzofuranyl, benzothienobenzothiophenyl, benzothienodibenzothiophenyl, benzothienobenzofuranyl, and benzothienodibenzofuranyl.

In the present invention, without specific definition, a C3 to C30 heteroarylene group may be selected from the group consisting of pyrrolylene, pyridinyl, pyrimidinylene, pyrazinylene, pyridazinylene, triazinylene, tetrazinylene, imidazolylene, pyrazolylene, indolylene, isoindolylene, indazolylene, indolizinylene, pyrrolizinylene, carbazolylene, benzocarbazolylene, dibenzocarbazolylene, indolocarbazolylene, indenocarbazolylene, benzofurocarbazolylene, benzothienocarbazolylene, quinolinylene, isoquinolinylene, phthalazinylene, quinoxalinylene, cinnolinylene, quinazolinylene, quinozolinylene, quinolinylene, purinylene, phthalazinylene, quinoxalinylene, benzoquinolinylene, benzoisoquinolinylene, benzoquinazolinylene, benzoquinoxalinylene, acridinylene, phenanthrolinylene, pyrimidinylene, phenanthridinylene, pteridinylene, cinnolinylene, naphthyridinylene, furanylene, oxazinylene, oxazolylene, oxadiazolylene, triazolylene, dioxynylene, benzofuranylene, dibenzofuranylene, thiopyranylene, xanthenylene, chromanylene, isochromanylene, thioazinylene, thiophenylene, benzothiophenylene, dibenzothiophenylene, difuropyrazinylene, benzofurodibenzofuranylene, benzothienobenzothiophenylene, benzothienodibenzothiophenylene, benzothienobenzofuranylene, and benzothienodibenzofuranylene.

In Formula 1, Ar1 may be a single bond or a substituted or unsubstituted C6 to C30 arylene group. In an aspect of the present invention, Ar1 may be selected from the group consisting of a single bond, phenylene and naphthylene, e.g., a-naphthylene or 2-naphthylene.

Each of Ar2 and Ar3 may be a substituted or unsubstituted C6 to C30 aryl group. In an aspect of the present invention, each of Ar2 and Ar3 may be selected from the group consisting of phenyl, naphthyl, e.g., a-naphthyl or 2-naphthyl, and phenanthrenyl.

$R_1$ may be a C1 to C30 alkyl group substituted deuterium, e.g., $CD_3$.

As described above, at least one of a1 to a4 in Formula 1 is a positive integer. Namely, the first host 252 is a partially or wholly deuterated anthracene derivative (compound). For example, the first host 252 may have a first deuteration ratio of about 1 to 100%, e.g., about 30 to 100%.

For example, when the first host 252 is formed by co-depositing a first compound having a deuteration ratio x and a second compound having a deuteration ratio y in a ratio of a:b, the deuteration ratio of the first host 252 is (ax+by)/(a+b).

In an aspect of the present invention, the first host 252 may be represented by Formula 1a.

[Formula 1a]

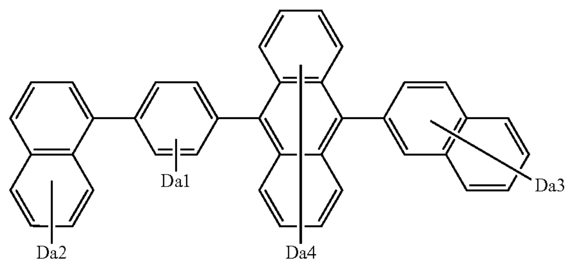

In Formula 1a, a1 is an integer of 0 to 4, each of a2 and a3 is independently an integer of 0 to 7, a4 is an integer of 0 to 8, and at least one of a1 to a4 is a positive integer.

For example, the first host 252 included in the first blue emitting layer 250 may include at least one of compounds in Formula 2 as referred to herein above.

The first dopant 254 is represented by Formula 3.

[Formula 3]

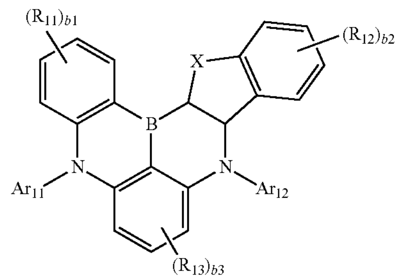

In Formula 3, each of b1 and b2 is independently an integer of 0 to 4, and b3 is an integer of 0 to 3, X is O or S, each of $Ar_{11}$ and $Ar_{12}$ is independently selected from the group consisting of a substituted or unsubstituted C6 to C30 aryl group, a substituted or unsubstituted C3 to C30 heteroaryl group and a substituted or unsubstituted C6 to C30 alicyclic group, and $R_{11}$, $R_{12}$ and $R_{13}$ is independently selected from the group consisting of a substituted or unsubstituted C1 to C30 alkyl group, a substituted or unsubstituted C3 to C30 cycloalkyl group, a substituted or unsubstituted C6 to C30 arylamino group, a substituted or unsubstituted C6 to C30 aryl group and a substituted or unsubstituted C3 to C30 heteroaryl group, or at least one pair of adjacent two or more $R_{11}$, adjacent two or more Ru and adjacent two or more $R_{13}$ are connected to each other to form a substitute or unsubstituted ring.

In an aspect of the present invention, each of $Ar_{\prime\prime}$ and $Ar_{12}$ may be independently selected from the group consisting of a C6 to C30 aryl group, e.g., phenyl or biphenyl, unsubstituted or substituted with a C1 to C30 alkyl group, e.g., tert-butyl, or a C3 to C30 cycloalkyl, e.g., adamantanyl, a C6 to C30 alicyclic group, e.g., tetramethyltetralinyl, unsubstituted or substituted with a C1 to C30 alkyl group, e.g., methyl, and a substituted or unsubstituted C3 to C30 heteroaryl group, e.g., dibenzofuranyl.

In an aspect of the present invention, each of $R_{11}$, $R_{12}$ and $R_{13}$ may be independently selected from the group consisting of a substituted or unsubstituted C1 to C30 alkyl group, e.g., methyl or tert-butyl, a C6 to C30 arylamino group, e.g., diphenyl group, unsubstituted or substituted with at least one of a C1 to C30 alkyl group and a C6 to C30 aryl group and a substituted or unsubstituted C3 to C30 cycloalkyl, e.g., adamantanyl. In an aspect of the present invention, adjacent two R1 may be connected to each other to form a C6 to C30 alicyclic group, e.g., tetramethyltetralin, which is unsubstituted or substituted with a C1 to C30 alkyl group, e.g., methyl, with a benzene ring in Formula 3.

In an aspect of the present invention, the first dopant 254 may be represented by Formula 3a.

[Formula 3a]

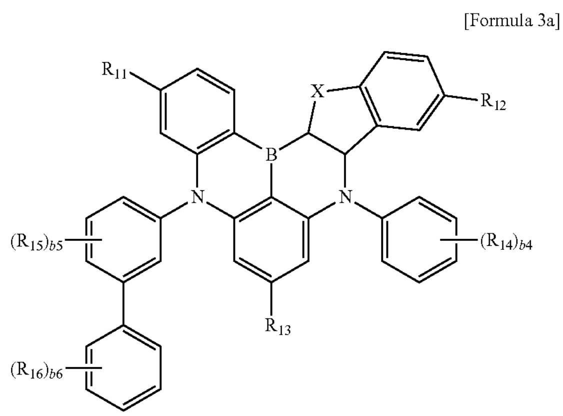

In Formula 3a, the definitions of X, $R_{11}$, $R_{12}$ and $R_{13}$ is same as those in Formula 3, each of b4 and b6 is independently an integer of 0 to 5, and b5 is an integer of 0 to 4, and each of $R_{14}$, $R_{15}$ and $R_{16}$ is selected from the group consisting of a substituted or unsubstituted C1 to C30 alkyl group and a substituted or unsubstituted C3 to C30 cycloalkyl group, or at least one pair of adjacent two $R_{14}$ and adjacent $R_{15}$ and $R_{16}$ are connected to each other to form a substituted or unsubstituted ring.

In an aspect of the present invention, $R_{14}$ may be a substituted or unsubstituted C3 to C30 cycloalkyl group, e.g., adamantanyl, or adjacent two $R_{14}$ may be connected to each other to form a C6 to C30 alicyclic group, e.g., tetramethyltetralin, which is unsubstituted or substituted with a C1 to C30 alkyl group, e.g., methyl, with a benzene ring in Formula 3a.

In an aspect of the present invention, each of $R_{15}$ and $R_{16}$ may be may be a substituted or unsubstituted C1 to C30 alkyl group, e.g., tert-butyl, or may be connected to each other to form a substituted or unsubstituted C6 to C30 heteroaryl group, e.g., dibenzofuran with a benzene ring in Formula 3a.

For example, the first dopant 254 included in the first blue emitting layer 250 may be one of compounds in Formula 4 as referred to herein above.

The second blue emitting layer 260 includes a second host 262 and a second dopant (e.g., a second emitter) 264. In the second blue emitting layer 260, the second host 262 may have a weight % (wt %) of 80 to 99, preferably 95 to 99, and the second dopant 264 may have a wt % of 1 to 20, preferably 1 to 5.

The second host 262 may include at least one of a second host compound represented by Formula 5.

[Formula 5]

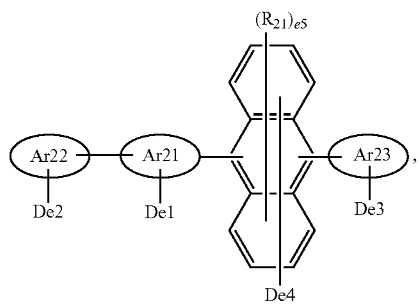

In Formula 5, each of e1, e2 and e3 is independently an integer of 0 or 30, each of e4 and e5 is independently an integer of 0 to 8, and a summation of e1 to e4 is smaller than a summation of a1 to a4 in Formula 1, Ar21 is selected from the group consisting of a single bond (a direct bond), a substituted or unsubstituted C6 to C30 arylene group and a substituted or unsubstituted C3 to C30 heteroarylene group, each of Ar22 and Ar23 is selected from the group consisting of a substituted or unsubstituted C6 to C30 aryl group and a substituted or unsubstituted C3 to C30 heteroaryl group, and $R_{21}$ is selected from the group consisting of a C1 to C30 alkyl group unsubstituted or substituted with deuterium and a C3 to C30 cycloalkyl group unsubstituted or substituted with deuterium.

In Formula 5, D denotes a deuterium atom, each of e1, e2, e3 and e4 is a number of deuterium atoms, and e5 is a number of $R_{21}$ as a substituent.

In Formula 5, Ar21 may be a single bond or a substituted or unsubstituted C6 to C30 arylene group. In an aspect of the present invention, Ar21 may be selected from the group consisting of a single bond, phenylene and naphthylene, e.g., a-naphthylene or 2-naphthylene.

Each of Ar22 and Ar23 may be a substituted or unsubstituted C6 to C30 aryl group. In an aspect of the present invention, each of Ar22 and Ar23 may be selected from the group consisting of phenyl, naphthyl, e.g., a-naphthyl or 2-naphthyl, and phenanthrenyl.

$R_{21}$ may be a C1 to C30 alkyl group substituted deuterium, e.g., $CD_3$.

The second host 262 is a non-deuterated or partially deuterated anthracene derivative. As described above, a summation of e1 to e4 in Formula 5 is smaller than a summation of a1 to a4 in Formula 1. Namely, the second host 262 has a second deuteration ratio smaller than the first deuteration ratio of the first host 252. For example, the second deuteration ratio of the second host 262 may be 0 to 99%, e.g., 0 to 75%.

In an aspect of the present invention, the second host 262 may be represented by Formula 5a.

[Formula 5a]

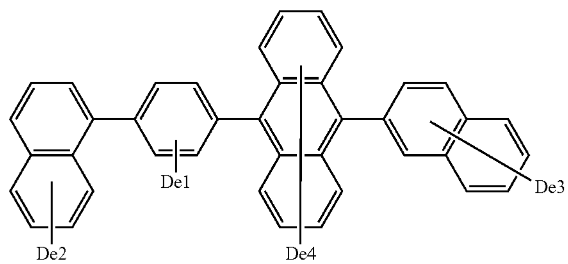

In Formula 5a, e1 is an integer of 0 to 4, each of e2 and e3 is independently an integer of 0 to 7, e4 is an integer of 0 to 8, and a summation of e1 to e4 is smaller than a summation of a1 to a4 in Formula 1a.

For example, the second host 262 included in the second blue emitting layer 260 may include at least one of compounds in Formula 6 as referred to herein above.

The second dopant 264 may be represented by Formula 7.

[Formula 7]

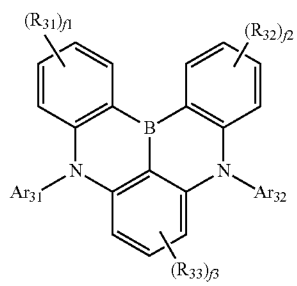

In Formula 7, each of f1 and f2 is independently an integer of 0 to 4, and f3 is an integer of 0 to 3, each of $Ar_{31}$ and $Ar_{32}$ is independently selected from the group consisting of a substituted or unsubstituted C6 to C30 aryl group, a substituted or unsubstituted C3 to C30 heteroaryl group and a substituted or unsubstituted C6 to C30 alicyclic group, and $R_{31}$, $R_{32}$ and $R_{33}$ is independently selected from the group consisting of a substituted or unsubstituted C1 to C30 alkyl group, a substituted or unsubstituted C3 to C30 cycloalkyl group, a substituted or unsubstituted C6 to C30 arylamino group, a substituted or unsubstituted C6 to C30 aryl group and a substituted or unsubstituted C3 to C30 heteroaryl group.

In an aspect of the present invention, each of $Ar_{31}$ and $Ar_{32}$ may be a C6 to C30 aryl group, e.g., phenyl, biphenyl, naphthyl or anthracenyl, unsubstituted or substituted with a C1 to C30 alkyl group, e.g., methyl or tert-butyl.

In an aspect of the present invention, each of $R_{31}$, $R_{32}$ and $R_{33}$ may be independently selected from the group consisting of a substituted or unsubstituted C1 to C30 alkyl group, e.g., methyl or tert-butyl, a substituted or unsubstituted C6 to C30 aryl group, e.g., phenyl, and a substituted or unsubstituted C6 to C30 arylamino group, e.g., diphenylamino.

In an aspect of the present invention, the second dopant 264 may be represented by Formula 7a.

[Formula 7a]

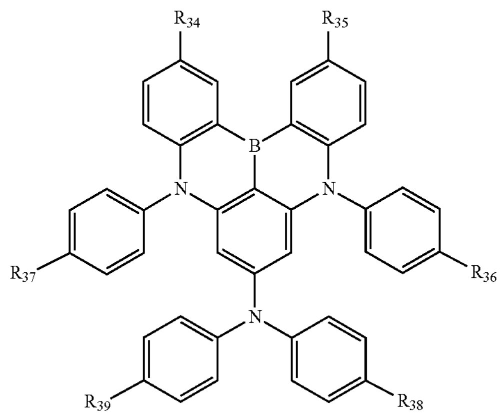

In Formula 7a, each of $R_{34}$ to $R_{39}$ is independently selected from the group consisting of hydrogen, a substituted or unsubstituted C1 to C30 alkyl group, a substituted or unsubstituted C3 to C30 cycloalkyl group, a substituted or unsubstituted C6 to C30 aryl group and a substituted or unsubstituted C3 to C30 heteroaryl group.

In an aspect of the present invention, each of $R_{34}$ to $R_{39}$ may be independently selected from the group consisting of a substituted or unsubstituted C1 to C30 alkyl group, e.g., methyl or tert-butyl, and a substituted or unsubstituted C6 to C30 aryl group. e.g., phenyl.

For example, the second dopant 264 included in the second blue emitting layer 260 may be one of compounds in Formula 8 as referred to herein above.

A weight % of the first host 252 in the first blue emitting layer 250 and a weight % of the second host 262 in the second blue emitting layer 260 may be same or different, and a weight % of the first dopant 254 in the first blue emitting layer 250 and a weight % of the second dopant 264 in the second blue emitting layer 260 may be same or different.

The first dopant 254 included in the first blue emitting layer 250, which is disposed to be closer to the first electrode 160 as an anode for injecting a hole, has a relatively high HOMO (highest occupied molecular orbital) energy level, i.e., a shallow HOMO system, and the second dopant 264 included in the second blue emitting layer 260, which is disposed to be closer to the second electrode 164 as a cathode for injecting an electron, has a relatively low HOMO energy level, i.e., a deep HOMO system.

Namely, the first dopant 254 may be a boron derivative having a first HOMO energy level, and the second dopant 264 may be a boron derivative having a second HOMO energy level lower than the first HOMO energy level. A difference between the first HOMO energy level and the second HOMO energy level may be 0.5 eV or less.

In addition, the first dopant 254 has a relatively high LUMO (lowest unoccupied molecular orbital) energy level, i.e., a shallow LUMO system, and the second dopant 264 has a relatively low LUMO energy level, i.e., a deep LUMO system. Namely, the first dopant 254 has a first LUMO energy level, and the second dopant 254 has a second LUMO energy level lower than the first LUMO energy level.

For example, the first HOMO energy level of the first dopant 254 may be in a range of −5.3 to −5.1 eV, and the second HOMO energy level of the second dopant 264 may be in a range of −5.5 to −5.3 eV. The first LUMO energy level of the first dopant 254 may be in a range of −2.6 to −2.3 eV, and the second LUMO energy level of the second dopant 264 may be in a range of −2.7 to −2.5 eV.

The HOMO energy level of the first dopant 254 may be higher than that of the first host 252, and the LUMO energy level of the first dopant 254 may be higher than that of the first host 252. The HOMO energy level of the second dopant 264 may be higher than that of the second host 262, and the LUMO energy level of the second dopant 264 may be higher than that of the second host 262.

The HOMO energy level of the first host 252 and the HOMO energy level of the second host 262 may be same or different, and the LUMO energy level of the first host 252 and the LUMO energy level of the second host 262 may be same or different. Each of the HOMO energy level of the first host 252 and the HOMO energy level of the second host 262 may be in a range of −6.0 to −5.8 eV, and each of the LUMO energy level of the first host 252 and the LUMO energy level of the second host 262 may be in a range of −3.1 to −2.9 eV.

The first dopant 254 included in the first blue emitting layer, which is disposed to be closer to the first electrode 160 as an anode for injecting a hole, has a relatively small triplet energy, and the second dopant 264 included in the second blue emitting layer, which is disposed to be closer to the second electrode 164 as a cathode for injecting an electron, has a relatively large triplet energy level. Namely, the first dopant 254 has a first triplet energy, and the second dopant 264 has a second triplet energy greater than the first triplet energy.

For example, the first triplet energy of the first dopant 254 may be 2.5 eV or less, e.g., in a range of 2.3 to 2.5 eV, and the second triplet energy of the second dopant 264 may be in a range of 2.5 to 2.7 eV.

The triplet energy of the first dopant 254 may be greater than that of the first host 252, and the triplet energy of the second dopant 264 may be greater than that of the second host 262.

The triplet energy of the first host 252 and the triplet energy of the second host 262 may be same or different. The triplet energy of the first host 252 and the triplet energy of the second host 262 may be in a range of 1.6 to 2.0 eV.

Namely, the first host 252 in the first blue emitting layer 250 and the second host 262 in the second blue emitting layer 260 have the same chemical structure and different deuteration ratios, and the first dopant 254 in the first blue emitting layer 250 and the second dopant 264 in the second blue emitting layer 260 have different chemical structures and different electro-optic property, e.g., a HOMO energy level, a LUMO energy level or a triplet energy.

The ETL 280 include an electron transporting material 282, and the electron transporting material 282 includes at least one of a compound represented by Formula 9, e.g., a first electron transporting material, and a compound represented by Formula 10, e.g., a second electron transporting material.

[Formula 9]

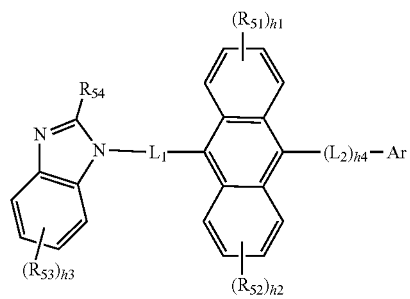

In Formula 9, each of h1, h2 and h3 is independently an integer of 0 to 4, and h4 is 0 or 1, each of $R_{51}$, $R_{52}$ and $R_{53}$ is independently selected from the group consisting of deuterium, a substituted or unsubstituted C1 to C10 alkyl group, a substituted or unsubstituted C3 to C10 cycloalkyl group, a substituted or unsubstituted C6 to C30 aryl group and a substituted or unsubstituted C3 to C30 heteroaryl group, $R_{54}$ is selected from the group consisting of hydrogen, deuterium, a substituted or unsubstituted C1 to C10 alkyl group, a substituted or unsubstituted C3 to C10 cycloalkyl group, a substituted or unsubstituted C6 to C30 aryl group and a substituted or unsubstituted C3 to C30 heteroaryl group, each of $L_1$ and $L_2$ is independently a substituted or unsubstituted C6 to C30 arylene group, and Ar is selected from the group consisting of a substituted or unsubstituted C6 to C30 aryl group and a substituted or unsubstituted C3 to C30 heteroaryl group.

In an aspect of the present invention, each of h1 and h2 may be 0.

In an aspect of the present invention, h3 may be 0 or 1, and $R_{53}$ may be a substituted or unsubstituted C1 to C10 alkyl group, e.g., methyl.

In an aspect of the present invention, $R_{54}$ may be selected from the group consisting of a substituted or unsubstituted C1 to C10 alkyl group, e.g., methyl or ethyl, and a substituted or unsubstituted C6 to C30 aryl group, phenyl, naphthyl or biphenyl.

In an aspect of the present invention, each of L and $L_2$ may be a substituted or unsubstituted C6 to C30 aryl group, phenyl, naphthyl, biphenyl, terphenyl or fluorenyl.

[Formula 10]

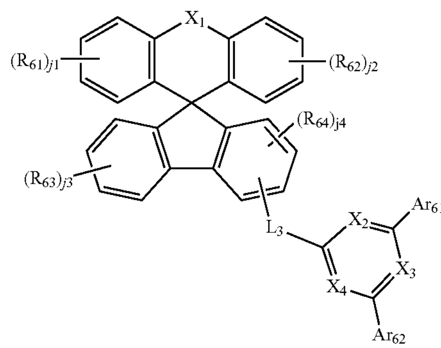

In Formula 10, each of j1, j2 and j3 is independently an integer of 0 to 4, and j4 is an integer of 0 to 3, each of $R_{61}$, $R_{62}$, $R_{63}$ and $R_{64}$ is independently selected from the group consisting of a substituted or unsubstituted C1 to C10 alkyl group, a substituted or unsubstituted C3 to C10 cycloalkyl group, a substituted or unsubstituted C6 to C30 aryl group and a substituted or unsubstituted C3 to C30 heteroaryl group, $X_1$ is O, S or $NR_{65}$, and $R_{65}$ is a substituted or unsubstituted C6 to C30 aryl group and connected to adjacent benzene ring to form a ring, each of $X_2$, $X_3$ and $X_4$ is independently N or $CR_{66}$, and at least two of $X_2$, $X_3$ and $X_4$ are N, each of $Ar_{61}$, $Ar_{62}$ and $R_{66}$ is independently selected from the group consisting of hydrogen, a substituted or unsubstituted C6 to C30 aryl group and a substituted or unsubstituted C3 to C30 heteroaryl group, and $L_3$ is selected from the group consisting of a substituted or unsubstituted C6 to C30 arylene group and a substituted or unsubstituted C3 to C30 heteroarylene group.

In an aspect of the present invention, each of j1, j2, j3 and j4 may be 0.

In an aspect of the present invention, $R_{65}$ may be phenyl and may be connected to N and adjacent benzene ring to form a carbazole structure.

In an aspect of the present invention, $L_3$ may be a substituted or unsubstituted C6 to C30 arylene group, e.g., phenylene.

In an aspect of the present invention, $Ar_{61}$ and $Ar_{62}$ may be a substituted or unsubstituted C6 to C30 aryl group, e.g., phenyl, naphthyl or naphthylphenyl.

In an aspect of the present invention, $R_{66}$ may be hydrogen.

For example, the compound of Formula 9 for the electron transporting material 282 may be one of compounds in Formula 11 as referred to herein above.

For example, the compound of Formula 10 for the electron transporting material 282 may be one of compounds in Formula 12 as referred to herein above.

The electron transporting material 282 has a HOMO energy level lower than the second dopant 264. The HOMO energy level of the electron transporting material 282 may be in a range of −6.5 to −5.8 eV. Each of a HOMO energy level of the first electron transporting material and a HOMO energy level of the second electron transporting material may be lower than that of the second dopant 264.

The electron transporting material 282 has a LUMO energy level lower than the second dopant 264. The LUMO energy level of the electron transporting material 282 may be in a range of −3.2 to −2.7 eV. Each of a LUMO energy level of the first electron transporting material and a LUMO energy level of the second electron transporting material may be lower than that of the second dopant 264.

A triplet energy of the first electron transporting material may be smaller than that of the first dopant 254, and a triplet energy of the second electron transporting material may be greater than that of the first dopant 254 and smaller than that of the second dopant 264. The triplet energy of the first electron transporting material may be in a range of 1.8 to 1.8 eV, and the triplet energy of the second electron transporting material may be in a range of 2.4 to 2.6 eV.

The first electron transporting material may have a first dipole moment, and the second electron transporting material may have a second dipole moment smaller than the first dipole moment. The dipole moment of the first electron transporting material may in a range of 5.0 to 5.6 C·m, and the dipole moment of the second electron transporting material may in a range of 5.0 to 5.6 C·m.

For example, the ETL 280 may include both the first electron transporting material and the second electron transporting material. In the ETL 280, a weight % ratio of the first electron transporting material to the second electron transporting material may be in a range of 3:7 to 7:3. For example, in the ETL 280, the first electron transporting material and the second electron transporting material may have the same weight %.

The organic emitting layer 162 may further include an HTL 220 disposed under the blue EML 240. Namely, the HTL 220 may be disposed between the blue EML 240 and the first electrode 160.

The organic emitting layer 162 may further include at least one of an HIL 210 between the HTL 220 and the first electrode 160 and an EIL 290 between the ETL 280 and the second electrode 164.

The organic emitting layer 162 may further include an EBL 230 between the blue EML 240.

For example, the organic emitting layer 162 may have a structure of the HIL 210, the HTL 220, the EBL 230, the first blue emitting layer 250, the second blue emitting layer 260, the ETL 280 and the EIL 290 sequentially stacked on the first electrode 160. When the ETL 280 includes both the first electron transporting material represented by Formula 9 and the second electron transporting material represented by Formula 10, the ETL 280 can have a hole blocking function with an electron transporting function. In this structure, the first blue emitting layer 250 contacts the EBL 230 and is spaced apart from the HTL 220, while the second blue emitting layer 260 contacts the ETL 280.

Alternatively, the organic emitting layer 162 may further include a hole blocking layer (HBL) between the blue EML 240 and the ETL 280. In this case, the organic emitting layer 162 may have a structure of the HIL 210, the HTL 220, the EBL 230, the first blue emitting layer 250, the second blue emitting layer 260, the HBL, the ETL 280 and the EIL 290 sequentially stacked on the first electrode 160. In this structure, the first blue emitting layer 250 contacts the EBL 230 and is spaced apart from the HTL 220, and the second blue emitting layer 260 contacts the HBL and is spaced apart from the ETL 280.

The HIL 210 may include a hole injection material being at least one compound selected from the group consisting of 4,4',4"-tris(3-methylphenylamino)triphenylamine (MTDATA), 4,4',4"-tris(N,N-diphenyl-amino)triphenylamine (NATA), 4,4',4"-tris(N-(naphthalene-1-yl)-N-phenyl-amino) triphenylamine (1T-NATA), 4,4',4"-tris(N-(naphthalene-2-yl)-N-phenyl-amino)triphenylamine (2T-NATA), copper phthalocyanine(CuPc), tris(4-carbazoyl-9-yl-phenyl)amine (TCTA), N,N'-diphenyl-N,N'-bis(1-naphthyl)-1,1'-biphenyl-4,4"-diamine (NPB or NPD), 1,4,5,8,9,11-hexaazatriphenylenehexacarbonitrile(dipyrazino[2,3-f:2' 3'-h]quinoxaline-2,3,6,7,10,11-hexacarbonitrile (HAT-CN), 1,3,5-tris[4-(diphenylamino)phenyl]benzene (TDAPB), poly(3,4-ethylenedioxythiophene)polystyrene sulfonate (PEDOT/PSS), and N-(biphenyl-4-yl)-9,9-dimethyl-N-(4-(9-phenyl-9H-carbazol-3-yl)phenyl)-9H-fluoren-2-amine, but it is not limited thereto. For example, the hole injection material for the HIL 210 may be a compound in Formula 15. The HIL 210 may have a thickness of 10 to 100 Å.

The HTL 220 may include a hole transporting material being at least one compound selected from the group consisting of N,N'-diphenyl-N,N'-bis(3-methylphenyl)-1,1'-biphenyl-4,4'-diamine (TPD), NPB (or NPD), 4,4'-bis(N-carbazolyl)-1,1'-biphenyl (CBP), poly[N,N'-bis(4-butylphenyl)-N,N'-bis(phenyl)-benzidine] (poly-TPD), (poly[(9,9-dioctylfluorenyl-2,7-diyl)-co-(4,4'-(N-(4-sec-butylphenyl)diphenylamine))] (TFB), di-[4-(N,N-di-p-tolyl-amino)-phenyl]cyclohexane (TAPC), 3,5-di(9H-carbazol-9-yl)-N,N-diphenylaniline (DCDPA), N-(biphenyl-4-yl)-9,9-dimethyl-N-(4-(9-phenyl-9H-carbazol-3-yl)phenyl)-9H-fluoren-2-amine, and N-(biphenyl-4-yl)-N-(4-(9-phenyl-9H-carbazol-3-yl)phenyl)biphenyl-4-amine, but it is not limited thereto. For example, the hole transporting material for the HTL 220 may be the compound in Formula 16. The HTL 220 may have a thickness of 500 to 1500 Å, preferably 700 to 1300 Å.

The EIL 290 may include an electron injection material being at least one of an alkali metal, such as Li, an alkali halide compound, such as LiF, CsF, NaF, or $BaF_2$, and an organo-metallic compound, such as Liq, lithium benzoate, or sodium stearate. Alternatively, the EIL 290 may include a compound in Formula 17 and a dopant, e.g., Li, and the dopant may have a weight % of 1 to 10. The EIL 290 may have a thickness of 50 to 400 Å, preferably 100 to 300 Å.

The EBL 230 may include an electron blocking material being at least one compound selected from the group consisting of TCTA, tris[4-(diethylamino)phenyl]amine, N-(biphenyl-4-yl)-9,9-dimethyl-N-(4-(9-phenyl-9H-carbazol-3-yl)phenyl)-9H-fluoren-2-amine, TAPC, MTDATA, 1,3-bis (carbazol-9-yl)benzene (mCP), 3,3'-bis(N-carbazolyl)-1,1'-biphenyl (mCBP), CuPc, N,N'-bis[4-[bis(3-methylphenyl) amino]phenyl]-N,N'-diphenyl-[1,1'-biphenyl]-4,4'-diamine (DNTPD), TDAPB, and DCDPA, 2,8-bis(9-phenyl-9H-carbazol-3-yl)dibenzo[b,d]thiophene). The EBL 230 may have a thickness of 100 to 300 Å.

Alternatively, the electron blocking material of the EBL 230 may be a compound represented by Formula 13.

[Formula 13]

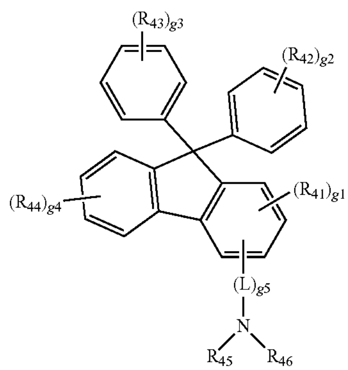

In Formula 13, g1 is an integer of 0 to 3, each of g2 and g3 is independently an integer of 0 to 5, g4 is an integer of 0 to 4, and g5 is 0 or 1, each of $R_{41}$ and $R_{44}$ is independently selected from the group consisting of deuterium, a substituted or unsubstituted C1 to C30 alkyl group, a substituted or unsubstituted C3 to C30 cycloalkyl group, a substituted or unsubstituted C6 to C30 aryl group and a substituted or unsubstituted C3 to C30 heteroaryl group, each of $R_{42}$ and $R_{43}$ is independently selected from the group consisting of deuterium, a substituted or unsubstituted C1 to C30 alkyl group, a C3 to C30 cycloalkyl group unsubstituted or substituted with deuterium, a substituted or unsubstituted C6 to C30 aryl group and a substituted or unsubstituted C3 to C30 heteroaryl group, or $R_{42}$ and $R_{43}$ are connected to each other to form a ring, each of $R_{45}$ and $R_{46}$ is independently selected from the group consisting of a substituted or unsubstituted C6 to C30 aryl group and a substituted or unsubstituted C3 to C30 heteroaryl group, L is selected from the group consisting of a substituted or unsubstituted C6 to C30 arylene group and a substituted or unsubstituted C3 to C30 heteroarylene group.

In an aspect of the present invention, g5 may be 0, or L may be a substituted or unsubstituted C6 to C30 arylene group, e.g., phenylene.

In an aspect of the present invention, each of $R_{42}$ and $R_{43}$ may be connected to each other so that the electron blocking material in Formula 13 has a structure of a spiro-fluorene.

In an aspect of the present invention, each of $R_{45}$ and $R_{46}$ may be independently selected from the group consisting of biphenyl, fluorenyl, carbazolyl, phenylcarbazolyl, carbazolylphenyl, dibenzothiophenyl and dibenzofuranyl and may be substituted with a C1 to C10 alkyl group or a C6 to C30 aryl group, e.g., phenyl.

For example, the electron blocking material in Formula 13 may be an amine derivative substituted with spiro-fluorene group.

A HOMO energy level of the electron blocking material, i.e., the compound in Formula 13, in the EBL 230 may be lower than each of a HOMO energy level of the first dopant 254 and a HOMO energy level of the second dopant 264.

The HOMO energy level of the electron blocking material, i.e., the compound in Formula 13, in the EBL 230 may be in a range of −5.8 to −5.6 eV, and a LUMO energy level of the electron blocking material, i.e., the compound in Formula 13, in the EBL 230 may be in a range of −2.6 to −2.3 eV.

For example, the electron blocking material in the EBL 230 may be one of compounds in Formula 14.

[Formula 14]

E1

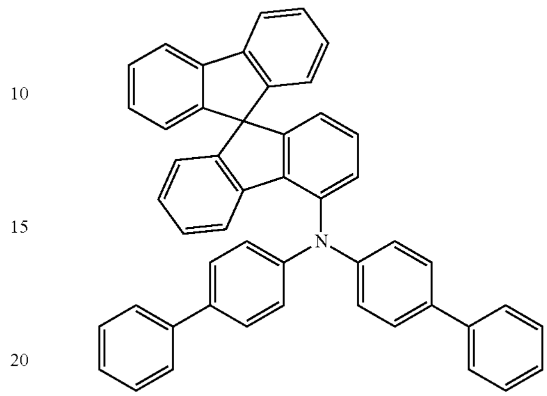

E2

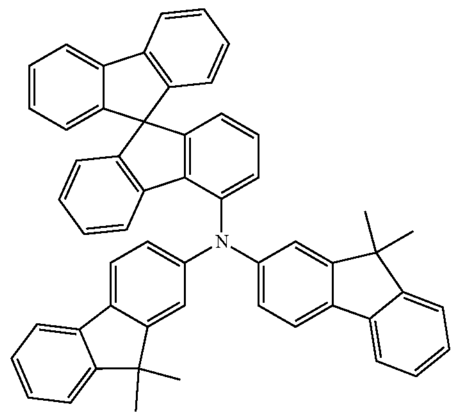

E3

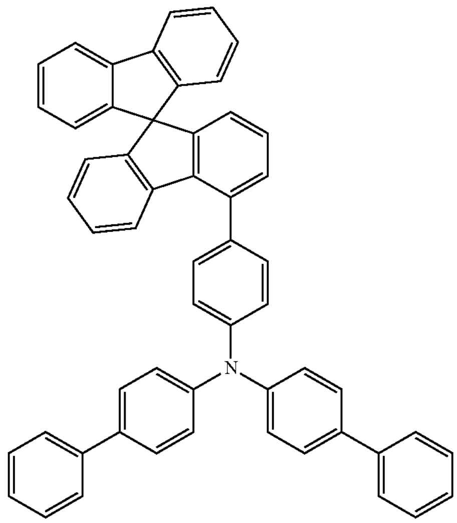

E4
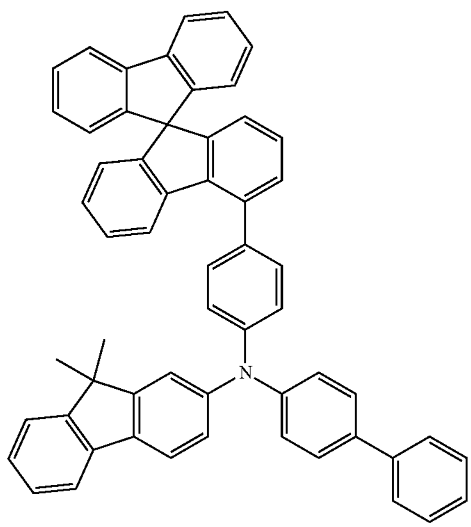
E5
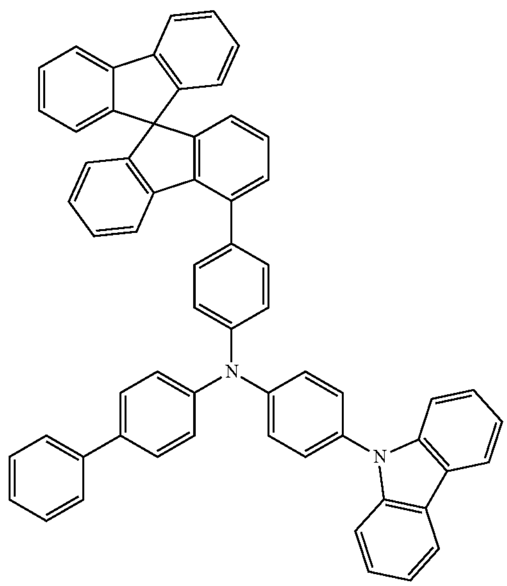
E6
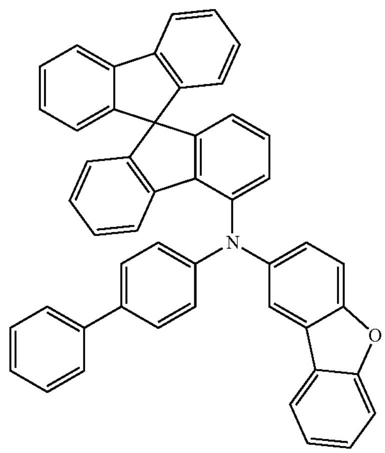
E7
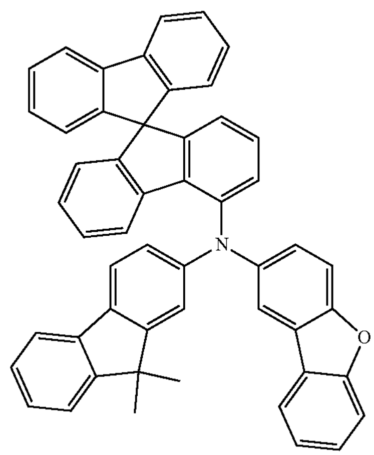
E8
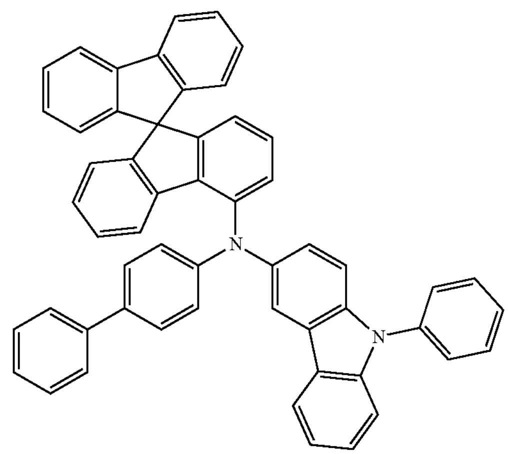
E9
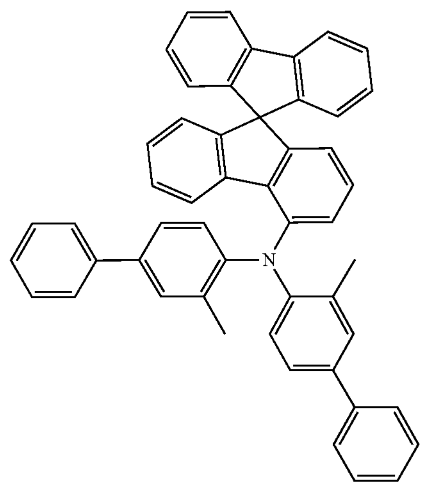

E10
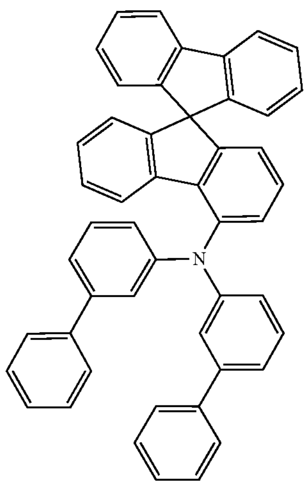
E11
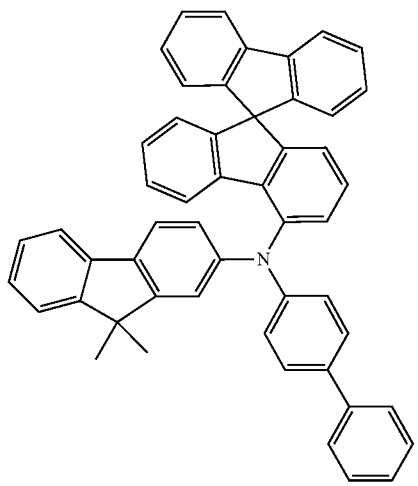
E12
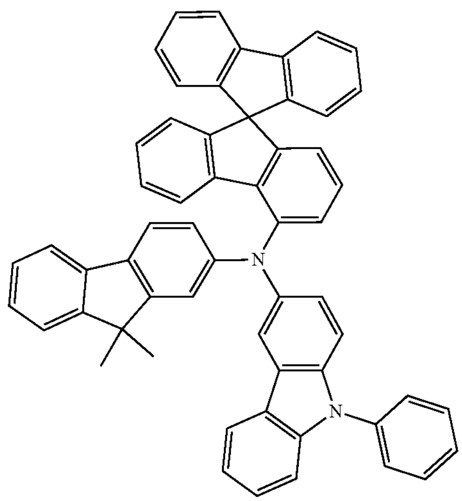
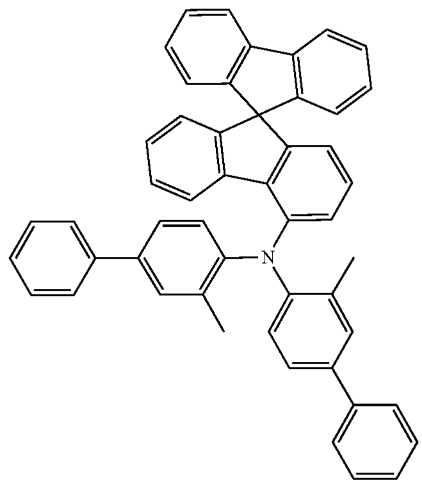
E10
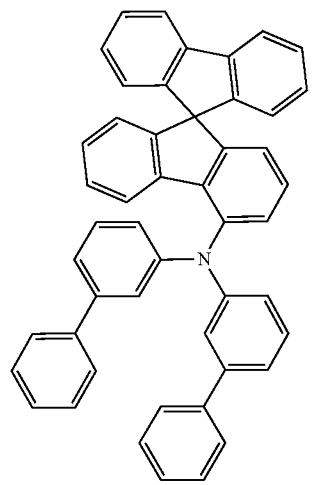
E11
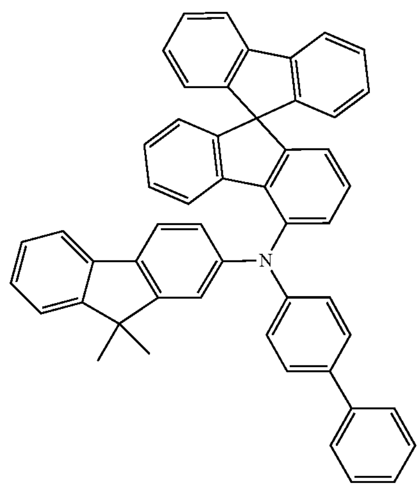

-continued
E12
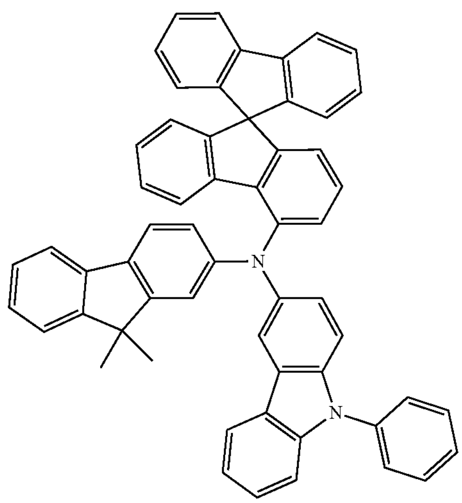
E17
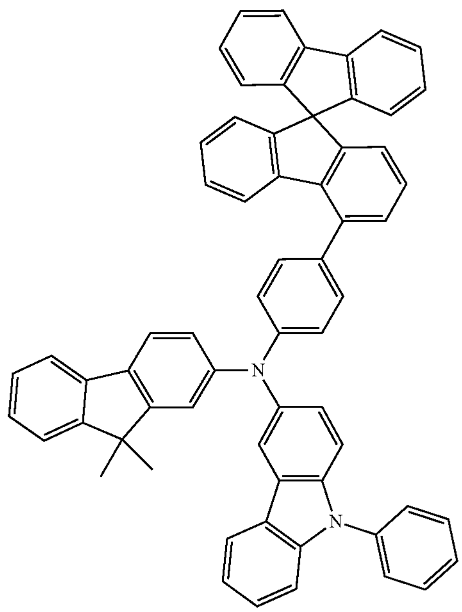
-continued
E18
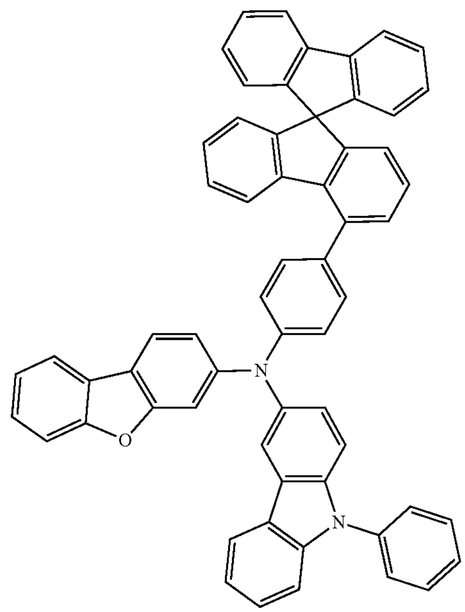
E19
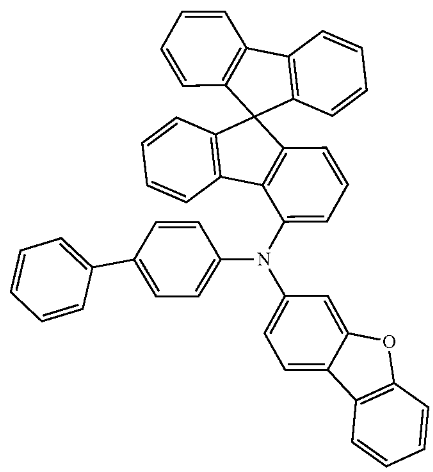
E20
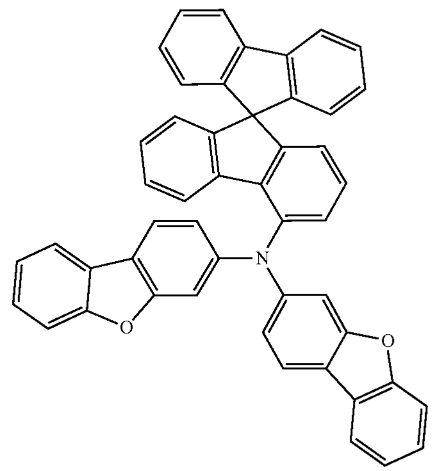

-continued

E21

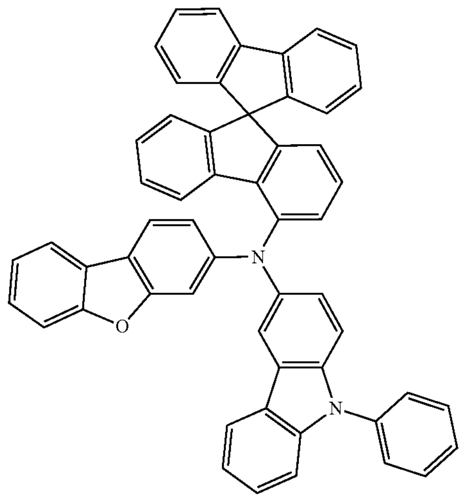

When the HBL is positioned between the second blue emitting layer 260 and the ETL 280, the HBL may include a hole blocking material being at least one compound selected from the group consisting of 2,9-bis(naphthalene-2-yl)4,7-diphenyl-1,10-phenanthroline (NBphen), 2,9-dimethyl-4,7-diphenyl-1,10-phenanthroline (BCP), bis(2-methyl-8-quinolinolato-N1,O8)-(1,1'-biphenyl-4-olato) aluminum (BAlq), tris-(8-hydroxyquinoline aluminum (Alq3), 2-biphenyl-4-yl-5-(4-t-butylphenyl)-1,3,4-oxadiazole (PBD), spiro-PBD, lithium quinolate (Liq), bis-4,6-(3,5-di-3-pyridylphenyl)-2-methylpyrimidine(B3PYMPM), bis[2-(diphenylphosphino)phenyl]teeth oxide(DPEPO), 9-(6-9H-carbazol-9-yl)pyridine-3-yl)-9H-3,9'-bicarbazole and TSPO1, but it is not limited thereto. The HBL may have a thickness of 100 to 500 Å, preferably 200 to 400 Å.

In the OLED D1, the blue EML 240 including the first and second blue emitting layers 250 and 260 and the ETL 280 constitute an emitting part, or the blue EML 240 including the first and second blue emitting layers 250 and 260 and the ETL 280 with at least one of the HIL 210, the HTL 220, the EBL 230, the HBL and the EIL 290 constitute an emitting part.

As described above, the OLED D1 of the present invention includes the blue EML 240 and the ETL 280, and the blue EML 240 includes the first blue emitting layer 250, which includes the first host 252 and the first dopant 254 and is disposed to be closer to the first electrode 160 as an anode, and the second blue emitting layer 260, which includes the second host 262 and the second dopant 264 and is disposed to be closer to the second electrode 164 as a cathode. In this case, the first host 252 includes at least one of the first host compounds represented by Formula 1, the second host 262 includes at least one of the second host compounds represented by Formula 5, the first dopant 254 is represented by Formula 3, the second dopant 264 is represented by Formula 7, and the electron transporting material 282 of the ETL 280 includes at least one of the compound represented by Formula 9 and the compound represented by Formula 10.

Accordingly, the OLED D1 and the organic light emitting display device 100 may have an advantage in at least one a driving voltage, an emitting efficiency and a lifespan.

The OLED D1 of the present invention includes the blue EML 240 and the ETL 280, and the blue EML 240 includes the first blue emitting layer 250, which includes the first host 252 and the first dopant 254 and is disposed to be closer to the first electrode 160 as an anode, and the second blue emitting layer 260, which includes the second host 262 and the second dopant 264 and is disposed to be closer to the second electrode 164 as a cathode. In this case, a deuteration ratio of the second host 262 is smaller than that of the first host 252, a HOMO energy level of the second dopant 264 is lower than that of the first dopant 254, and a triplet energy of the second dopant 264 is greater than that of the first dopant 254. In addition, the ETL 280 includes the first and second electron transporting materials, and each of the first and second electron transporting materials has a HOMO energy level lower than the second dopant 264.

Accordingly, the OLED D1 and the organic light emitting display device 100 may have an advantage in at least one of an advantage in at least one a driving voltage, an emitting efficiency and a lifespan.

Figure 4:
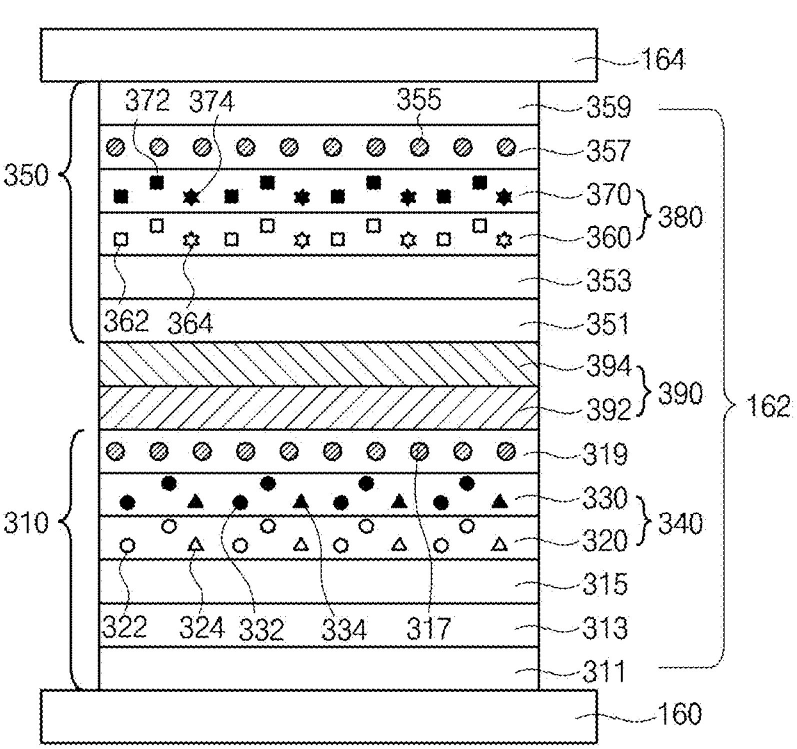
FIG. 4 is a schematic cross-sectional view illustrating an OLED according to a third embodiment of the present invention.

FIG. 4 is a schematic cross-sectional view illustrating an OLED according to a third embodiment of the present invention.

As illustrated in FIG. 4, the OLED D2 includes the first and second electrodes 160 and 164 facing each other and the organic emitting layer 162 between the first and second electrodes 160 and 164. The organic emitting layer 162 includes a first emitting part 310 including a first blue EML 340 and a first ETL 319 and a second emitting part 350 including a second blue EML 380 and a second ETL 357. In addition, the organic emitting layer 162 may further include a charge generation layer (CGL) 390 between the first and second emitting parts 310 and 350.

The organic light emitting display device 100 (of FIG. 2) includes a red pixel, a green pixel and a blue pixel. The organic light emitting display device 100 may further include a white pixel region. The OLED D2 is positioned in the blue pixel.

One of the first and second electrodes 160 and 164 is an anode, and the other one of the first and second electrodes 160 and 164 is cathode. In addition, one of the first and second electrodes 160 and 164 may be a reflection electrode, and the other one of the first and second electrodes 160 and 164 may be a transparent (or a semi-transparent) electrode.

For example, the first electrode 160 may include a transparent conductive material layer of ITO or IZO, and the second electrode 164 may be formed of one of Al, Mg, Ag, AlMg and MgAg.

The CGL 390 is positioned between the first and second emitting parts 310 and 350, and the first emitting part 310, the CGL 390 and the second emitting part 350 are sequentially stacked on the first electrode 160. Namely, the first emitting part 310 is positioned between the first electrode 160 and the CGL 390, and the second emitting part 350 is positioned between the second electrode 164 and the CGL 390.

In the first emitting part 310, the first blue EML 340 includes a first blue emitting layer 320 being closer to the first electrode 160 and a second blue emitting layer 330 being closer to the second electrode 164 and adjacent to the first blue emitting layer 320. Namely, the second blue emitting layer 330 is disposed between the first blue emitting layer 320 and the second electrode 164 and contacts the first blue emitting layer 320.

The first blue EML 340 may have a thickness of 100 to 500 Å. A summation of a thickness of the first blue emitting layer 320 and a thickness of the second blue emitting layer 330 is equal to a thickness of the first blue EML 340, and the thickness of the first blue emitting layer 320 and the thickness of the second blue emitting layer 330 may be same or different. Each of the thickness of the first blue emitting layer 320 and the thickness of the second blue emitting layer 330 may be 50 to 250 Å, e.g., 70 to 150 Å.

The first blue emitting layer 320 includes a first host 322 and a first dopant (e.g., a first emitter) 324. In the first blue emitting layer 320, the first host 322 may have a weight % (wt %) of 80 to 99, preferably 95 to 99, and the first dopant 324 may have a wt % of 1 to 20, preferably 1 to 5.

The first host 322 includes at least one of the first host compounds represented by Formula 1, and the first dopant 324 is represented by Formula 3. In an aspect of the present invention, the first host 322 may be represented by Formula 1a, and the first dopant 324 may be represented by Formula 3a. For example, the first host 322 may include at least one of the compounds in Formula 2, and the first dopant 324 may include at least one of the compounds in Formula 4.

The first host 322 is a partially or wholly deuterated anthracene derivative. For example, the first host 322 may have a first deuteration ratio of about 1 to 100%, e.g., about 30 to 100%.

The second blue emitting layer 330 includes a second host 332 and a second dopant (e.g., a second emitter) 334. In the second blue emitting layer 330, the second host 332 may have a weight % (wt %) of 80 to 99, preferably 95 to 99, and the second dopant 334 may have a wt % of 1 to 20, preferably 1 to 5.

The second host 332 includes at least one of the first host compounds represented by Formula 5, and the second dopant 334 is represented by Formula 7. In an aspect of the present invention, the second host 332 may be represented by Formula 5a, and the second dopant 334 may be represented by Formula 7a. For example, the second host 332 may include at least one of the compounds in Formula 6, and the second dopant 334 may include at least one of the compounds in Formula 8.

The second host 332 is a non-deuterated or partially deuterated anthracene derivative. Namely, the second host 332 has a second deuteration ratio smaller than the first deuteration ratio of the first host 322. For example, the second deuteration ratio of the second host 332 may be 0 to 99%, e.g., 0 to 75%.

A weight % of the first host 322 in the first blue emitting layer 320 and a weight % of the second host 332 in the second blue emitting layer 330 may be same or different, and a weight % of the first dopant 324 in the first blue emitting layer 320 and a weight % of the second dopant 334 in the second blue emitting layer 330 may be same or different.

The first dopant 324 included in the first blue emitting layer 320, which is disposed to be closer to the first electrode 160 as an anode for injecting a hole, has a relatively high HOMO energy level, i.e., a shallow HOMO system, and the second dopant 334 included in the second blue emitting layer 330, which is disposed to be closer to the second electrode 164 as a cathode for injecting an electron, has a relatively low HOMO energy level, i.e., a deep HOMO system. Namely, the first dopant 324 may have a first HOMO energy level, and the second dopant 334 may have a second HOMO energy level lower than the first HOMO energy level. A difference between the first HOMO energy level and the second HOMO energy level may be 0.5 eV or less.

In addition, the first dopant 324 has a relatively high LUMO energy level, i.e., a shallow LUMO system, and the second dopant 334 has a relatively low LUMO energy level, i.e., a deep LUMO system. Namely, the first dopant 324 has a first LUMO energy level, and the second dopant 334 has a second LUMO energy level lower than the first LUMO energy level.

For example, the first HOMO energy level of the first dopant 324 may be in a range of −5.3 to −5.1 eV, and the second HOMO energy level of the second dopant 334 may be in a range of −5.5 to −5.3 eV. The first LUMO energy level of the first dopant 324 may be in a range of −2.6 to −2.3 eV, and the second LUMO energy level of the second dopant 334 may be in a range of −2.7 to −2.5 eV.

The HOMO energy level of the first dopant 324 may be higher than that of the first host 322, and the LUMO energy level of the first dopant 324 may be higher than that of the first host 322. The HOMO energy level of the second dopant 334 may be higher than that of the second host 332, and the LUMO energy level of the second dopant 334 may be higher than that of the second host 332.

The HOMO energy level of the first host 322 and the HOMO energy level of the second host 332 may be same or different, and the LUMO energy level of the first host 322 and the LUMO energy level of the second host 332 may be same or different. Each of the HOMO energy level of the first host 322 and the HOMO energy level of the second host 332 may be in a range of −6.0 to −5.8 eV, and each of the LUMO energy level of the first host 322 and the LUMO energy level of the second host 332 may be in a range of −3.1 to −2.9 eV.

The first dopant 324 included in the first blue emitting layer 320, which is disposed to be closer to the first electrode 160 as an anode for injecting a hole, has a relatively small triplet energy, and the second dopant 334 included in the second blue emitting layer 330, which is disposed to be closer to the second electrode 164 as a cathode for injecting an electron, has a relatively large triplet energy level. Namely, the first dopant 324 has a first triplet energy, and the second dopant 334 has a second triplet energy greater than the first triplet energy.

For example, the first triplet energy of the first dopant 324 may be 2.5 eV or less, e.g., in a range of 2.3 to 2.5 eV, and the second triplet energy of the second dopant 334 may be in a range of 2.5 to 2.7 eV.

The triplet energy of the first dopant 324 may be greater than that of the first host 322, and the triplet energy of the second dopant 334 may be greater than that of the second host 332. The triplet energy of the first host 322 and the triplet energy of the second host 332 may be same or different. The triplet energy of the first host 322 and the triplet energy of the second host 332 may be in a range of 1.6 to 2.0 eV.

Namely, in the first blue EML 340, the first host 322 in the first blue emitting layer 320 and the second host 332 in the second blue emitting layer 330 have the same chemical structure and different deuteration ratios, and the first dopant 324 in the first blue emitting layer 320 and the second dopant 334 in the second blue emitting layer 330 have different chemical structures and different electro-optic property, e.g., a HOMO energy level, a LUMO energy level or a triplet energy.

The first ETL 319 is positioned between the first blue EML 340 and the second emitting part 350. The first ETL 319 may have a thickness of 100 to 500 Å, preferably 200 to 400 Å.

The first ETL 319 includes a first electron transporting material 317 including at least one of a compound represented by Formula 9, e.g., a first electron transporting material, and a compound represented by Formula 10, e.g., a second electron transporting material. For example, the first ETL 319 may include both the compound represented by Formula 9 as the first electron transporting material and the compound represented by Formula 10 as the second electron transporting material. In an aspect of the present invention, the first ETL 319 may include one of the compounds in Formula 11 and one of the compounds in Formula 12.

Each of a HOMO energy level of the first electron transporting material of the first ETL 319 and a HOMO energy level of the second electron transporting material of the first ETL 319 may be lower than that of the second dopant 334. Each of a LUMO energy level of the first electron transporting material of the first ETL 319 and a LUMO energy level of the second electron transporting material of the first ETL 319 may be lower than that of the second dopant 334.

A triplet energy of the first electron transporting material of the first ETL 319 may be smaller than that of the first dopant 324, and a triplet energy of the second electron transporting material of the first ETL 319 may be greater than that of the first dopant 324 and smaller than that of the second dopant 334.

The first electron transporting material may have a first dipole moment, and the second electron transporting material may have a second dipole moment smaller than the first dipole moment.

The first emitting part 310 may further include a first HTL 313 disposed under the first blue EML 340. Namely, the first HTL 313 may be disposed between the first blue EML 340 and the first electrode 160.

The first emitting part 310 may further include an HIL 311 between the first HTL 313 and the first electrode 160.

The first emitting part 310 may further include a first EBL 315 between the first blue EML 340 and the first HTL 313.

For example, the first emitting part 310 may have a structure of the HIL 311, the first HTL 313, the first EBL 315, the first blue emitting layer 320, the second blue emitting layer 330 and the first ETL 319 sequentially stacked on the first electrode 160. When the first ETL 319 includes both the first electron transporting material represented by Formula 9 and the second electron transporting material represented by Formula 10, the first ETL 319 can have a hole blocking function with an electron transporting function. In this structure, the first blue emitting layer 320 contacts the first EBL 315 and is spaced apart from the first HTL 313, while the second blue emitting layer 330 contacts the first ETL 319.

Alternatively, the first emitting part 310 may further include a first hole blocking layer (HBL) between the first blue EML 340 and the first ETL 319. In this case, the first emitting part 310 may have a structure of the HIL 311, the first HTL 313, the first EBL 315, the first blue emitting layer 320, the second blue emitting layer 330, the first HBL and the first ETL 319 sequentially stacked on the first electrode 160. In this structure, the first blue emitting layer 320 contacts the first EBL 315 and is spaced apart from the first HTL 313, and the second blue emitting layer 330 contacts the first HBL and is spaced apart from the first ETL 319.

In the second emitting part 350, the second blue EML 380 includes a third blue emitting layer 360, which is disposed to be closer to the first electrode 160, and a fourth blue emitting layer 370, which is disposed to be closer to the second electrode 164 and is adjacent to the third blue emitting layer 360. Namely, the fourth blue emitting layer 370 is positioned between the third blue emitting layer 360 and the second electrode 164 and contacts the third blue emitting layer 360.

The second blue EML 380 may have a thickness of 100 to 500 Å. A summation of a thickness of the third blue emitting layer 360 and a thickness of the fourth blue emitting layer 370 is equal to a thickness of the second blue EML 380, and the thickness of the third blue emitting layer 360 and the thickness of the fourth blue emitting layer 370 may be same or different. Each of the thickness of the third blue emitting layer 360 and the thickness of the fourth blue emitting layer 370 may be 50 to 250 Å, e.g., 70 to 150 Å.

The third blue emitting layer 360 includes a third host 362 and a third dopant (e.g., a third emitter) 364. In the third blue emitting layer 360, the third host 362 may have a weight % (wt %) of 80 to 99, preferably 95 to 99, and the third dopant 364 may have a wt % of 1 to 20, preferably 1 to 5.

The third host 362 includes at least one of the first host compounds represented by Formula 1, and the third dopant 364 is represented by Formula 3. In an aspect of the present invention, the third host 362 may be represented by Formula 1a, and the third dopant 364 may be represented by Formula 3a. For example, the third host 362 may include at least one of the compounds in Formula 2, and the third dopant 364 may include at least one of the compounds in Formula 4.

The third host 362 and the first host 322 may be same or different, and the third dopant 364 and the first dopant 324 may be same or different.

The third host 362 is a partially or wholly deuterated anthracene derivative. For example, the third host 362 may have a third deuteration ratio of about 1 to 100%, e.g., about 30 to 100%.

The fourth blue emitting layer 370 includes a fourth host 372 and a fourth dopant (e.g., a fourth emitter) 374. In the fourth blue emitting layer 370, the fourth host 372 may have a weight % (wt %) of 80 to 99, preferably 95 to 99, and the fourth dopant 374 may have a wt % of 1 to 20, preferably 1 to 5.

The fourth host 372 includes at least one of the first host compounds represented by Formula 5, and the fourth dopant 374 is represented by Formula 7. In an aspect of the present invention, the fourth host 372 may be represented by Formula 5a, and the fourth dopant 374 may be represented by Formula 7a. For example, the fourth host 372 may include at least one of the compounds in Formula 6, and the fourth dopant 374 may include at least one of the compounds in Formula 8.

The fourth host 372 and the second host 332 may be same or different, and the fourth dopant 374 and the second dopant 334 may be same or different.

The fourth host 372 is a non-deuterated or partially deuterated anthracene derivative. Namely, the fourth host 372 has a fourth deuteration ratio smaller than the third deuteration ratio of the third host 362. For example, the fourth deuteration ratio of the fourth host 372 may be 0 to 99%, e.g., 0 to 75%.

A weight % of the third host 362 in the third blue emitting layer 360 and a weight % of the fourth host 372 in the fourth blue emitting layer 370 may be same or different, and a weight % of the third dopant 364 in the third blue emitting layer 360 and a weight % of the fourth dopant 374 in the fourth blue emitting layer 370 may be same or different.

The third dopant 364 included in the third blue emitting layer 360, which is disposed to be closer to the first electrode 160 as an anode for injecting a hole, has a relatively high HOMO energy level, i.e., a shallow HOMO system, and the fourth dopant 374 included in the fourth blue emitting layer 370, which is disposed to be closer to the second electrode 164 as a cathode for injecting an electron, has a relatively low HOMO energy level, i.e., a deep HOMO system. Namely, the third dopant 364 may have a third HOMO energy level, and the fourth dopant 374 may have a fourth HOMO energy level lower than the third HOMO energy level. A difference between the third HOMO energy level and the fourth HOMO energy level may be 0.5 eV or less.

In addition, the third dopant 364 has a relatively high LUMO energy level, i.e., a shallow LUMO system, and the fourth dopant 374 has a relatively low LUMO energy level, i.e., a deep LUMO system. Namely, the third dopant 364 has a third LUMO energy level, and the fourth dopant 374 has a fourth LUMO energy level lower than the third LUMO energy level.

For example, the third HOMO energy level of the third dopant 364 may be in a range of −5.3 to −5.1 eV, and the fourth HOMO energy level of the fourth dopant 374 may be in a range of −5.5 to −5.3 eV. The third LUMO energy level of the third dopant 364 may be in a range of −2.6 to −2.3 eV, and the fourth LUMO energy level of the fourth dopant 374 may be in a range of −2.7 to −2.5 eV.

The HOMO energy level of the third dopant 364 may be higher than that of the third host 362, and the LUMO energy level of the third dopant 364 may be higher than that of the third host 362. The HOMO energy level of the fourth dopant 374 may be higher than that of the fourth host 372, and the LUMO energy level of the fourth dopant 374 may be higher than that of the fourth host 372.

The HOMO energy level of the third host 362 and the HOMO energy level of the fourth host 372 may be same or different, and the LUMO energy level of the third host 362 and the LUMO energy level of the fourth host 372 may be same or different. Each of the HOMO energy level of the third host 362 and the HOMO energy level of the fourth host 372 may be in a range of −6.0 to −5.8 eV, and each of the LUMO energy level of the third host 362 and the LUMO energy level of the fourth host 372 may be in a range of −3.1 to −2.9 eV.

The third dopant 364 included in the third blue emitting layer 360, which is disposed to be closer to the first electrode 160 as an anode for injecting a hole, has a relatively small triplet energy, and the fourth dopant 374 included in the fourth blue emitting layer 370, which is disposed to be closer to the second electrode 164 as a cathode for injecting an electron, has a relatively large triplet energy level. Namely, the third dopant 364 has a third triplet energy, and the fourth dopant 374 has a fourth triplet energy greater than the third triplet energy.

For example, the third triplet energy of the third dopant 364 may be 2.5 eV or less, e.g., in a range of 2.3 to 2.5 eV, and the fourth triplet energy of the fourth dopant 374 may be in a range of 2.5 to 2.7 eV.

The triplet energy of the third dopant 364 may be greater than that of the third host 362, and the triplet energy of the fourth dopant 374 may be greater than that of the fourth host 372. The triplet energy of the third host 362 and the triplet energy of the fourth host 372 may be same or different. The triplet energy of the third host 362 and the triplet energy of the fourth host 372 may be in a range of 1.6 to 2.0 eV.

Namely, in the second blue EML 380, the third host 362 in the third blue emitting layer 360 and the fourth host 372 in the fourth blue emitting layer 370 have the same chemical structure and different deuteration ratios, and the third dopant 364 in the third blue emitting layer 360 and the fourth dopant 374 in the fourth blue emitting layer 370 have different chemical structures and different electro-optic property, e.g., a HOMO energy level, a LUMO energy level or a triplet energy.

The second ETL 357 is positioned between the second blue EML 380 and the second electrode 164. The second ETL 357 may have a thickness of 100 to 500 Å, preferably 200 to 400 Å.

The second ETL 357 includes a second electron transporting material 355 including at least one of a compound represented by Formula 9, e.g., a first electron transporting material, and a compound represented by Formula 10, e.g., a second electron transporting material. For example, the second ETL 357 may include both the compound represented by Formula 9 as the first electron transporting material and the compound represented by Formula 10 as the second electron transporting material. In an aspect of the present invention, the second ETL 357 may include one of the compounds in Formula 11 and one of the compounds in Formula 12.

Each of a HOMO energy level of the first electron transporting material of the second ETL 357 and a HOMO energy level of the second electron transporting material of the second ETL 357 may be lower than that of the fourth dopant 374. Each of a LUMO energy level of the first electron transporting material of the second ETL 357 and a LUMO energy level of the second electron transporting material of the second ETL 357 may be lower than that of the fourth dopant 374.

A triplet energy of the first electron transporting material of the second ETL 357 may be smaller than that of the third dopant 364, and a triplet energy of the second electron transporting material of the second ETL 357 may be greater than that of the third dopant 364 and smaller than that of the fourth dopant 374.

The first electron transporting material may have a first dipole moment, and the second electron transporting material may have a second dipole moment smaller than the first dipole moment.

The second emitting part 350 may further include a second HTL 351 disposed under the second blue EML 380. Namely, the second HTL 351 is positioned between the second blue EML 380 and the first emitting part 310.

The second emitting part 350 may further include an EIL 359 between the second ETL 357 and the second electrode 164.

The second emitting part 350 may further include a second EBL 353 between the second blue EML 380 and the second HTL 351.

For example, the second emitting part 350 may have a structure of the second HTL 351, the second EBL 353, the third emitting layer 360, the fourth emitting layer 370, the second ETL 357 and the EIL 359. When the second ETL 357 includes both the first electron transporting material represented by Formula 9 and the second electron transporting material represented by Formula 10, the second ETL 357 can have a hole blocking function with an electron transporting function. In this structure, the third emitting layer 360 contacts the second EBL 353 and is spaced apart from the second HTL 351, while the fourth emitting layer 370 contacts the second ETL 357.

Alternatively, the second emitting part 350 may further include a first hole blocking layer (HBL) between the second blue EML 380 and the second ETL 357. In this case, the second emitting part 310 may have a structure of the second HTL 351, the second EBL 353, the third emitting layer 360, the fourth emitting layer 370, the second HBL the second ETL 357 and the EIL 359. In this structure, the third blue emitting layer 360 contacts the second EBL 353 and is spaced apart from the second HTL 351, and the fourth blue emitting layer 370 contacts the second HBL and is spaced apart from the second ETL 357.

The HIL 311 may include the above-mentioned hole injection material and may have a thickness of 10 to 100 Å.

Each of the first and second HTLs 313 and 351 may include the above-mentioned hole transporting material and may have a thickness of 500 to 1500 Å, preferably 700 to 1300 Å.

The EIL 359 may include the above-mentioned electron injection material and may have a thickness of 50 to 400 Å, preferably 100 to 300 Å.

Each of the first and second EBLs 315 and 353 may include the above-mentioned electron blocking material and may have a thickness of 10 to 300 Å.

Each of the first and second HBLs may include the above-mentioned hole blocking material and may have a thickness of 100 to 500 Å, preferably 200 to 400 Å.

A HOMO energy level of the electron blocking material, e.g., a compound in Formula 13, in the first ETL 315 may be lower than each of a HOMO energy level of the first dopant 324 and a HOMO energy level of the second dopant 334. A HOMO energy level of the electron blocking material, e.g., a compound in Formula 13, in the second ETL 353 may be lower than each of a HOMO energy level of the third dopant 364 and a HOMO energy level of the fourth dopant 374.

A HOMO energy level and a LUMO energy of the electron blocking material, e.g., a compound in Formula 13, in the first ETL 315 may be higher than a HOMO energy level and a LUMO energy of the first host 322, respectively. A HOMO energy level and a LUMO energy of the electron blocking material, e.g., a compound in Formula 13, in the second ETL 353 may be higher than a HOMO energy level and a LUMO energy of the third host 362, respectively.

The HOMO energy level of the electron blocking material, i.e., the compound in Formula 13, in each of the first and second EBLs 315 and 353 may be in a range of −5.8 to −5.6 eV, and a LUMO energy level of the electron blocking material, i.e., the compound in Formula 13, in each of the first and second EBLs 315 and 353 may be in a range of −2.6 to −2.3 eV.

The CGL 390 is positioned between the first and second emitting parts 310 and 350. Namely, the first and second emitting parts 310 and 350 are connected through the CGL 390. The CGL 390 may be a P—N junction CGL of an N-type CGL 392 and a P-type CGL 394.

The N-type CGL 392 is positioned between the first HBL 317 and the second HTL 351, and the P-type CGL 394 is positioned between the N-type CGL 392 and the second HTL 351.

The N-type CGL 392 may be an organic layer doped with an alkali metal, e.g., Li, Na, K and Cs, and/or an alkali earth metal, e.g., Mg, Sr, Ba and Ra. For example, the N-type CGL 392 may be formed of an N-type charge generation material including a host being the organic material, e.g., 4,7-dipheny-1,10-phenanthroline (Bphen) and MTDATA, a dopant being an alkali metal and/or an alkali earth metal, and the dopant may be doped with a weight % of 0.01 to 30.

The P-type CGL 394 may be formed of a P-type charge generation material including an inorganic material, e.g., tungsten oxide ($WO_x$), molybdenum oxide ($MoO_x$), beryllium oxide ($Be_2O_3$) and vanadium oxide ($V_2O_5$), an organic material, e.g., NPD, HAT-CN, F4TCNQ, TPD, TNB, TCTA and N,N'-dioctyl-3,4,9,10-perylenedicarboximide (PTCDI-C8).

In FIG. 4, the first blue EML 340 has a double-layered structure including the first and second blue emitting layers 320 and 330, and the second blue EML 380 has a double-layered structure including the third and fourth blue emitting layers 360 and 370.

Alternatively, one of the first and second blue EMLs 340 and 380 may have a double-layered structure, while the other one of the first and second blue EMLs 340 and 380 may have a single-layered structure. In this instance, the other one of the first and second blue EMLs 340 and 380 may include a blue host and a blue dopant.

For example, the blue host may be selected from the group consisting of mCP, 9-(3-(9H-carbazol-9-yl)phenyl)-9H-carbazole-3-carbonitrile (mCP-CN), mCBP, CBP-CN, 9-(3-(9H-Carbazol-9-yl)phenyl)-3-(diphenylphosphoryl)-9H-carbazole (mCPPO1) 3,5-Di(9H-carbazol-9-yl)biphenyl (Ph-mCP), TSPO1, 9-(3'-(9H-carbazol-9-yl)-[1,1'-biphenyl]-3-yl)-9H-pyrido[2,3-b]indole (CzBPCb), bis(2-methylphenyl)diphenylsilane (UGH-1), 1,4-bis(triphenylsilyl)benzene (UGH-2), 1,3-bis(triphenylsilyl)benzene (UGH-3), 9,9-spirobifluoren-2-yl-diphenyl-phosphine oxide (SPPO1) and 9,9'-(5-(triphenylsilyl)-1,3-phenylene)bis(9H-carbazole) (SimCP).

The blue dopant may be selected from the group consisting of perylene, 4,4'-bis[4-(di-p-tolylamino)styryl]biphenyl (DPAVBi), 4-(di-p-tolylamino)-4-4'-[(di-p-tolylamino)styryl]stilbene (DPAVB), 4,4'-bis[4-(diphenylamino)styryl]biphenyl (BDAVBi), 2,7-bis(4-diphenylamino)styryl)-9,9-spirofluorene (spiro-DPVBi), [1,4-bis[2-[4-[N,N-di(p-tolyl)amino]phenyl]vinyl]benzene (DSB), 1-4-di-[4-(N,N-diphenyl)amino]styryl-benzene (DSA), 2,5,8,11-tetra-tetr-butylperylene (TBPe), bis(2-hydroxyphenyl)-pyridine)beryllium (Bepp2), 9-(9-Phenylcarbazole-3-yl)-10-(naphthalene-1-yl)anthracene (PCAN), mer-tris(1-phenyl-3-methylimidazolin-2-ylidene-C,C(2)'iridium(III)(III) (mer-Ir(pmi)3), fac-Tris(1,3-diphenyl-benzimidazolin-2-ylidene-C,C(2)'iridium(III) (fac-Ir(dpbic)3), bis(3,4,5-trifluoro-2-(2-pyridyl)phenyl-(2-carboxypyridyl)iridium(III) (Ir(tfpd)2pic), tris(2-(4,6-difluorophenyl)pyridine))iridium(III) (Ir(Fppy)3) and bis[2-(4,6-difluorophenyl)pyridinato-C2,N](picolinato)iridium(III) (FIrpic).

As described above, each of the first electron transporting material 317 in the first ETL 319 and the second electron transporting material 355 in the second ETL 357 is the compound represented by Formula 9. Alternatively, one of the first ETL 319 and the second ETL 357 may include the compound represented by Formula 9, and the other one of the first ETL 319 and the second ETL 357 may include an electron transporting material other than the compound represented by Formula 9. For example, the electron transporting material for the other one of the first ETL 319 and the second ETL 357 may be one of tris-(8-hydroxyquinoline aluminum ($Alq_3$), 2-biphenyl-4-yl-5-(4-t-butylphenyl)-1,3,4-oxadiazole (PBD), spiro-PBD, lithium quinolate (Liq), 1,3,5-tris(N-phenylbenzimidazol-2-yl)benzene (TPBi), bis(2-methyl-8-quinolinolato-N1,O8)-(1,1'-biphenyl-4-olato)aluminum (BAlq), 4,7-diphenyl-1,10-phenanthroline (Bphen), 2,9-bis(naphthalene-2-yl)-4,7-diphenyl-1,10-phenanthroline (NBphen), 2,9-dimethyl-4,7-diphenyl-1,10-phenanthroline (BCP), 3-(4-biphenyl)-4-phenyl-5-tert-butylphenyl-1,2,4-triazole (TAZ), 4-(naphthalen-1-yl)-3,5-diphenyl-4H-1,2,4-triazole (NTAZ), 1,3,5-tri(p-pyrid-3-yl-phenyl)benzene (TpPyPB), 2,4,6-tris(3'-(pyridin-3-yl)biphenyl-3-yl)1,3,5-triazine (TmPPPyTz), poly[9,9-bis(3'-((N,N-dimethyl)-N-ethylammonium)-propyl)-2,7-fluorene]-alt-2,7-(9,9-dioctylfluorene)] (PFNBr), tris(phenylquinoxaline) (TPQ), diphenyl-4-triphenylsilyl-phenylphosphine oxide (TSPO1), and 2-[4-(9,10-Di-2-naphthalen2-yl-2-anthracen-2-yl)phenyl]-1-phenyl-1H-benzimidazole (ZADN).

The OLED D2 of the present invention includes the first emitting part 310 including the first blue EML 340 and the first ETL 319 and the second emitting part 350 including the second blue EML 380 and the second ETL 357, and at least one of the first and second blue EMLs 340 and 380 includes a first blue emitting layer including a first host and a first dopant and a second blue emitting layer including a second host and a second dopant. In this case, the first host includes at least one of the first host compounds represented by Formula 1, the second host includes at least one of the second host compounds represented by Formula 5, the first dopant is represented by Formula 3, and the second dopant is represented by Formula 7. In addition, at least one of the first ETL 319 and the second ETL 357 include at least one of the first electron transporting material represented by Formula 9 and the second electron transporting material represented by Formula 10.

Accordingly, the OLED D2 and the organic light emitting display device 100 may have an advantage in at least one a driving voltage, an emitting efficiency and a lifespan.

The OLED D2 of the present invention includes the first emitting part 310 including the first blue EML 340 and the first ETL 319 and the second emitting part 350 including the second blue EML 380 and the second ETL 357, and at least one of the first and second blue EMLs 340 and 380 includes a first blue emitting layer including a first host and a first dopant and a second blue emitting layer including a second host and a second dopant. In this case, a deuteration ratio of the second host in the second blue emitting layer, which is closer to the second electrode 164 as a cathode, is smaller than that of the first host in the first blue emitting layer, which is closer to the first electrode 160 as an anode, a HOMO energy level of the second dopant in the second blue emitting layer, which is closer to the second electrode 164 as a cathode, is lower than that of the first dopant in the first blue emitting layer, which is closer to the first electrode 160 as an anode, and a triplet energy of the second dopant is greater than that of the first dopant. In addition, at least one of the first ETL 319 and the second ETL 357 include at least one of the first electron transporting material represented by Formula 9 and the second electron transporting material represented by Formula 10, and each of the first and second electron transporting materials has a HOMO energy level lower than the second dopant.

Accordingly, the OLED D2 and the organic light emitting display device 100 may have an advantage in at least one a driving voltage, an emitting efficiency and a lifespan.

Figure 5:
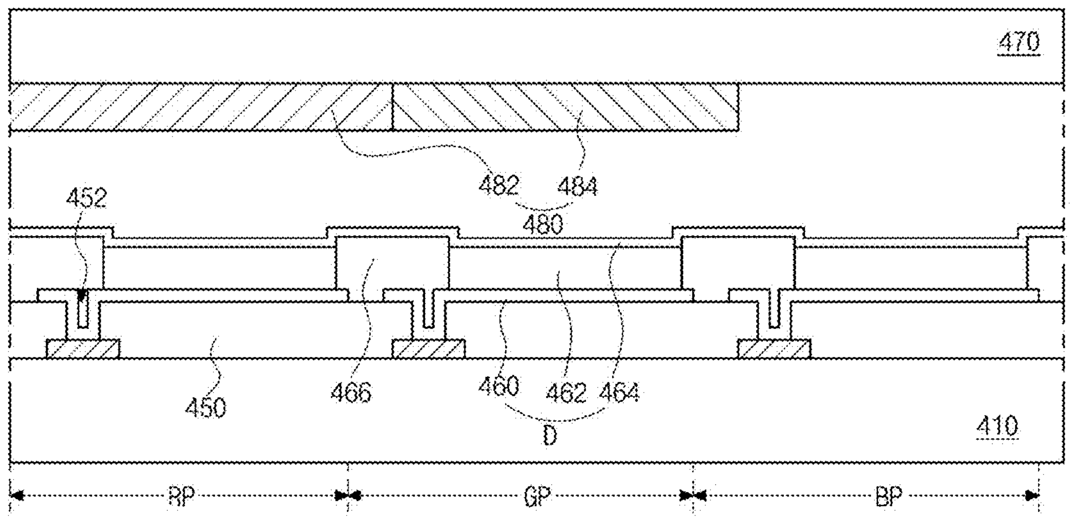
FIG. 5 is a schematic cross-sectional view illustrating an organic light emitting display device according to a fourth embodiment of the present invention.

FIG. 5 is a schematic cross-sectional view illustrating an organic light emitting display device according to a fourth embodiment of the present invention.

As illustrated in FIG. 5, the organic light emitting display device 400 includes a first substrate 410, where a red pixel RP, a green pixel GP and a blue pixel BP are defined, a second substrate 470 facing the first substrate 410, an OLED D, which is positioned between the first and second substrates 410 and 470 and providing white emission, and a color conversion layer 480 between the OLED D and the second substrate 470.

Although not shown, a color filter may be formed between the second substrate 470 and each color conversion layer 480.

Each of the first and second substrates 410 and 470 may be a glass substrate or a flexible substrate. For example, each of the first and second substrates 410 and 470 may be a polyimide (PI) substrate, a polyethersulfone (PES) substrate, a polyethylenenaphthalate (PEN) substrate, a polyethylene terephthalate (PET) substrate or a polycarbonate (PC) substrate.

A TFT Tr, which corresponding to each of the red, green and blue pixels RP, GP and BP, is formed on the first substrate 410, and a planarization layer 450, which has a drain contact hole 452 exposing an electrode, e.g., a drain electrode, of the TFT Tr is formed to cover the TFT Tr.

The OLED D including a first electrode 460, an organic emitting layer 462 and a second electrode 464 is formed on the planarization layer 450. In this instance, the first electrode 460 may be connected to the drain electrode of the TFT Tr through the drain contact hole 452.

A bank layer 466 is formed on the planarization layer 450 to cover an edge of the first electrode 460. Namely, the bank layer 466 is positioned at a boundary of the pixel and exposes a center of the first electrode 460 in the pixel.

The OLED D emits a blue light and may have a structure shown in FIG. 3 or FIG. 4. Namely, the OLED D is formed in each of the red, green and blue pixels RP, GP and BP and provides the blue light.

For example, referring to FIG. 3, the organic emitting layer 462 of the OLED D includes the blue EML 240 including the first blue emitting layer 250, which is disposed to be closer to the first electrode 160 as an anode, and the second blue emitting layer 260, which is disposed to be closer to the second electrode 164 as a cathode, and the ETL 280. The first blue emitting layer 250 includes the first host 252 and the first dopant 254, the second blue emitting layer 260 includes the second host 262 and the second dopant 264, the ETL 280 includes the electron transporting material 282. In this case, the first host 252 includes at least one of the first host compounds represented by Formula 1, the second host 262 includes at least one of the second host compounds represented by Formula 5, the first dopant 254 is represented by Formula 3, and the second dopant is represented by Formula 7. In addition, the electron transporting material 282 includes at least one of a first electron transporting material represented by Formula 9 and a second electron transporting material represented by Formula 10.

The color conversion layer 480 includes a first color conversion layer 482 corresponding to the red pixel RP and a second color conversion layer 484 corresponding to the green pixel GP. For example, the color conversion layer 480 may include an inorganic color conversion material such as a quantum dot.

The blue light from the OLED D is converted into the red light by the first color conversion layer 482 in the red pixel RP, and the blue light from the OLED D is converted into the green light by the second color conversion layer 484 in the green pixel GP.

Accordingly, the organic light emitting display device 400 can display a full-color image.

A color filter layer may be disposed between the second substrate 470 and the color conversion layer 480. The color filter layer may include a red color filter and a green color filter respectively corresponding to the red and green pixel regions.

On the other hand, when the light from the OLED D passes through the first substrate 410, the color conversion layer 480 is disposed between the OLED D and the first substrate 410. In this case, the color filter layer may be disposed between the first substrate 410 and the color conversion layer 480.

Figure 6:
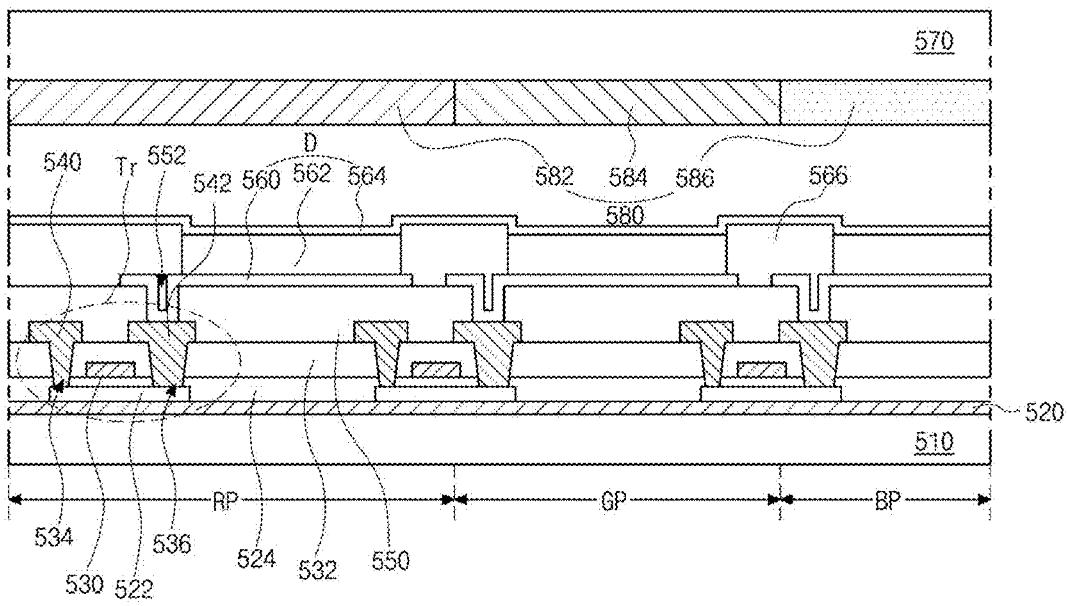
FIG. 6 is a schematic cross-sectional view illustrating an organic light emitting display device according to a fifth embodiment of the present invention.
Figure 7:
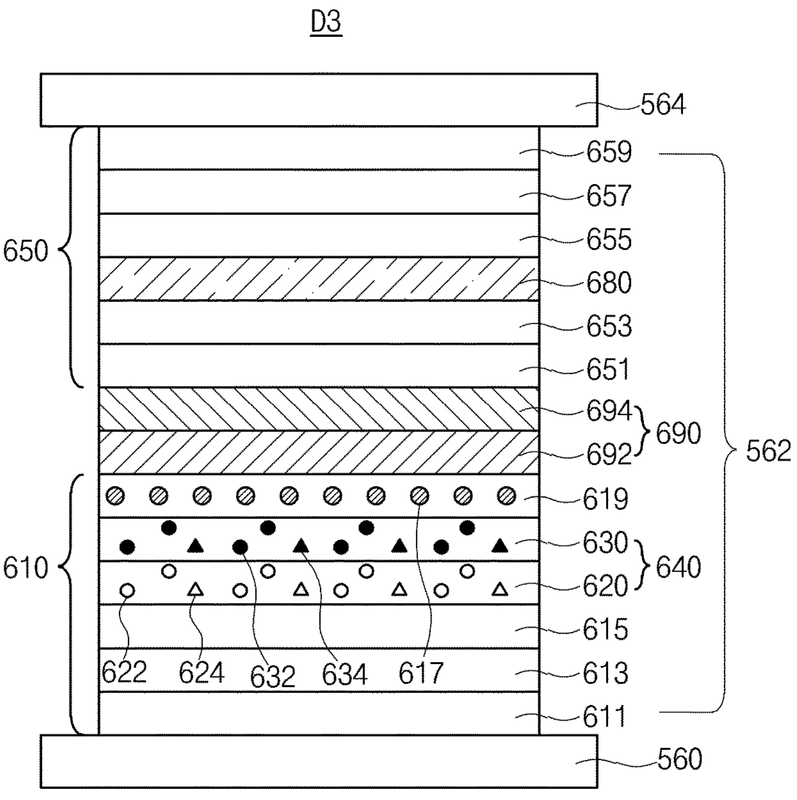
FIG. 7 is a schematic cross-sectional view illustrating an OLED according to a sixth embodiment of the present invention.
Figure 8:
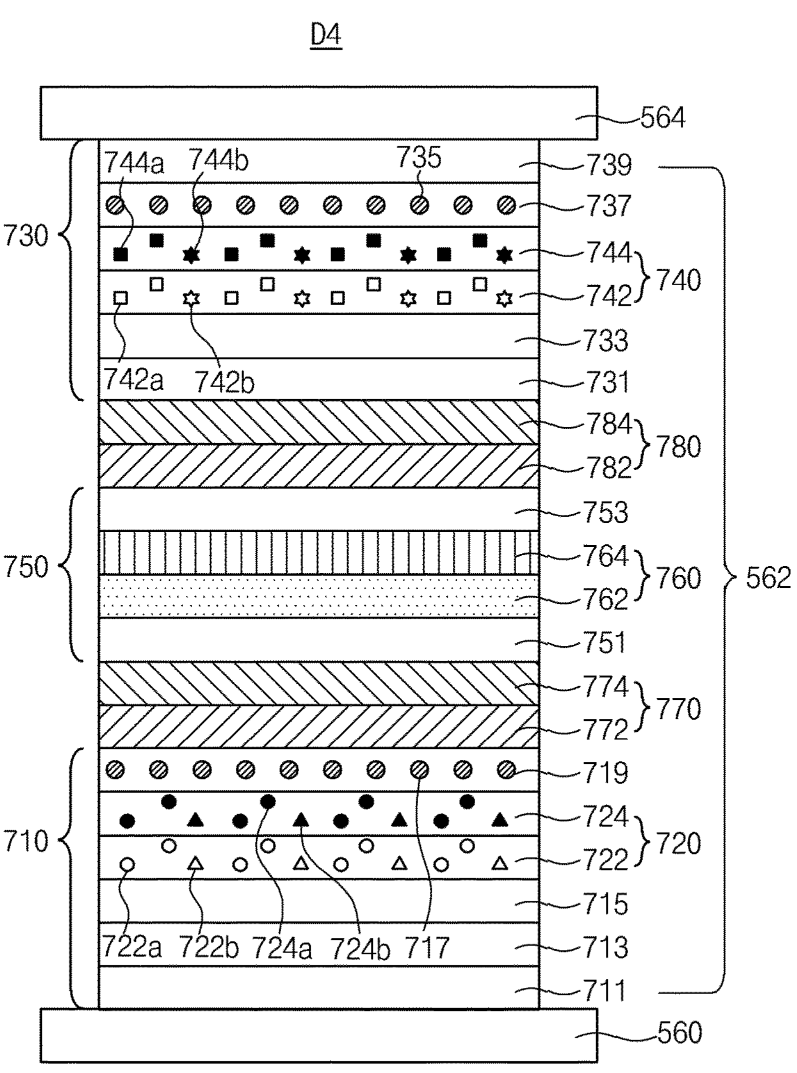
FIG. 8 is a schematic cross-sectional view illustrating an OLED according to a seventh embodiment of the present invention.

FIG. 6 is a schematic cross-sectional view illustrating an organic light emitting display device according to a fifth embodiment of the present invention. FIG. 7 is a schematic cross-sectional view illustrating an OLED according to a sixth embodiment of the present invention, and FIG. 8 is a schematic cross-sectional view illustrating an OLED according to a seventh embodiment of the present invention.

As illustrated in FIG. 6, the organic light emitting display device 500 includes a first substrate 510, where a red pixel RP, a green pixel GP and a blue pixel BP are defined, a second substrate 570 facing the first substrate 510, an OLED D, which is positioned between the first and second substrates 510 and 570 and providing white emission, and a color filter layer 580 between the OLED D and the second substrate 570.

Each of the first and second substrates 510 and 570 may be a glass substrate or a flexible substrate. For example, each of the first and second substrates 510 and 570 may be a polyimide (PI) substrate, a polyethersulfone (PES) substrate, a polyethylenenaphthalate (PEN) substrate, a polyethylene terephthalate (PET) substrate or a polycarbonate (PC) substrate.

A buffer layer 520 is formed on the substrate, and the TFT Tr corresponding to each of the red, green and blue pixels RP, GP and BP is formed on the buffer layer 520. The buffer layer 520 may be omitted.

A semiconductor layer 522 is formed on the buffer layer 520. The semiconductor layer 522 may include an oxide semiconductor material or polycrystalline silicon.

A gate insulating layer 524 is formed on the semiconductor layer 522. The gate insulating layer 524 may be formed of an inorganic insulating material such as silicon oxide or silicon nitride.

A gate electrode 530, which is formed of a conductive material, e.g., metal, is formed on the gate insulating layer 524 to correspond to a center of the semiconductor layer 522.

An interlayer insulating layer 532, which is formed of an insulating material, is formed on the gate electrode 530. The interlayer insulating layer 532 may be formed of an inorganic insulating material, e.g., silicon oxide or silicon nitride, or an organic insulating material, e.g., benzocyclobutene or photo-acryl.

The interlayer insulating layer 532 includes first and second contact holes 534 and 536 exposing both sides of the semiconductor layer 522. The first and second contact holes 534 and 536 are positioned at both sides of the gate electrode 530 to be spaced apart from the gate electrode 530.

A source electrode 540 and a drain electrode 542, which are formed of a conductive material, e.g., metal, are formed on the interlayer insulating layer 532.

The source electrode 540 and the drain electrode 542 are spaced apart from each other with respect to the gate electrode 530 and respectively contact both sides of the semiconductor layer 522 through the first and second contact holes 534 and 536.

The semiconductor layer 522, the gate electrode 530, the source electrode 540 and the drain electrode 542 constitute the TFT Tr. The TFT Tr serves as a driving element. Namely, the TFT Tr may correspond to the driving TFT Td (of FIG. 1).

Although not shown, the gate line and the data line cross each other to define the pixel, and the switching TFT is formed to be connected to the gate and data lines. The switching TFT is connected to the TFT Tr as the driving element.

In addition, the power line, which may be formed to be parallel to and spaced apart from one of the gate and data lines, and the storage capacitor for maintaining the voltage of the gate electrode of the TFT Tr in one frame may be further formed.

A planarization layer 550, which includes a drain contact hole 552 exposing the drain electrode 542 of the TFT Tr, is formed to cover the TFT Tr.

A first electrode 560, which is connected to the drain electrode 542 of the TFT Tr through the drain contact hole 552, is separately formed in each pixel and on the planarization layer 550. The first electrode 560 may be an anode and may be formed of a conductive material having a relatively high work function. For example, the first electrode 560 may be formed of a transparent conductive material, e.g., ITO or IZO.

A reflective electrode or a reflective layer may be further formed under the first electrode 560 on the planarization layer 550. For example, the reflective electrode or the reflective layer may be formed of aluminum-palladium-copper (APC) alloy.

A bank layer 566 is formed on the planarization layer 550 to cover an edge of the first electrode 560. Namely, the bank layer 566 is positioned at a boundary of the pixel and exposes a center of the first electrode 560 in the pixel.

An organic emitting layer 562 is formed on the first electrode 560.

Referring to FIG. 7, the OLED D3 includes the first electrode 560, the second electrode 564 and the organic emitting layer 562 therebetween, and the organic emitting layer 562 includes a first emitting part 610 including a first EML 640 and the first ETL 619 and a second emitting part 650 including a second EML 680. In addition, the organic emitting layer 562 may further include a charge generation layer (CGL) 690 between the first and second emitting parts 610 and 680.

The OLED D3 is positioned to correspond to all of the red, green and blue pixel regions RP, GP and BP.

The CGL 690 is positioned between the first and second emitting parts 610 and 650, and the first emitting part 610, the CGL 690 and the second emitting part 650 are sequentially stacked on the first electrode 560. Namely, the first emitting part 610 is positioned between the first electrode 560 and the CGL 690, and the second emitting part 650 is positioned between the second electrode 564 and the CGL 690.

The first EML 640 in the first emitting part 610 is a blue EML. The first EML 640 includes a first blue emitting layer 620 being closer to the first electrode 160 and a second blue emitting layer 630 being closer to the second electrode 564 and adjacent to the first blue emitting layer 620. Namely, the second blue emitting layer 630 is disposed between the first blue emitting layer 620 and the second electrode 564 and contacts the first blue emitting layer 620.

The first EML 640 may have a thickness of 100 to 500 Å. A summation of a thickness of the first blue emitting layer 620 and a thickness of the second blue emitting layer 630 is equal to a thickness of the first EML 640, and the thickness of the first blue emitting layer 620 and the thickness of the second blue emitting layer 630 may be same or different. Each of the thickness of the first blue emitting layer 620 and the thickness of the second blue emitting layer 630 may be 50 to 250 Å, e.g., 70 to 150 Å.

The first host 622 includes at least one of the first host compounds represented by Formula 1, and the first dopant 624 is represented by Formula 3. In an aspect of the present invention, the first host 622 may be represented by Formula 1a, and the first dopant 624 may be represented by Formula 3a. For example, the first host 622 may include at least one of the compounds in Formula 2, and the first dopant 624 may include at least one of the compounds in Formula 4.

The first host 622 is a partially or wholly deuterated anthracene derivative. For example, the first host 622 may have a first deuteration ratio of about 1 to 100%, e.g., about 30 to 100%.

The second blue emitting layer 630 includes a second host 632 and a second dopant (e.g., a second emitter) 634. In the second blue emitting layer 630, the second host 632 may have a weight % (wt %) of 80 to 99, preferably 95 to 99, and the second dopant 634 may have a wt % of 1 to 20, preferably 1 to 5.

The second host 632 includes at least one of the first host compounds represented by Formula 5, and the second dopant 634 is represented by Formula 7. In an aspect of the present invention, the second host 632 may be represented by Formula 5a, and the second dopant 634 may be represented by Formula 7a. For example, the second host 632 may include at least one of the compounds in Formula 6, and the second dopant 634 may include at least one of the compounds in Formula 8.

The second host 632 is a non-deuterated or partially deuterated anthracene derivative. Namely, the second host 632 has a second deuteration ratio smaller than the first deuteration ratio of the first host 622. For example, the second deuteration ratio of the second host 632 may be 0 to 99%, e.g., 0 to 75%.

A weight % of the first host 622 in the first blue emitting layer 620 and a weight % of the second host 632 in the second blue emitting layer 630 may be same or different, and a weight % of the first dopant 624 in the first blue emitting layer 620 and a weight % of the second dopant 634 in the second blue emitting layer 630 may be same or different.

The first dopant 624 included in the first blue emitting layer 620, which is disposed to be closer to the first electrode 160 as an anode for injecting a hole, has a relatively high HOMO energy level, i.e., a shallow HOMO system, and the second dopant 634 included in the second blue emitting layer 630, which is disposed to be closer to the second electrode 164 as a cathode for injecting an electron, has a relatively low HOMO energy level, i.e., a deep HOMO system. Namely, the first dopant 624 may have a first HOMO energy level, and the second dopant 634 may have a second HOMO energy level lower than the first HOMO energy level. A difference between the first HOMO energy level and the second HOMO energy level may be 0.5 eV or less.

In addition, the first dopant 624 has a relatively high LUMO energy level, i.e., a shallow LUMO system, and the second dopant 634 has a relatively low LUMO energy level, i.e., a deep LUMO system. Namely, the first dopant 624 has a first LUMO energy level, and the second dopant 634 has a second LUMO energy level lower than the first LUMO energy level.

For example, the first HOMO energy level of the first dopant 624 may be in a range of −5.3 to −5.1 eV, and the second HOMO energy level of the second dopant 634 may be in a range of −5.5 to −5.3 eV. The first LUMO energy level of the first dopant 624 may be in a range of −2.6 to −2.3 eV, and the second LUMO energy level of the second dopant 634 may be in a range of −2.7 to −2.5 eV.

The HOMO energy level of the first dopant 624 may be higher than that of the first host 622, and the LUMO energy level of the first dopant 624 may be higher than that of the first host 622. The HOMO energy level of the second dopant 634 may be higher than that of the second host 632, and the LUMO energy level of the second dopant 634 may be higher than that of the second host 632.

The HOMO energy level of the first host 622 and the HOMO energy level of the second host 632 may be same or different, and the LUMO energy level of the first host 622 and the LUMO energy level of the second host 632 may be same or different. Each of the HOMO energy level of the first host 622 and the HOMO energy level of the second host 632 may be in a range of −6.0 to −5.8 eV, and each of the LUMO energy level of the first host 622 and the LUMO energy level of the second host 632 may be in a range of −3.1 to −2.9 eV.

The first dopant 624 included in the first blue emitting layer 620, which is disposed to be closer to the first electrode 160 as an anode for injecting a hole, has a relatively small triplet energy, and the second dopant 634 included in the second blue emitting layer 630, which is disposed to be closer to the second electrode 164 as a cathode for injecting an electron, has a relatively large triplet energy level. Namely, the first dopant 624 has a first triplet energy, and the second dopant 634 has a second triplet energy greater than the first triplet energy.

For example, the first triplet energy of the first dopant 624 may be 2.5 eV or less, e.g., in a range of 2.3 to 2.5 eV, and the second triplet energy of the second dopant 634 may be in a range of 2.5 to 2.7 eV.

The triplet energy of the first dopant 624 may be greater than that of the first host 622, and the triplet energy of the second dopant 634 may be greater than that of the second host 632. The triplet energy of the first host 622 and the triplet energy of the second host 632 may be same or different. The triplet energy of the first host 622 and the triplet energy of the second host 632 may be in a range of 1.6 to 2.0 eV.

Namely, in the first blue EML 640, the first host 622 in the first blue emitting layer 620 and the second host 632 in the second blue emitting layer 630 have the same chemical structure and different deuteration ratios, and the first dopant 624 in the first blue emitting layer 620 and the second dopant 634 in the second blue emitting layer 630 have different chemical structures and different electro-optic property, e.g., a HOMO energy level, a LUMO energy level or a triplet energy.

The first ETL 619 is positioned between the first blue EML 340 and the second emitting part 650. The first ETL 619 may have a thickness of 100 to 500 Å, preferably 200 to 400 Å.

The first ETL 619 includes at least one of a first electron transporting material 617 including a compound represented by Formula 9, e.g., a first electron transporting material, and a compound represented by Formula 10, e.g., a second electron transporting material. For example, the first ETL 619 may include both the compound represented by Formula 9 as the first electron transporting material and the compound represented by Formula 10 as the second electron transporting material. In an aspect of the present invention, the first ETL 619 may include one of the compounds in Formula 11 and one of the compounds in Formula 12.

Each of a HOMO energy level of the first electron transporting material of the first ETL 619 and a HOMO energy level of the second electron transporting material of the first ETL 619 may be lower than that of the second dopant 634. Each of a LUMO energy level of the first electron transporting material of the first ETL 619 and a LUMO energy level of the second electron transporting material of the first ETL 619 may be lower than that of the second dopant 634.

A triplet energy of the first electron transporting material of the first ETL 619 may be smaller than that of the first dopant 624, and a triplet energy of the second electron transporting material of the first ETL 619 may be greater than that of the first dopant 624 and smaller than that of the second dopant 634.

The first electron transporting material may have a first dipole moment, and the second electron transporting material may have a second dipole moment smaller than the first dipole moment.

The first emitting part 610 may further include a first HTL 613 disposed under the first blue EML 640. Namely, the first HTL 613 may be disposed between the first blue EML 640 and the first electrode 560.

The first emitting part 610 may further include an HIL 611 between the first HTL 613 and the first electrode 560.

The first emitting part 610 may further include a first EBL 615 between the first blue EML 640 and the first HTL 613.

For example, the first emitting part 610 may have a structure of the HIL 611, the first HTL 613, the first EBL 615, the first blue emitting layer 620, the second blue emitting layer 630 and the first ETL 619 sequentially stacked on the first electrode 560. When the first ETL 619 includes both the first electron transporting material represented by Formula 9 and the second electron transporting material represented by Formula 10, the first ETL 619 can have a hole blocking function with an electron transporting function. In this structure, the first blue emitting layer 620 contacts the first EBL 615 and is spaced apart from the first HTL 613, while the second blue emitting layer 630 contacts the first ETL 619.

Alternatively, the first emitting part 610 may further include a first hole blocking layer (HBL) between the first blue EML 640 and the first ETL 619. In this case, the first emitting part 610 may have a structure of the HIL 611, the first HTL 613, the first EBL 615, the first blue emitting layer 620, the second blue emitting layer 630, the first HBL and the first ETL 619 sequentially stacked on the first electrode 560. In this structure, the first blue emitting layer 620 contacts the first EBL 615 and is spaced apart from the first HTL 613, and the second blue emitting layer 630 contacts the first HBL and is spaced apart from the first ETL 619.

The second EML 680 in the second emitting part 650 may be a yellow-green EML. The second EML 680 may include a yellow-green host and a yellow-green dopant. For example, the yellow-green dopant may be one of a fluorescent compound, a phosphorescent compound and a delayed fluorescent compound.

In the second EML 680, the yellow-green host may have a weight % of about 70 to 99.9, and the yellow-green dopant may have a weight % of about 0.1 to 10, preferably about 1 to 5.

For example, the yellow-green host may be selected from the group consisting of mCP-CN, CBP, mCBP, mCP, DPEPO, 2,8-bis(diphenylphosphoryl)dibenzothiophene (PPT), TmPyPB, PYD-2Cz, 2,8-di(9H-carbazol-9-yl)dibenzothiophene (DCzDBT), 3',5'-di(carbazol-9-yl)-[1,1'-biphenyl]-3,5-dicarbonitrile (DCzTPA), 4'-(9H-carbazol-9-yl)biphenyl-3,5-dicarbonitrile(4'-(9H-carbazol-9-yl)biphenyl-3,5-dicarbonitrile (pCzB-2CN), 3'-(9H-carbazol-9-yl) biphenyl-3,5-dicarbonitrile (mCzB-2CN), TSPO1, and 9-(9-phenyl-9H-carbazol-6-yl)-9H-carbazole (CCP), but it is not limited thereto.

For example, the yellow-green dopant may be selected from the group consisting of 5,6,11,12-tetraphenylnaphthalene (Rubrene), 2,8-di-tert-butyl-5,11-bis(4-tert-butylphenyl)-6,12-diphenyltetracene (TBRb), bis(2-phenylbenzothiazolato)(acetylacetonate)iridium(III) (Ir(BT)2(acac)), bis(2-(9,9-diethyl-fluoren-2-yl)-1-phenyl-1H-benzo[d]imdiazolato)(acetylacetonate)iridium(III) (Ir(fbi)2(acac)), bis(2-phenylpyridine)(3-(pyridine-2-yl)-2H-chromen-2-onate)iridium(III) (fac-Ir(ppy)2Pc), bis(2-(2,4-difluorophenyl)quinoline)(picolinate)iridium(III) (FPQIrpic), and bis(4-phenylthieno[3,2-c]pyridinato-N,C2') (acetylacetonate) iridium(III) (PO-01), but it is not limited thereto.

The second emitting part 650 may further include at least one of a second HTL 651 disposed under the second EML 680 and a second ETL 657 disposed over the second EML 680. Namely, the second HTL 651 is positioned between the second EML 680 and the first emitting part 610, and the second ETL 657 is positioned between the second EML 680 and the second electrode 564.

The second emitting part 650 may further include an EIL 659 between the second ETL 657 and the second electrode 564.

The second emitting part 650 may further include a second EBL 653 between the second blue EML 680 and the second HTL 651 and a second HBL 655 between the second EML 680 and the second ETL 657.

The HIL 611 may include the above-mentioned hole injection material and may have a thickness of 10 to 100 Å.

Each of the first and second HTLs 613 and 651 may include the above-mentioned hole transporting material and may have a thickness of 500 to 1500 Å, preferably 700 to 1300 Å.

The second ETL 657 may include the above-mentioned electron transporting material. For example, the second ETL 657 may include at least one of the first electron transporting material of Formula 9 and the second electron transporting material of Formula 10 or other electron transporting material other than the electron transporting materials in Formulas 9 and 10. The second ETL 657 may have a thickness of 100 to 500 Å, preferably 200 to 400 Å.

The EIL 659 may include the above-mentioned electron injection material and may have a thickness of 50 to 400 Å, preferably 100 to 300 Å.

Each of the first and second EBLs 615 and 653 may include the above-mentioned electron blocking material and may have a thickness of 10 to 300 Å.

Each of the first HBL and the second HBL 655 may include the above-mentioned hole blocking material and may have a thickness of 100 to 500 Å, preferably 200 to 400 Å.

A HOMO energy level of the electron blocking material, e.g., a compound in Formula 13, in the first ETL 615 may be lower than each of a HOMO energy level of the first dopant 624 and a HOMO energy level of the second dopant 634.

A HOMO energy level and a LUMO energy of the electron blocking material, e.g., a compound in Formula 13, in the first ETL 615 may be higher than a HOMO energy level and a LUMO energy of the first host 622, respectively.

The HOMO energy level of the electron blocking material, i.e., the compound in Formula 13, in the first ETL 615 may be in a range of −5.8 to −5.6 eV, and a LUMO energy level of the electron blocking material, i.e., the compound in Formula 13, in the first ETL 615 may be in a range of −2.6 to −2.3 eV.

The CGL 690 is positioned between the first and second emitting parts 610 and 650. Namely, the first and second emitting parts 610 and 650 are connected through the CGL 690. The CGL 390 may be a P-N junction CGL of an N-type CGL 692 and a P-type CGL 694.

The N-type CGL 692 is positioned between the first HBL 617 and the second HTL 651, and the P-type CGL 694 is positioned between the N-type CGL 692 and the second HTL 651.

The N-type CGL 692 may include the above-mentioned N-type charge generation material, and the P-type CGL 694 may include the above-mentioned P-type charge generation material.

In FIG. 7, the first EML 640 between the first electrode 560 and the CGL 690 is the blue EML including the first and second blue emitting layers 620 and 630, while the second EML 680 between the second electrode 564 and the CGL 690 is the yellow-green EML.

Alternatively, the first EML 640 between the first electrode 560 and the CGL 690 may be the yellow-green EML, while the second EML 680 between the second electrode 564 and the CGL 690 may be the blue EML including the first and second blue emitting layers 620 and 630.

In the OLED D3 of the present invention, the first emitting part 610 includes the first EML 640 and the first ETL 619, and the first EML 640 includes the first blue emitting material layer 620, which includes the first host 622 and the first dopant 624 and is disposed to be closer to the first electrode 560 as an anode, and the second blue emitting material layer 630, which includes the second host 632 and the second dopant 634 and is disposed to be closer to the second electrode 564 as a cathode. In this case, the first host 622 includes at least one of the first host compounds represented by Formula 1, and the second host 632 includes at least one of the second host compounds represented by Formula 5, the first dopant 624 is represented by Formula 3, and the second dopant 634 is represented by Formula 7. In addition, the first ETL 619 includes at least one of the first electron transporting material represented by Formula 9 and the second electron transporting material represented by Formula 10.

Accordingly, the OLED D3 and the organic light emitting display device 500 may have an advantage in at least one a driving voltage, an emitting efficiency and a lifespan.

In the OLED D3 of the present invention, the first emitting part 610 includes the first EML 640 and the first ETL 619, and the first EML 640 includes the first blue emitting material layer 620, which includes the first host 622 and the first dopant 624 and is disposed to be closer to the first electrode 560 as an anode, and the second blue emitting material layer 630, which includes the second host 632 and the second dopant 634 and is disposed to be closer to the second electrode 564 as a cathode. In this case, a deuteration ratio of the second host 632 in the second blue emitting layer 630, which is closer to the second electrode 564 as a cathode, is smaller than that of the first host 622 in the first blue emitting layer 620, which is closer to the first electrode 560 as an anode, a HOMO energy level of the second dopant 634 in the second blue emitting layer 630, which is closer to the second electrode 564 as a cathode, is lower than that of the first dopant 624 in the first blue emitting layer 620, which is closer to the first electrode 560 as an anode, and a triplet energy of the second dopant 634 is greater than that of the first dopant 624. In addition, a HOMO energy level of each of the first electron transporting material and the second electron transporting material in the first ETL 619 has a lower HOMO energy level and a greater triplet energy than the second dopant 634.

Accordingly, the OLED D3 and the organic light emitting display device 100 may have an advantage in at least one a driving voltage, an emitting efficiency and a lifespan.

In addition, the OLED D3 including the first emitting part 610, which emits a blue light, and the second emitting part 650, which emits a yellow-green light, can provide a white light.

Referring to FIG. 8, the OLED D4 includes the first electrode 560, the second electrode 564 and the organic emitting layer 562 therebetween, and the organic emitting layer 562 includes a first emitting part 710 including a first EML 720 and a first ETL 719, a second emitting part 730 including a second EML 740 and a second ETL 737 and a third emitting part 750 including a third EML 760. In addition, the organic emitting layer 562 may further include a first CGL 770 between the first and third emitting parts 710 and 750 and a second CGL 780 between the second and third emitting parts 730 and 750.

The OLED D4 is positioned to correspond to all of the red, green and blue pixel regions RP, GP and BP.

The first CGL 770 is positioned between the first and third emitting parts 710 and 750, and the second CGL 780 is positioned between the second and third emitting parts 730 and 750. Namely, the first emitting part 710, the first CGL 770, the third emitting part 750, the second CGL 780 and the second emitting part 730 may be sequentially stacked on the first electrode 560. In other words, the first emitting part 710 may be positioned between the first electrode 560 and the first CGL 770, the third emitting part 750 may be positioned between the first and second CGLs 770 and 780, and the second emitting part 730 may be positioned between the second CGL 780 and the second electrode 564.

The first EML 720 in the first emitting part 710 is a blue EML. The first EML 720 includes a first blue emitting layer 722 being closer to the first electrode 560 and a second blue emitting layer 724 being closer to the second electrode 564 and adjacent to the first blue emitting layer 722. Namely, the second blue emitting layer 724 is disposed between the first blue emitting layer 722 and the second electrode 564 and contacts the first blue emitting layer 722.

The first EML 720 may have a thickness of 100 to 500 Å. A summation of a thickness of the first blue emitting layer 722 and a thickness of the second blue emitting layer 724 is equal to a thickness of the first EML 720, and the thickness of the first blue emitting layer 722 and the thickness of the second blue emitting layer 724 may be same or different. Each of the thickness of the first blue emitting layer 722 and the thickness of the second blue emitting layer 724 may be 50 to 250 Å, e.g., 70 to 150 Å.

In an aspect of the present invention, the thickness of the first blue emitting layer 722 may be smaller than that of the second blue emitting layer 724. For example, the first blue emitting layer 722 may have a thickness of 20 to 100 Å, and the second blue emitting layer 724 may have a thickness of 150 to 250 Å.

The first blue emitting layer 720 includes a first host **722*a* and a first dopant (e.g., a first emitter) 722*b*. In the first blue emitting layer 720, the first host 722*a* may have a weight % (wt %) of 80 to 99, preferably 95 to 99, and the first dopant 722*b*** may have a wt % of 1 to 20, preferably 1 to 5.

The second blue emitting layer 724 includes a second host **724*a* and a second dopant (e.g., a second emitter) 724*b*. In the second blue emitting layer 724, the second host 724*a* may have a weight % (wt %) of 80 to 99, preferably 95 to 99, and the second dopant 724*b*** may have a wt % of 1 to 20, preferably 1 to 5.

The first host **722*aa* includes at least one of the first host compounds represented by Formula 1, and the first dopant 722*b* is represented by Formula 3. In an aspect of the present invention, the first host 722*a* may be represented by Formula 1a, and the first dopant 722b may be represented by Formula 3a. For example, the first host 722a may include at least one of the compounds in Formula 2, and the first dopant 722b** may include at least one of the compounds in Formula 4.

The first host 722a is a partially or wholly deuterated anthracene derivative. For example, the first host 722a may have a first deuteration ratio of about 1 to 100%, e.g., about 30 to 100%.

The second blue emitting layer 724 includes a second host 724a and a second dopant (e.g., a second emitter) 724b. In the second blue emitting layer 724, the second host 724a may have a weight % (wt %) of 80 to 99, preferably 95 to 99, and the second dopant 724b may have a wt % of 1 to 20, preferably 1 to 5.

The second host 724a includes at least one of the first host compounds represented by Formula 5, and the second dopant 724b is represented by Formula 7. In an aspect of the present invention, the second host 724a may be represented by Formula 5a, and the second dopant 724b may be represented by Formula 7a. For example, the second host 724a may include at least one of the compounds in Formula 6, and the second dopant 724b may include at least one of the compounds in Formula 8.

The second host 724a is a non-deuterated or partially deuterated anthracene derivative. Namely, the second host 724a has a second deuteration ratio smaller than the first deuteration ratio of the first host 722a. For example, the second deuteration ratio of the second host 724a may be 0 to 99%, e.g., 0 to 75%.

A weight % of the first host 722a in the first blue emitting layer 720 and a weight % of the second host 724a in the second blue emitting layer 724 may be same or different, and a weight % of the first dopant 722b in the first blue emitting layer 720 and a weight % of the second dopant 724b in the second blue emitting layer 724 may be same or different.

The first dopant 722b included in the first blue emitting layer 720, which is disposed to be closer to the first electrode 560 as an anode for injecting a hole, has a relatively high HOMO energy level, i.e., a shallow HOMO system, and the second dopant 724b included in the second blue emitting layer 724, which is disposed to be closer to the second electrode 564 as a cathode for injecting an electron, has a relatively low HOMO energy level, i.e., a deep HOMO system. Namely, the first dopant 722b may have a first HOMO energy level, and the second dopant 724b may have a second HOMO energy level lower than the first HOMO energy level. A difference between the first HOMO energy level and the second HOMO energy level may be 0.5 eV or less.

In addition, the first dopant 722b has a relatively high LUMO energy level, i.e., a shallow LUMO system, and the second dopant 724b has a relatively low LUMO energy level, i.e., a deep LUMO system. Namely, the first dopant 722b has a first LUMO energy level, and the second dopant 724b has a second LUMO energy level lower than the first LUMO energy level.

For example, the first HOMO energy level of the first dopant 722b may be in a range of −5.3 to −5.1 eV, and the second HOMO energy level of the second dopant 724b may be in a range of −5.5 to −5.3 eV. The first LUMO energy level of the first dopant 722b may be in a range of −2.6 to −2.3 eV, and the second LUMO energy level of the second dopant 724b may be in a range of −2.7 to −2.5 eV.

The HOMO energy level of the first dopant 722b may be higher than that of the first host 722a, and the LUMO energy level of the first dopant 722b may be higher than that of the first host 722a. The HOMO energy level of the second dopant 724b may be higher than that of the second host 724a, and the LUMO energy level of the second dopant 724b may be higher than that of the second host 724a.

The HOMO energy level of the first host 722a and the HOMO energy level of the second host 724a may be same or different, and the LUMO energy level of the first host 722a and the LUMO energy level of the second host 724a may be same or different. Each of the HOMO energy level of the first host 722a and the HOMO energy level of the second host 724a may be in a range of −6.0 to −5.8 eV, and each of the LUMO energy level of the first host 722a and the LUMO energy level of the second host 724a may be in a range of −3.1 to −2.9 eV.

The first dopant 722b included in the first blue emitting layer 720, which is disposed to be closer to the first electrode 560 as an anode for injecting a hole, has a relatively small triplet energy, and the second dopant 724b included in the second blue emitting layer 724, which is disposed to be closer to the second electrode 564 as a cathode for injecting an electron, has a relatively large triplet energy level. Namely, the first dopant 722b has a first triplet energy, and the second dopant 724b has a second triplet energy greater than the first triplet energy.

For example, the first triplet energy of the first dopant 722b may be 2.5 eV or less, e.g., in a range of 2.3 to 2.5 eV, and the second triplet energy of the second dopant 724b may be in a range of 2.5 to 2.7 eV.

The triplet energy of the first dopant 722b may be greater than that of the first host 722a, and the triplet energy of the second dopant 724b may be greater than that of the second host 724a. The triplet energy of the first host 722a and the triplet energy of the second host 724a may be same or different. The triplet energy of the first host 722a and the triplet energy of the second host 724a may be in a range of 1.6 to 2.0 eV.

Namely, in the first blue EML 720, the first host 722a in the first blue emitting layer 720 and the second host 724a in the second blue emitting layer 724 have the same chemical structure and different deuteration ratios, and the first dopant 722b in the first blue emitting layer 720 and the second dopant 724b in the second blue emitting layer 724 have different chemical structures and different electro-optic property, e.g., a HOMO energy level, a LUMO energy level or a triplet energy.

The first ETL 719 is positioned between the first blue EML 720 and the second emitting part 750. The first ETL 719 may have a thickness of 100 to 500 Å, preferably 200 to 400 Å.

The first ETL 719 includes a first electron transporting material 717 including at least one of a compound represented by Formula 9, e.g., a first electron transporting material, and a compound represented by Formula 10, e.g., a second electron transporting material. For example, the first ETL 719 may include both the compound represented by Formula 9 as the first electron transporting material and the compound represented by Formula 10 as the second electron transporting material. In an aspect of the present invention, the first ETL 719 may include one of the compounds in Formula 11 and one of the compounds in Formula 12.

Each of a HOMO energy level of the first electron transporting material of the first ETL 719 and a HOMO energy level of the second electron transporting material of the first ETL 719 may be lower than that of the second dopant 724b. Each of a LUMO energy level of the first electron transporting material of the first ETL 719 and a LUMO energy level of the second electron transporting material of the first ETL 719 may be lower than that of the second dopant 724*b*.

A triplet energy of the first electron transporting material of the first ETL 719 may be smaller than that of the first dopant 722*b*, and a triplet energy of the second electron transporting material of the first ETL 719 may be greater than that of the first dopant 722*b* and smaller than that of the second dopant 724*b*.

The first electron transporting material may have a first dipole moment, and the second electron transporting material may have a second dipole moment smaller than the first dipole moment.

The first emitting part 710 may further include a first HTL 713 disposed under the first EML 720. Namely, the first HTL 713 may be disposed between the first EML 720 and the first electrode 560.

The first emitting part 710 may further include an HIL 711 between the first HTL 713 and the first electrode 560.

The first emitting part 710 may further include a first EBL 715 between the first EML 720 and the first HTL 713.

For example, the first emitting part 710 may have a structure of the HIL 711, the first HTL 713, the first EBL 715, the first blue emitting layer 722, the second blue emitting layer 724, and the first ETL 719 sequentially stacked on the first electrode 560. When the first ETL 619 includes both the first electron transporting material represented by Formula 9 and the second electron transporting material represented by Formula 10, the first ETL 319 can have a hole blocking function with an electron transporting function. In this structure, the first blue emitting layer 620 contacts the first EBL 615 and is spaced apart from the first HTL 613, while the second blue emitting layer 330 contacts the first ETL 619.

Alternatively, the first emitting part 710 may further include a first hole blocking layer (HBL) between the first blue EML 720 and the first ETL 719. In this case, the first emitting part 710 may have a structure of the HIL 711, the first HTL 713, the first EBL 715, the first blue emitting layer 722, the second blue emitting layer 724, the first HBL and the first ETL 719 sequentially stacked on the first electrode 560. In this structure, the first blue emitting layer 722 contacts the first EBL 715 and is spaced apart from the first HTL 713, and the second blue emitting layer 724 contacts the first HBL and is spaced apart from the first ETL 719.

The second EML 740 in the second emitting part 730 is a blue EML. The second EML 740 includes a third blue emitting layer 742, which is disposed to be closer to the first electrode 560, and a fourth blue emitting layer 744, which is disposed to be closer to the second electrode 564 and is adjacent to the third blue emitting layer 742. Namely, the fourth blue emitting layer 744 is positioned between the third blue emitting layer 742 and the second electrode 564 and contacts the third blue emitting layer 742.

The second EML 740 may have a thickness of 100 to 500 Å. A summation of a thickness of the third blue emitting layer 742 and a thickness of the fourth blue emitting layer 744 is equal to a thickness of the second EML 740, and the thickness of the third blue emitting layer 742 and the thickness of the fourth blue emitting layer 744 may be same or different. Each of the thickness of the third blue emitting layer 742 and the thickness of the fourth blue emitting layer 744 may be 50 to 250 Å, e.g., 70 to 150 Å.

The third blue emitting layer 742 includes a third host 742*a* and a third dopant (e.g., a third emitter) 742*b*. In the third blue emitting layer 742, the third host 742*a* may have a weight % (wt %) of 80 to 99, preferably 95 to 99, and the third dopant 742*b* may have a wt % of 1 to 20, preferably 1 to 5.

The third host 742*a* includes at least one of the first host compounds represented by Formula 1, and the third dopant 742*b* is represented by Formula 3. In an aspect of the present invention, the third host 742*a* may be represented by Formula 1a, and the third dopant 742*b* may be represented by Formula 3a. For example, the third host 742*a* may include at least one of the compounds in Formula 2, and the third dopant 742*b* may include at least one of the compounds in Formula 4.

The third host 742*a* and the first host 722*a* may be same or different, and the third dopant 742*b* and the first dopant 722*b* may be same or different.

The third host 742*a* is a partially or wholly deuterated anthracene derivative. For example, the third host 742*a* may have a third deuteration ratio of about 1 to 100%, e.g., about 30 to 100%.

The fourth blue emitting layer 744 includes a fourth host 744*a* and a fourth dopant (e.g., a fourth emitter) 744*b*. In the fourth blue emitting layer 744, the fourth host 744*a* may have a weight % (wt %) of 80 to 99, preferably 95 to 99, and the fourth dopant 744*b* may have a wt % of 1 to 20, preferably 1 to 5.

The fourth host 744*a* includes at least one of the first host compounds represented by Formula 5, and the fourth dopant 744*b* is represented by Formula 7. In an aspect of the present invention, the fourth host 744*a* may be represented by Formula 5a, and the fourth dopant 744*b* may be represented by Formula 7a. For example, the fourth host 744*a* may include at least one of the compounds in Formula 6, and the fourth dopant 744*b* may include at least one of the compounds in Formula 8.

The fourth host 744*a* and the second host 724*a* may be same or different, and the fourth dopant 744*b* and the second dopant 724*b* may be same or different.

The fourth host 744*a* is a non-deuterated or partially deuterated anthracene derivative. Namely, the fourth host 744*a* has a fourth deuteration ratio smaller than the third deuteration ratio of the third host 742*a*. For example, the fourth deuteration ratio of the fourth host 744*a* may be 0 to 99%, e.g., 0 to 75%.

A weight % of the third host 742*a* in the third blue emitting layer 742 and a weight % of the fourth host 744*a* in the fourth blue emitting layer 744 may be same or different, and a weight % of the third dopant 742*b* in the third blue emitting layer 742 and a weight % of the fourth dopant 744*b* in the fourth blue emitting layer 744 may be same or different.

The third dopant 742*b* included in the third blue emitting layer 742, which is disposed to be closer to the first electrode 560 as an anode for injecting a hole, has a relatively high HOMO energy level, i.e., a shallow HOMO system, and the fourth dopant 744*b* included in the fourth blue emitting layer 744, which is disposed to be closer to the second electrode 564 as a cathode for injecting an electron, has a relatively low HOMO energy level, i.e., a deep HOMO system. Namely, the third dopant 742*b* may have a third HOMO energy level, and the fourth dopant 744*b* may have a fourth HOMO energy level lower than the third HOMO energy level. A difference between the third HOMO energy level and the fourth HOMO energy level may be 0.5 eV or less.

In addition, the third dopant 742*b* has a relatively high LUMO energy level, i.e., a shallow LUMO system, and the fourth dopant 744*b* has a relatively low LUMO energy level, i.e., a deep LUMO system. Namely, the third dopant 742*b* has a third LUMO energy level, and the fourth dopant 744*b* has a fourth LUMO energy level lower than the third LUMO energy level.

For example, the third HOMO energy level of the third dopant 742*b* may be in a range of −5.3 to −5.1 eV, and the fourth HOMO energy level of the fourth dopant 744*b* may be in a range of −5.5 to −5.3 eV. The third LUMO energy level of the third dopant 742*b* may be in a range of −2.6 to −2.3 eV, and the fourth LUMO energy level of the fourth dopant 744*b* may be in a range of −2.7 to −2.5 eV.

The HOMO energy level of the third dopant 742*b* may be higher than that of the third host 742*a*, and the LUMO energy level of the third dopant 742*b* may be higher than that of the third host 742*a*. The HOMO energy level of the fourth dopant 744*b* may be higher than that of the fourth host 744*a*, and the LUMO energy level of the fourth dopant 744*b* may be higher than that of the fourth host 744*a*.

The HOMO energy level of the third host 742*a* and the HOMO energy level of the fourth host 744*a* may be same or different, and the LUMO energy level of the third host 742*a* and the LUMO energy level of the fourth host 744*a* may be same or different. Each of the HOMO energy level of the third host 742*a* and the HOMO energy level of the fourth host 744*a* may be in a range of −6.0 to −5.8 eV, and each of the LUMO energy level of the third host 742*a* and the LUMO energy level of the fourth host 744*a* may be in a range of −3.1 to −2.9 eV.

The third dopant 742*b* included in the third blue emitting layer 742, which is disposed to be closer to the first electrode 560 as an anode for injecting a hole, has a relatively small triplet energy, and the fourth dopant 744*b* included in the fourth blue emitting layer 744, which is disposed to be closer to the second electrode 564 as a cathode for injecting an electron, has a relatively large triplet energy level. Namely, the third dopant 742*b* has a third triplet energy, and the fourth dopant 744*b* has a fourth triplet energy greater than the third triplet energy.

For example, the third triplet energy of the third dopant 742*b* may be 2.5 eV or less, e.g., in a range of 2.3 to 2.5 eV, and the fourth triplet energy of the fourth dopant 744*b* may be in a range of 2.5 to 2.7 eV.

The triplet energy of the third dopant 742*b* may be greater than that of the third host 742*a*, and the triplet energy of the fourth dopant 744*b* may be greater than that of the fourth host 744*a*. The triplet energy of the third host 742*a* and the triplet energy of the fourth host 744*a* may be same or different. The triplet energy of the third host 742*a* and the triplet energy of the fourth host 744*a* may be in a range of 1.6 to 2.0 eV.

Namely, in the second blue EML 740, the third host 742*a* in the third blue emitting layer 742 and the fourth host 744*a* in the fourth blue emitting layer 744 have the same chemical structure and different deuteration ratios, and the third dopant 742*b* in the third blue emitting layer 742 and the fourth dopant 744*b* in the fourth blue emitting layer 744 have different chemical structures and different electro-optic property, e.g., a HOMO energy level, a LUMO energy level or a triplet energy.

The second ETL 737 is positioned between the second blue EML 740 and the second electrode 564. The second ETL 737 may have a thickness of 100 to 500 Å, preferably 200 to 400 Å.

The second ETL 737 includes a second electron transporting material 735 including at least one of a compound represented by Formula 9, e.g., a first electron transporting material, and a compound represented by Formula 10, e.g., a second electron transporting material. For example, the second ETL 737 may include both the compound represented by Formula 9 as the first electron transporting material and the compound represented by Formula 10 as the second electron transporting material. In an aspect of the present invention, the second ETL 737 may include one of the compounds in Formula 11 and one of the compounds in Formula 12.

Each of a HOMO energy level of the first electron transporting material of the second ETL 737 and a HOMO energy level of the second electron transporting material of the second ETL 737 may be lower than that of the fourth dopant 744*b*. Each of a LUMO energy level of the first electron transporting material of the second ETL 737 and a LUMO energy level of the second electron transporting material of the second ETL 737 may be lower than that of the fourth dopant 744*b*.

A triplet energy of the first electron transporting material of the second ETL 737 may be smaller than that of the third dopant 742*b*, and a triplet energy of the second electron transporting material of the second ETL 737 may be greater than that of the third dopant 742*b* and smaller than that of the fourth dopant 744*b*.

The first electron transporting material may have a first dipole moment, and the second electron transporting material may have a second dipole moment smaller than the first dipole moment.

The second emitting part 730 may further include a second HTL 731 disposed under the second EML 740. Namely, the second HTL 731 is positioned between the second EML 740 and the first emitting part 710.

The second emitting part 730 may further include an EIL 739 between the second ETL 737 and the second electrode 564.

The second emitting part 730 may further include a second EBL 733 between the second EML 740 and the second HTL 731.

For example, the second emitting part 730 may have a structure of the second HTL 731, the second EBL 733, the third emitting layer 742, the fourth emitting layer 744, the second ETL 737 and the EIL 739. When the second ETL 737 includes both the first electron transporting material represented by Formula 9 and the second electron transporting material represented by Formula 10, the second ETL 357 can have a hole blocking function with an electron transporting function. In this structure, the third emitting layer 360 contacts the second EBL 353 and is spaced apart from the second HTL 351, while the fourth emitting layer 370 contacts the second ETL 737.

Alternatively, the second emitting part 730 may further include a second hole blocking layer (HBL) between the second blue EML 740 and the second ETL 737. In this case, the second emitting part 730 may have a structure of the second HTL 731, the second EBL 733, the third emitting layer 742, the fourth emitting layer 744, the second HBL, the second ETL 737 and the EIL 739. In this structure, the third blue emitting layer 742 contacts the second EBL 733 and is spaced apart from the second HTL 731, while the fourth blue emitting layer 744 contacts the second HBL and is spaced apart from the second ETL 737.

The third EML 760 in the third emitting part 750 includes a red emitting layer 762 and a green emitting layer 764 to provide red and green light.

The red emitting layer 762 may include a red host and a red dopant. For example, the red dopant may be one of a fluorescent compound, a phosphorescent compound and a delayed fluorescent compound.

The red host may be selected from the group consisting of mCP-CN, CBP, mCBP, mCP, DPEPO, 2,8-bis(diphenylphosphoryl)dibenzothiophene (PPT), 1,3,5-tri[(3-pyridyl)-phen-3-yl]benzene (TmPyPB), 2,6-di(9H-carbazol-9-yl)pyridine (PYD-2Cz), 2,8-di(9H-carbazol-9-yl) dibenzothiophene (DCzDBT), 3',5'-di(carbazol-9-yl)-[1,1'-biphenyl]-3,5-dicarbonitrile (DCzTPA), 4'-(9H-carbazol-9-yl)biphenyl-3,5-dicarbonitrile(4'-(9H-carbazol-9-yl) biphenyl-3,5-dicarbonitrile (pCzB-2CN), 3'-(9H-carbazol-9-yl)biphenyl-3,5-dicarbonitrile (mCzB-2CN), TSPO1, 9-(9-phenyl-9H-carbazol-6-yl)-9H-carbazole (CCP), 4-(3-(triphenylen-2-yl)phenyl)dibenzo[b,d]thiophene, 9-(4-(9H-carbazol-9-yl)phenyl)-9H-3,9'-bicarbazole, 9-(3-(9H-carbazol-9-yl)phenyl)-9H-3,9'-bicarbazole, 9-(6-(9H-carbazol-9-yl)pyridin-3-yl)-9H-3,9'-bicarbazole, 9,9'-diphenyl-9H,9'H-3,3'-bicarbazole (BCzPh), 1,3,5-tris(carbazole-9-yl)benzene (TCP), TCTA, 4,4'-bis(carbazole-9-yl)-2,2'-dimethylbiphenyl (CDBP), 2,7-bis(carbazole-9-yl)-9,9-dimethylfluorene (DMFL-CBP), 2,2',7,7'-tetrakis(carbazole-9-yl)-9,9-spirofluorene (Spiro-CBP), and 3,6-bis(carbazole-9-yl)-9-(2-ethyl-hexyl)-9H-carbazole; TCz1), but it is not limited thereto.

The red dopant may be selected from the group consisting of [bis(2-(4,6-dimethyl)phenylquinoline)](2,2,6,6-tetramethylheptane-3,5-dionate)iridium(III), bis[2-(4-n-hexylphenyl)quinoline](acetylacetonate)iridium(III) (Hex-Ir(phq)2 (acac)), tris[2-(4-n-hexylphenyl)quinoline]iridium(III) (Hex-Ir(phq)3), tris[2-phenyl-4-methylquinoline]iridium (III) (Ir(Mphq)3), bis(2-phenylquinoline)(2,2,6,6-tetramethylheptene-3,5-dionate)iridium(III) (Ir(dpm)PQ2), bis(phenylisoquinoline)(2,2,6,6-tetramethylheptene-3,5-dionate) iridium(III) (Ir(dpm)(piq)2), bis[(4-n-hexylphenyl) isoquinoline](acetylacetonate)iridium(III) (Hex-Ir(piq)2 (acac)), tris[2-(4-n-hexylphenyl)quinoline]iridium(III) (Hex-Ir(piq)3), tris(2-(3-methylphenyl)-7-methyl-quinolato)iridium (Ir(dmpq)3), bis[2-(2-methylphenyl)-7-methyl-quinoline](acetylacetonate)iridium(III) (Ir(dmpq)2(acac)), bis[2-(3,5-dimethylphenyl)-4-methyl-quinoline](acetylacetonate)iridium(III) (Ir(mphmq)2(acac)), and tris(dibenzoylmethane)mono(1,10-phenanthroline)europium(III) (Eu (dbm)3(phen)), but it is not limited thereto.

The green emitting layer 764 may include a green host and a green dopant. For example, the green dopant may be one of a fluorescent compound, a phosphorescent compound and a delayed fluorescent compound.

The green host may be one of the materials for the yellow-green host.

The green dopant may be selected from the group consisting of bis(2-phenylpyridine)](pyridyl-2-benzofuro[2,3-b]pyridine)iridium), tris[2-phenylpyridine]iridium(III) (Ir (ppy)3), fac-tris(2-phenylpyridine)iridium(III) (fac-Ir(ppy) 3), bis(2-phenylpyridine)(acetylacetonate)iridium(III) (Ir (ppy)2(acac)), tris[2-(p-tolyl)pyridine]iridium(III) (Ir (mppy)3), bis(2-(naphthalene-2-yl)pyridine) (acetylacetonate)iridium(III) (Ir(npy)2acac), tris(2-phenyl-3-methyl-pyridine)iridium (Ir(3mppy)3), and fac-tris(2-(3-p-xylyl)phenyl)pyridine iridium(III) (TEG), but it is not limited thereto.

In an aspect, the third EML 760 in the third emitting part 750 may further include a yellow-green emitting layer to have a triple-layered structure. The yellow-green emitting layer may include the above-mentioned yellow-green host and the above-mentioned yellow-green dopant. In another aspect, the yellow-green EML may be included instead of the third emitting part 760.

The third emitting part 750 may further include at least one of a third HTL 751 under the third EML 760 and a third ETL 753 on the third EML 760.

In addition, the third emitting part 750 may further include at least one of a third EBL between the third HTL 751 and the third EML 760 and a third HBL between the third EML 760 and the third ETL 753.

The HIL 711 may include the above-mentioned hole injection material and may have a thickness of 10 to 100 Å.

Each of the first to third HTLs 713, 731 and 751 may include the above-mentioned hole transporting material and may have a thickness of 500 to 1500 Å, preferably 700 to 1300 Å.

The third ETL 753 may include the above-mentioned electron transporting material. For example, the third ETL 753 may include at least one of the first electron transporting material in Formula 9 and the first electron transporting material in Formula 10 or other electron transporting material other than the electron transporting materials in Formulas 9 and 10. The third ETL 753 may a thickness of 100 to 500 Å, preferably 200 to 400 Å.

The EIL 739 may include the above-mentioned electron injection material and may have a thickness of 50 to 400 Å, preferably 100 to 300 Å.

Each of the first EBL 715, the second EBL 733 and the third EBL may include the above-mentioned electron blocking material and may have a thickness of 10 to 300 Å.

Each of the first HBL, the second HBL and the third HBL may include the above-mentioned hole blocking material and may have a thickness of 100 to 500 Å, preferably 200 to 400 Å.

A HOMO energy level of the electron blocking material, e.g., a compound in Formula 13, in the first ETL 715 may be lower than each of a HOMO energy level of the first dopant 724*b* and a HOMO energy level of the second dopant 744*b*. A HOMO energy level of the electron blocking material, e.g., a compound in Formula 13, in the second ETL 733 may be lower than each of a HOMO energy level of the third dopant 742*b* and a HOMO energy level of the fourth dopant 744*b*.

A HOMO energy level and a LUMO energy of the electron blocking material, e.g., a compound in Formula 13, in the first ETL 715 may be higher than a HOMO energy level and a LUMO energy of the first host 722*a*, respectively. A HOMO energy level and a LUMO energy of the electron blocking material, e.g., a compound in Formula 13, in the second ETL 73 may be higher than a HOMO energy level and a LUMO energy of the third host 742*a*, respectively.

The HOMO energy level of the electron blocking material, i.e., the compound in Formula 13, in each of the first and second EBLs 715 and 733 may be in a range of −5.8 to −5.6 eV, and a LUMO energy level of the electron blocking material, i.e., the compound in Formula 13, in each of the first and second EBLs 715 and 733 may be in a range of −2.6 to −2.3 eV.

The first CGL 770 is positioned between the first and third emitting parts 710 and 750, and the second CGL 780 is positioned between the second and third emitting parts 730 and 750. Namely, the first and third emitting parts 710 and 750 may be connected to each other through the first CGL 770, and the second and third emitting parts 730 and 750 may be connected to each other through the second CGL 780. The first CGL 770 may be a P-N junction CGL of a first N-type CGL 772 and a first P-type CGL 774, and the second CGL 780 may be a P-N junction CGL of a second N-type CGL 782 and a second P-type CGL 784.

In the first CGL 770, the first N-type CGL 772 is positioned between the first ETL 719 and the third HTL 751, and the first P-type CGL 774 is positioned between the first N-type CGL 772 and the third HTL 751.

In the second CGL 780, the second N-type CGL 782 is positioned between the third ETL 753 and the second HTL 731, and the second P-type CGL 784 is positioned between the second N-type CGL 782 and the second HTL 731.

Each of the first and second N-type CGLs 772 and 782 may include the above-mentioned N-type charge generation material, and each of the first and second P-type CGLs 774 and 784 may include the above-mentioned P-type charge generation material.

In FIG. 8, the first EML 720 has a double-layered structure including the first and second blue emitting layers 722 and 724, and the second EML 740 has a double-layered structure including the third and fourth blue emitting layers 742 and 744.

Alternatively, one of the first and second EMLs 720 and 740 may have a double-layered structure, while the other one of the first and second EMLs 720 and 740 may have a single-layered structure. In this instance, the other one of the first and second EMLs 720 and 740 may include a blue host and a blue dopant. The blue host may be the above-mentioned blue host material, and the blue dopant may be the above-mentioned blue dopant material.

The OLED D4 of the present invention includes the first emitting part 710 including the first EML 720 (e.g., a first blue EML) and the first ETL 719, the second emitting part 730 including the second EML 740 (e.g., a second blue EML) and the second ETL 737 and the third emitting part 750 including the third EML 760, which includes the red and green emitting layers 762 and 764, and at least one of the first and second blue EMLs 720 and 740 includes a first blue emitting layer including a first host and a first dopant and a second blue emitting layer including a second host and a second dopant. In this case, the first host includes at least one of the first host compounds represented by Formula 1, the second host includes at least one of the second host compounds represented by Formula 5, the first dopant is represented by Formula 3, and the second dopant is represented by Formula 7. In addition, at least one of the electron transporting material 717 of the first ETL 719 and the transporting material 735 of the second ETL 737 include at least one of the first electron transporting material represented by Formula 9 and the second electron transporting material represented by Formula 10.

Accordingly, the OLED D4 and the organic light emitting display device 500 may have an advantage in at least one a driving voltage, an emitting efficiency and a lifespan.

The OLED D4 of the present invention includes the first emitting part 710 including the first EML 720 (e.g., a first blue EML) and the first ETL 719, the second emitting part 730 including the second EML 740 (e.g., a second blue EML) and the second ETL 737 and the third emitting part 750 including the third EML 760, which includes the red and green emitting layers 762 and 764, and at least one of the first and second blue EMLs 720 and 740 includes a first blue emitting layer including a first host and a first dopant and a second blue emitting layer including a second host and a second dopant. In this case, a deuteration ratio of the second host in the second blue emitting layer, which is closer to the second electrode 564 as a cathode, is smaller than that of the first host in the first blue emitting layer, which is closer to the first electrode 560 as an anode, a HOMO energy level of the second dopant in the second blue emitting layer, which is closer to the second electrode 564 as a cathode, is lower than that of the first dopant in the first blue emitting layer, which is closer to the first electrode 560 as an anode, and a triplet energy of the second dopant is greater than that of the first dopant. In addition, at least one of the electron transporting material 717 of the first ETL 719 and the transporting material 735 of the second ETL 737 include at least one of the first electron transporting material represented by Formula 9 and the second electron transporting material represented by Formula 10, each of the first and second electron transporting materials has a HOMO energy level lower than the second dopant **724*b* or the fourth dopant 744*b***.

Accordingly, the OLED D4 and the organic light emitting display device 500 may have an advantage in at least one a driving voltage, an emitting efficiency and a lifespan.

In addition, the OLED D4 includes the first and second emitting parts 710 and 730 each providing a blue emission and the third emitting part 750 providing a red-green emission such that the OLED D4 can provide a white emission.

The OLED D4 in FIG. 8 has a three-stack structure including the first, second and third emitting parts 710, 730 and 750. The OLED D4 may further include additional emitting part and additional CGL.

Referring to FIG. 6 again, a second electrode 564 is formed over the substrate 510 where the organic emitting layer 562 is formed.

In the organic light emitting display device 500, since the light emitted from the organic emitting layer 562 is incident to the color filter layer 580 through the second electrode 564, the second electrode 564 has a thin profile for transmitting the light.

The first electrode 560, the organic emitting layer 562 and the second electrode 564 constitute the OLED D.

The color filter layer 580 is disposed over the OLED D and includes a red color filter 582, a green color filter 584 and a blue color filter 586 respectively corresponding to the red pixel region RP, the green pixel region GP and the blue pixel region BP.

The color filter layer 580 may be attached to the OLED D using an adhesive layer. Alternatively, the color filter layer 580 may be formed directly on the OLED D.

An encapsulation layer (or an encapsulation film) may be formed to prevent penetration of moisture into the OLED D. For example, the encapsulation film may include a first inorganic insulating layer, an organic insulating layer and a second inorganic insulating layer sequentially stacked, but it is not limited thereto. The encapsulation film may be omitted.

A polarization plate for reducing an ambient light reflection may be disposed over the top-emission type OLED D. For example, the polarization plate may be a circular polarization plate.

In the OLED D of FIG. 6, the light from the organic emitting layer 562 passes through the second electrode 564, and the color filter layer 580 is disposed over the OLED D. Alternatively, the light from the organic emitting layer 562 may pass through the first electrode 560, the color filter layer 580 may be disposed between the OLED D and the first substrate 510.

A color conversion layer (not shown) may be formed between the OLED D and the color filter layer 580. The color conversion layer may include a red color conversion layer, a green color conversion layer and a blue color conversion layer respectively corresponding to the red, green and blue pixels RP, GP and BP. The white light from the OLED D is converted into the red light, the green light and the blue light by the red, green and blue color conversion layer, respectively.

As described above, in the organic light emitting display device 500, the OLED D in the red, green and blue pixels RP, GP and BP emits the white light, and the white light from the organic light emitting diode D passes through the red color filter 582, the green color filter 584 and the blue color filter 586. As a result, the red light, the green light and the blue light are provided from the red pixel RP, the green pixel GP and the blue pixel BP, respectively.

In FIGS. 6 to 8, the OLED D emitting the white light is used for a display device. Alternatively, the OLED D may be formed on an entire surface of a substrate without at least one of the driving element and the color filter layer to be used for a lightening device. The display device and the lightening device each including the OLED D of the present invention may be referred to as an organic light emitting device.

[OLED]

On an anode (ITO, 1100 Å), an HIL (the compound in Formula 15, 750 Å), an HTL (the compound in Formula 16, 1100 Å), an EBL (the compound E1 in Formula 14, 150 Å), a first blue emitting layer (a first host (97 wt %) and a first dopant (3 wt %), 100 Å), a second blue emitting layer (a second host (97 wt %) and a second dopant (3 wt %), 100 Å), an ETL (150 Å), an EIL (the compound in Formula 17 (97 wt %) and Li (3 wt %), 200 Å), and a cathode (Al, 1000 Å) were sequentially stacked to form an OLED.

[Formula 15]

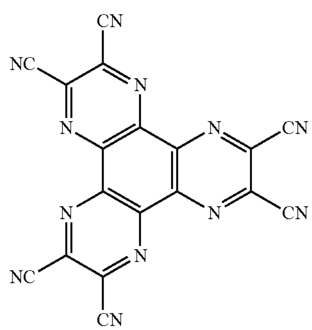

[Formula 16]

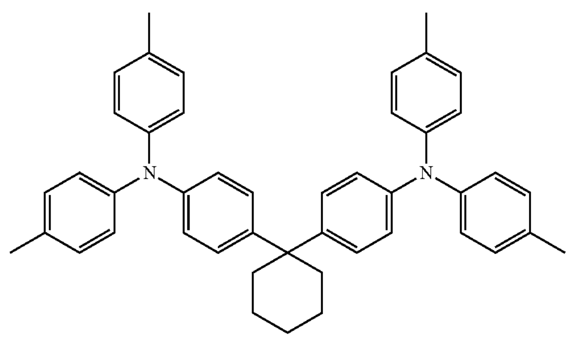

[Formula 17]

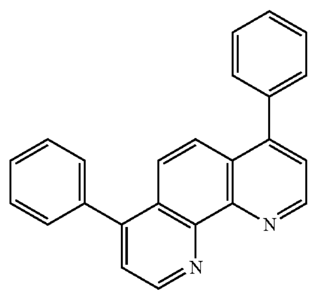

1. COMPARATIVE EXAMPLES (1) Comparative Examples 1 and 2 (Ref1 and Ref2)

The compound BH3 in Formula 6 was used as the first host, the compound BD1_A1 in Formula 8 was used as the first dopant. The compound BH3 in Formula 6 was used as the second host, and the compounds BD2_B1 and BD2_B2 in Formula 4 were used as the second dopant, respectively. The compound ETL-A in Formula 18 was used to form the ETL.

(2) Comparative Examples 3 and 4 (Ref3 and Ref4)

The compound BH3 in Formula 6 was used as the first host, the compound BD1_A1 in Formula 8 was used as the first dopant. The compound BH3_D1 in Formula 6 was used as the second host, and the compounds BD2_B1 and BD2_B2 in Formula 4 were used as the second dopant, respectively. The compound ETL-A in Formula 18 was used to form the ETL.

(3) Comparative Examples 5 and 6 (Ref5 and Ref6)

The compound BH3 in Formula 6 was used as the first host, the compound BD1_A1 in Formula 8 was used as the first dopant. The compound BH3_D2 in Formula 6 was used as the second host, and the compounds BD2_B1 and BD2_B2 in Formula 4 were used as the second dopant, respectively. The compound ETL-A in Formula 18 was used to form the ETL.

(4) Comparative Examples 7 and 8 (Ref7 and Ref8)

The compound BH3 in Formula 6 was used as the first host, the compound BD1_A1 in Formula 8 was used as the first dopant. The compound BH3_D3 in Formula 6 was used as the second host, and the compounds BD2_B1 and BD2_B2 in Formula 4 were used as the second dopant, respectively. The compound ETL-A in Formula 18 was used to form the ETL.

(5) Comparative Examples 9 and 10 (Ref9 and Ref10)

The compound BH3 in Formula 6 was used as the first host, the compound BD1_A1 in Formula 8 was used as the first dopant. The compound BH3_D4 in Formula 6 was used as the second host, and the compounds BD2_B1 and BD2_B2 in Formula 4 were used as the second dopant, respectively. The compound ETL-A in Formula 18 was used to form the ETL.

(6) Comparative Examples 11 and 12 (Ref11 and Ref12)

The compound BH3_D1 in Formula 6 was used as the first host, the compound BD1_A1 in Formula 8 was used as the first dopant. The compound BH3 in Formula 6 was used as the second host, and the compounds BD2_B1 and BD2_B2 in Formula 4 were used as the second dopant, respectively. The compound ETL-A in Formula 18 was used to form the ETL.

(7) Comparative Examples 13 and 14 (Ref13 and Ref14)

The compound BH3_D2 in Formula 6 was used as the first host, the compound BD1_A1 in Formula 8 was used as the first dopant. The compound BH3 in Formula 6 was used as the second host, and the compounds BD2_B1 and BD2_B2 in Formula 4 were used as the second dopant, respectively. The compound ETL-A in Formula 18 was used to form the ETL.

(8) Comparative Examples 15 and 16 (Ref15 and Ref16)

The compound BH3_D3 in Formula 6 was used as the first host, the compound BD1_A1 in Formula 8 was used as the first dopant. The compound BH3 in Formula 6 was used as the second host, and the compounds BD2_B1 and BD2_B2 in Formula 4 were used as the second dopant, respectively. The compound ETL-A in Formula 18 was used to form the ETL.

(9) Comparative Examples 17 and 18 (Ref17 and Ref18)

The compound BH3_D4 in Formula 6 was used as the first host, the compound BD1_A1 in Formula 8 was used as the first dopant. The compound BH3 in Formula 6 was used as the second host, and the compounds BD2_B1 and BD2_B2 in Formula 4 were used as the second dopant, respectively. The compound ETL-A in Formula 18 was used to form the ETL.

(10) Comparative Examples 19 and 20 (Ref19 and Ref20)

The compound BH3 in Formula 6 was used as the first host, the compound BH3 in Formula 6 was used as the second host. The compound BD1_A1 in Formula 8 was used as the second dopant, and the compounds BD2_B1 and BD2_B2 in Formula 4 were used as the first dopant, respectively. The compound ETL-A in Formula 18 was used to form the ETL.

(11) Comparative Examples 21 and 22 (Ref21 and Ref22)

The compound BH3 in Formula 6 was used as the first host, the compound BH3_D1 in Formula 6 was used as the second host. The compound BD1_A1 in Formula 8 was used as the second dopant, and the compounds BD2_B1 and BD2_B2 in Formula 4 were used as the first dopant, respectively. The compound ETL-A in Formula 18 was used to form the ETL.

(12) Comparative Examples 23 and 24 (Ref23 and Ref24)

The compound BH3 in Formula 6 was used as the first host, the compound BH3_D2 in Formula 6 was used as the second host. The compound BD1_A1 in Formula 8 was used as the second dopant, and the compounds BD2_B1 and BD2_B2 in Formula 4 were used as the first dopant, respectively. The compound ETL-A in Formula 18 was used to form the ETL.

(13) Comparative Examples 25 and 26 (Ref25 and Ref26)

The compound BH3 in Formula 6 was used as the first host, the compound BH3_D3 in Formula 6 was used as the second host. The compound BD1_A1 in Formula 8 was used as the second dopant, and the compounds BD2_B1 and BD2_B2 in Formula 4 were used as the first dopant, respectively. The compound ETL-A in Formula 18 was used to form the ETL.

(14) Comparative Examples 27 and 28 (Ref27 and Ref28)

The compound BH3 in Formula 6 was used as the first host, the compound BH3_D4 in Formula 6 was used as the second host. The compound BD1_A1 in Formula 8 was used as the second dopant, and the compounds BD2_B1 and BD2_B2 in Formula 4 were used as the first dopant, respectively. The compound ETL-A in Formula 18 was used to form the ETL.

(15) Comparative Examples 29 and 30 (Ref29 and Ref30)

The compound BH3_D1 in Formula 6 was used as the first host, the compound BD1_A1 in Formula 8 was used as the first dopant. The compound BH3_D4 in Formula 6 was used as the second host, and the compounds BD2_B1 and BD2_B2 in Formula 4 were used as the second dopant, respectively. The compound ETL-A in Formula 18 was used to form the ETL.

(16) Comparative Examples 31 and 32 (Ref31 and Ref32)

The compound BH3_D4 in Formula 6 was used as the first host, the compound BD1_A1 in Formula 8 was used as the first dopant. The compound BH3_D1 in Formula 6 was used as the second host, and the compounds BD2_B1 and BD2_B2 in Formula 4 were used as the second dopant, respectively. The compound ETL-A in Formula 18 was used to form the ETL.

(17) Comparative Examples 33 and 34 (Ref33 and Ref34)

The compound BH3_D1 in Formula 6 was used as the first host, the compound BH3_D4 in Formula 6 was used as the second host. The compound BD1_A1 in Formula 8 was used as the second dopant, and the compounds BD2_B1 and BD2_B2 in Formula 4 were used as the first dopant, respectively. The compound ETL-A in Formula 18 was used to form the ETL.

[Formula 18]

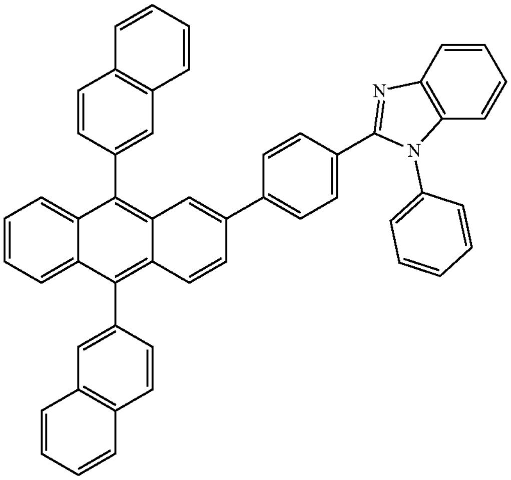

2. EXAMPLES (1) Example 1 (Ex1)

The compound BH3_D1 in Formula 2 was used as the first host, the compound BD2_B1 in Formula 4 was used as the first dopant. The compound BH3 in Formula 6 was used as the second host, and the compounds BD1_A1 in Formula 8 were used as the second dopant. The compounds ETL1-1 in Formula 11 and ETL2-1 in Formula 12 were used to form the ETL. (the compound ETL1-1:the compound2−1=1:1(a weight %))

(2) Example 2 (Ex2)

The compound BH3_D1 in Formula 2 was used as the first host, the compound BD2_B1 in Formula 4 was used as the first dopant. The compound BH3 in Formula 6 was used as the second host, and the compounds BD1_A1 in Formula 8 were used as the second dopant. The compounds ETL1-1 in Formula 11 and ETL2-7 in Formula 12 were used to form the ETL. (the compound ETL1-1:the compound2−7=1:1(a weight %))

(3) Example 3 (Ex3)

The compound BH3_D1 in Formula 2 was used as the first host, the compound BD2_B2 in Formula 4 was used as the first dopant. The compound BH3 in Formula 6 was used as the second host, and the compounds BD1_A1 in Formula 8 were used as the second dopant. The compounds ETL1-1 in Formula 11 and ETL2-1 in Formula 12 were used to form the ETL. (the compound ETL1-1:the compound2−1=1:1(a weight %))

(4) Example 4 (Ex4)

The compound BH3_D1 in Formula 2 was used as the first host, the compound BD2_B2 in Formula 4 was used as the first dopant. The compound BH3 in Formula 6 was used as the second host, and the compounds BD1_A1 in Formula 8 were used as the second dopant. The compounds ETL1-1 in Formula 11 and ETL2-7 in Formula 12 were used to form the ETL. (the compound ETL1-1:the compound2−7=1:1(a weight %))

(5) Example 5 (Ex5)

The compound BH3_D2 in Formula 2 was used as the first host, the compound BD2_B1 in Formula 4 was used as the first dopant. The compound BH3 in Formula 6 was used as the second host, and the compounds BD1_A1 in Formula 8 were used as the second dopant. The compounds ETL1-1 in Formula 11 and ETL2-1 in Formula 12 were used to form the ETL. (the compound ETL1-1:the compound2−1=1:1(a weight %))

(6) Example 6 (Ex6)

The compound BH3_D2 in Formula 2 was used as the first host, the compound BD2_B1 in Formula 4 was used as the first dopant. The compound BH3 in Formula 6 was used as the second host, and the compounds BD1_A1 in Formula 8 were used as the second dopant. The compounds ETL1-1 in Formula 11 and ETL2-7 in Formula 12 were used to form the ETL. (the compound ETL1-1:the compound2−7=1:1(a weight %))

(7) Example 7 (Ex7)

The compound BH3_D2 in Formula 2 was used as the first host, the compound BD2_B2 in Formula 4 was used as the first dopant. The compound BH3 in Formula 6 was used as the second host, and the compounds BD1_A1 in Formula 8 were used as the second dopant. The compounds ETL1-1 in Formula 11 and ETL2-1 in Formula 12 were used to form the ETL. (the compound ETL1-1:the compound2−1=1:1(a weight %))

(8) Example 8 (Ex8)

The compound BH3_D2 in Formula 2 was used as the first host, the compound BD2_B2 in Formula 4 was used as the first dopant. The compound BH3 in Formula 6 was used as the second host, and the compounds BD1_A1 in Formula 8 were used as the second dopant. The compounds ETL1-1 in Formula 11 and ETL2-7 in Formula 12 were used to form the ETL. (the compound ETL1-1:the compound2−7=1:1(a weight %))

(9) Example 9 (Ex9)

The compound BH3_D3 in Formula 2 was used as the first host, the compound BD2_B1 in Formula 4 was used as the first dopant. The compound BH3 in Formula 6 was used as the second host, and the compounds BD1_A1 in Formula 8 were used as the second dopant. The compounds ETL1-1 in Formula 11 and ETL2-1 in Formula 12 were used to form the ETL. (the compound ETL1-1:the compound2−1=1:1(a weight %))

(10) Example 10 (Ex10)

The compound BH3_D3 in Formula 2 was used as the first host, the compound BD2_B1 in Formula 4 was used as the first dopant. The compound BH3 in Formula 6 was used as the second host, and the compounds BD1_A1 in Formula 8 were used as the second dopant. The compounds ETL1-1 in Formula 11 and ETL2-7 in Formula 12 were used to form the ETL. (the compound ETL1-1:the compound2−7=1:1(a weight %))

(11) Example 11 (Ex11)

The compound BH3_D3 in Formula 2 was used as the first host, the compound BD2_B2 in Formula 4 was used as the first dopant. The compound BH3 in Formula 6 was used as the second host, and the compounds BD1_A1 in Formula 8 were used as the second dopant. The compounds ETL1-1 in Formula 11 and ETL2-1 in Formula 12 were used to form the ETL. (the compound ETL1-1:the compound2−1=1:1(a weight %))

(12) Example 12 (Ex12)

The compound BH3_D3 in Formula 2 was used as the first host, the compound BD2_B2 in Formula 4 was used as the first dopant. The compound BH3 in Formula 6 was used as the second host, and the compounds BD1_A1 in Formula 8 were used as the second dopant. The compounds ETL1-1 in Formula 11 and ETL2-7 in Formula 12 were used to form the ETL. (the compound ETL1-1:the compound2−7=1:1(a weight %))

(13) Example 13 (Ex13)

The compound BH3_D4 in Formula 2 was used as the first host, the compound BD2_B1 in Formula 4 was used as the first dopant. The compound BH3 in Formula 6 was used as the second host, and the compounds BD1_A1 in Formula 8 were used as the second dopant. The compounds ETL1-1 in Formula 11 and ETL2-1 in Formula 12 were used to form the ETL. (the compound ETL1-1:the compound2−1=1:1(a weight %))

(14) Example 14 (Ex14)

The compound BH3_D4 in Formula 2 was used as the first host, the compound BD2_B1 in Formula 4 was used as the first dopant. The compound BH3 in Formula 6 was used as the second host, and the compounds BD1_A1 in Formula 8 were used as the second dopant. The compounds ETL1-1 in Formula 11 and ETL2-7 in Formula 12 were used to form the ETL. (the compound ETL1-1:the compound2−7=1:1(a weight %))

(15) Example 15 (Ex15)

The compound BH3_D4 in Formula 2 was used as the first host, the compound BD2_B2 in Formula 4 was used as the first dopant. The compound BH3 in Formula 6 was used as the second host, and the compounds BD1_A1 in Formula 8 were used as the second dopant. The compounds ETL1-1 in Formula 11 and ETL2-1 in Formula 12 were used to form the ETL. (the compound ETL1-1:the compound2−1=1:1(a weight %))

(16) Example 16 (Ex16)

The compound BH3_D4 in Formula 2 was used as the first host, the compound BD2_B2 in Formula 4 was used as the first dopant. The compound BH3 in Formula 6 was used as the second host, and the compounds BD1_A1 in Formula 8 were used as the second dopant. The compounds ETL1-1 in Formula 11 and ETL2-7 in Formula 12 were used to form the ETL. (the compound ETL1-1:the compound2−7=1:1(a weight %))

(17) Example 17 (Ex17)

The compound BH3_D4 in Formula 2 was used as the first host, the compound BD2_BT in Formula 4 was used as the first dopant. The compound BH3_D1 in Formula 6 was used as the second host, and the compounds BD1_A1 in Formula 8 were used as the second dopant. The compounds ETL1-1 in Formula 11 and ETL2-1 in Formula 12 were used to form the ETL. (the compound ETL1-1:the compound2−1=1:1(a weight %))

(18) Example 18 (Ex18)

The compound BH3_D4 in Formula 2 was used as the first host, the compound BD2_BT in Formula 4 was used as the first dopant. The compound BH3_D1 in Formula 6 was used as the second host, and the compounds BD1_A1 in Formula 8 were used as the second dopant. The compounds ETL1-1 in Formula 11 and ETL2-7 in Formula 12 were used to form the ETL. (the compound ETL1-1:the compound2−7=1:1(a weight %))

(19) Example 19 (Ex19)

The compound BH3_D4 in Formula 2 was used as the first host, the compound BD2_B2 in Formula 4 was used as the first dopant. The compound BH3_D1 in Formula 6 was used as the second host, and the compounds BD1_A1 in Formula 8 were used as the second dopant. The compounds ETL1-1 in Formula 11 and ETL2-1 in Formula 12 were used to form the ETL. (the compound ETL1-1:the compound2−1=1:1(a weight %))

(20) Example 20 (Ex20)

The compound BH3_D4 in Formula 2 was used as the first host, the compound BD2_B2 in Formula 4 was used as the first dopant. The compound BH3_D1 in Formula 6 was used as the second host, and the compounds BD1_A1 in Formula 8 were used as the second dopant. The compounds ETL1-1 in Formula 11 and ETL2-7 in Formula 12 were used to form the ETL. (the compound ETL1-1:the compound2−7=1:1(a weight %))

(21) Examples 21 to 23 (Ex21 to Ex23)

The compound BH3_D1 in Formula 2 was used as the first host, the compound BD2_B1 in Formula 4 was used as the first dopant. The compound BH3 in Formula 6 was used as the second host, and the compounds BD1_A1 in Formula 8 were used as the second dopant. The compounds ETL1-1 in Formula 11, ETL2-1 in Formula 12 and ETL2-7 in Formula 12 were used to form the ETL, respectively.

(22) Examples 24 to 26 (Ex24 to Ex26)

The compound BH3_D1 in Formula 2 was used as the first host, the compound BD2_B2 in Formula 4 was used as the first dopant. The compound BH3 in Formula 6 was used as the second host, and the compounds BD1_A1 in Formula 8 were used as the second dopant. The compounds ETL1-1 in Formula 11, ETL2-1 in Formula 12 and ETL2-7 in Formula 12 were used to form the ETL, respectively.

(23) Examples 27 to 29 (Ex27 to Ex29)

The compound BH3_D2 in Formula 2 was used as the first host, the compound BD2_B1 in Formula 4 was used as the first dopant. The compound BH3 in Formula 6 was used as the second host, and the compounds BD1_A1 in Formula 8 were used as the second dopant. The compounds ETL1-1 in Formula 11, ETL2-1 in Formula 12 and ETL2-7 in Formula 12 were used to form the ETL, respectively.

(24) Examples 30 to 32 (Ex30 to Ex32)

The compound BH3_D2 in Formula 2 was used as the first host, the compound BD2_B2 in Formula 4 was used as the first dopant. The compound BH3 in Formula 6 was used as the second host, and the compounds BD1_A1 in Formula 8 were used as the second dopant. The compounds ETL1-1 in Formula 11, ETL2-1 in Formula 12 and ETL2-7 in Formula 12 were used to form the ETL, respectively.

(25) Examples 33 to 35 (Ex33 to Ex35)

The compound BH3_D3 in Formula 2 was used as the first host, the compound BD2_B1 in Formula 4 was used as the first dopant. The compound BH3 in Formula 6 was used as the second host, and the compounds BD1_A1 in Formula 8 were used as the second dopant. The compounds ETL1-1 in Formula 11, ETL2-1 in Formula 12 and ETL2-7 in Formula 12 were used to form the ETL, respectively.

(26) Examples 36 to 38 (Ex36 to Ex38)

The compound BH3_D3 in Formula 2 was used as the first host, the compound BD2_B2 in Formula 4 was used as the first dopant. The compound BH3 in Formula 6 was used as the second host, and the compounds BD1_A1 in Formula 8 were used as the second dopant. The compounds ETL1-1 in Formula 11, ETL2-1 in Formula 12 and ETL2-7 in Formula 12 were used to form the ETL, respectively.

(27) Examples 39 to 41 (Ex39 to Ex41)

The compound BH3_D4 in Formula 2 was used as the first host, the compound BD2_B1 in Formula 4 was used as the first dopant. The compound BH3 in Formula 6 was used as the second host, and the compounds BD1_A1 in Formula 8 were used as the second dopant. The compounds ETL1-1 in Formula 11, ETL2-1 in Formula 12 and ETL2-7 in Formula 12 were used to form the ETL, respectively.

(28) Examples 42 to 44 (Ex42 to Ex44)

The compound BH3_D4 in Formula 2 was used as the first host, the compound BD2_B2 in Formula 4 was used as the first dopant. The compound BH3 in Formula 6 was used as the second host, and the compounds BD1_A1 in Formula 8 were used as the second dopant. The compounds ETL1-1 in Formula 11, ETL2-1 in Formula 12 and ETL2-7 in Formula 12 were used to form the ETL, respectively.

(29) Examples 45 to 47 (Ex45 to Ex47)

The compound BH3_D4 in Formula 2 was used as the first host, the compound BD2_B1 in Formula 4 was used as the first dopant. The compound BH3_D1 in Formula 6 was used as the second host, and the compounds BD1_A1 in Formula 8 were used as the second dopant. The compounds ETL1-1 in Formula 11, ETL2-1 in Formula 12 and ETL2-7 in Formula 12 were used to form the ETL, respectively.

(30) Examples 48 to 50 (Ex48 to Ex50)

The compound BH3_D4 in Formula 2 was used as the first host, the compound BD2_B2 in Formula 4 was used as the first dopant. The compound BH3_D1 in Formula 6 was used as the second host, and the compounds BD1_A1 in Formula 8 were used as the second dopant. The compounds ETL1-1 in Formula 11, ETL2-1 in Formula 12 and ETL2-7 in Formula 12 were used to form the ETL, respectively.

The properties, i.e., a HOMO energy level, a LUMO energy level and a triplet energy (T1), of the dopants used for the first and second blue emitting layers of the OLEDs manufactured in Comparative Examples 1 to 34 and Examples 1 to 50 and the properties, i.e., a HOMO energy level, a LUMO energy level, a triplet energy level (T1) and a dipole moment, of the electron transporting materials used for the first and second blue emitting layers of the OLEDs manufactured in Comparative Examples 1 to 34 and Examples 1 to 50 were measured and listed in Table 1.

Various methods of determining the HOMO energy level are known to the skilled person. For example, the HOMO energy level can be determined using a conventional surface analyser such as an AC3 surface analyser made by RKI instruments. The surface analyser may be used to interrogate a single film (neat film) of a compound with a thickness of 50 nm. The LUMO energy level can be calculated as follows:

$$LUMO = HOMO - \text{bandgap}.$$

The bandgap may be calculated using any conventional method known to the skilled person, such as from a UV-vis measurement of a single film with a thickness of 50 nm. For example, this can be done using a SCINCO S-3100 spectrophotometer. The HOMO and LUMO values of the compounds of the examples and embodiments disclosed herein may be determined in this way. Namely, the HOMO and LUMO values may be experimentally or empirically determined values of thin films, such as 50 nm films.

The triplet energy may be measured or calculated from a PL spectrum.

In addition, the dipole moment may be directly measured by an optical method. Alternatively, the dipole moment may be measured by a simulation, e.g., Gaussian or Basis set: B3LYP 6-31(d), adequate to a molecular structure.

TABLE 1

| | HOMO (eV) | LUMO (eV) | T1 (eV) | Dipole moment (C · m) |
|---|---|---|---|---|
| BD1_A1 | −5.37 | −2.66 | 2.63 | |
| BD2_B1 | −5.17 | −2.45 | 2.41 | |
| BD2_B2 | −5.17 | −2.45 | 2.40 | |
| ETL1-1 | −5.99 | −2.98 | 1.80 | 5.42 |
| ETL2-1 | −5.87 | −2.71 | 2.42 | 0.94 |
| ETL2-7 | −6.45 | −3.15 | 2.51 | 1.42 |

The combination of the compounds used for the first and second emitting layers of the OLEDs in Comparative Examples 1 to 34 and Examples 1 to 50 is listed in Tables 2 to 6, and the properties, i.e., a driving voltage (V), an external quantum efficiency (EQE) and a lifespan (LT), of the OLEDs manufactured in Comparative Examples 1 to 34 and Examples 1 to 50 were measured and listed in Tables 6 to 11.

TABLE 2

| | B-EML1 | | B-EML2 | | D-ratio of Host | | |
|---|---|---|---|---|---|---|---|
| | BH | BD | BH | BD | B-EML1 | B-EML2 | ETL |
| Ref1 | BH3 | BD1_A1 | BH3 | BD2_B1 | 0% | 0% | ETL-A |
| Ref2 | BH3 | BD1_A1 | BH3 | BD2_B2 | 0% | 0% | ETL-A |
| Ref3 | BH3 | BD1_A1 | BH3_D1 | BD2_B1 | 0% | 31% | ETL-A |
| Ref4 | BH3 | BD1_A1 | BH3_D1 | BD2_B2 | 0% | 31% | ETL-A |
| Ref5 | BH3 | BD1_A1 | BH3_D2 | BD2_B1 | 0% | 58% | ETL-A |
| Ref6 | BH3 | BD1_A1 | BH3_D2 | BD2_B2 | 0% | 58% | ETL-A |
| Ref7 | BH3 | BD1_A1 | BH3_D3 | BD2_B1 | 0% | 73% | ETL-A |
| Ref8 | BH3 | BD1_A1 | BH3_D3 | BD2_B2 | 0% | 73% | ETL-A |
| Ref9 | BH3 | BD1_A1 | BH3_D4 | BD2_B1 | 0% | 100% | ETL-A |
| Ref10 | BH3 | BD1_A1 | BH3_D4 | BD2_B2 | 0% | 100% | ETL A |
| Ref11 | BH3_D1 | BD1_A1 | BH3 | BD2_B1 | 31% | 0% | ETL A |
| Ref12 | BH3_D1 | BD1_A1 | BH3 | BD2_B2 | 31% | 0% | ETL A |
| Ref13 | BH3_D2 | BD1_A1 | BH3 | BD2_B1 | 58% | 0% | ETL A |
| Ref14 | BH3_D2 | BD1_A1 | BH3 | BD2_B2 | 58% | 0% | ETL A |
| Ref15 | BH3_D3 | BD1_A1 | BH3 | BD2_B1 | 73% | 0% | ETL A |
| Ref16 | BH3_D3 | BD1_A1 | BH3 | BD2_B2 | 73% | 0% | ETL A |
| Ref17 | BH3_D4 | BD1_A1 | BH3 | BD2_B1 | 100% | 0% | ETL A |
| Ref18 | BH3_D4 | BD1_A1 | BH3 | BD2_B2 | 100% | 0% | ETL A |

TABLE 3

| | B-EML1 | | B-EML2 | | D-ratio of Host | | |
|---|---|---|---|---|---|---|---|
| | BH | BD | BH | BD | B-EML1 | B-EML2 | ETL |
| Ref19 | BH3 | BD2_B1 | BH3 | BD1_A1 | 0% | 0% | ETL A |
| Ref20 | BH3 | BD2_B2 | BH3 | BD1_A1 | 0% | 0% | ETL A |
| Ref21 | BH3 | BD2_B1 | BH3_D1 | BD1_Al | 0% | 31% | ETL A |
| Ref22 | BH3 | BD2_B2 | BH3_D1 | BD1_A1 | 0% | 31% | ETL A |
| Ref23 | BH3 | BD2_B1 | BH3_D2 | BD1_A1 | 0% | 58% | ETL-A |
| Ref24 | BH3 | BD2_B2 | BH3_D2 | BD1_A1 | 0% | 58% | ETL-A |
| Ref25 | BH3 | BD2_B1 | BH3_D3 | BD1_A1 | 0% | 73% | ETL-A |
| Ref26 | BH3 | BD2_B2 | BH3_D3 | BD1_A1 | 0% | 73% | ETL-A |
| Ref27 | BH3 | BD2_B1 | BH3_D4 | BD1_A1 | 0% | 100% | ETL-A |
| Ref28 | BH3 | BD2_B2 | BH3_D4 | BD1_A1 | 0% | 100% | ETL-A |
| Ref29 | BH3_D1 | BD1_A1 | BH3_D4 | BD2_B1 | 31% | 100% | ETL-A |
| Ref30 | BH3_D1 | BD1_A1 | BH3_D4 | BD2_B2 | 31% | 100% | ETL-A |
| Ref31 | BH3_D4 | BD1_A1 | BH3_D1 | BD2_B1 | 100% | 31% | ETL-A |
| Ref32 | BH3_D4 | BD1_A1 | BH3_D1 | BD2_B2 | 100% | 31% | ETL-A |
| Ref33 | BH3_D1 | BD2_B1 | BH3_D4 | BD1_A1 | 31% | 100% | ETL-A |
| Ref34 | BH3_D1 | BD2_B2 | BH3_D4 | BD1_A1 | 31% | 100% | ETL-A |

TABLE 4

| | B-EML1 | | B-EML2 | | D-ratio of Host | | ETL | |
|---|---|---|---|---|---|---|---|---|
| | BH | BD | BH | BD | B-EML1 | B-EML2 | ETL | |
| Ex1 | BH3_D1 | BD2_B1 | BH3 | BD1_Al | 31% | 0% | ETL1-1 | ETL2-1 |
| Ex2 | BH3_D1 | BD2_B1 | BH3 | BD1_A1 | 31% | 0% | ETL1-1 | ETL2-7 |
| Ex3 | BH3_D1 | BD2_B2 | BH3 | BD1_A1 | 31% | 0% | ETL1-1 | ETL2-1 |
| Ex4 | BH3_D1 | BD2_B2 | BH3 | BD1_A1 | 31% | 0% | ETL1-1 | ETL2-7 |
| Ex5 | BH3_D2 | BD2_B1 | BH3 | BD1_A1 | 58% | 0% | ETL1-1 | ETL2-1 |
| Ex6 | BH3_D2 | BD2_B1 | BH3 | BD1_A1 | 58% | 0% | ETL1-1 | ETL2-7 |
| Ex7 | BH3_D2 | BD2_B2 | BH3 | BD1_A1 | 58% | 0% | ETL1-1 | ETL2-1 |
| Ex8 | BH3_D2 | BD2_B2 | BH3 | BD1_A1 | 58% | 0% | ETL1-1 | ETL2-7 |
| Ex9 | BH3_D3 | BD2_B1 | BH3 | BD1_A1 | 73% | 0% | ETL1-1 | ETL2-1 |
| Ex10 | BH3_D3 | BD2_B1 | BH3 | BD1_A1 | 73% | 0% | ETL1-1 | ETL2-7 |
| Ex11 | BH3_D3 | BD2_B2 | BH3 | BD1_A1 | 73% | 0% | ETL1-1 | ETL2-1 |
| Ex12 | BH3_D3 | BD2_B2 | BH3 | BD1_A1 | 73% | 0% | ETL1-1 | ETL2-7 |
| Ex13 | BH3_D4 | BD2_B1 | BH3 | BD1_A1 | 100% | 0% | ETL1-1 | ETL2-1 |
| Ex14 | BH3_D4 | BD2_B1 | BH3 | BD1_A1 | 100% | 0% | ETL1-1 | ETL2-7 |

TABLE 4-continued

| | B-EML1 | | B-EML2 | | D-ratio of Host | | ETL | |
|---|---|---|---|---|---|---|---|---|
| | BH | BD | BH | BD | B-EML1 | B-EML2 | | |
| Ex15 | BH3_D4 | BD2_B2 | BH3 | BD1_A1 | 100% | 0% | ETL1-1 | ETL2-1 |
| Ex16 | BH3_D4 | BD2_B2 | BH3 | BD1_A1 | 100% | 0% | ETL1-1 | ETL2-7 |
| Ex17 | BH3_D4 | BD2_B1 | BH3_D1 | BD1_A1 | 100% | 31% | ETL1-1 | ETL2-1 |
| Ex18 | BH3_D4 | BD2_B1 | BH3_D1 | BD1_A1 | 100% | 31% | ETL1-1 | ETL2-7 |
| Ex19 | BH3_D4 | BD2_B2 | BH3_D1 | BD1_A1 | 100% | 31% | ETL1-1 | ETL2-1 |
| Ex20 | BH3_D4 | BD2_B2 | BH3_D1 | BD1_A1 | 100% | 31% | ETL1-1 | ETL2-7 |

TABLE 5

| | B-EML1 | | B-EML2 | | D-ratio of Host | | ETL | |
|---|---|---|---|---|---|---|---|---|
| | BH | BD | BH | BD | B-EML1 | B-EML2 | | |
| Ex21 | BH3_D1 | BD2_B1 | BH3 | BD1_A1 | 31% | 0% | ETL1-1 | ETL1-1 |
| Ex22 | BH3_D1 | BD2_B1 | BH3 | BD1_Al | 31% | 0% | ETL2-1 | ETL2-1 |
| Ex23 | BH3_D1 | BD2_B1 | BH3 | BD1_Al | 31% | 0% | ETL2-7 | ETL2-7 |
| Ex24 | BH3_D1 | BD2_B2 | BH3 | BD1_A1 | 31% | 0% | ETL1-1 | ETL1-1 |
| Ex25 | BH3_D1 | BD2_B2 | BH3 | BD1_Al | 31% | 0% | ETL2-1 | ETL2-1 |
| Ex26 | BH3_D1 | BD2_B2 | BH3 | BD1_A1 | 31% | 0% | ETL2-7 | ETL2-7 |
| Ex27 | BH3_D2 | BD2_B1 | BH3 | BD1_Al | 58% | 0% | ETL1-1 | ETL1-1 |
| Ex28 | BH3_D2 | BD2_B1 | BH3 | BD1_A1 | 58% | 0% | ETL2-1 | ETL2-1 |
| Ex29 | BH3_D2 | BD2_B1 | BH3 | BD1_A1 | 58% | 0% | ETL2-7 | ETL2-7 |
| Ex30 | BH3_D2 | BD2_B2 | BH3 | BD1_A1 | 58% | 0% | ETL1-1 | ETL1-1 |
| Ex31 | BH3_D2 | BD2_B2 | BH3 | BD1_A1 | 58% | 0% | ETL2-1 | ETL2-1 |
| Ex32 | BH3_D2 | BD2_B2 | BH3 | BD1_A1 | 58% | 0% | ETL2-7 | ETL2-7 |
| Ex33 | BH3_D3 | BD2_B1 | BH3 | BD1_A1 | 73% | 0% | ETL1-1 | ETL1-1 |
| Ex34 | BH3_D3 | BD2_B1 | BH3 | BD1_A1 | 73% | 0% | ETL2-1 | ETL2-1 |
| Ex35 | BH3_D3 | BD2_B1 | BH3 | BD1_A1 | 73% | 0% | ETL2-7 | ETL2-7 |

TABLE 6

| | B-EML1 | | B-EML2 | | D-ratio of Host | | ETL | |
|---|---|---|---|---|---|---|---|---|
| | BH | BD | BH | BD | B-EML1 | B-EML2 | | |
| Ex36 | BH3_D3 | BD2_B2 | BH3 | BD1_A1 | 73% | 0% | ETL1-1 | ETL1-1 |
| Ex37 | BH3_D3 | BD2_B2 | BH3 | BD1_A1 | 73% | 0% | ETL2-1 | ETL2-1 |
| Ex38 | BH3_D3 | BD2_B2 | BH3 | BD1_Al | 73% | 0% | ETL2-7 | ETL2-7 |
| Ex39 | BH3_D4 | BD2_B1 | BH3 | BD1_A1 | 100% | 0% | ETL1-1 | ETL1-1 |
| Ex40 | BH3_D4 | BD2_B1 | BH3 | BD1_A1 | 100% | 0% | ETL2-1 | ETL2-1 |
| Ex41 | BH3_D4 | BD2_B1 | BH3 | BD1_A1 | 100% | 0% | ETL2-7 | ETL2-7 |
| Ex42 | BH3_D4 | BD2_B2 | BH3 | BD1_A1 | 100% | 0% | ETL1-1 | ETL1-1 |
| Ex43 | BH3_D4 | BD2_B2 | BH3 | BD1_A1 | 100% | 0% | ETL2-1 | ETL2-1 |
| Ex44 | BH3_D4 | BD2_B2 | BH3 | BD1_A1 | 100% | 0% | ETL2-7 | ETL2-7 |
| Ex45 | BH3_D4 | BD2_B1 | BH3_D1 | BD1_A1 | 100% | 31% | ETL1-1 | ETL1-1 |
| Ex46 | BH3_D4 | BD2_B1 | BH3_D1 | BD1_A1 | 100% | 31% | ETL2-1 | ETL2-1 |
| Ex47 | BH3_D4 | BD2_B1 | BH3_D1 | BD1_A1 | 100% | 31% | ETL2-7 | ETL2-7 |
| Ex48 | BH3_D4 | BD2_B2 | BH3_D1 | BD1_A1 | 100% | 31% | ETL1-1 | ETL1-1 |
| Ex49 | BH3_D4 | BD2_B2 | BH3_D1 | BD1_A1 | 100% | 31% | ETL2-1 | ETL2-1 |
| Ex50 | BH3_D4 | BD2_B2 | BH3_D1 | BD1_A1 | 100% | 31% | ETL2-7 | ETL2-7 |

TABLE 7

| | Property (@10 mA) | | |
|---|---|---|---|
| | V | EQE | LT |
| Ref1 | 0.00 | 100% | 100% |
| Ref2 | 0.00 | 102% | 100% |
| Ref3 | 0.09 | 100% | 105% |
| Ref4 | 0.09 | 102% | 106% |
| Ref5 | 0.16 | 100% | 110% |
| Ref6 | 0.16 | 102% | 110% |
| Ref7 | 0.19 | 99% | 113% |
| Ref8 | 0.19 | 102% | 113% |
| Ref9 | 0.24 | 99% | 118% |
| Ref10 | 0.24 | 101% | 118% |
| Ref11 | 0.08 | 100% | 107% |
| Ref12 | 0.08 | 102% | 107% |
| Ref13 | 0.14 | 100% | 113% |
| Ref14 | 0.14 | 102% | 114% |
| Ref15 | 0.16 | 100% | 117% |
| Ref16 | 0.16 | 102% | 117% |

TABLE 7-continued

| | Property (@10 mA) | | |
|---|---|---|---|
| | V | EQE | LT |
| Ref17 | 0.20 | 100% | 124% |
| Ref18 | 0.20 | 102% | 125% |
| Ref19 | −0.05 | 101% | 115% |

TABLE 8

| | Property (@10 mA) | | |
|---|---|---|---|
| | V | EQE | LT |
| Ref20 | −0.05 | 103% | 116% |
| Ref21 | 0.05 | 101% | 121% |
| Ref22 | 0.05 | 103% | 122% |
| Ref23 | 0.12 | 100% | 127% |
| Ref24 | 0.12 | 103% | 128% |
| Ref25 | 0.15 | 100% | 130% |
| Ref26 | 0.15 | 102% | 132% |
| Ref27 | 0.20 | 100% | 136% |
| Ref28 | 0.20 | 102% | 138% |
| Ref29 | 0.33 | 106% | 150% |
| Ref30 | 0.33 | 100% | 141% |
| Ref31 | 0.30 | 102% | 143% |
| Ref32 | 0.30 | 104% | 140% |
| Ref33 | 0.29 | 101% | 117% |
| Ref34 | 0.29 | 100% | 125% |

TABLE 9

| | Property (@10 mA) | | |
|---|---|---|---|
| | V | EQE | LT |
| Ex1 | 0.10 | 114% | 202% |
| Ex2 | 0.04 | 122% | 192% |
| Ex3 | 0.10 | 117% | 204% |
| Ex4 | 0.04 | 125% | 194% |
| Ex5 | 0.16 | 114% | 216% |
| Ex6 | 0.10 | 122% | 205% |
| Ex7 | 0.16 | 117% | 219% |
| Ex8 | 0.10 | 125% | 208% |
| Ex9 | 0.19 | 114% | 225% |
| Ex10 | 0.13 | 122% | 214% |
| Ex11 | 0.19 | 117% | 227% |
| Ex12 | 0.13 | 125% | 216% |
| Ex13 | 0.23 | 114% | 241% |
| Ex14 | 0.18 | 122% | 229% |
| Ex15 | 0.23 | 117% | 244% |
| Ex16 | 0.18 | 125% | 232% |
| Ex17 | 0.34 | 115% | 203% |
| Ex18 | 0.28 | 123% | 194% |
| Ex19 | 0.34 | 118% | 236% |
| Ex20 | 0.28 | 125% | 225% |

TABLE 10

| | Property (@10 mA) | | |
|---|---|---|---|
| | V | EQE | LT |
| Ex21 | −0.26 | 120% | 108% |
| Ex22 | 0.51 | 105% | 188% |
| Ex23 | 0.37 | 119% | 173% |
| Ex24 | −0.26 | 122% | 109% |
| Ex25 | 0.51 | 107% | 190% |
| Ex26 | 0.37 | 121% | 174% |
| Ex27 | −0.20 | 120% | 115% |
| Ex28 | 0.57 | 105% | 202% |
| Ex29 | 0.43 | 119% | 185% |
| Ex30 | −0.20 | 122% | 117% |

TABLE 10-continued

| | Property (@10 mA) | | |
|---|---|---|---|
| | V | EQE | LT |
| Ex31 | 0.57 | 107% | 204% |
| Ex32 | 0.43 | 121% | 187% |
| Ex33 | −0.17 | 120% | 120% |
| Ex34 | 0.60 | 105% | 210% |
| Ex35 | 0.46 | 119% | 192% |

TABLE 11

| | Property (@10 mA) | | |
|---|---|---|---|
| | V | EQE | LT |
| Ex36 | −0.17 | 122% | 121% |
| Ex37 | 0.60 | 107% | 212% |
| Ex38 | 0.46 | 121% | 194% |
| Ex39 | −0.13 | 120% | 129% |
| Ex40 | 0.64 | 105% | 225% |
| Ex41 | 0.50 | 119% | 206% |
| Ex42 | −0.13 | 122% | 130% |
| Ex43 | 0.64 | 107% | 228% |
| Ex44 | 0.50 | 121% | 209% |
| Ex45 | −0.03 | 121% | 130% |
| Ex46 | 0.74 | 107% | 225% |
| Ex47 | 0.61 | 121% | 206% |
| Ex48 | −0.03 | 122% | 142% |
| Ex49 | 0.74 | 107% | 246% |
| Ex50 | 0.61 | 121% | 226% |

As shown in Tables 2 to 11, in comparison to the OLED of Comparative Examples 1 and 34, the OLED of Examples 1 to 50 has an advantage in at least one a driving voltage, an emitting efficiency and a lifespan.

For example, the OLED of Comparative Examples 3, 11 and 21 and Examples 1, 2, 21 to 23, in which the blue EML includes the compounds BH3 D1, BD1_A1, BH3 and BD2_B1, has a difference in a combination of the host and the dopant in each of the first and second blue emitting layers and a difference in a material of the ETL.

Namely, in the OLED of Examples 1, 2 and 21 to 23, the first blue emitting layer includes the first host represented by Formula 1 and the first dopant represented by Formula 3, the second blue emitting layer includes the second host represented by Formula 5 and the second dopant represented by Formula 7, and the ETL include at least one of a compound represented by Formula 9 and a compound represented by Formula 10. As a result, in comparison to the OLED of Comparative Examples 3, 11 and 21, the OLED of Examples 1, 2 and 21 to 23 has an advantage in at least one a driving voltage, an emitting efficiency and a lifespan.

In addition, in comparison to the OLED of Examples 21 to 23, in which the ETL includes a compound represented by Formula 9, e.g., the compound ETL1-1, or a compound represented by Formula 10, e.g., the compound ETL2-1 or the compound ETL2-7, the lifespan of the OLED of Examples 1 and 2, in which the ETL include both the compound represented by Formula 9 and the compound represented by Formula 10, is significantly increased.

For example, the OLED of Comparative Examples 4, 12 and 22 and Examples 3, 4 and 24 to 26, in which the blue EML includes the compounds BH3 D1, BD1_A1, BH3 and BD2_B2, has a difference in a combination of the host and the dopant in each of the first and second blue emitting layers and a difference in a material of the ETL.

Namely, in the OLED of Examples 3, 4 and 24 to 26, the first blue emitting layer includes the first host represented by Formula 1 and the first dopant represented by Formula 3, the second blue emitting layer includes the second host represented by Formula 5 and the second dopant represented by Formula 7, and the ETL include at least one of a compound represented by Formula 9 and a compound represented by Formula 10. As a result, in comparison to the OLED of Comparative Examples 4, 12 and 22, the OLED of Examples 3, 4 and 24 to 26 has an advantage in at least one a driving voltage, an emitting efficiency and a lifespan.

In addition, in comparison to the OLED of Examples 24 to 26, in which the ETL includes a compound represented by Formula 9, e.g., the compound ETL1-1, or a compound represented by Formula 10, e.g., the compound ETL2-1 or the compound ETL2-7, the lifespan of the OLED of Examples 3 and 4, in which the ETL include both the compound represented by Formula 9 and the compound represented by Formula 10, is significantly increased.

For example, the OLED of Comparative Examples 29, 31 and 33 and Examples 17, 18 and 45 to 47, in which the blue EML includes the compounds BH3_D4, BD1_A1, BH3_D1 and BD2_B1, has a difference in a combination of the host and the dopant in each of the first and second blue emitting layers and a difference in a material of the ETL.

Namely, in the OLED of Examples 17, 18 and 45 to 47, the first blue emitting layer includes the first host represented by Formula 1 and the first dopant represented by Formula 3, the second blue emitting layer includes the second host represented by Formula 5 and the second dopant represented by Formula 7, and the ETL include at least one of a compound represented by Formula 9 and a compound represented by Formula 10. As a result, in comparison to the OLED of Comparative Examples 29, 31 and 33, the OLED of Examples 17, 18 and 45 to 47 has an advantage in at least one a driving voltage, an emitting efficiency and a lifespan.

It will be apparent to those skilled in the art that various modifications and variations can be made in the OLED and the organic light emitting device of the present invention without departing from the spirit or scope of the present invention. Thus, it is intended that the modifications and variations cover this invention provided they come within the scope of the appended claims and their equivalents.

What is claimed is:

1. An organic light emitting diode, comprising:

a first electrode;

a second electrode facing the first electrode; and a first emitting part including a first blue emitting layer, a second blue emitting layer and a first electron transporting layer and positioned between the first and second electrode, the second blue emitting layer positioned between the first blue emitting layer and the second electrode and contacting the first blue emitting layer, and the first electron transporting layer positioned between the second blue emitting layer and the second electrode, wherein the first blue emitting layer includes a first host and a first dopant, and the second blue emitting layer includes a second host and a second dopant, wherein the first host is an anthracene derivative having a first deuteration ratio, and the second host is an anthracene derivative having a second deuteration ratio smaller than the first deuteration ratio, wherein the first dopant is a first compound represented by Formula 3:

[Formula 3]

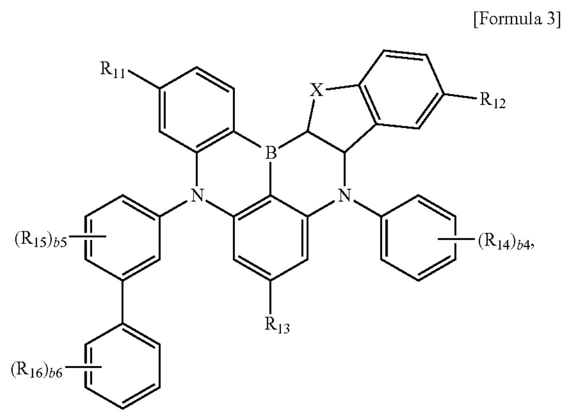

wherein in the Formula 3, $R_{11}$, $R_{12}$ and $R_{13}$ is independently selected from the group consisting of a substituted or unsubstituted C1 to C30 alkyl group, a substituted or unsubstituted C3 to C30 cycloalkyl group, a substituted or unsubstituted C6 to C30 arylamino group, a substituted or unsubstituted C6 to C30 aryl group and a substituted or unsubstituted C3 to C30 heteroaryl group, or at least one pair of adjacent two or more $R_{11}$, adjacent two or more $R_{12}$ and adjacent two or more $R_{13}$ are connected to each other to form a substitute or unsubstituted ring, and each of $R_{14}$, $R_{15}$ and $R_{16}$ is selected from the group consisting of a substituted or unsubstituted C1 to C30 alkyl group and a substituted or unsubstituted C3 to C30 cycloalkyl group, or at least one pair of adjacent two $R_{14}$ and adjacent $R_{15}$ and $R_{16}$ are connected to each other to form a substituted or unsubstituted ring, wherein the first electron transporting layer includes at least one of a first electron transporting material represented by Formula 9 and a second electron transporting material represented by Formula 10;

[Formula 9]

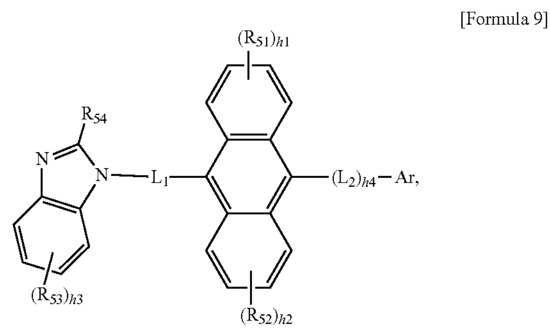

wherein in the Formula 9, each of h1, h2 and h3 is independently an integer of 0 to 4, and h4 is 0 or 1, each of $R_{51}$, $R_{52}$ and $R_{53}$ is independently selected from the group consisting of deuterium, a substituted or unsubstituted C1 to C10 alkyl group, a substituted or unsubstituted C3 to C10 cycloalkyl group, a substituted or unsubstituted C6 to C30 aryl group and a substituted or unsubstituted C3 to C30 heteroaryl group, $R_{54}$ is selected from the group consisting of hydrogen, deuterium, a substituted or unsubstituted C1 to C10 alkyl group, a substituted or unsubstituted C3 to C10 cycloalkyl group, a substituted or unsubstituted C6 to C30 aryl group and a substituted or unsubstituted C3 to C30 heteroaryl group, each of $L_1$ and $L_2$ is independently a substituted or unsubstituted C6 to C30 arylene group, and Ar is selected from the group consisting of a substituted or unsubstituted C6 to C30 aryl group and a substituted or unsubstituted C3 to C30 heteroaryl group,

[Formula 10]

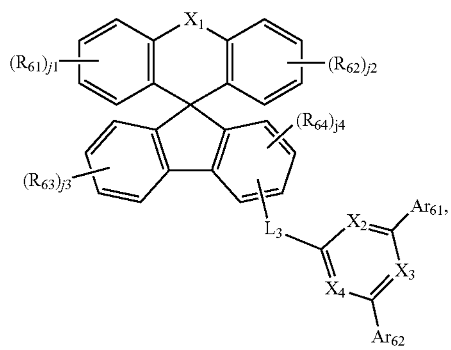

wherein in the Formula 10, each of j1, j2 and j3 is independently an integer of 0 to 4, and j4 is an integer of 0 to 3, each of $R_{61}$, $R_{62}$, $R_{63}$ and $R_{64}$ is independently selected from the group consisting of a substituted or unsubstituted C1 to C10 alkyl group, a substituted or unsubstituted C3 to C10 cycloalkyl group, a substituted or unsubstituted C6 to C30 aryl group and a substituted or unsubstituted C3 to C30 heteroaryl group, $X_1$ is O, S or $NR_{65}$, and $R_{65}$ is a substituted or unsubstituted C6 to C30 aryl group and connected to adjacent benzene ring to form a ring, each of $X_2$, $X_3$ and $X_4$ is independently N or $CR_{66}$, and at least two of $X_2$, $X_3$ and $X_4$ are N, each of $Ar_{61}$, $Ar_{62}$ and $R_{66}$ is independently selected from the group consisting of hydrogen, a substituted or unsubstituted C6 to C30 aryl group and a substituted or unsubstituted C3 to C30 heteroaryl group, and $L_3$ is selected from the group consisting of a substituted or unsubstituted C6 to C30 arylene group and a substituted or unsubstituted C3 to C30 heteroarylene group.

2. The organic light emitting diode according to claim 1, wherein the first dopant is one of compounds in Formula 4:

[Formula 4]

BD2_B1

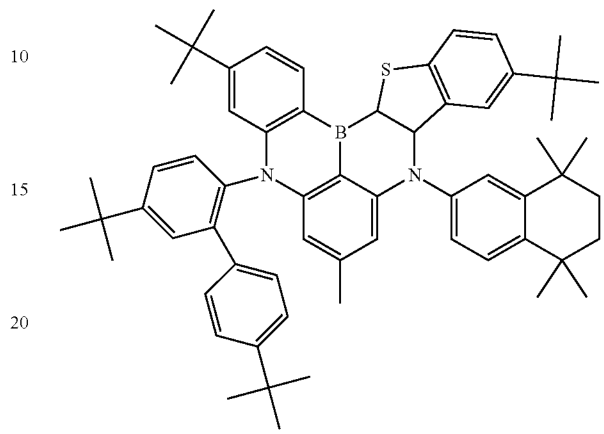

BD2_B2

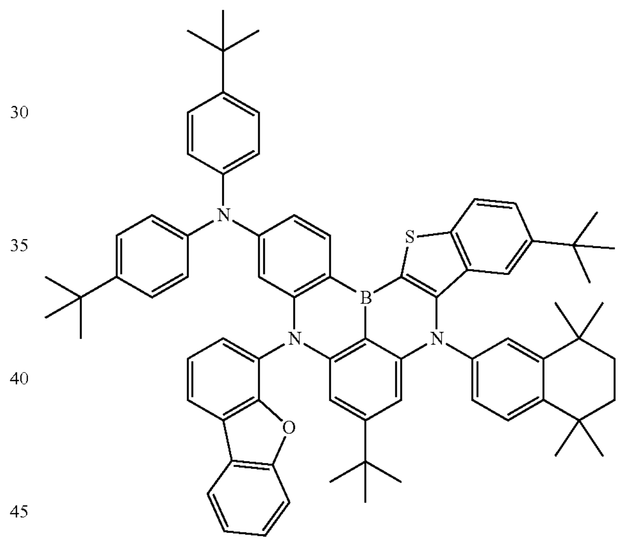

BD2_B3

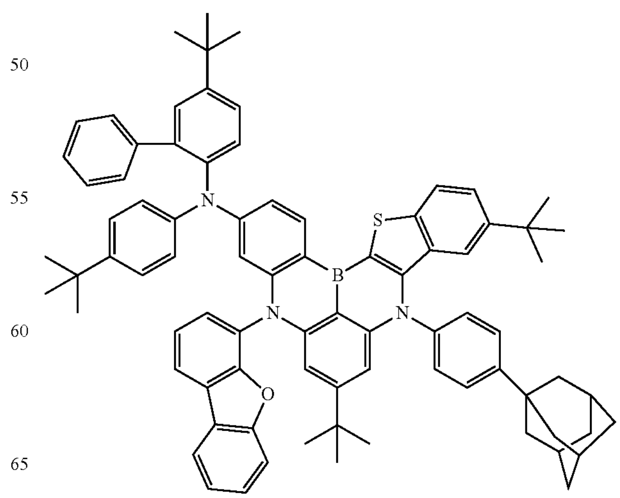

-continued
BD2_B4
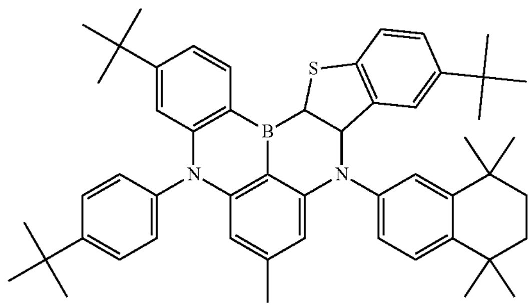
BD2_B5
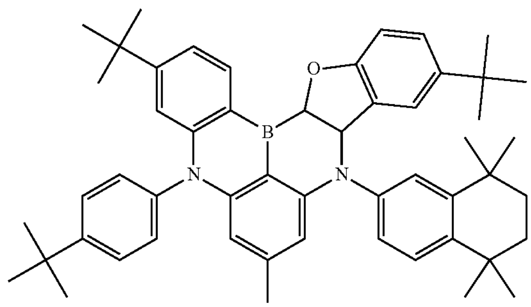
BD2_B6
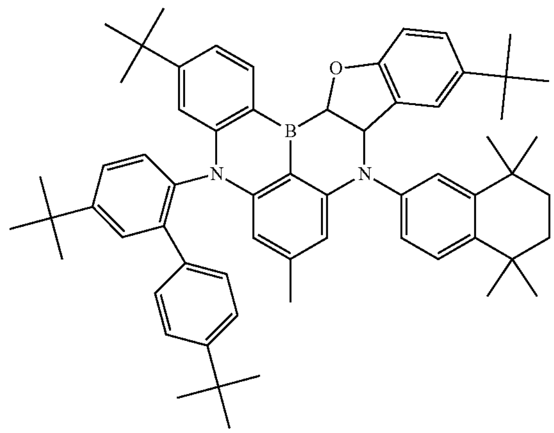
BD2_B7
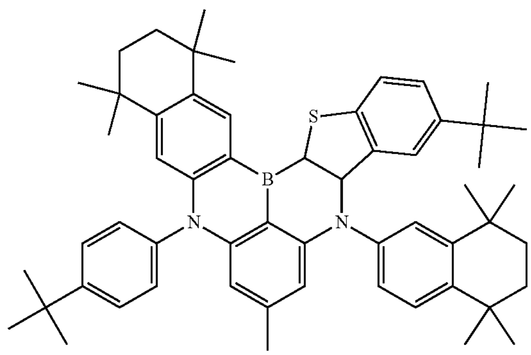
-continued
BD2_B8
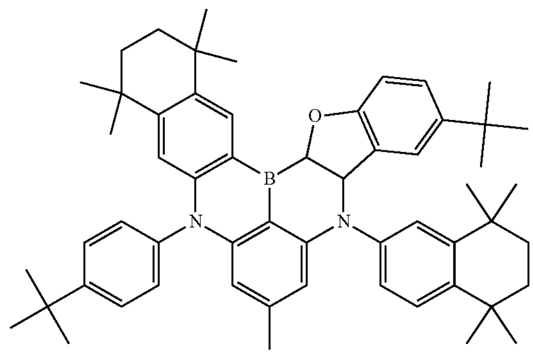
BD2_B9
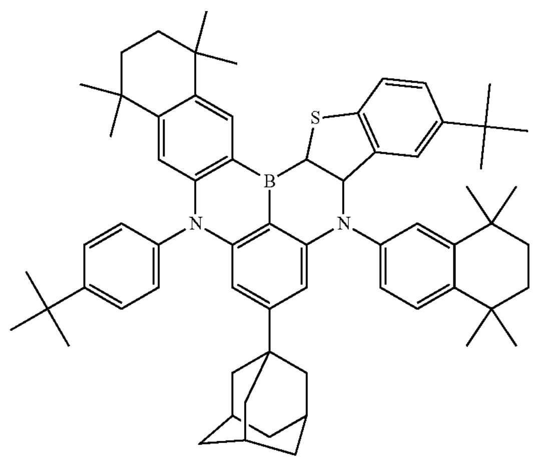
BD2_B10
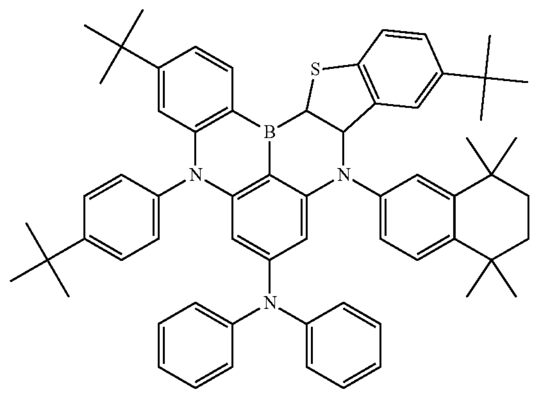

-continued
BD2_B11
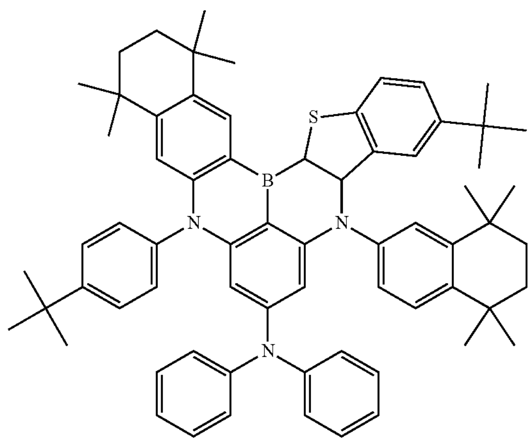
BD2_B12
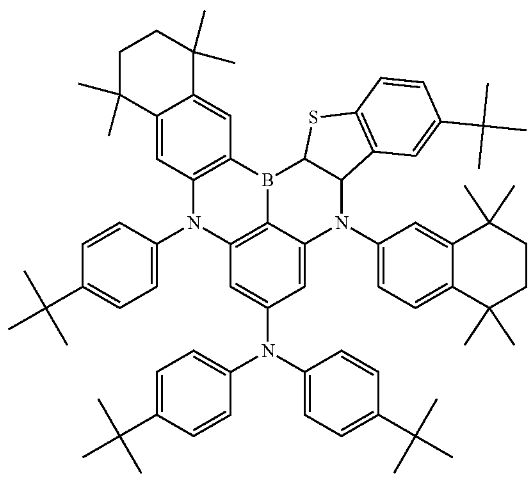
BD2_B13
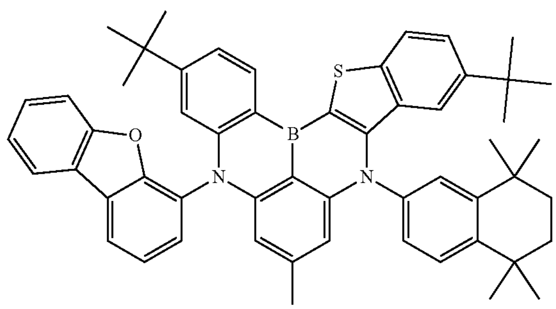
-continued
BD2_B14
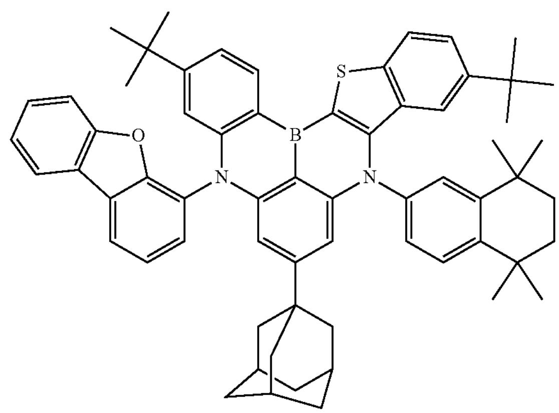
BD2_B15
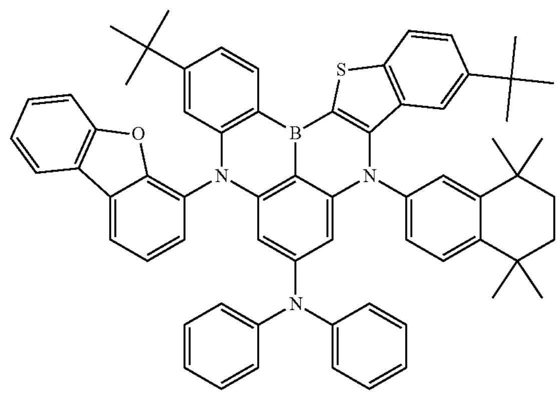
BD2_B16
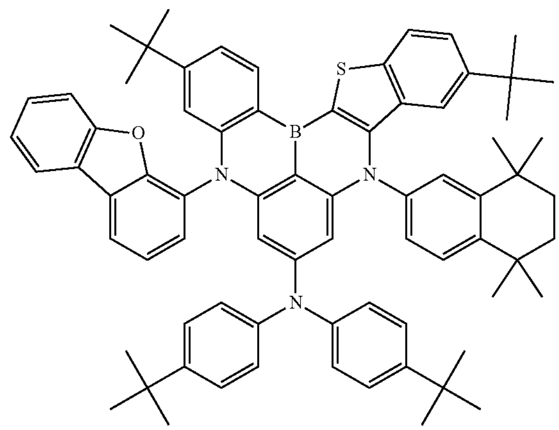

-continued

BD2_B17

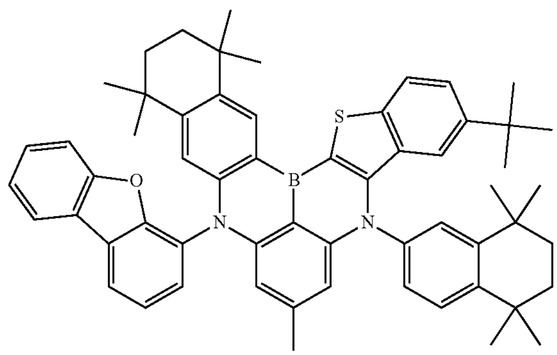

BD2_B18

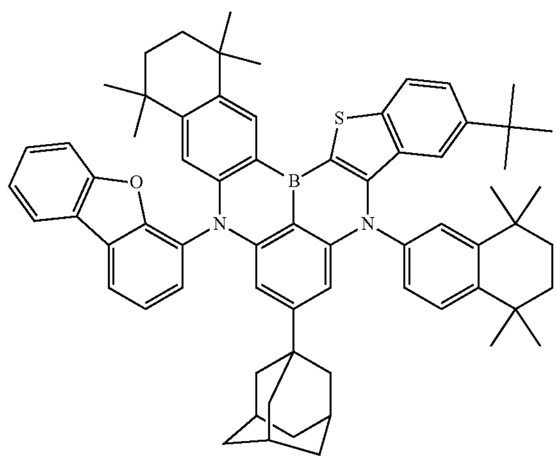

BD2_B19

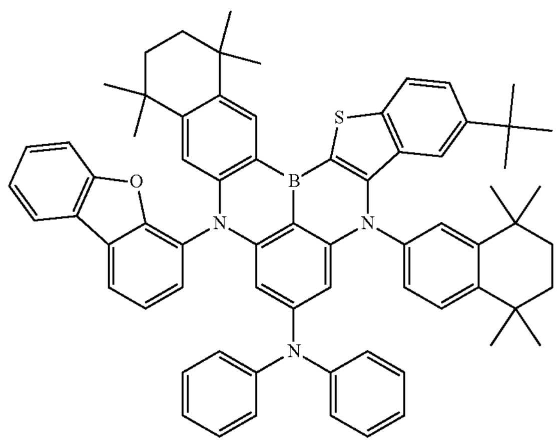

-continued

BD2_B20

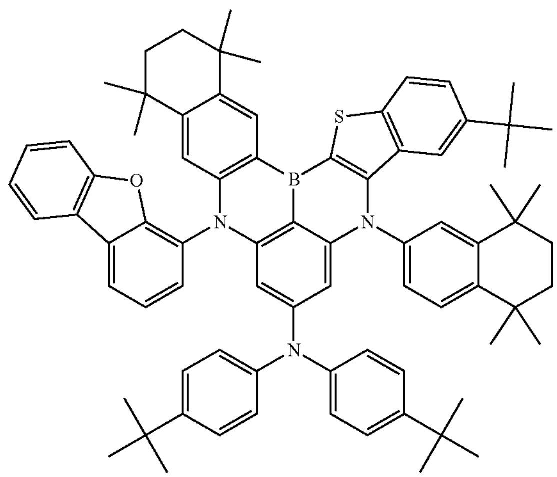

3. The organic light emitting diode according to claim 1, wherein the second dopant is a second compound represented by Formula 7:

[Formula 7]

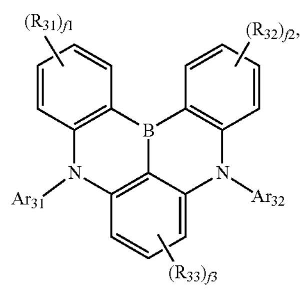

wherein in the Formula 7, each of f1 and f2 is independently an integer of 0 to 4, and f3 is an integer of 0 to 3, each of $Ar_{31}$ and $Ar_{32}$ is independently selected from the group consisting of a substituted or unsubstituted C6 to C30 aryl group, a substituted or unsubstituted C3 to C30 heteroaryl group and a substituted or unsubstituted C6 to C30 alicyclic group, and $R_{31}$, $R_{32}$ and $R_{33}$ is independently selected from the group consisting of a substituted or unsubstituted C1 to C30 alkyl group, a substituted or unsubstituted C3 to C30 cycloalkyl group, a substituted or unsubstituted C6 to C30 arylamino group, a substituted or unsubstituted C6 to C30 aryl group and a substituted or unsubstituted C3 to C30 heteroaryl group.

4. The organic light emitting diode according to claim 3, wherein the second dopant is represented by Formula 7a:

[Formula 7a]

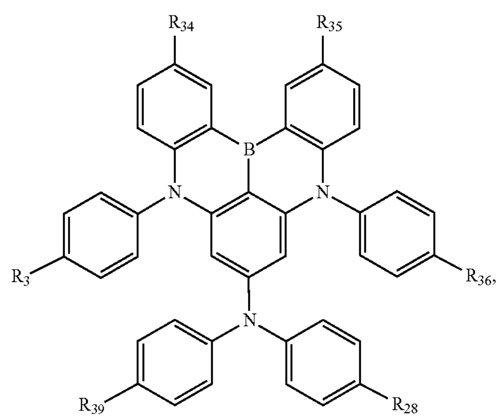

wherein in the Formula 7a, each of $R_{34}$ to $R_{39}$ is independently selected from the group consisting of hydrogen, a substituted or unsubstituted C1 to C30 alkyl group, a substituted or unsubstituted C3 to C30 cycloalkyl group, a substituted or unsubstituted C6 to C30 aryl group and a substituted or unsubstituted C3 to C30 heteroaryl group.

5. The organic light emitting diode according to claim 3, wherein the second dopant is one of compounds in Formula 8:

[Formula 8]

BD1_A1

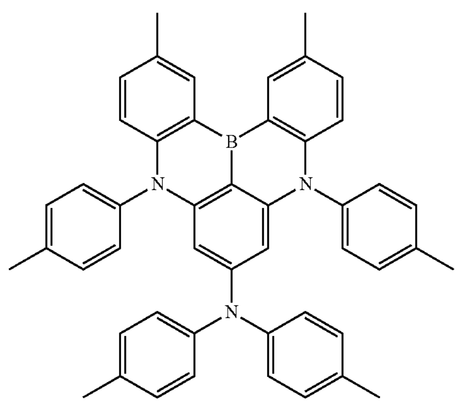

-continued

BD1_A2

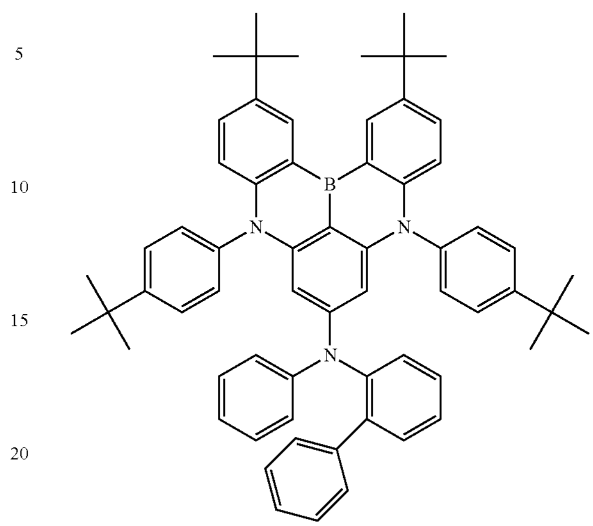

BD1_A3

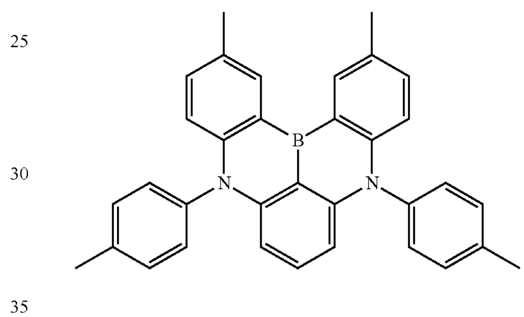

BD1_A4

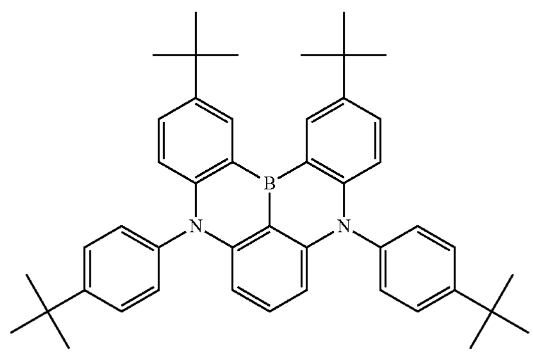

BD1_A5

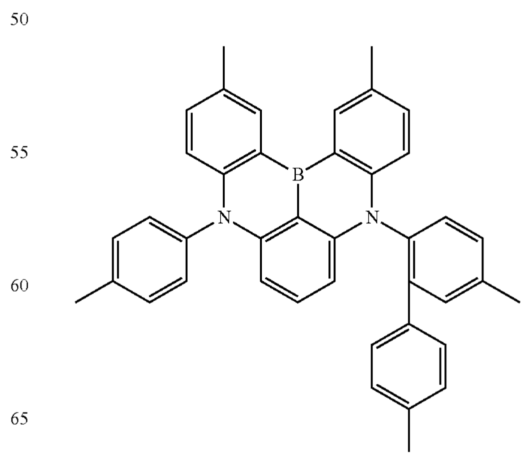

-continued
BD1_A6
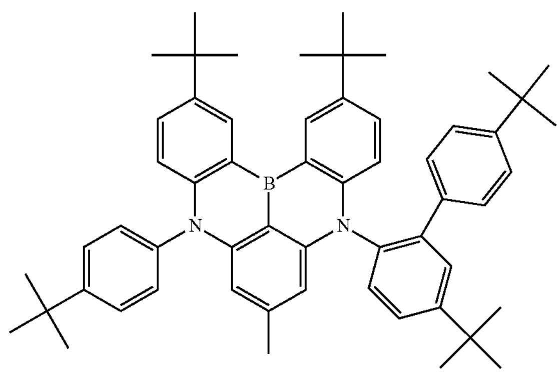
BD1_A7
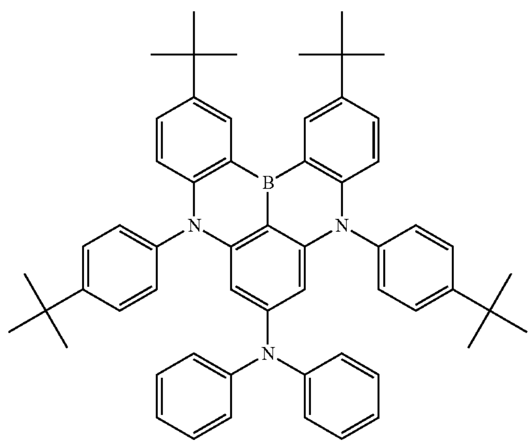
BD1_A8
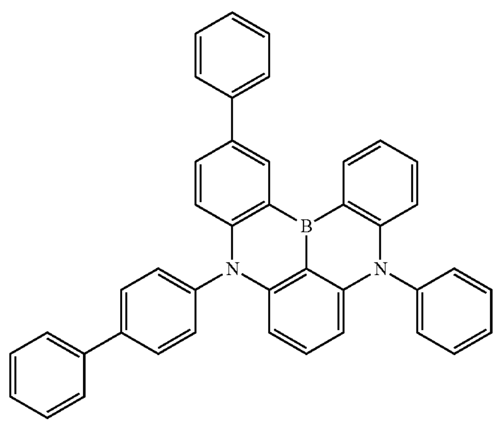
-continued
BD1_A9
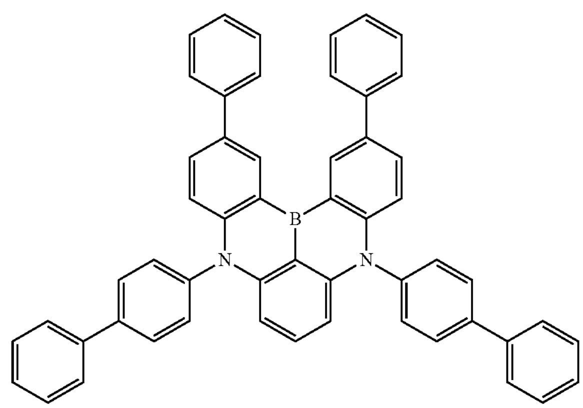
BD1_A10
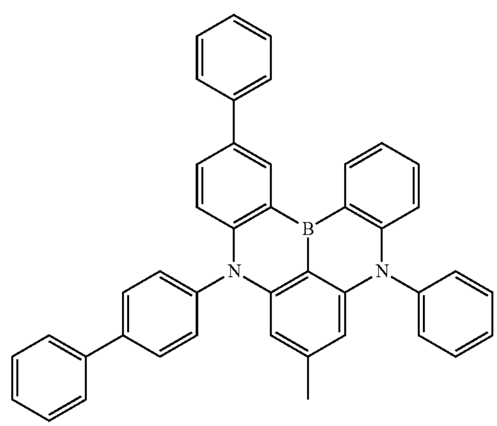
BD1_A11
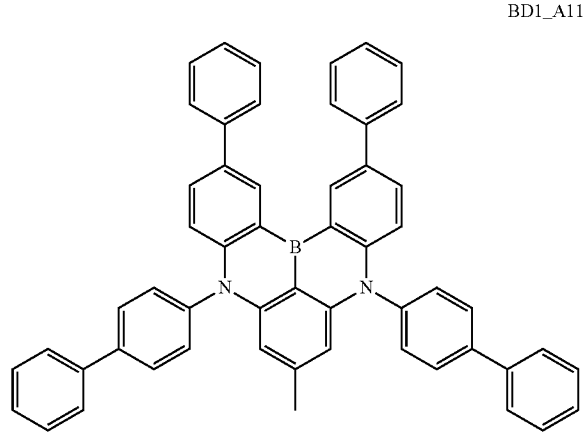

-continued
BD1_A12
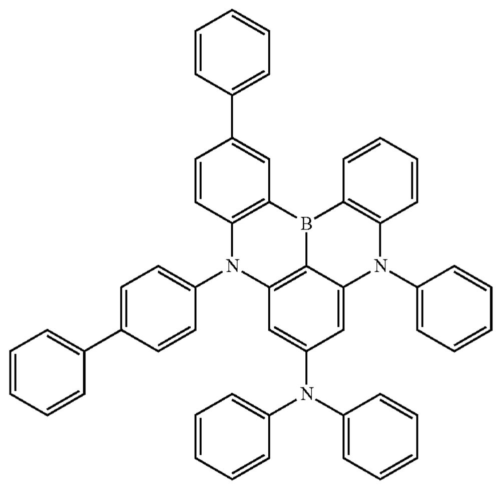
BD1_A13
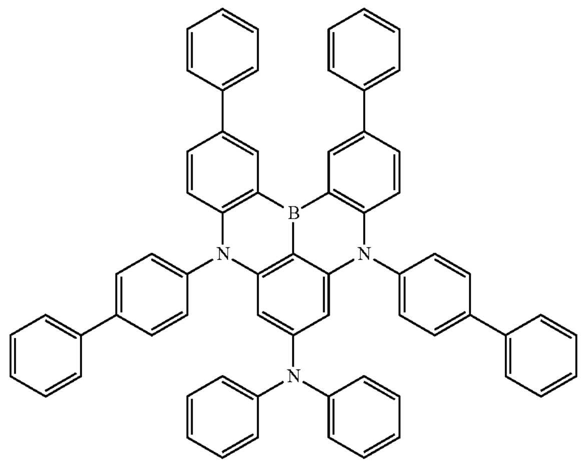
BD1_A14
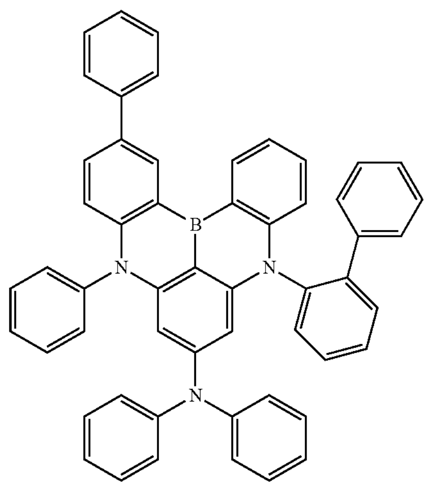
-continued
BD1_A15
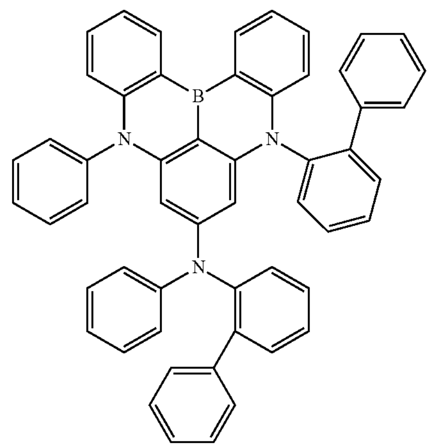
BD1_A16
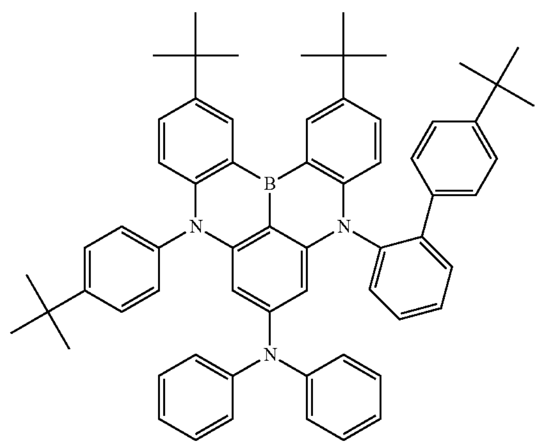
BD1_A17
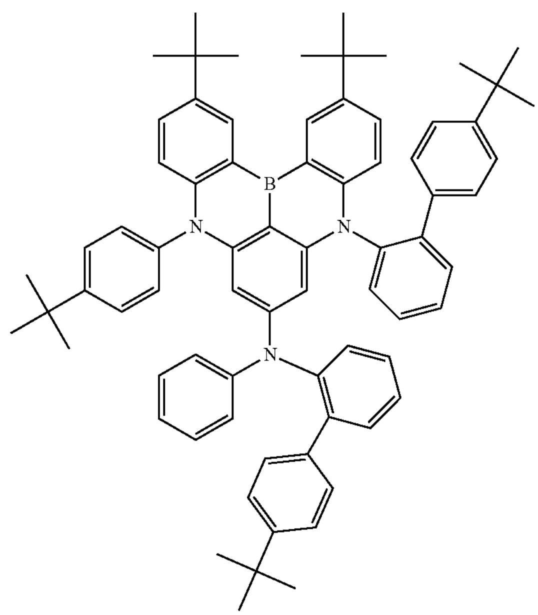

-continued

BD1_A18

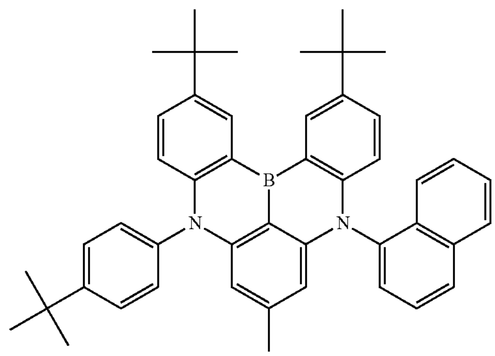

BD1_A19

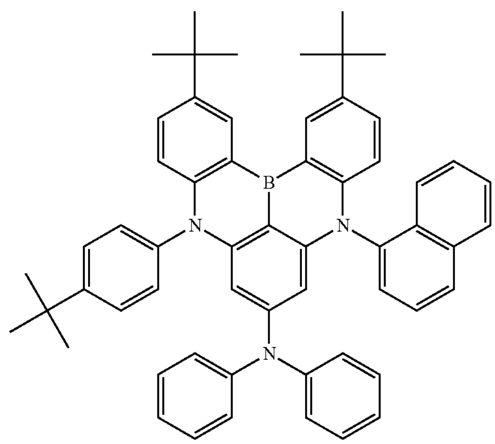

BD1_A20

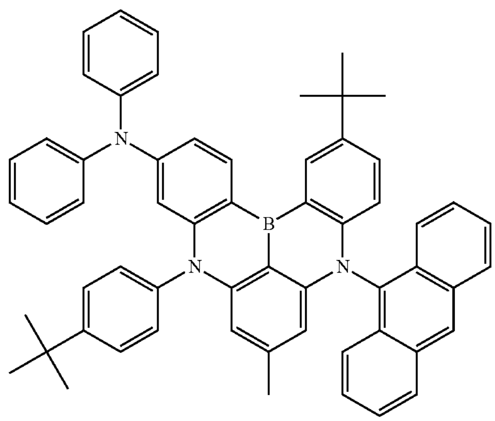

6. The organic light emitting diode according to claim 3, further comprising:

a second emitting part including a third blue emitting layer, a fourth blue emitting layer and a second electron transporting layer and positioned between the first emitting part and the second electrode, the fourth blue emitting layer positioned between the third blue emitting layer and the second electrode and contacting the third blue emitting layer, and the second electron transporting layer positioned between the fourth blue emitting layer and the second electrode, wherein the third blue emitting layer includes a third host and a third dopant, and the fourth blue emitting layer includes a fourth host and a fourth dopant, wherein the third host is an anthracene derivative having a third deuteration ratio, and the fourth host is an anthracene derivative having a fourth deuteration ratio smaller than the third deuteration ratio, wherein the third dopant is a third compound represented by the Formula 3, and the fourth dopant is a fourth compound represented by the Formula 7, and wherein the second electron transporting layer includes at least one of the first electron transporting material and the second electron transporting material.

7. The organic light emitting diode according to claim 1, wherein the first host is represented by Formula 1:

[Formula 1]

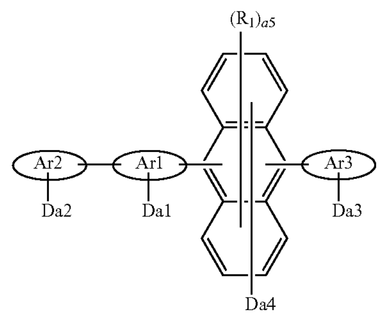

wherein in the Formula 1, each of a1, a2 and a3 is independently an integer of 0 or 30, each of a4 and a5 is independently an integer of 0 to 8, and at least one of a1 to a4 is a positive integer, Ar1 is selected from the group consisting of a single bond (a direct bond), a substituted or unsubstituted C6 to C30 arylene group and a substituted or unsubstituted C3 to C30 heteroarylene group, each of Ar2 and Ar3 is selected from the group consisting of a substituted or unsubstituted C6 to C30 aryl group and a substituted or unsubstituted C3 to C30 heteroaryl group, and $R_1$ is selected from the group consisting of a C1 to C30 alkyl group unsubstituted or substituted with deuterium and a C3 to C30 cycloalkyl group unsubstituted or substituted with deuterium, wherein the second host is represented by Formula 5:

[Formula 5]

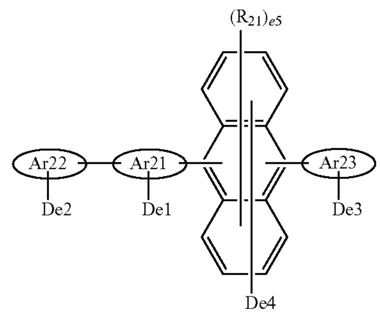

wherein in the Formula 5, each of e1, e2 and e3 is independently an integer of 0 or 30, each of e4 and e5 is independently an integer of 0 to 8, and a summation of e1 to e4 is smaller than a summation of a1 to a4 in Formula 1, Ar21 is selected from the group consisting of a single bond (a direct bond), a substituted or unsubstituted C6 to C30 arylene group and a substituted or unsubstituted C3 to C30 heteroarylene group, each of Ar22 and Ar23 is selected from the group consisting of a substituted or unsubstituted C6 to C30 aryl group and a substituted or unsubstituted C3 to C30 heteroaryl group, and $R_{21}$ is selected from the group consisting of a C1 to C30 alkyl group unsubstituted or substituted with deuterium and a C3 to C30 cycloalkyl group unsubstituted or substituted with deuterium.

8. The organic light emitting diode according to claim 7, wherein the first host is represented by Formula 1a:

[Formula 1a]

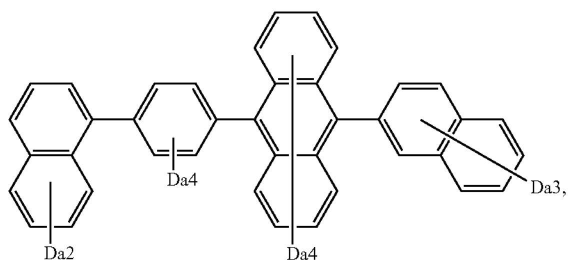

wherein in the Formula 1a, a1 is an integer of 0 to 4, each of a2 and a3 is independently an integer of 0 to 7, a4 is an integer of 0 to 8, and at least one of a1 to a4 is a positive integer, wherein the second host is represented by Formula 5a:

[Formula 5a]

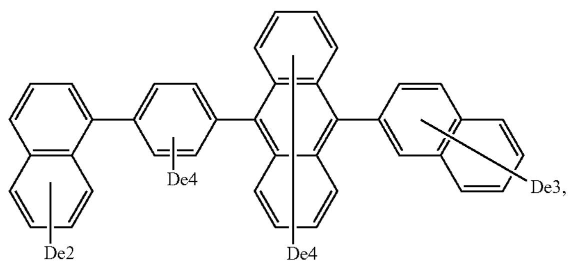

wherein in the Formula 5a, e1 is an integer of 0 to 4, each of e2 and e3 is independently an integer of 0 to 7, e4 is an integer of 0 to 8, and a summation of e1 to e4 is smaller than a summation of a1 to a4 in Formula 1a.

9. The organic light emitting diode according to claim 7, wherein the first host includes at least one of first host compounds in Formula 2:

[Formula 2]

BH1_D1

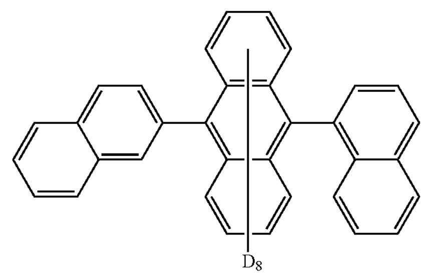

BH1_D2

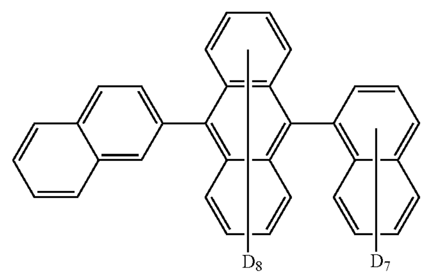

BH1_D3

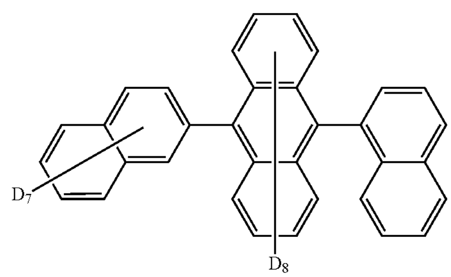

BH1_D4

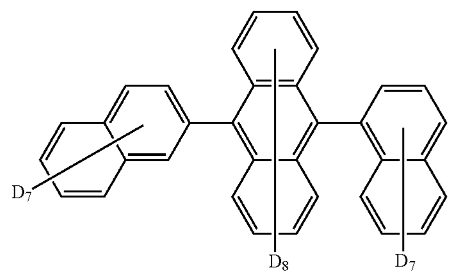

BH2_D1

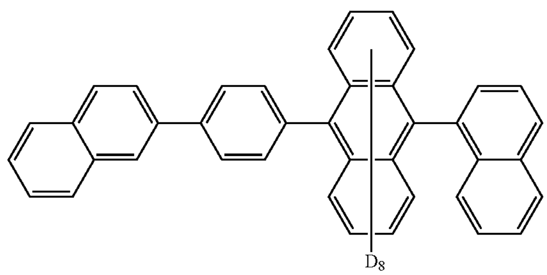

-continued
BH2_D2
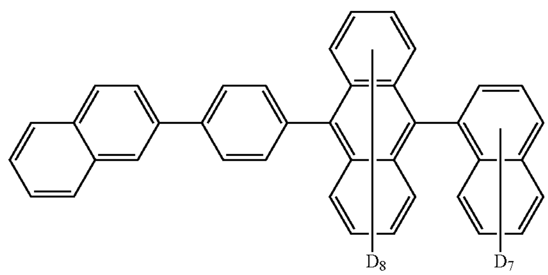
BH2_D3
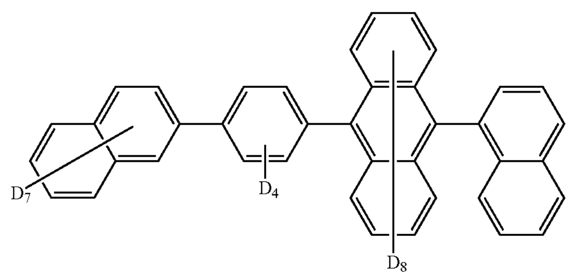
BH2_D4
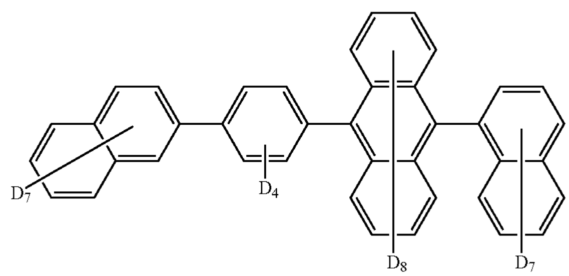
BH3_D1
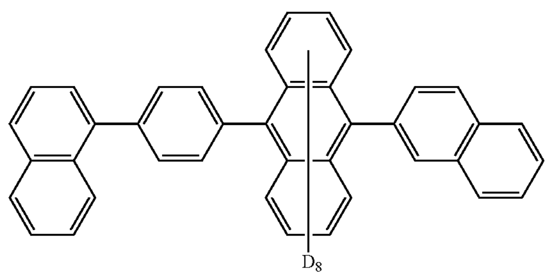
BH3_D2
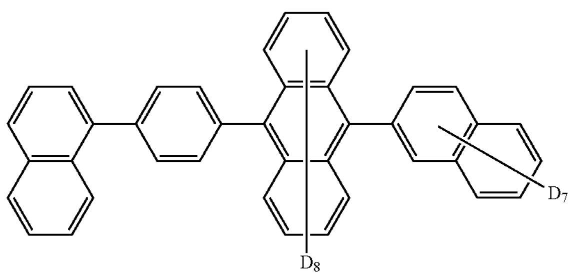
-continued
BH3_D3
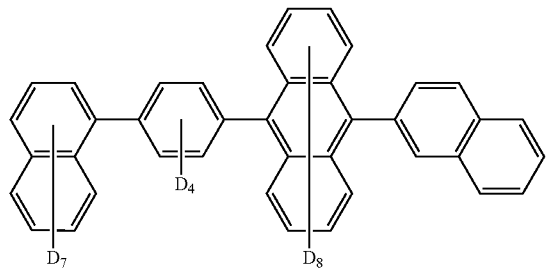
BH3_D4
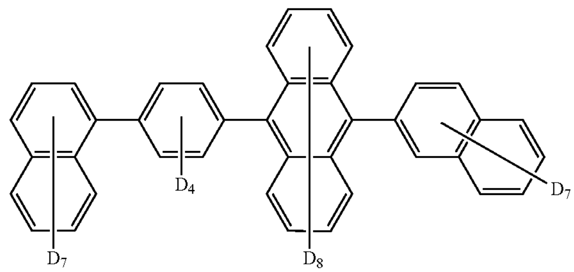
BH4_D1
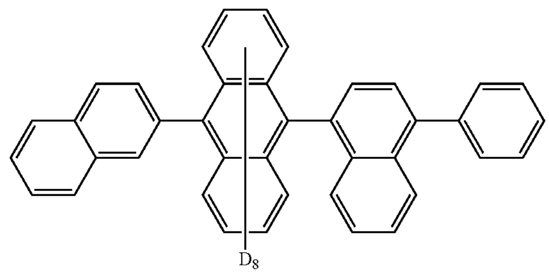
BH4_D2
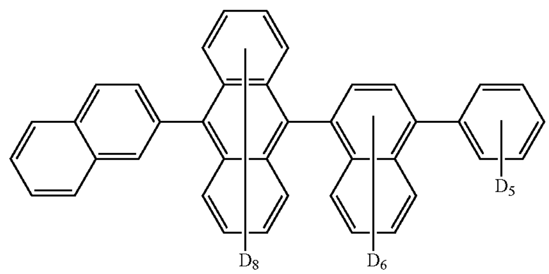
BH4_D3
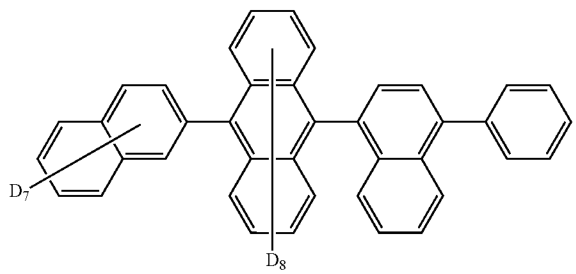

BH4_D4
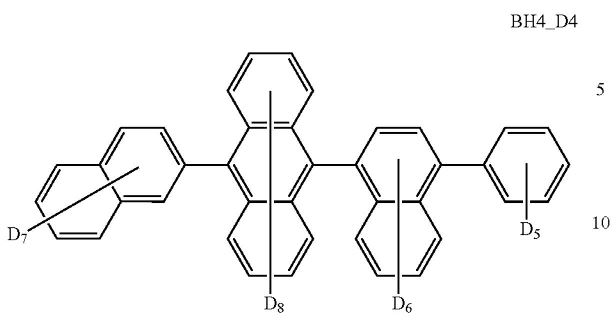
BH5_D1
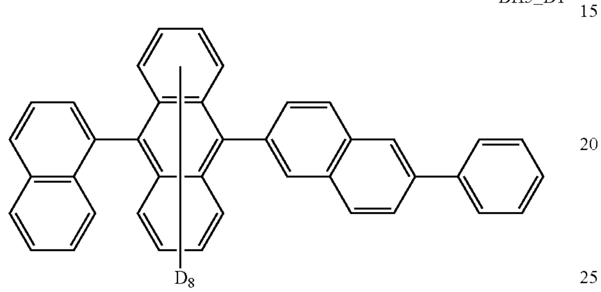
BH5_D2
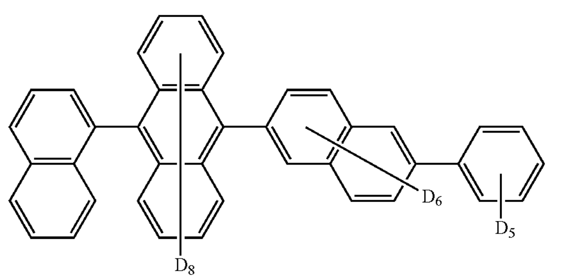
BH5_D3
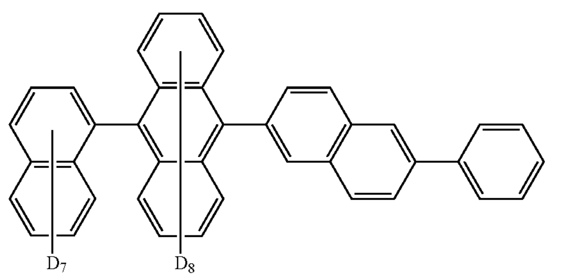
BH5_D4
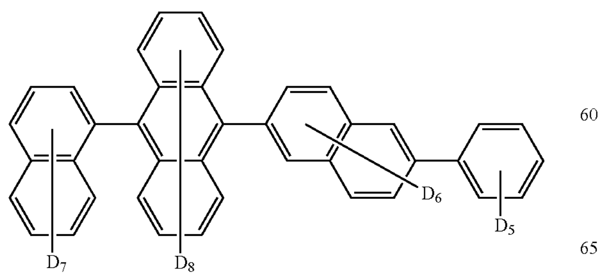
BH6_D1
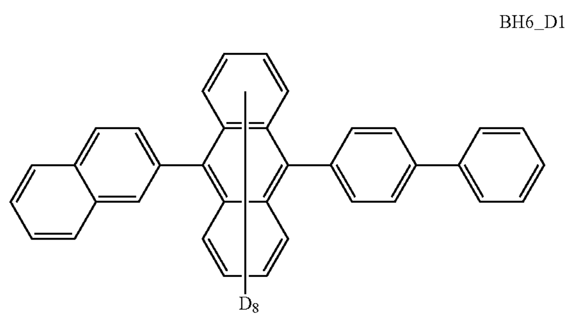
BH6_D2
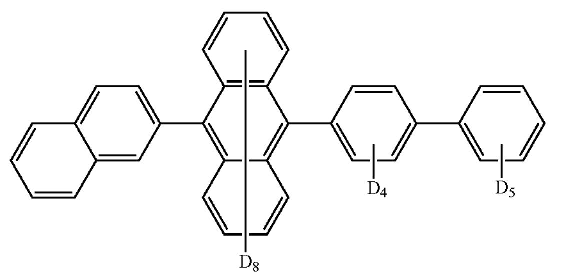
BH6_D3
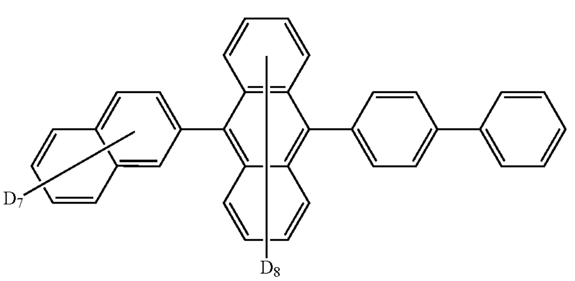
BH6_D4
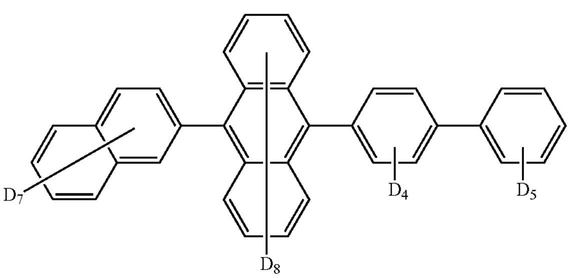
BH7_D1
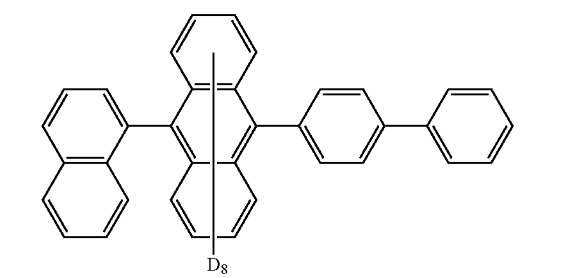

-continued
BH7_D2
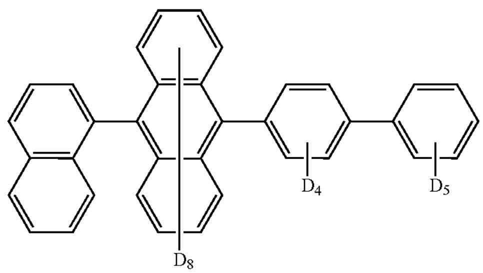
BH7_D3
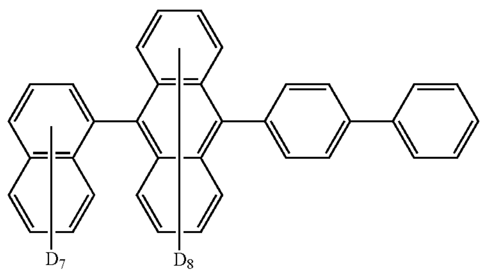
BH7_D4
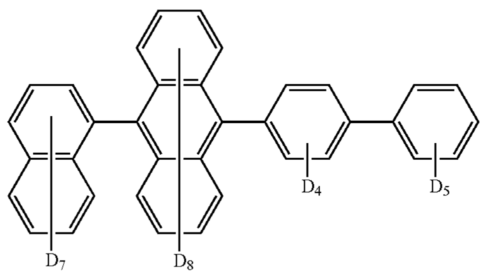
BH8_D1
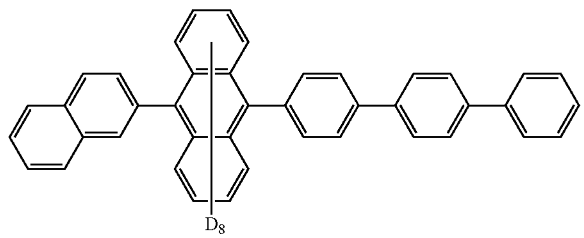
BH8_D2
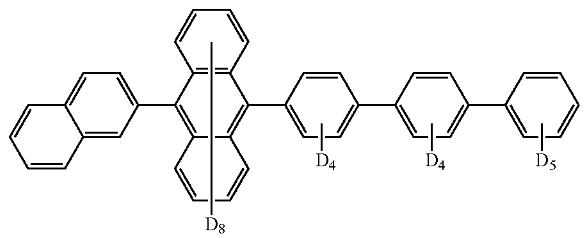
-continued
BH8_D3
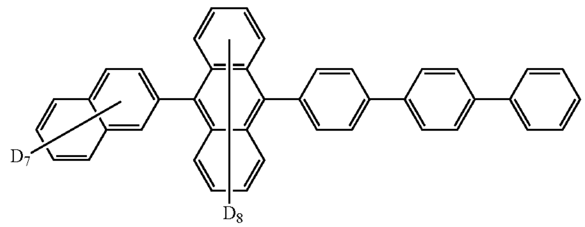
BH8_D4
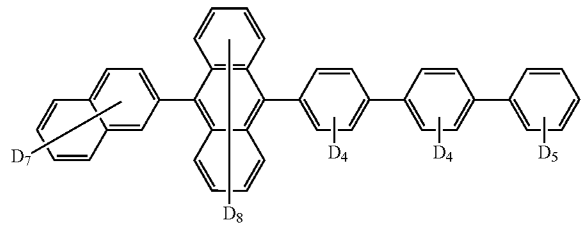
BH9_D1
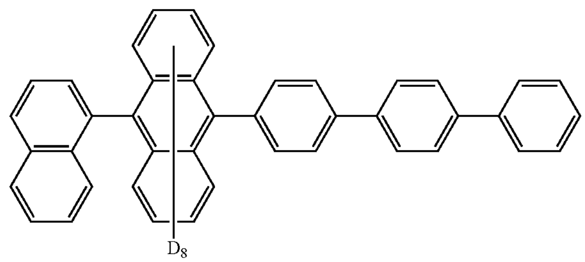
BH9_D2
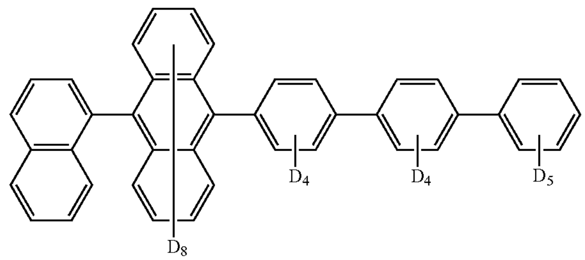
BH9_D3
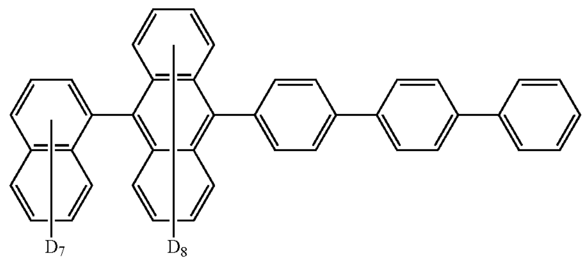
BH9_D4
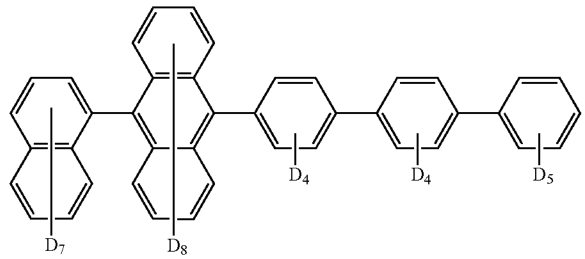

-continued
BH10_D1
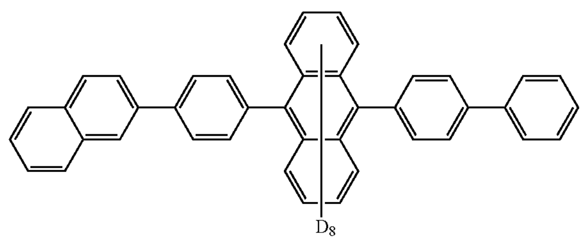
BH10_D2
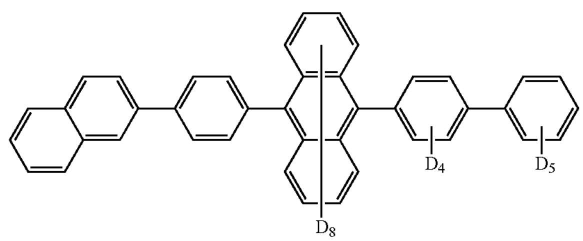
BH10_D3
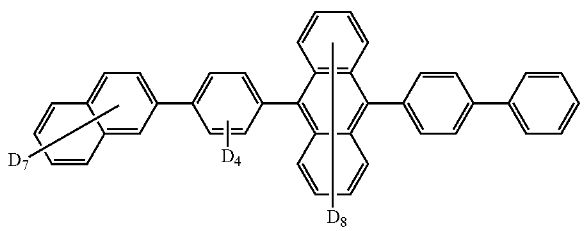
BH10_D4
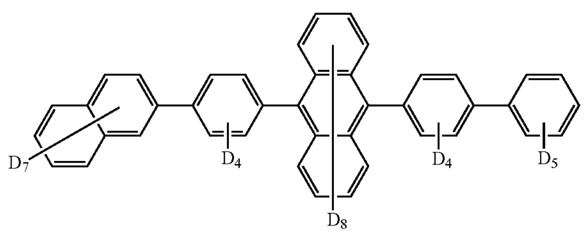
BH11_D1
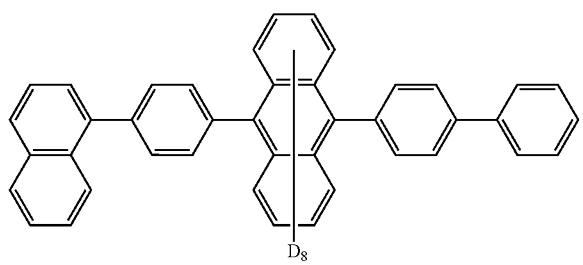
BH11_D2
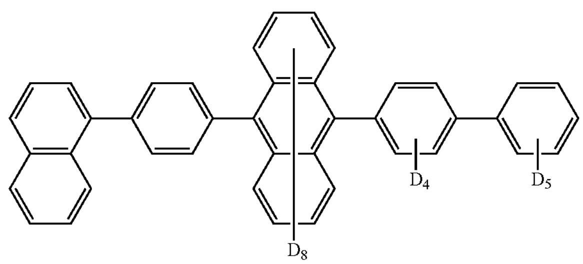
-continued
BH11_D3
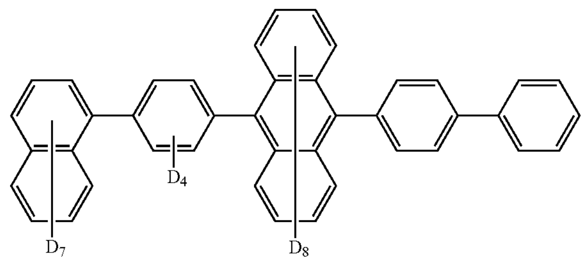
BH11_D4
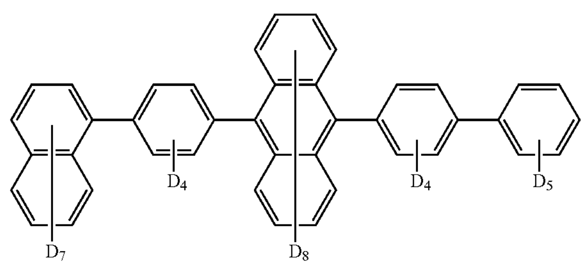
BH12_D1
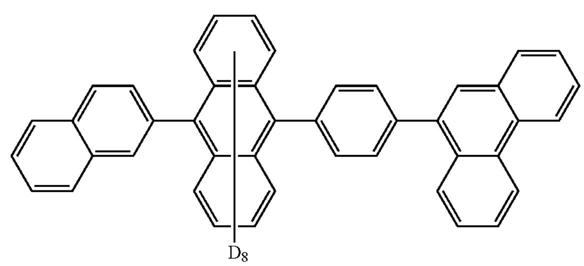
BH12_D2
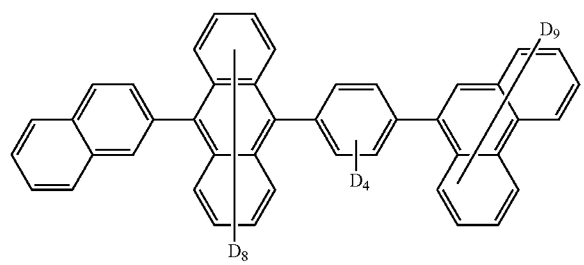
BH12_D3
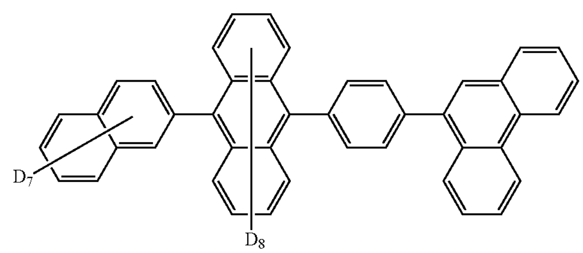

-continued
BH12_D4
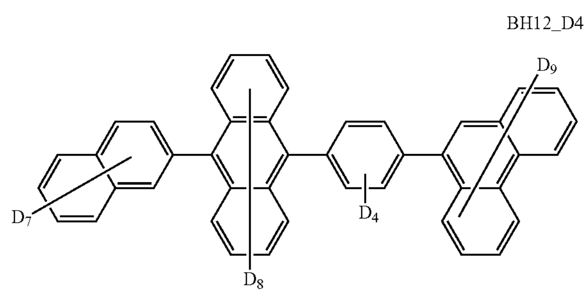
BH13_D1
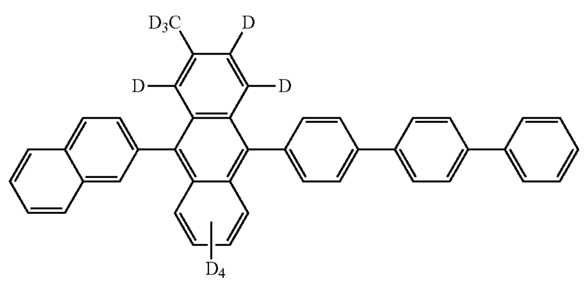
BH13_D2
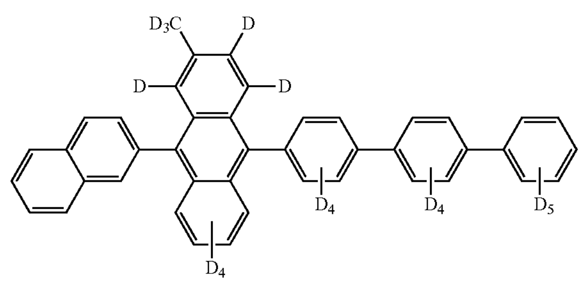
BH13_D3
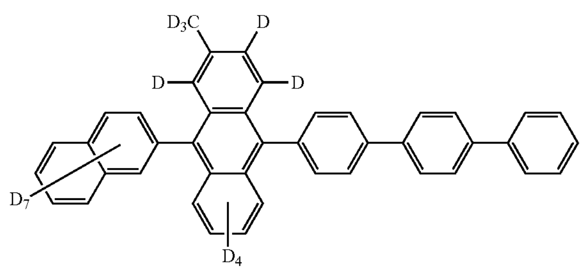
BH13_D4
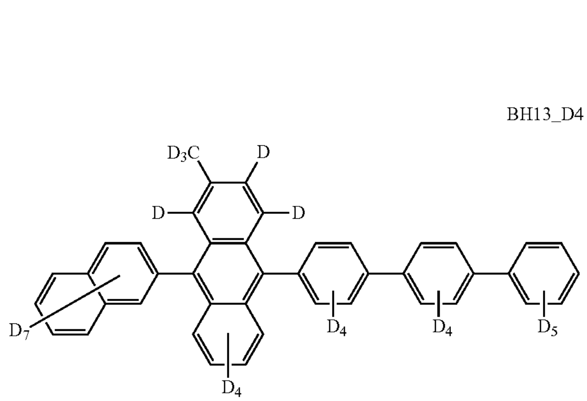
-continued
BH14_D1
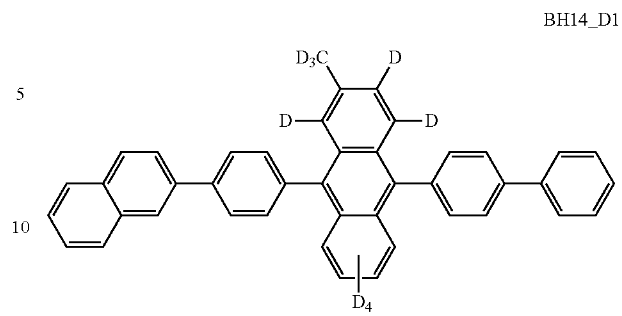
BH14_D2
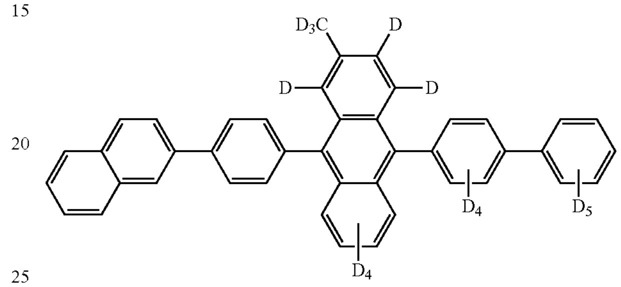
BH14_D3
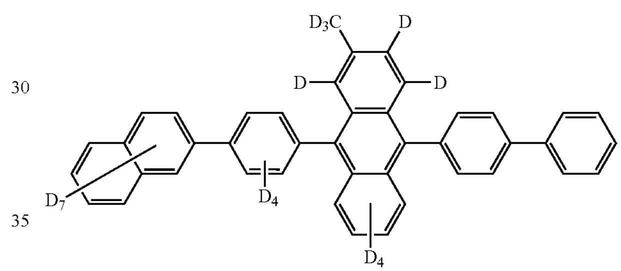
BH14_D4
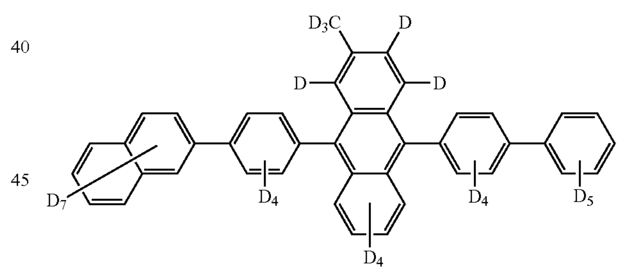
BH15_D1
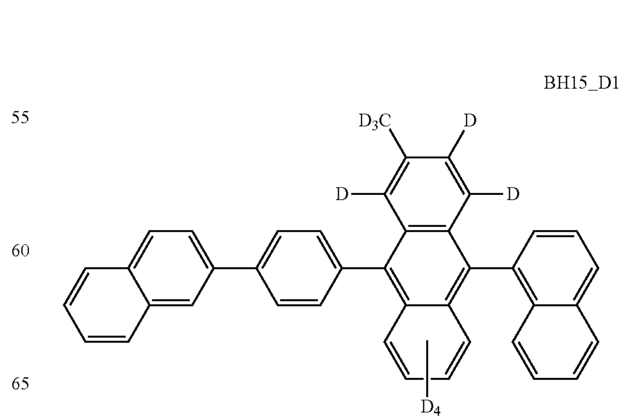

-continued
BH15_D2
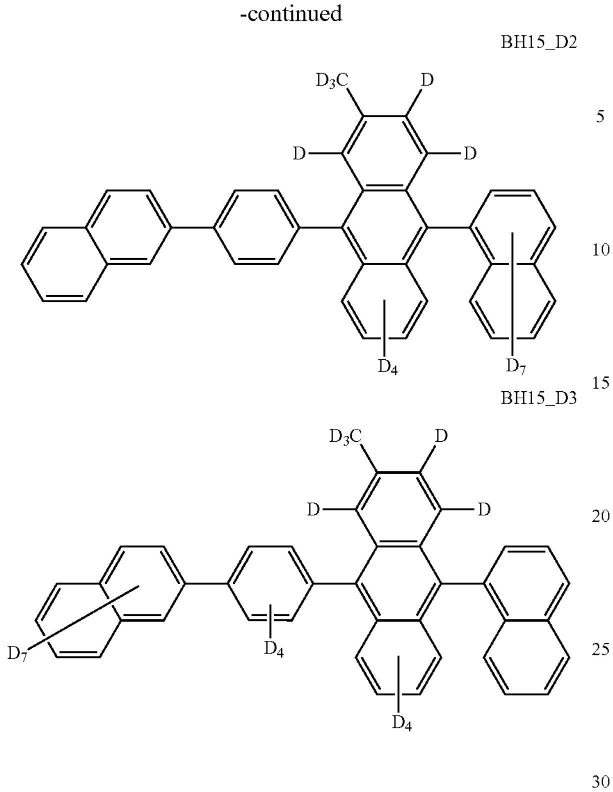
BH15_D3
BH15_D4
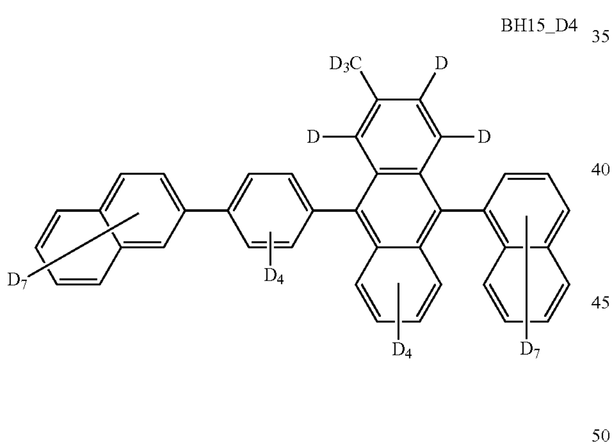
BH16_D1
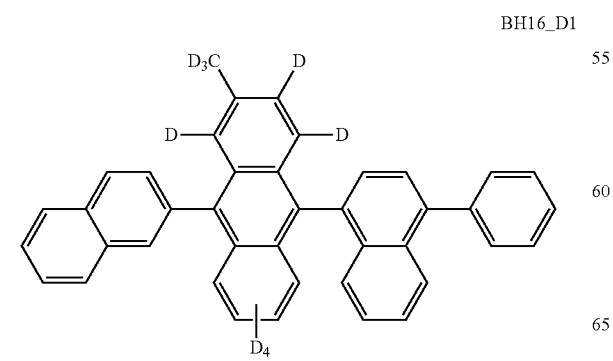
-continued
BH16_D2
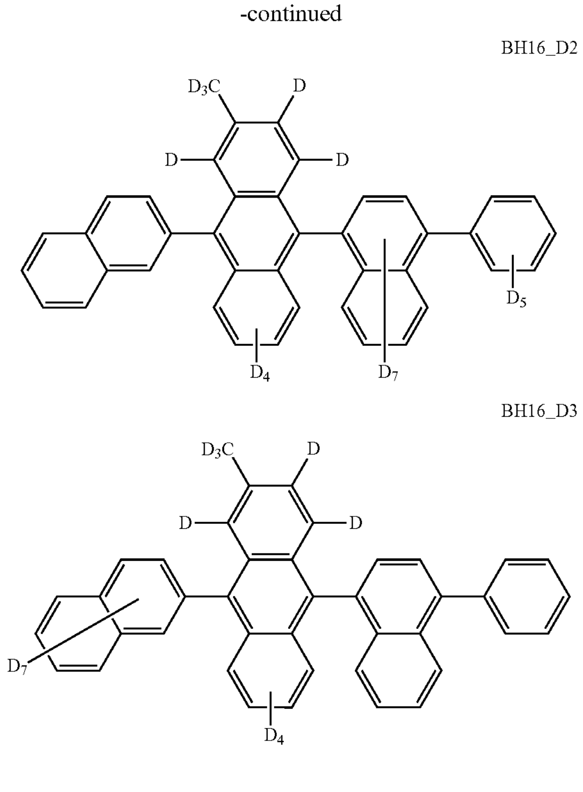
BH16_D3
BH16_D4
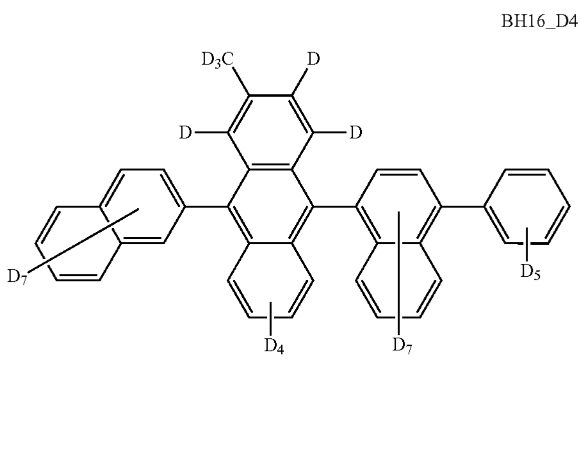
BH17_D1
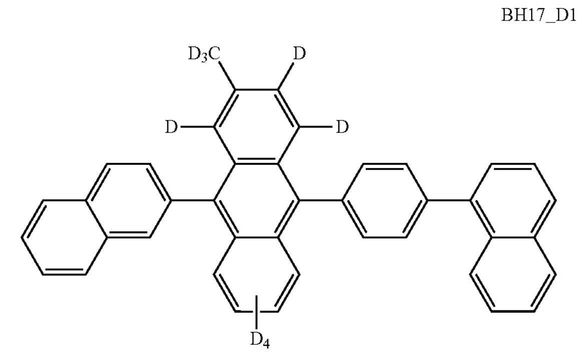

-continued
BH17_D2
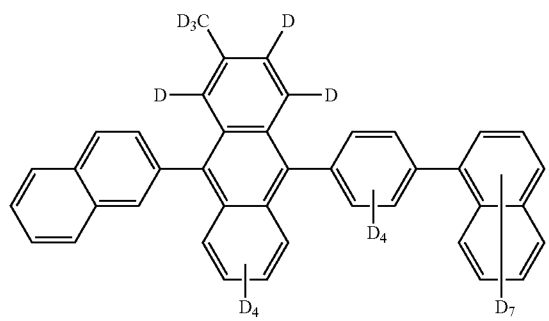
BH17_D3
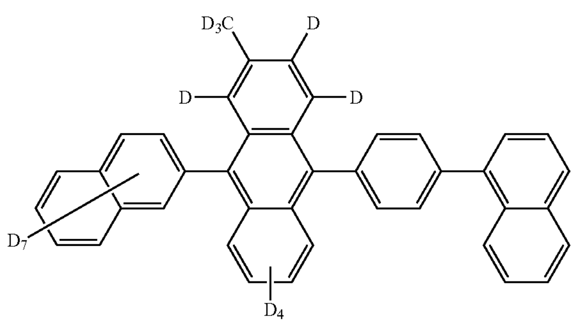
BH17_D4
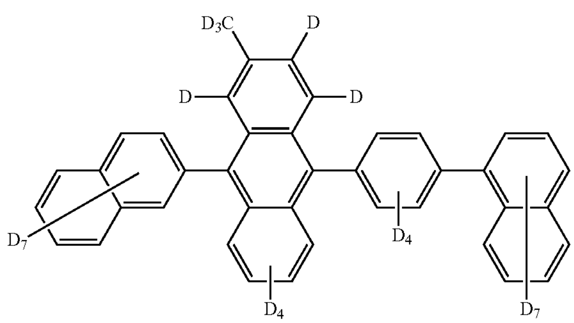
BH18_D1
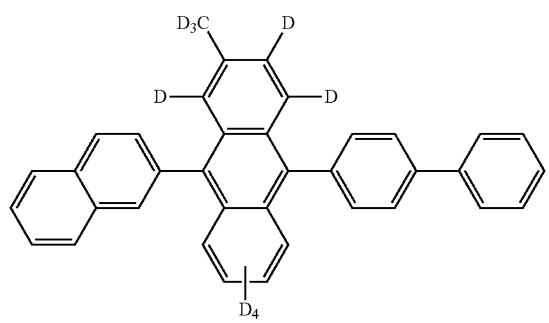
-continued
BH18_D2
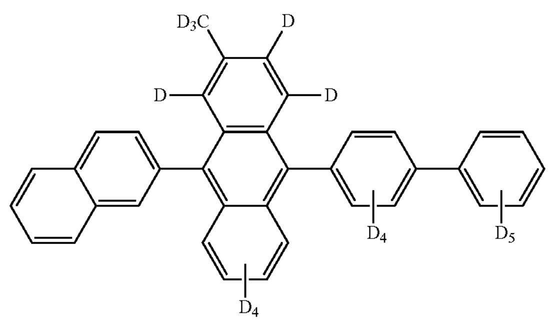
BH18_D3
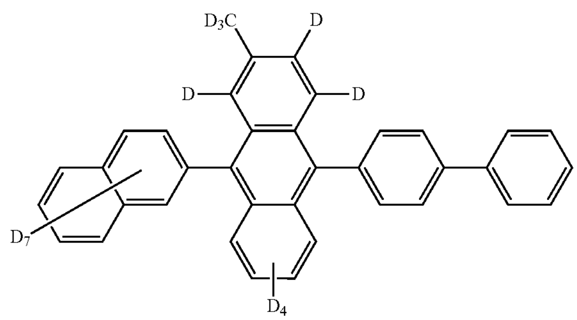
BH18_D4
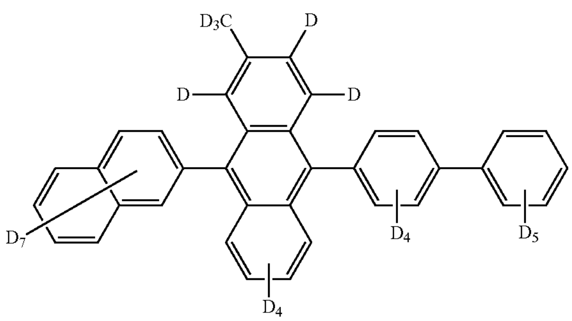
10. The organic light emitting diode according to claim 7, wherein the second host includes at least one of second host compounds in Formula 6:
[Formula 6]
BH1
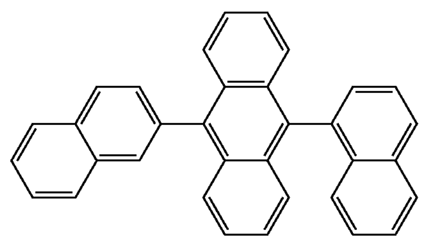

-continued
BH1_D1
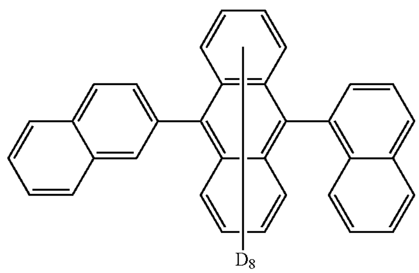
BH1_D2
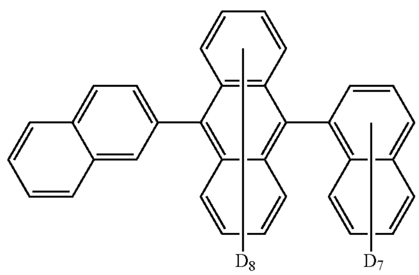
BH1_D3
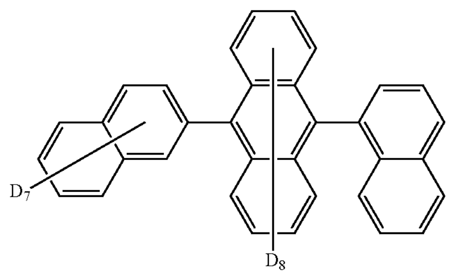
BH1_D4
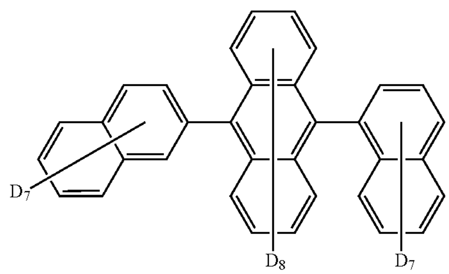
BH2
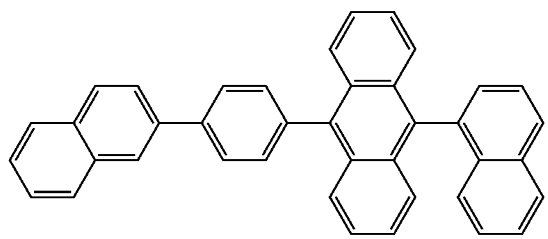
-continued
BH2_D1
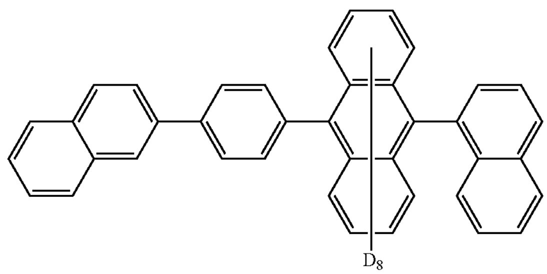
BH2_D2
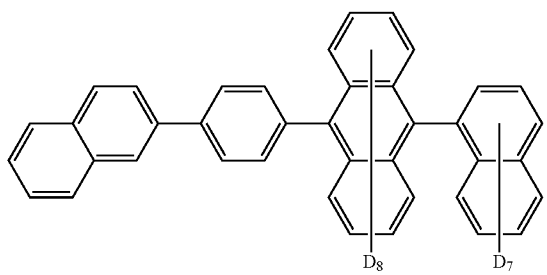
BH2_D3
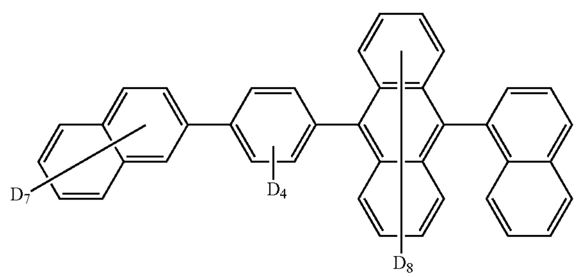
BH2_D4
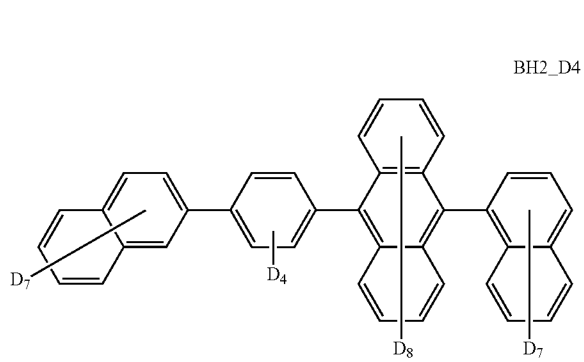
BH3
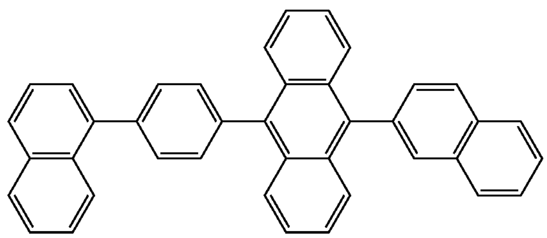

-continued
BH3_D1
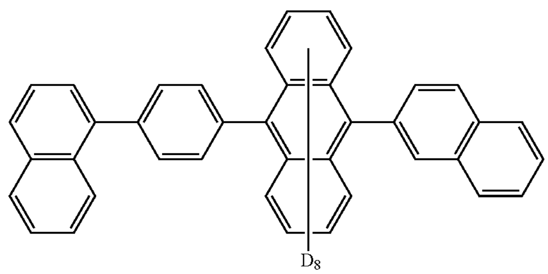
BH3_D2
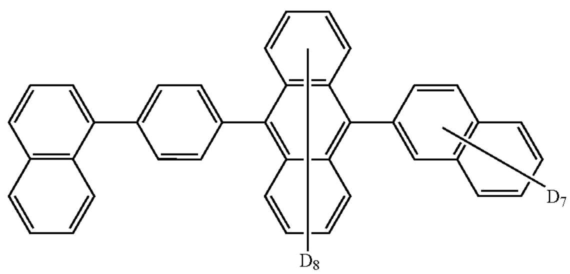
BH3_D3
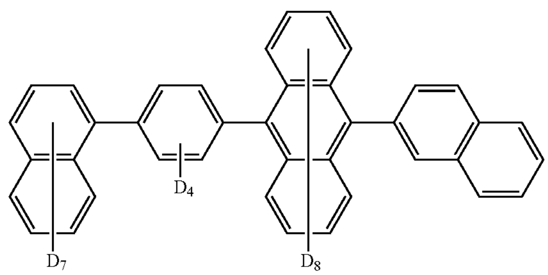
BH3_D4
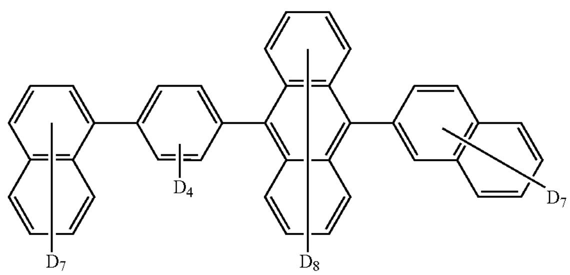
BH4
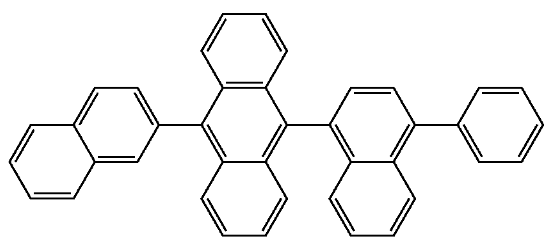
-continued
BH4_D1
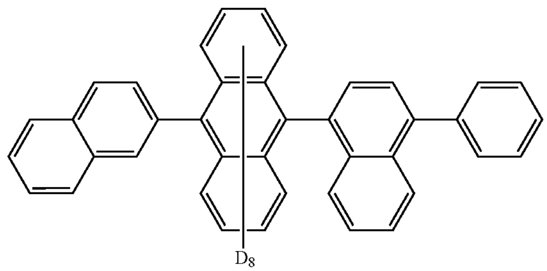
BH4_D2
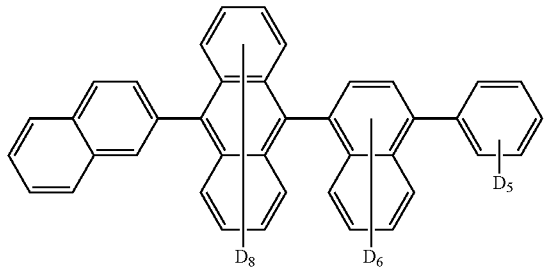
BH4_D3
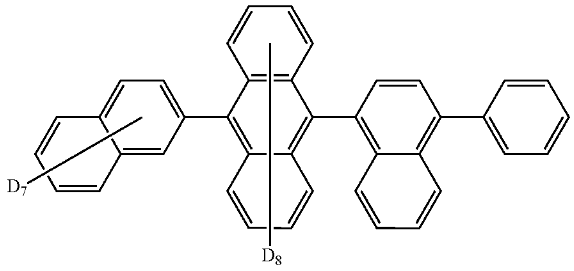
BH4_D4
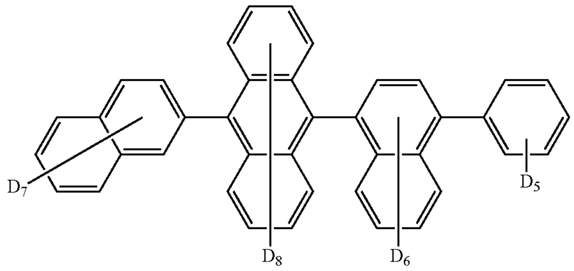
BH5
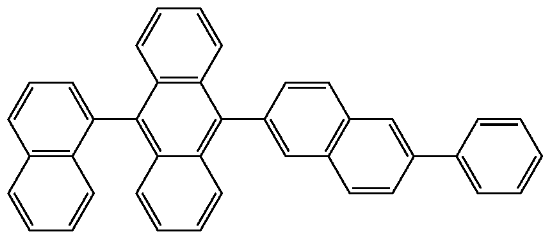

-continued
BH5_D1
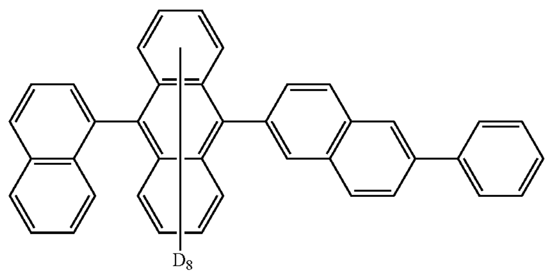
BH5_D2
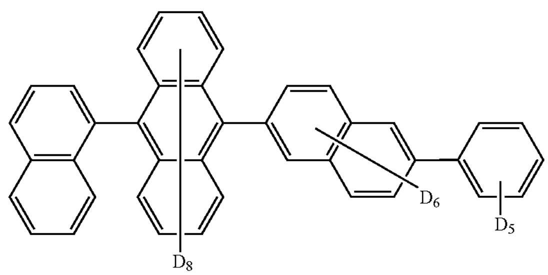
BH5_D3
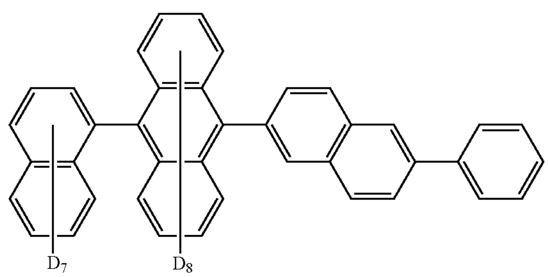
BH5_D4
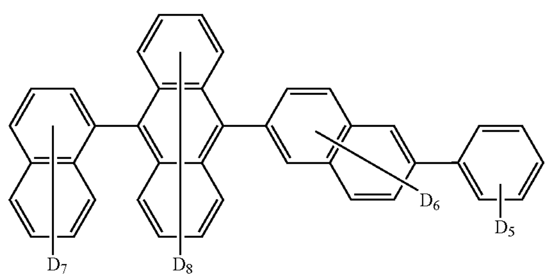
BH6
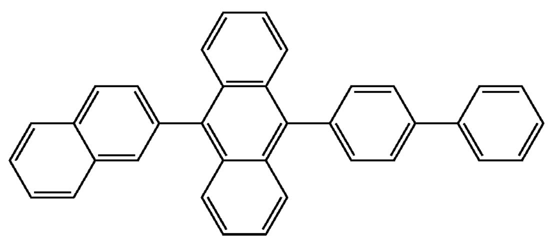
-continued
BH6_D1
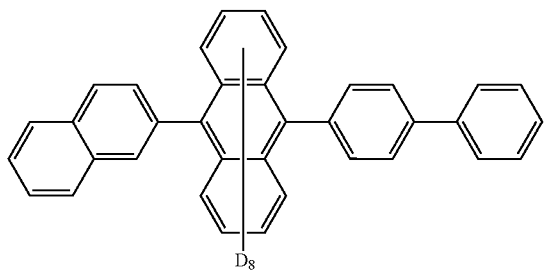
BH6_D2
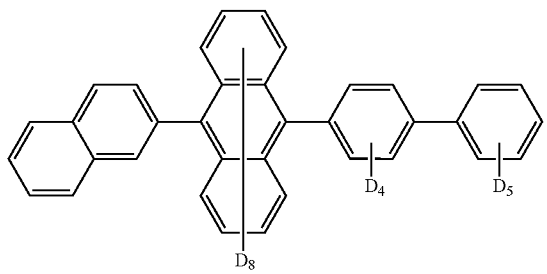
BH6_D3
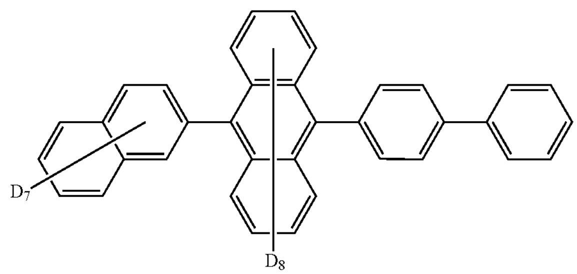
BH6_D4
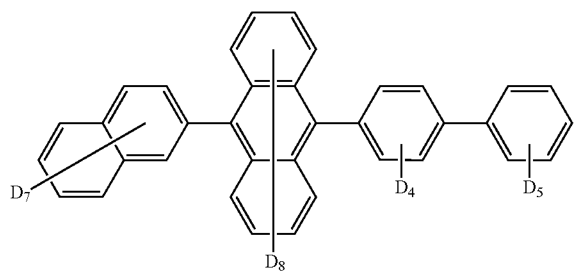
BH7
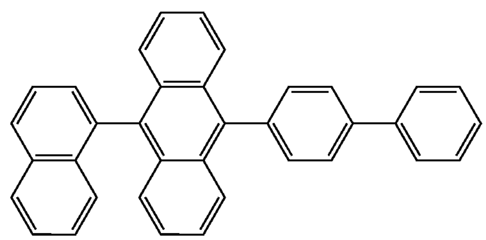

-continued
BH7_D1
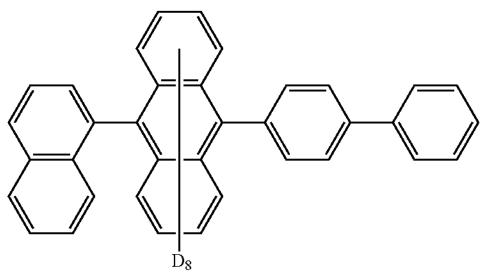
BH7_D2
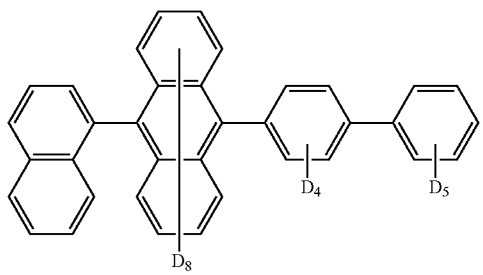
BH7_D3
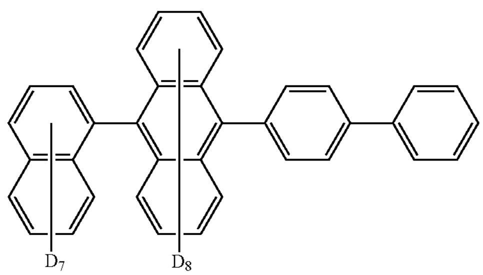
BH7_D4
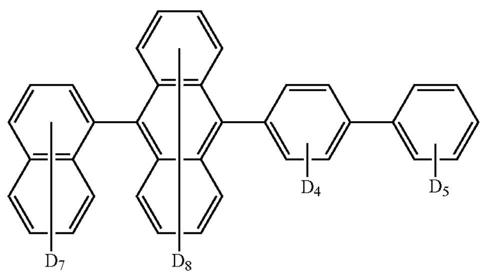
BH8
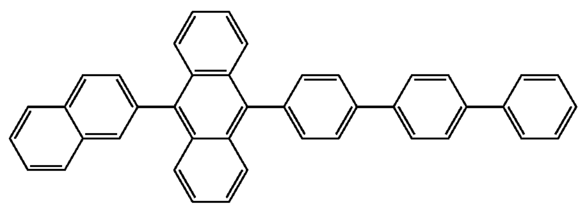
-continued
BH8_D1
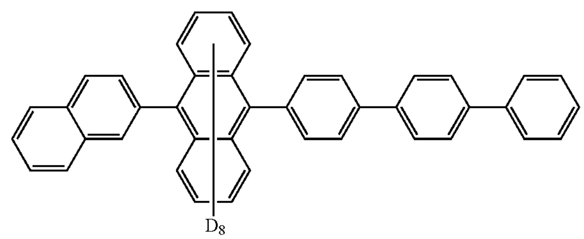
BH8_D2
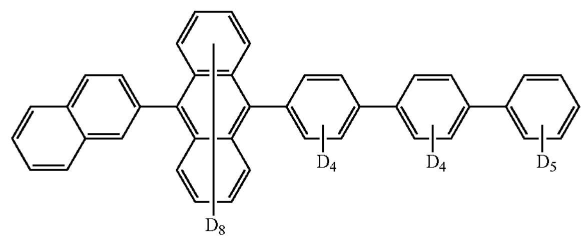
BH8_D3
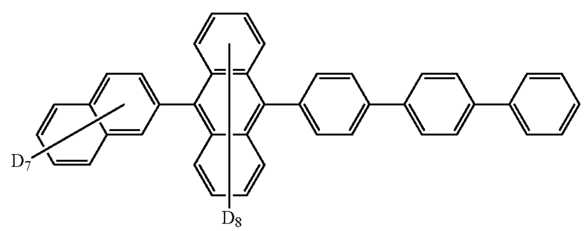
BH8_D4
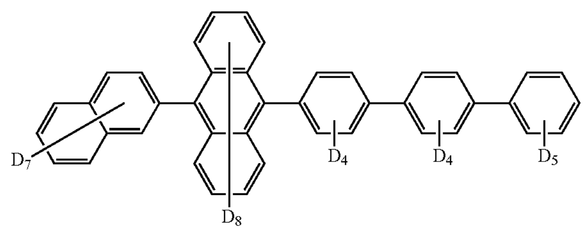
BH9
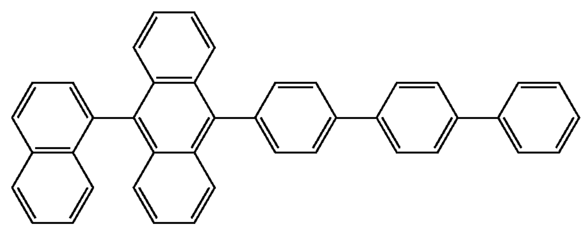
BH9_D1
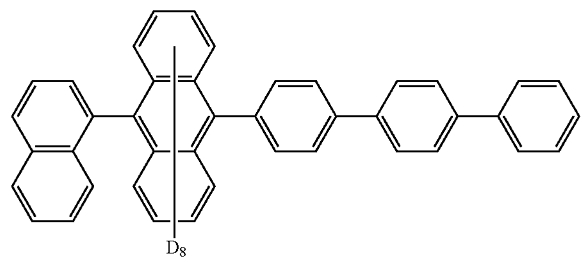

-continued
BH9_D2
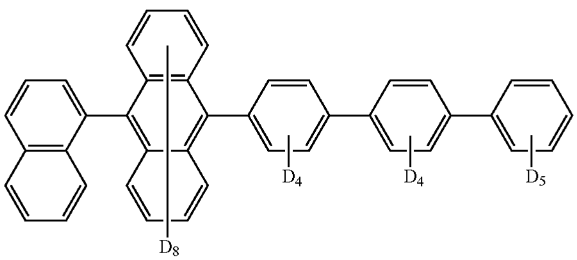
BH9_D3
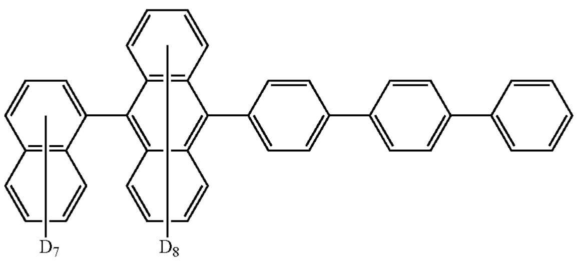
BH9_D4
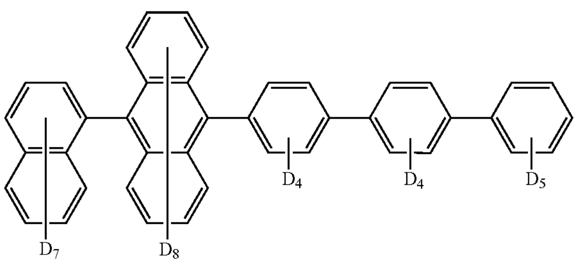
BH10
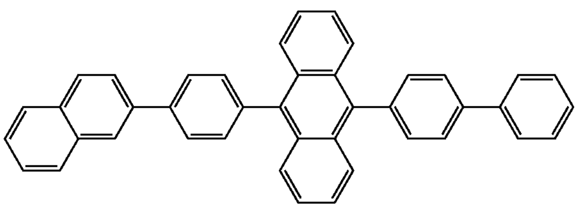
BH10_D1
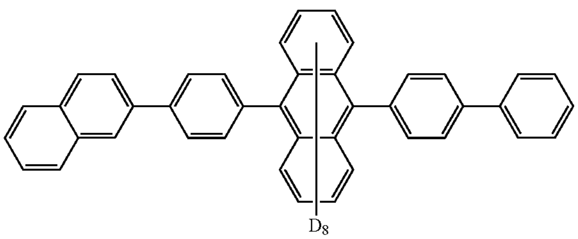
BH10_D2
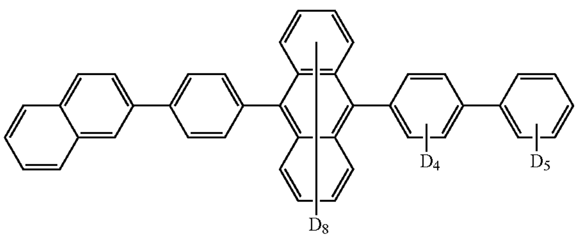
-continued
BH10_D3
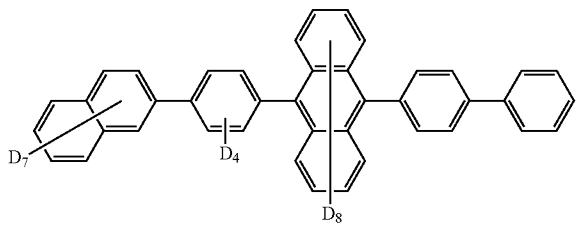
BH10_D4
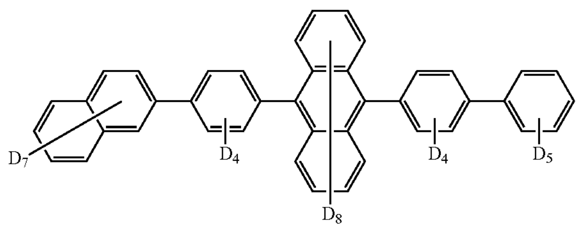
BH11
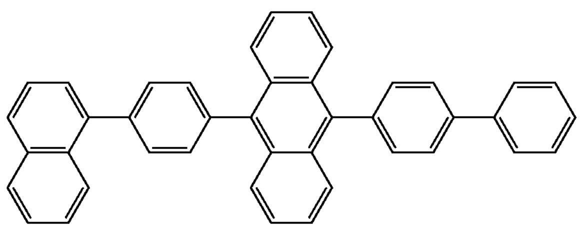
BH11_D1
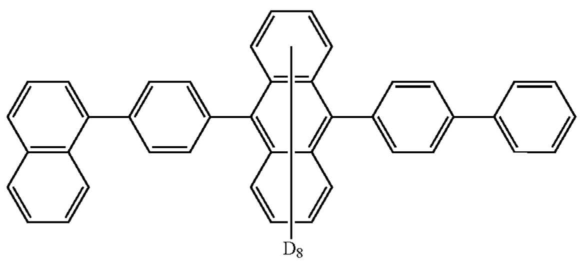
BH11_D2
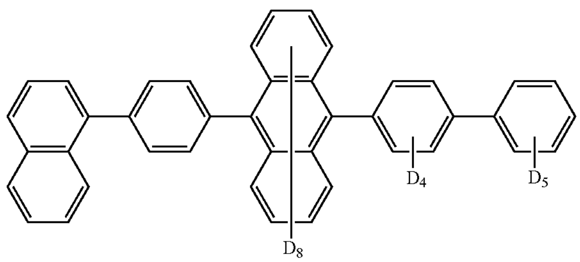
BH11_D3
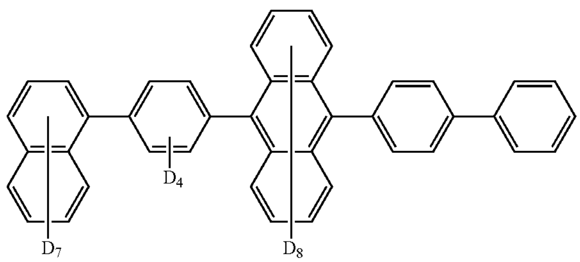

-continued
BH11_D4
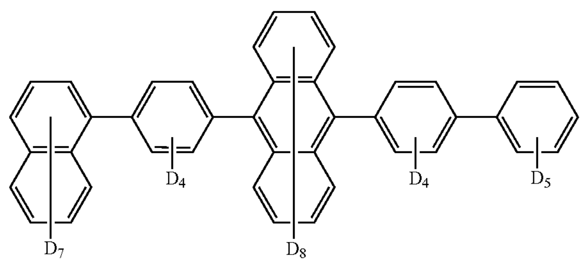
BH12
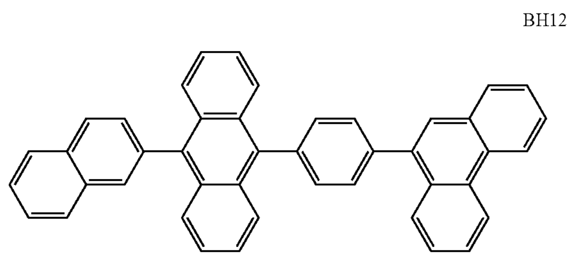
BH12_D1
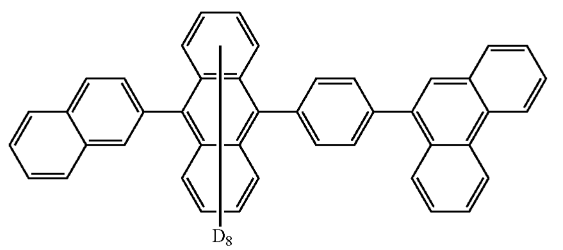
BH12_D2
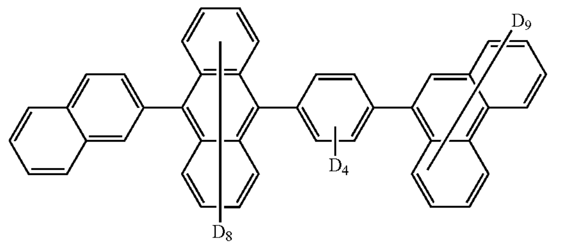
BH12_D3
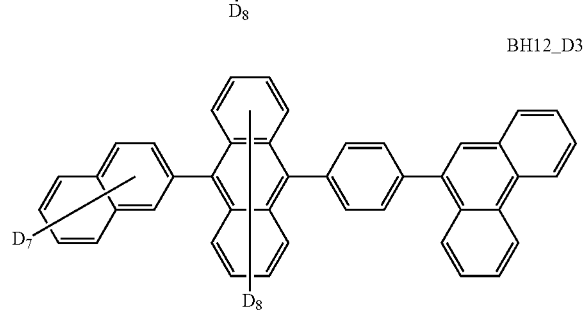
BH12_D4
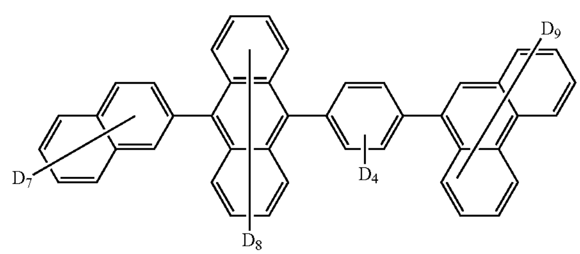
-continued
BH13
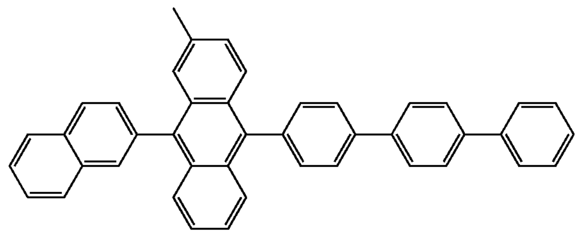
BH13_D1
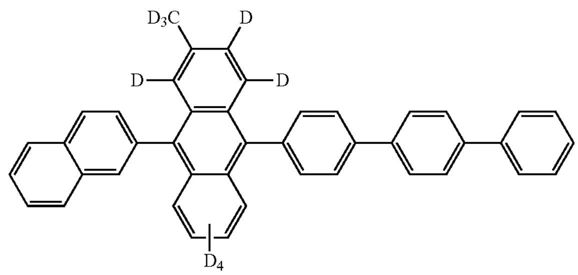
BH13_D2
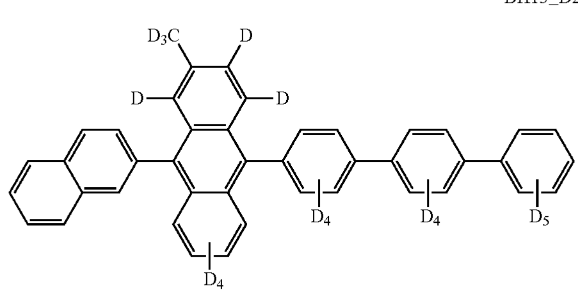
BH13_D3
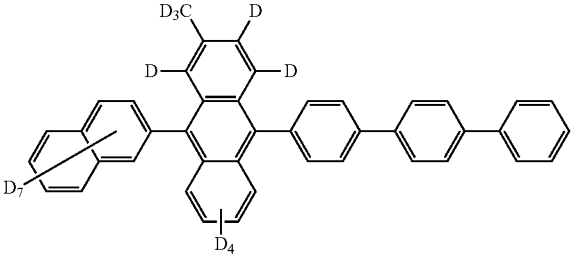
BH13_D4
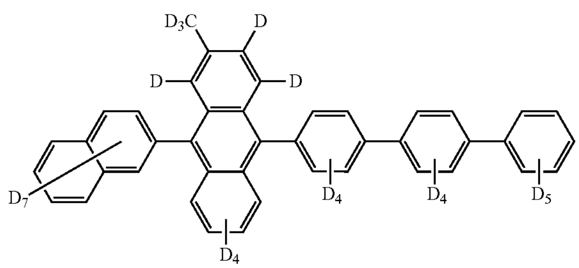

BH14
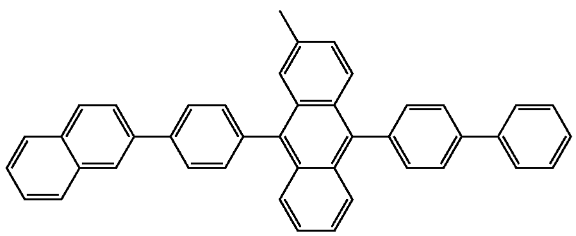
BH14_D1
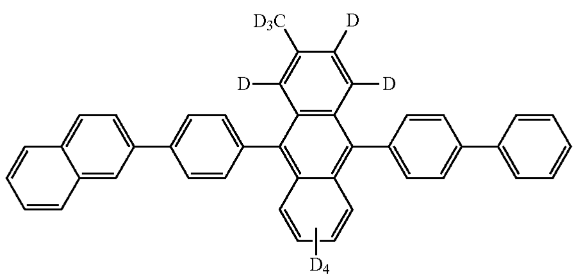
BH14_D2
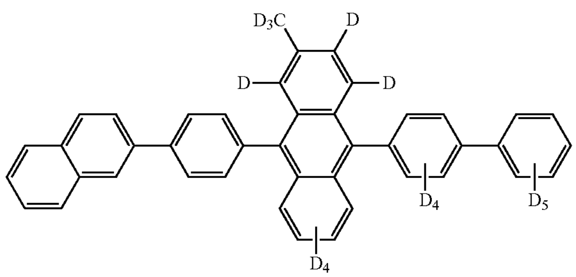
BH14_D3
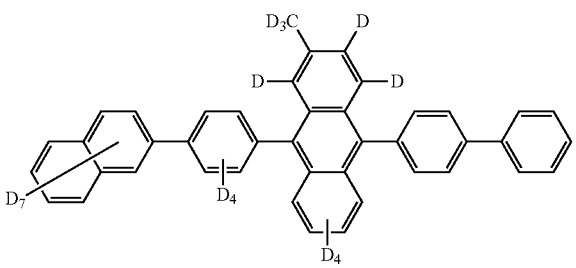
BH14_D4
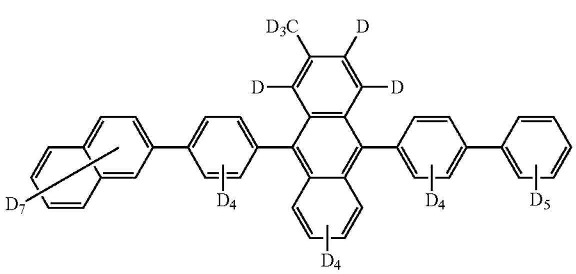
BH15
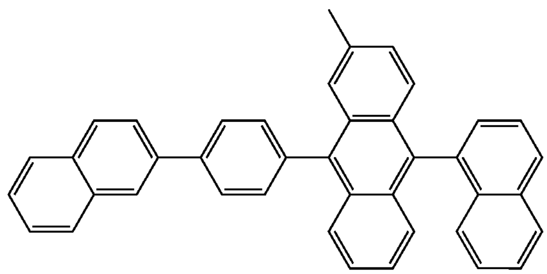
BH15_D1
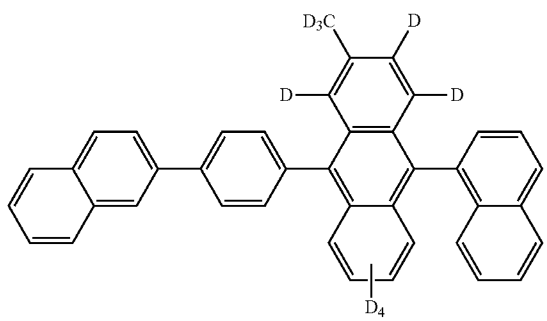
BH15_D2
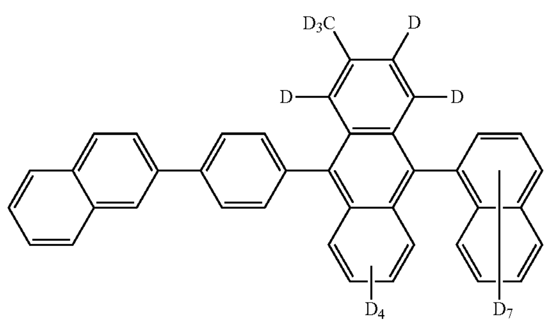
BH15_D3
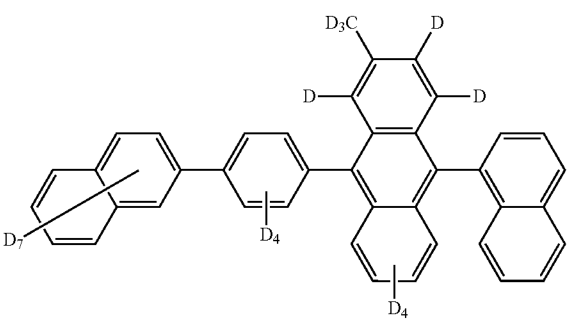
BH15_D4
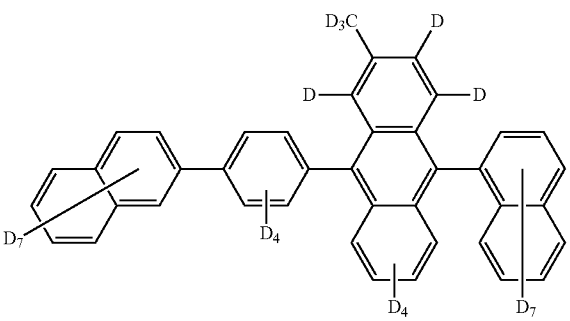

-continued
BH16
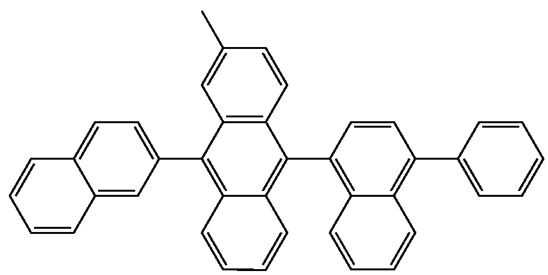
BH16_D1
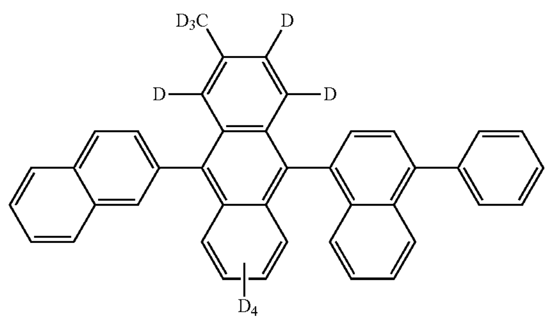
BH16_D2
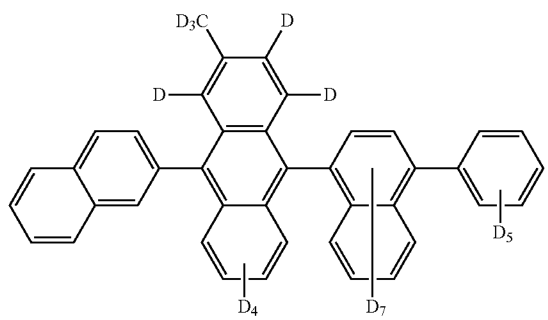
BH16_D3
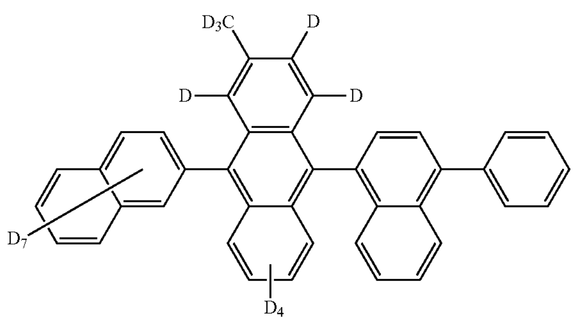
BH16_D4
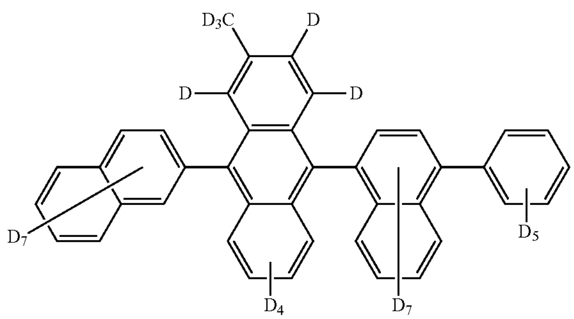
-continued
BH17
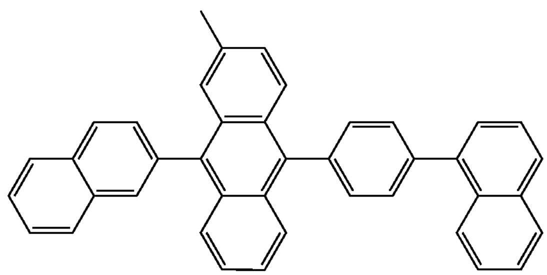
BH17_D1
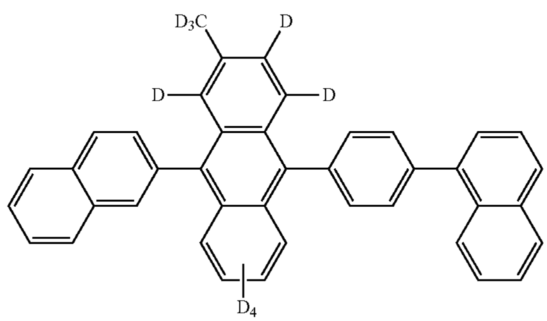
BH17_D2
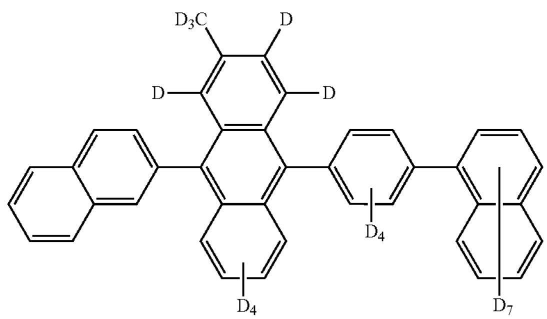
BH17_D3
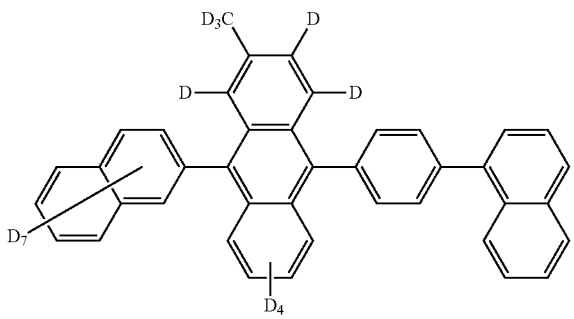
BH17_D4
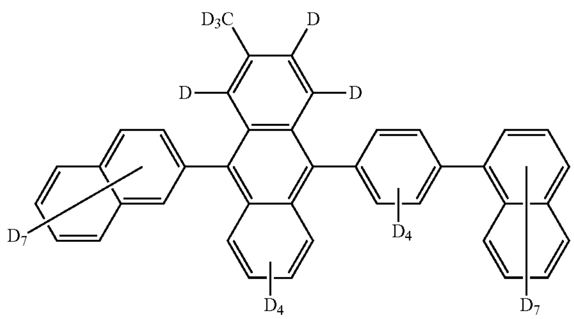

-continued

BH18

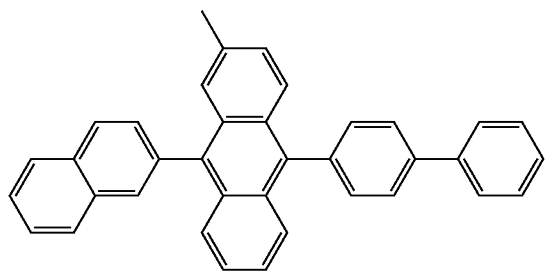

BH18_D1

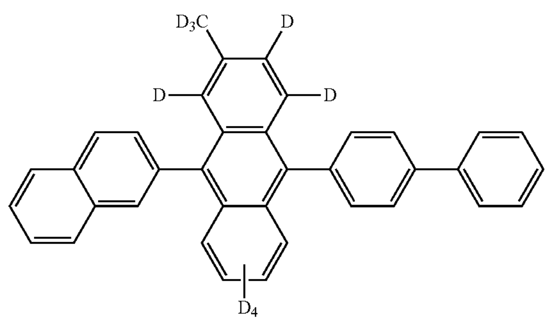

BH18_D2

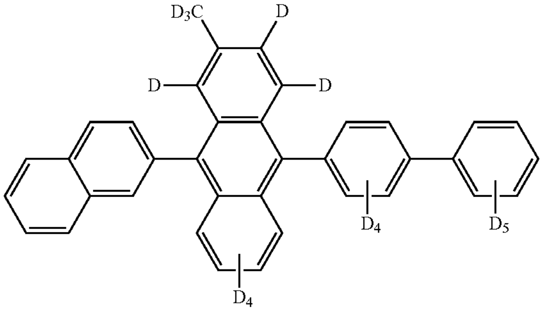

BH18_D3

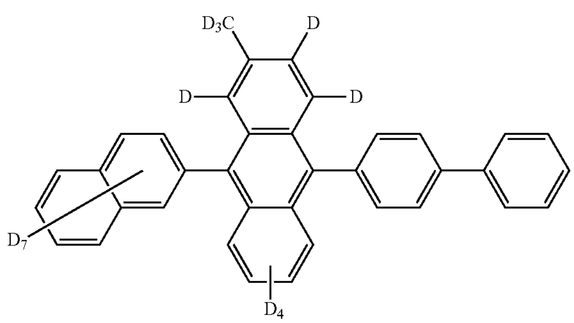

-continued

BH18_D4

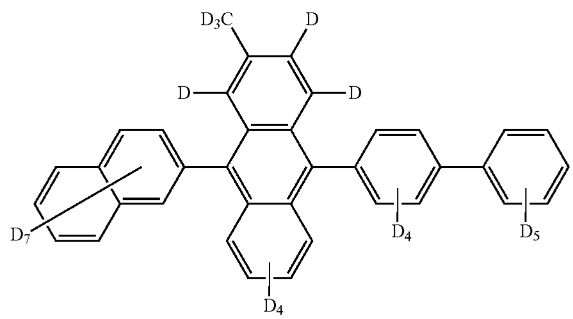

11. The organic light emitting diode according to claim 1, wherein a weight % ratio of the first electron transporting material to the second electron transporting material is in a range of 3:7 to 7:3.

12. The organic light emitting diode according to claim 1, wherein the first electron transporting material is one of compounds in Formula 11:

[Formula 11]

ETL1-1

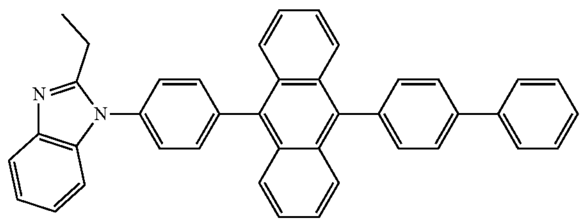

ETL1-2

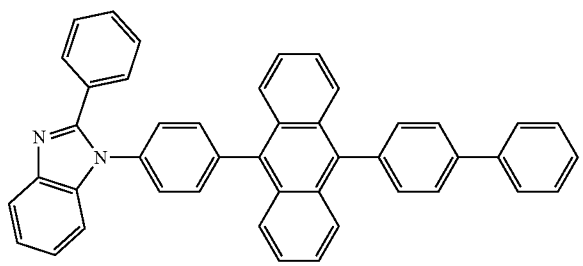

ETL1-3

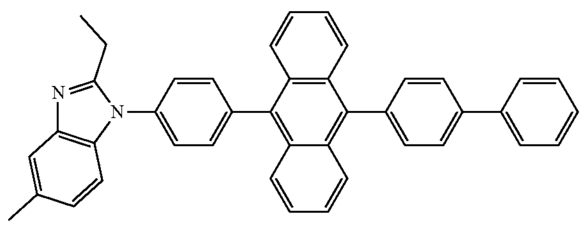

ETL1-4
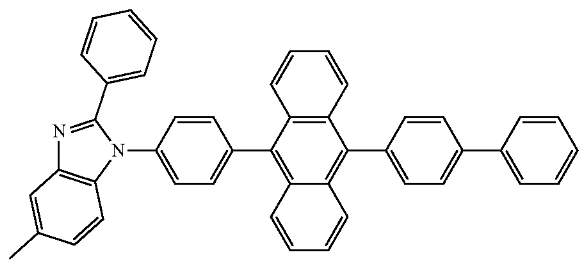
ETL1-5
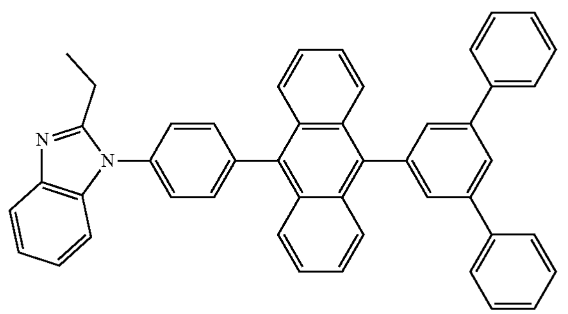
ETL1-6
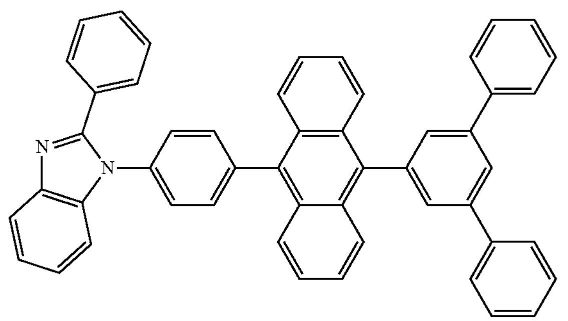
ETL1-7
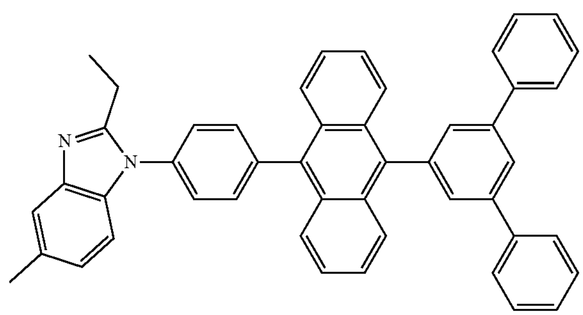
ETL1-8
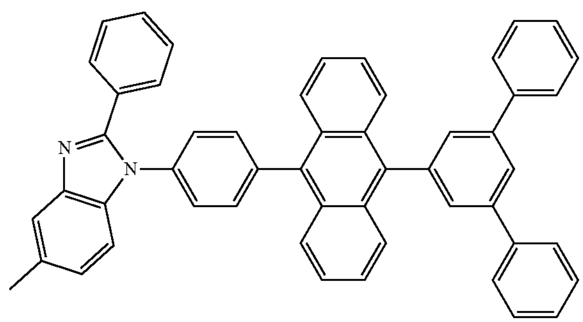
ETL1-9
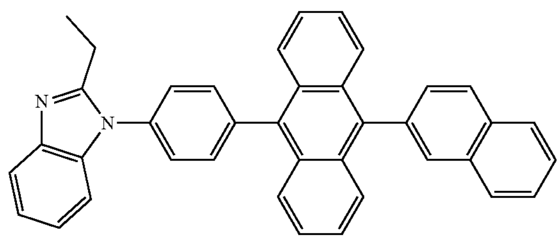
ETL1-10
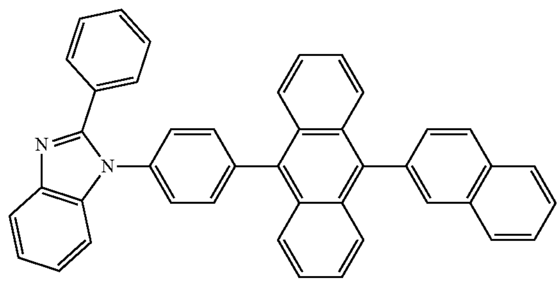
ETL1-11
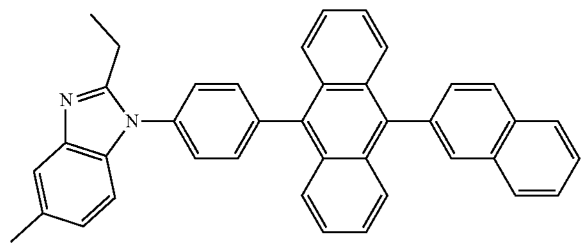
ETL1-12
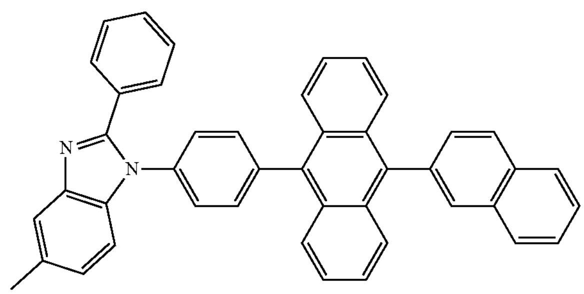
ETL1-13
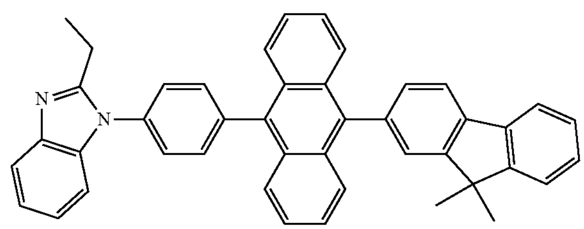

-continued
ETL1-14
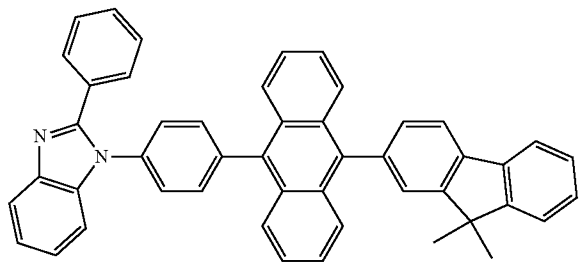
ETL1-15
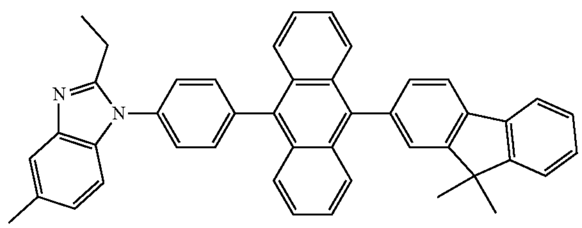
ETL1-16
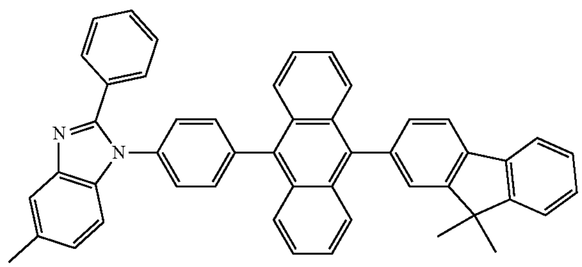
ETL1-17
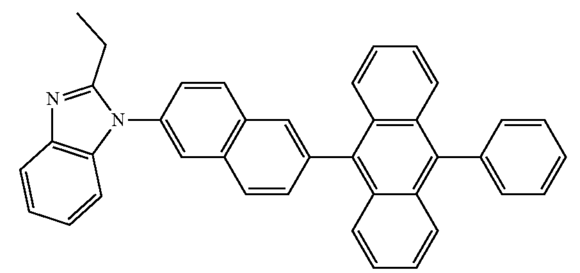
ETL1-18
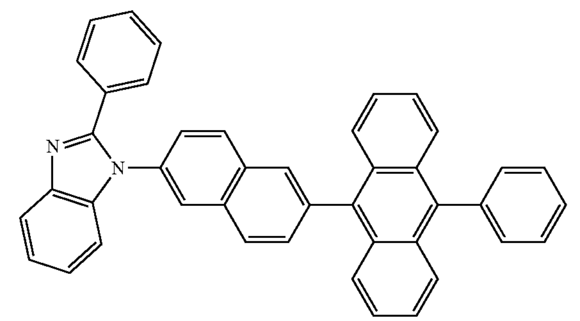
-continued
ETL1-19
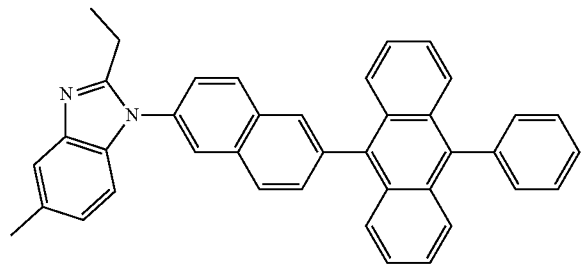
ETL1-20
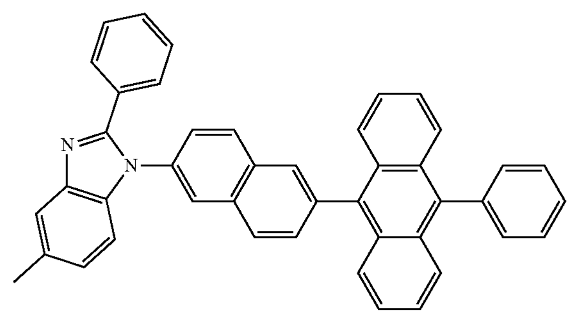
13. The organic light emitting diode according to claim 1, wherein the second electron transporting material is one of compounds in Formula 12:
[Formula 12]
ETL2-1
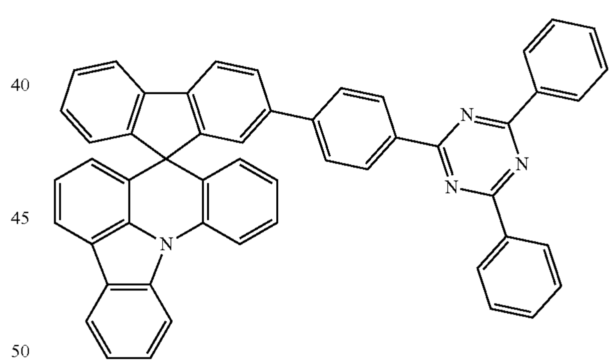
ETL2-2
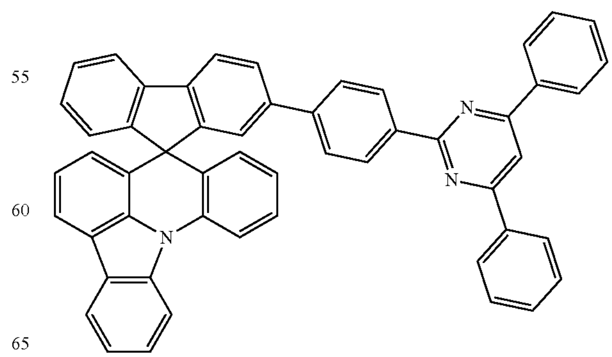

-continued
ETL2-3
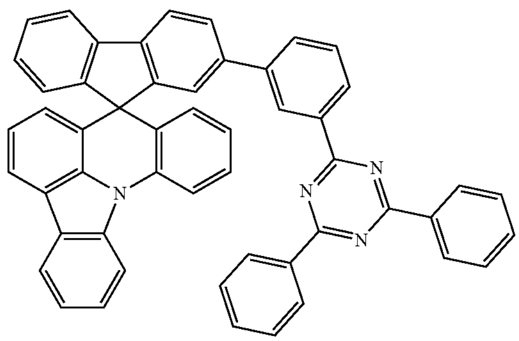
ETL2-4
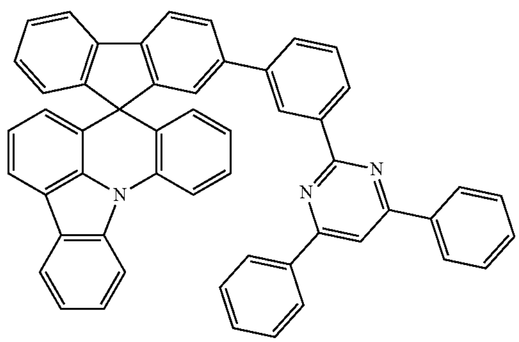
ETL2-5
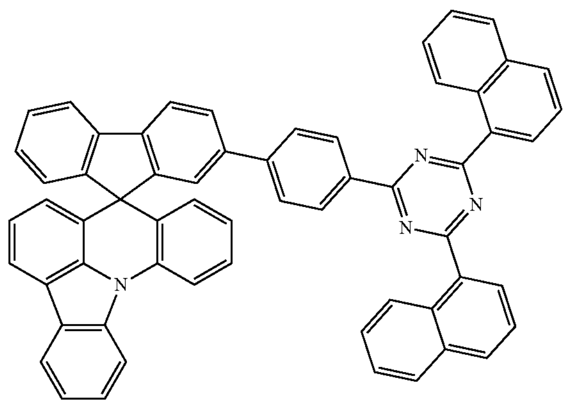
ETL2-6
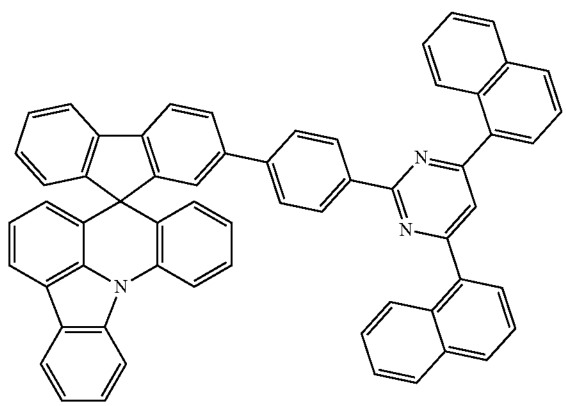
-continued
ETL2-7
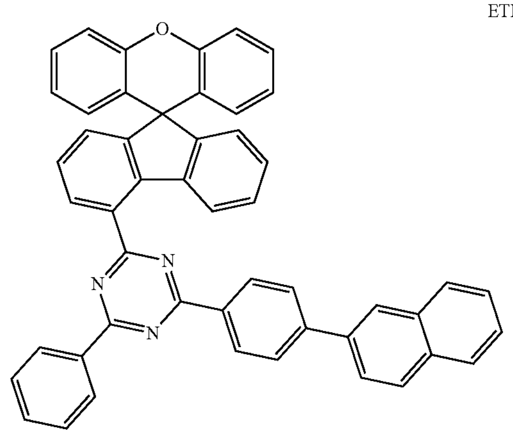
ETL2-8
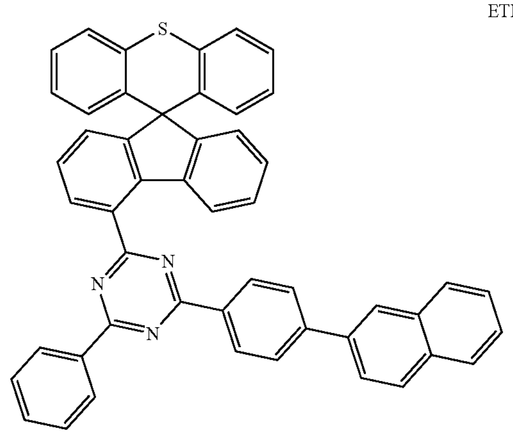
ETL2-9
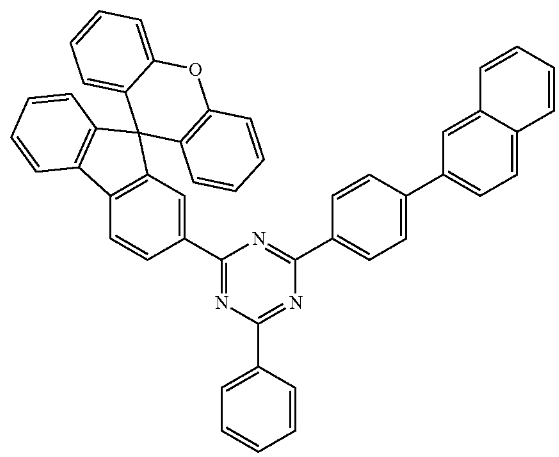

-continued
ETL2-10
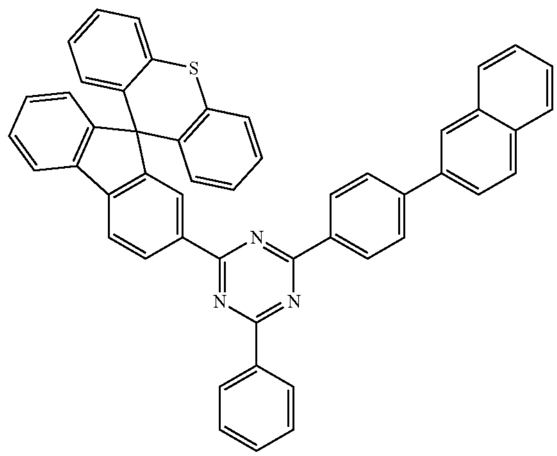
ETL2-11
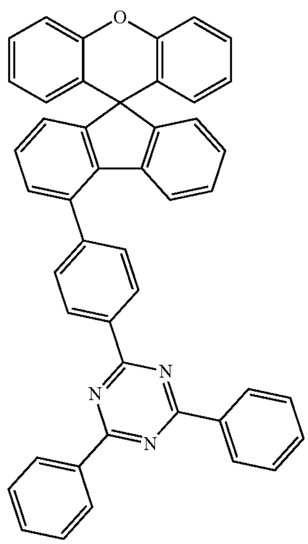
ETL2-12
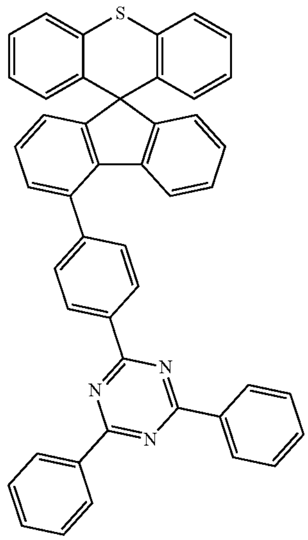
-continued
ETL2-13
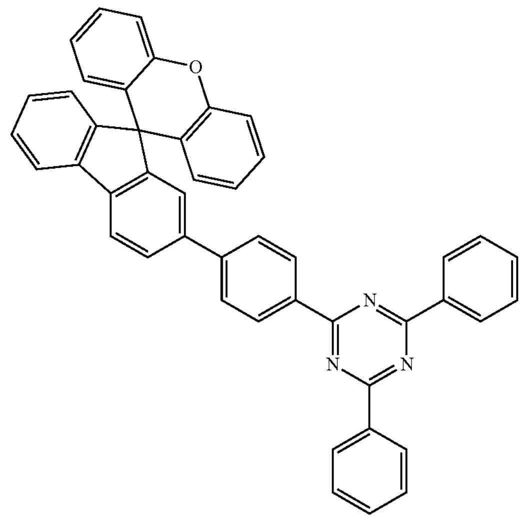
ETL2-14
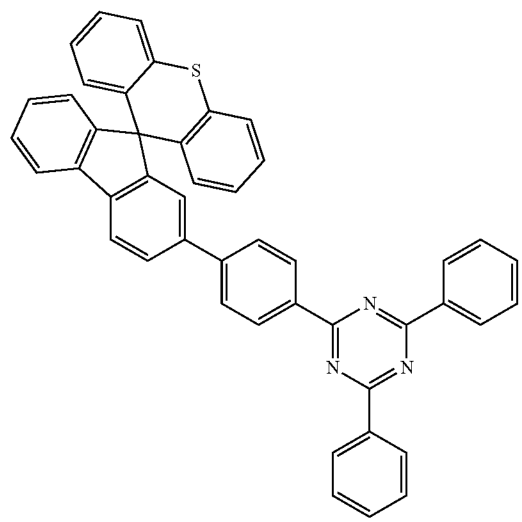
ETL2-15
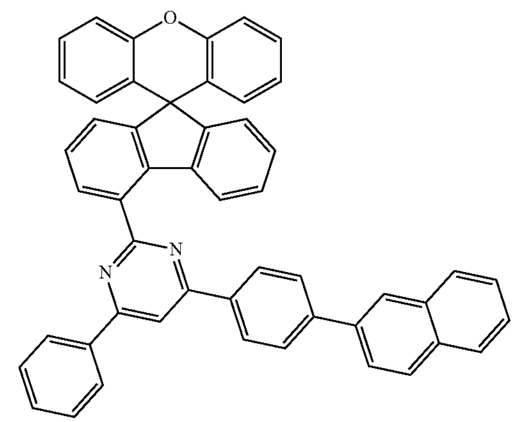

-continued

ETL2-16

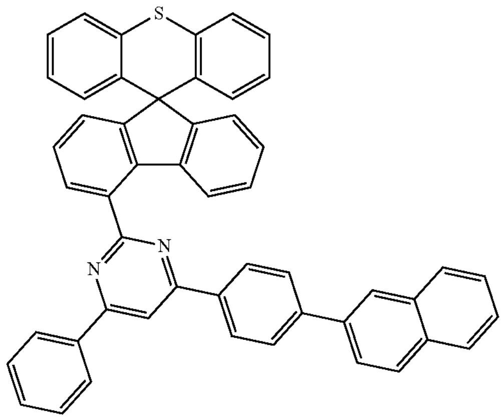

14. The organic light emitting diode according to claim 1, wherein the first dopant is a boron derivative having a first HOMO energy level and a first triplet energy, and the second dopant is a boron derivative having a second HOMO energy level lower than the first HOMO energy level and a second triplet energy greater than the first triplet energy, and wherein the first electron transporting material has a third HOMO energy level lower than the second HOMO energy level and a third triplet energy greater than the first triplet energy, and wherein the second electron transporting material has a fourth HOMO energy level lower than the second HOMO energy level and a fourth triplet energy smaller than the second triplet energy.

15. An organic light emitting diode, comprising:

a first electrode;

a second electrode facing the first electrode;

a first emitting part including a first blue emitting layer, a second blue emitting layer and a first electron transporting layer and positioned between the first and second electrode, the second blue emitting layer positioned between the first blue emitting layer and the second electrode and contacting the first blue emitting layer, and the first electron transporting layer positioned between the second blue emitting layer and the second electrode; and a second emitting part including a third blue emitting layer, a fourth blue emitting layer and a second electron transporting layer and positioned between the first emitting part and the second electrode, the fourth blue emitting layer positioned between the third blue emitting layer and the second electrode and contacting the third blue emitting layer, and the second electron transporting layer positioned between the fourth blue emitting layer and the second electrode, wherein the first blue emitting layer includes a first host and a first dopant, and the second blue emitting layer includes a second host and a second dopant, wherein the third blue emitting layer includes a third host and a third dopant, and the fourth blue emitting layer includes a fourth host and a fourth dopant, wherein the first host is an anthracene derivative having a first deuteration ratio, and the second host is an anthracene derivative having a second deuteration ratio smaller than the first deuteration ratio, wherein the third host is an anthracene derivative having a third deuteration ratio, and the fourth host is an anthracene derivative having a fourth deuteration ratio smaller than the third deuteration ratio, wherein each of the first dopant and the third dopant is a first compound represented by Formula 3:

[Formula 3]

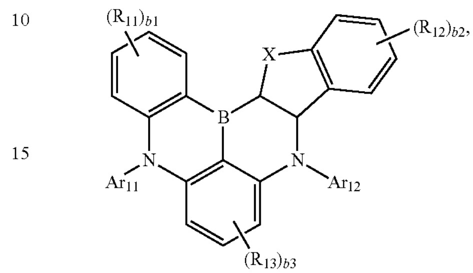

wherein in the Formula 3, each of b1 and b2 is independently an integer of 0 to 4, and b3 is an integer of 0 to 3, X is O or S, each of $Ar_{11}$ and $Ar_{12}$ is independently selected from the group consisting of a substituted or unsubstituted C6 to C30 aryl group, a substituted or unsubstituted C3 to C30 heteroaryl group and a substituted or unsubstituted C6 to C30 alicyclic group, and $R_{11}$, $R_{12}$ and $R_{13}$ is independently selected from the group consisting of a substituted or unsubstituted C1 to C30 alkyl group, a substituted or unsubstituted C3 to C30 cycloalkyl group, a substituted or unsubstituted C6 to C30 arylamino group, a substituted or unsubstituted C6 to C30 aryl group and a substituted or unsubstituted C3 to C30 heteroaryl group, or at least one pair of adjacent two or more $R_{11}$, adjacent two or more $R_{12}$ and adjacent two or more $R_{13}$ are connected to each other to form a substitute or unsubstituted ring, wherein each of the second dopant and the fourth dopant is a second compound represented by Formula 7:

[Formula 7]

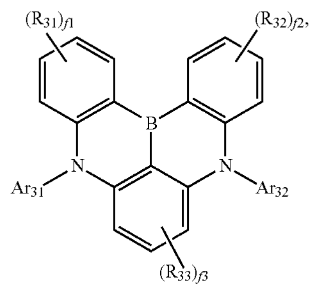

wherein in the Formula 7, each of f1 and f2 is independently an integer of 0 to 4, and f3 is an integer of 0 to 3, each of $Ar_{31}$ and $Ar_{32}$ is independently selected from the group consisting of a substituted or unsubstituted C6 to C30 aryl group, a substituted or unsubstituted C3 to C30 heteroaryl group and a substituted or unsubstituted C6 to C30 alicyclic group, and $R_{31}$, $R_{32}$ and $R_{33}$ is independently selected from the group consisting of a substituted or unsubstituted C1 to C30 alkyl group, a substituted or unsubstituted C3 to C30 cycloalkyl group, a substituted or unsubstituted C6 to C30 arylamino group, a substituted or unsubstituted C6 to C30 aryl group and a substituted or unsubstituted C3 to C30 heteroaryl group, wherein the first electron transporting layer includes at least one of a first electron transporting material represented by Formula 9 and a second electron transporting material represented by Formula 10;

[Formula 9]

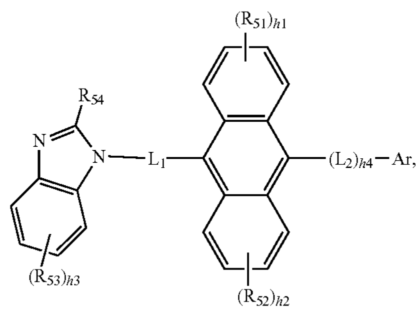

wherein in the Formula 9, each of h1, h2 and h3 is independently an integer of 0 to 4, and h4 is 0 or 1, each of $R_{51}$, $R_{52}$ and $R_{53}$ is independently selected from the group consisting of deuterium, a substituted or unsubstituted C1 to C10 alkyl group, a substituted or unsubstituted C3 to C10 cycloalkyl group, a substituted or unsubstituted C6 to C30 aryl group and a substituted or unsubstituted C3 to C30 heteroaryl group, $R_{54}$ is selected from the group consisting of hydrogen, deuterium, a substituted or unsubstituted C1 to C10 alkyl group, a substituted or unsubstituted C3 to C10 cycloalkyl group, a substituted or unsubstituted C6 to C30 aryl group and a substituted or unsubstituted C3 to C30 heteroaryl group, each of $L_1$ and $L_2$ is independently a substituted or unsubstituted C6 to C30 arylene group, and Ar is selected from the group consisting of a substituted or unsubstituted C6 to C30 aryl group and a substituted or unsubstituted C3 to C30 heteroaryl group,

[Formula 10]

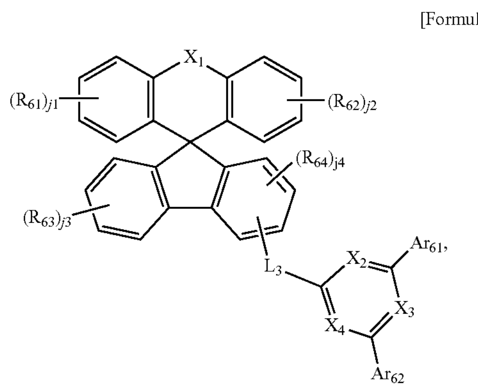

wherein in the Formula 10, each of j1, j2 and j3 is independently an integer of 0 to 4, and j4 is an integer of 0 to 3, each of $R_{61}$, $R_{62}$, $R_{63}$ and $R_{64}$ is independently selected from the group consisting of a substituted or unsubstituted C1 to C10 alkyl group, a substituted or unsubstituted C3 to C10 cycloalkyl group, a substituted or unsubstituted C6 to C30 aryl group and a substituted or unsubstituted C3 to C30 heteroaryl group, $X_1$ is O, S or $NR_{65}$, and $R_{65}$ is a substituted or unsubstituted C6 to C30 aryl group and connected to adjacent benzene ring to form a ring, each of $X_2$, $X_3$ and $X_4$ is independently N or $CR_{66}$, and at least two of $X_2$, $X_3$ and $X_4$ are N, each of $Ar_{61}$, $Ar_{62}$ and $R_{66}$ is independently selected from the group consisting of hydrogen, a substituted or unsubstituted C6 to C30 aryl group and a substituted or unsubstituted C3 to C30 heteroaryl group, and $L_3$ is selected from the group consisting of a substituted or unsubstituted C6 to C30 arylene group and a substituted or unsubstituted C3 to C30 heteroarylene group, and wherein the second electron transporting layer includes at least one of the first electron transporting material and the second electron transporting material.

16. An organic light emitting diode, comprising:

a first electrode;

a second electrode facing the first electrode; and a first emitting part including a first blue emitting layer, a second blue emitting layer and a first electron transporting layer and positioned between the first and second electrode, the second blue emitting layer positioned between the first blue emitting layer and the second electrode and contacting the first blue emitting layer, and the first electron transporting layer positioned between the second blue emitting layer and the second electrode, wherein the first blue emitting layer includes a first host and a first dopant, and the second blue emitting layer includes a second host and a second dopant, wherein the first host is an anthracene derivative having a first deuteration ratio, and the second host is an anthracene derivative having a second deuteration ratio smaller than the first deuteration ratio, wherein the first dopant is a first compound represented by Formula 3:

[Formula 3]

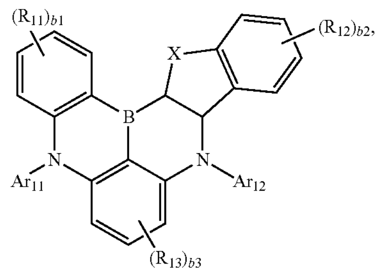

wherein in the Formula 3, each of b1 and b2 is independently an integer of 0 to 4, and b3 is an integer of 0 to 3, X is O or S, each of $Ar_{11}$ and $Ar_{12}$ is independently selected from the group consisting of a substituted or unsubstituted C6 to C30 aryl group, a substituted or unsubstituted C3 to C30 heteroaryl group and a substituted or unsubstituted C6 to C30 alicyclic group, and $R_{11}$, $R_{12}$ and $R_{13}$ is independently selected from the group consisting of a substituted or unsubstituted C1 to C30 alkyl group, a substituted or unsubstituted C3 to C30 cycloalkyl group, a substituted or unsubstituted C6 to C30 arylamino group, a substituted or unsubstituted C6 to C30 aryl group and a substituted or unsubstituted C3 to C30 heteroaryl group, or at least one pair of adjacent two or more $R_{11}$, adjacent two or more $R_{12}$ and adjacent two or more $R_{13}$ are connected to each other to form a substitute or unsubstituted ring, wherein the first electron transporting layer includes at least one of a first electron transporting material represented by Formula 9 and a second electron transporting material represented by Formula 10;

[Formula 9]

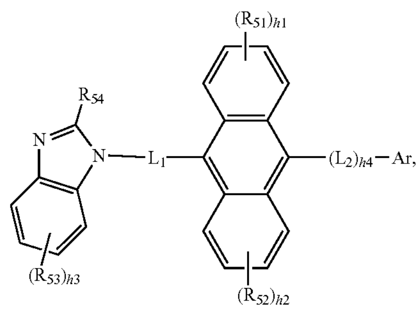

wherein in the Formula 9, each of h1, h2 and h3 is independently an integer of 0 to 4, and h4 is 0 or 1, each of $R_{51}$, $R_{52}$ and $R_{53}$ is independently selected from the group consisting of deuterium, a substituted or unsubstituted C1 to C10 alkyl group, a substituted or unsubstituted C3 to C10 cycloalkyl group, a substituted or unsubstituted C6 to C30 aryl group and a substituted or unsubstituted C3 to C30 heteroaryl group, $R_{54}$ is selected from the group consisting of hydrogen, deuterium, a substituted or unsubstituted C1 to C10 alkyl group, a substituted or unsubstituted C3 to C10 cycloalkyl group, a substituted or unsubstituted C6 to C30 aryl group and a substituted or unsubstituted C3 to C30 heteroaryl group, each of $L_1$ and $L_2$ is independently a substituted or unsubstituted C6 to C30 arylene group, and Ar is selected from the group consisting of a substituted or unsubstituted C6 to C30 aryl group and a substituted or unsubstituted C3 to C30 heteroaryl group,

[Formula 10]

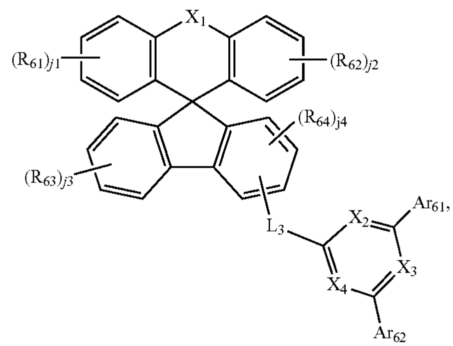

wherein in the Formula 10, each of j1, j2 and j3 is independently an integer of 0 to 4, and j4 is an integer of 0 to 3, each of $R_{61}$, $R_{62}$, $R_{63}$ and $R_{64}$ is independently selected from the group consisting of a substituted or unsubstituted C1 to C10 alkyl group, a substituted or unsubstituted C3 to C10 cycloalkyl group, a substituted or unsubstituted C6 to C30 aryl group and a substituted or unsubstituted C3 to C30 heteroaryl group, $X_1$ is O, S or $NR_{65}$, and $R_{65}$ is a substituted or unsubstituted C6 to C30 aryl group and connected to adjacent benzene ring to form a ring, each of $X_2$, $X_3$ and $X_4$ is independently N or $CR_{66}$, and at least two of $X_2$, $X_3$ and $X_4$ are N, each of $Ar_{61}$, $Ar_{62}$ and $R_{66}$ is independently selected from the group consisting of hydrogen, a substituted or unsubstituted C6 to C30 aryl group and a substituted or unsubstituted C3 to C30 heteroaryl group, and $L_3$ is selected from the group consisting of a substituted or unsubstituted C6 to C30 arylene group and a substituted or unsubstituted C3 to C30 heteroarylene group, wherein the first dopant is a boron derivative having a first HOMO energy level and a first triplet energy, and the second dopant is a boron derivative having a second HOMO energy level lower than the first HOMO energy level and a second triplet energy greater than the first triplet energy, and wherein the first electron transporting material has a third HOMO energy level lower than the second HOMO energy level and a third triplet energy greater than the first triplet energy, and wherein the second electron transporting material has a fourth HOMO energy level lower than the second HOMO energy level and a fourth triplet energy smaller than the second triplet energy.

* * * * *